(12) United States Patent
Nishida et al.

(10) Patent No.: US 7,411,238 B2
(45) Date of Patent: Aug. 12, 2008

(54) SEMICONDUCTOR INTEGRATED CIRCUIT DEVICE AND A METHOD OF MANUFACTURING THE SAME

(75) Inventors: Akio Nishida, Tachikawa (JP); Hiraku Chakihara, Akishima (JP); Koichi Toba, Tachikawa (JP)

(73) Assignee: Renesas Technology Corp., Tokyo (JP)

( * ) Notice: Subject to any disclaimer, the term of this patent is extended or adjusted under 35 U.S.C. 154(b) by 45 days.

(21) Appl. No.: 11/584,623

(22) Filed: Oct. 23, 2006

(65) Prior Publication Data
US 2007/0034968 A1 Feb. 15, 2007

Related U.S. Application Data

(63) Continuation of application No. 11/521,486, filed on Sep. 15, 2006, now Pat. No. 7,202,628, and a continuation-in-part of application No. 10/781,861, filed on Feb. 20, 2004, now Pat. No. 7,145,194.

(30) Foreign Application Priority Data

Feb. 21, 2003 (JP) ............................. 2003-044820
Jul. 2, 2004 (JP) ............................. 2004-196188

(51) Int. Cl.
*H01L 27/108* (2006.01)

(52) U.S. Cl. ................. 257/296; 257/297; 257/298; 257/300; 257/E27.098
(58) Field of Classification Search ......... 257/296–298, 257/300, 393, E27.098, E27.099
See application file for complete search history.

(56) References Cited

U.S. PATENT DOCUMENTS

| 5,780,910 A | * | 7/1998 | Hashimoto et al. | .......... 257/393 |
| 6,635,937 B2 | * | 10/2003 | Ootsuka et al. | ............. 257/379 |
| 6,649,456 B1 | * | 11/2003 | Liaw | .......................... 438/153 |

* cited by examiner

*Primary Examiner*—Matthew E. Warren
(74) *Attorney, Agent, or Firm*—Antonelli, Terry, Stout & Kraus, LLP.

(57) ABSTRACT

In order to improve the soft error resistance of a memory cell of an SRAM without increasing its chip size in deep through-holes formed by perforating a silicon oxide film, there is a silicon nitride film and a silicon oxide film, a capacitor element having a TIN film serving as a lower electrode. This capacitor element is connected between a storage node and a supply voltage line, between a storage node and a reference voltage line, or between storage nodes of the memory cell of the SRAM.

10 Claims, 87 Drawing Sheets

SEMICONDUCTOR INTEGRATED CIRCUIT DEVICE AND A METHOD OF MANUFACTURING THE SAME

CROSS-REFERENCE TO RELATED APPLICATION

This application is a Continuation application of application Ser. No. 10/781,861 filed Feb. 20, 2004 now U.S. Pat. No. 7,145,194, which claims priority from JP 2003-044820 filed on Feb. 21, 2003, the content of which is hereby incorporated by reference into this application.

TECHNICAL FIELD

The present invention relates to a semiconductor integrated circuit device and to a technique for use in the manufacture thereof, and, more particularly, the invention relates to a technique which is effective when applied to the manufacture of a semiconductor integrated circuit device having a capacitor.

BACKGROUND OF THE INVENTION

An SRAM (Static Random Access Memory) is a type of RAM which allows writing and reading operations at any time without a refreshing operation when the electricity is on; and, it has a flip flop circuit that is capable of storing 1 bit of information and two information transfer MISFETs (Metal Insulator Semiconductor Field Effect Transistors). The flip flop circuit has, for example, a pair of drive MISFETs and a pair of load MISFETS.

In such a memory cell, soft errors due to, for example, α rays become a problem. This phenomenon occurs when α rays contained in the cosmic rays from outer space or alpha rays emitted from a radioactive atom contained in the packaging material of an LSI damage the information stored in the memory cell. Addition of a capacitance to the information storage portion (input/output portions of the flip flop circuit) in the memory cell to increase the capacitance of the information storage portion is under investigation as a countermeasure against this α ray problem.

There is a potential danger that, as scaling-down of the memory cell proceeds and the operating voltage lowers, the capacitance which the memory cell itself possesses decreases and soft errors which damage the information tend to occur.

For example, there is a technique (refer to, for example, the below-listed Patent Document 1) of forming a capacitor between two interconnects for cross-coupling input/output terminals of a flip flop circuit for storing information, by adding two metal film layers, which will constitute capacitor electrodes, and a thin insulating film interposed therebetween, to increase the capacitance of a storage node of the memory cell, thereby preventing lowering of the soft error resistance. Patent Document: Japanese Patent Application Laid-Open No. 36252/1997

SUMMARY OF THE INVENTION

With miniaturization of memory cells due to high integration thereof and size reduction of a semiconductor chip (which will hereinafter simply be called a "chip"), the region in which a capacitor element can be formed becomes smaller. Such a tendency imposes a limitation on an increase in the capacitance of the information storage portion.

When a capacitor is formed between two interconnects cross-coupling input/output terminals of a flip flop circuit for storing information by adding two metal film layers, which are to serve as capacitor electrodes and a thin insulating film interposed therebetween, a planar capacitor must be formed. A large plane area becomes necessary to increase the capacitance, which inevitably disturbs the scaling-down of the chip size.

An object of the present invention is to provide a technique that is capable of improving the properties of a semiconductor integrated circuit device.

The above-described and the other objects, and novel features of the present invention will be apparent from the description herein and the accompanying drawings.

An outline of the typical aspects of the present invention will be described briefly.

In one aspect of the present invention, there is provided a semiconductor integrated circuit device comprising a memory cell having first and second transfer MISFETs, first and second drive MISFETs and first and second load MISFETs, each disposed at an intersection between a pair of complementary data lines and a word line, the first drive MISFET and first load MISFET being cross-coupled with the second drive MISFET and second load MISFET, wherein:

the first and second transfer MISFETs and the first and second drive MISFETs are formed over the main surface of a semiconductor substrate;

a first insulating film is formed over the semiconductor substrate and a first opening reaching a gate electrode of the first and drive MISFETs and a drain of the first and second load MISFETs is formed in the first insulating film;

a first capacitor element, having, as a lower electrode, a first conductive film formed along the sidewall and bottom of the first opening, as an insulator, a second insulating film formed over the first conductive film, and as an upper electrode, a second conductive film formed over the second insulating film, is formed over the sidewall and bottom of the first opening;

over the first capacitor element, a supply voltage line, to be electrically connected to the first and second drive MISFETs and a reference voltage line to be electrically connected to the first and second load MISFETs, are formed;

the lower electrode forms a first storage node of the memory cell by electrically connecting a drain of the first drive MISFET, a drain of the first load MISFET, a gate electrode of the second drive MISFET and a gate electrode of the second load MISFET, and it forms a second storage node of the memory cell by electrically connecting a drain of the second drive MISFET, a drain of the second load MISFET, a gate electrode of the first drive MISFET and a gate electrode of the first load MISFET; and the first capacitor element is electrically connected between the first storage node and second storage node, and the supply voltage line, between the first storage node and second storage node, and the reference voltage line, or between the first storage node and the second storage node.

The above-described semiconductor integrated circuit device is manufactured by, for examples, a method including the following steps (a) to (e):

(a) forming the first and second transfer MISFETs and the first and second drive MISFETs over the main surface of a semiconductor substrate;

(b) forming a first insulating film over the semiconductor substrate, and making, in the first insulating film, a first opening reaching a gate electrode of each of the first and second drive MISFETs, and reaching a drain of the first and second load MISFETs;

(c) forming a first conductive film over the sidewall and bottom of the first opening, forming a first storage node of the memory cell by electrically connecting, via the first conductive film, the drain of the first drive MISFET, the drain of the first load MISFET, the gate electrode of the second drive MISFET and the gate electrode of the second load MISFET, and forming a second node by electrically connecting, via the first conductive film, a drain of the second drive MISFET, a drain of the second load MISFET, the gate electrode of the first drive MISFET and a gate electrode of the first load MISFET;

(d) forming a second insulating film over the first conductive film, forming a second conductive film over the second insulating film and forming a first capacitor element having the first conductive film as a lower electrode, the second insulating film serving as an insulator and the second conductive film serving as an upper electrode; and (e) forming a supply voltage line and a reference voltage line over the first capacitor element.

DETAILED DESCRIPTION OF THE PREFERRED EMBODIMENTS

Figure 1:
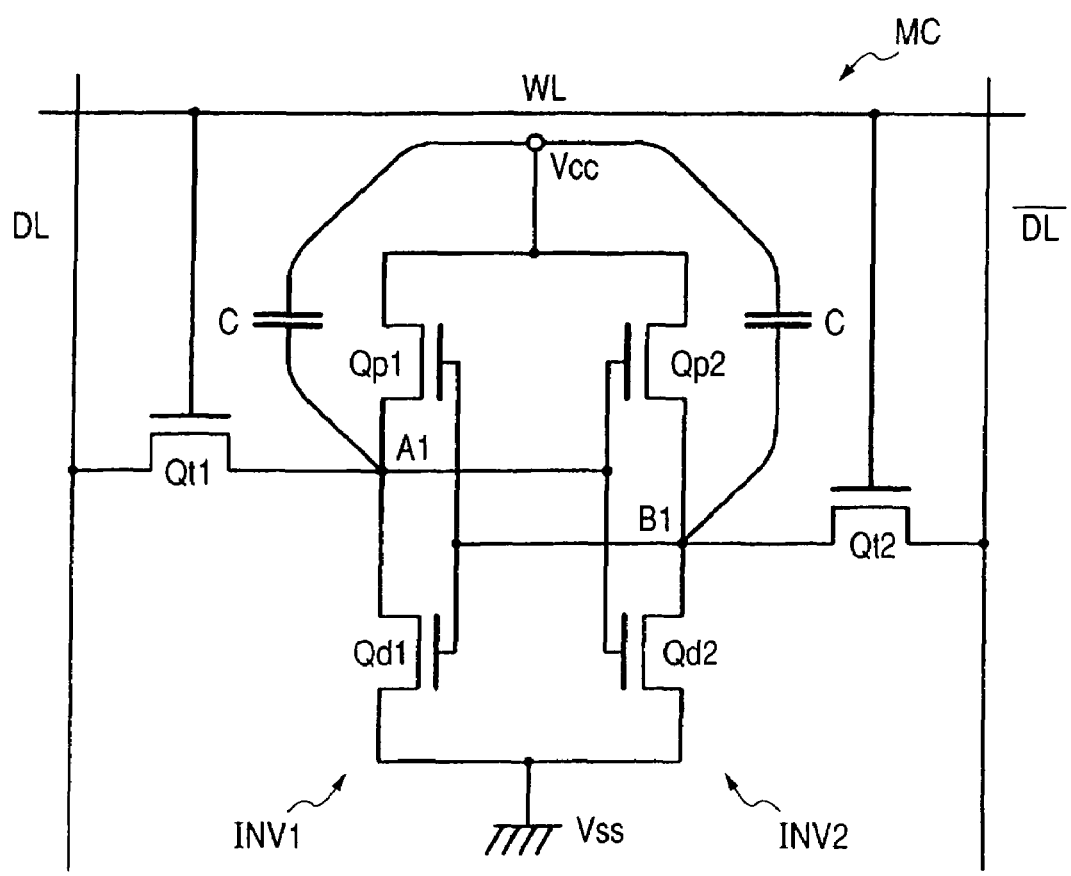
FIG. 1 is an equivalent circuit diagram of a memory cell of an SRAM according to Embodiment 1 of the present invention.

Various embodiments of the present invention will be described specifically with reference to the accompanying drawings. In all the drawings, members having a like function will be identified by like reference numerals, and overlapping descriptions thereof will be omitted.

Figure 2:
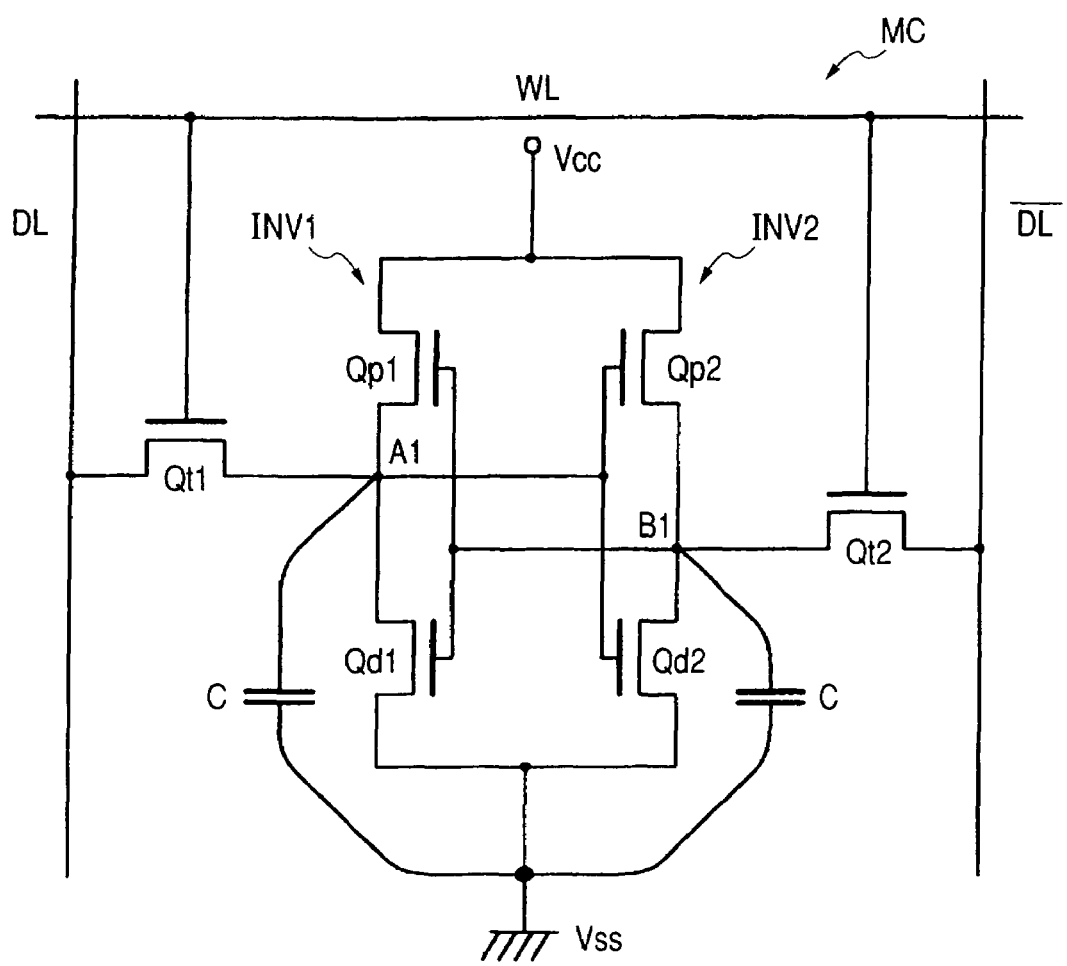
FIG. 2 is an equivalent circuit diagram of another memory cell of the SRAM according to Embodiment 1 of the present invention.
Figure 3:
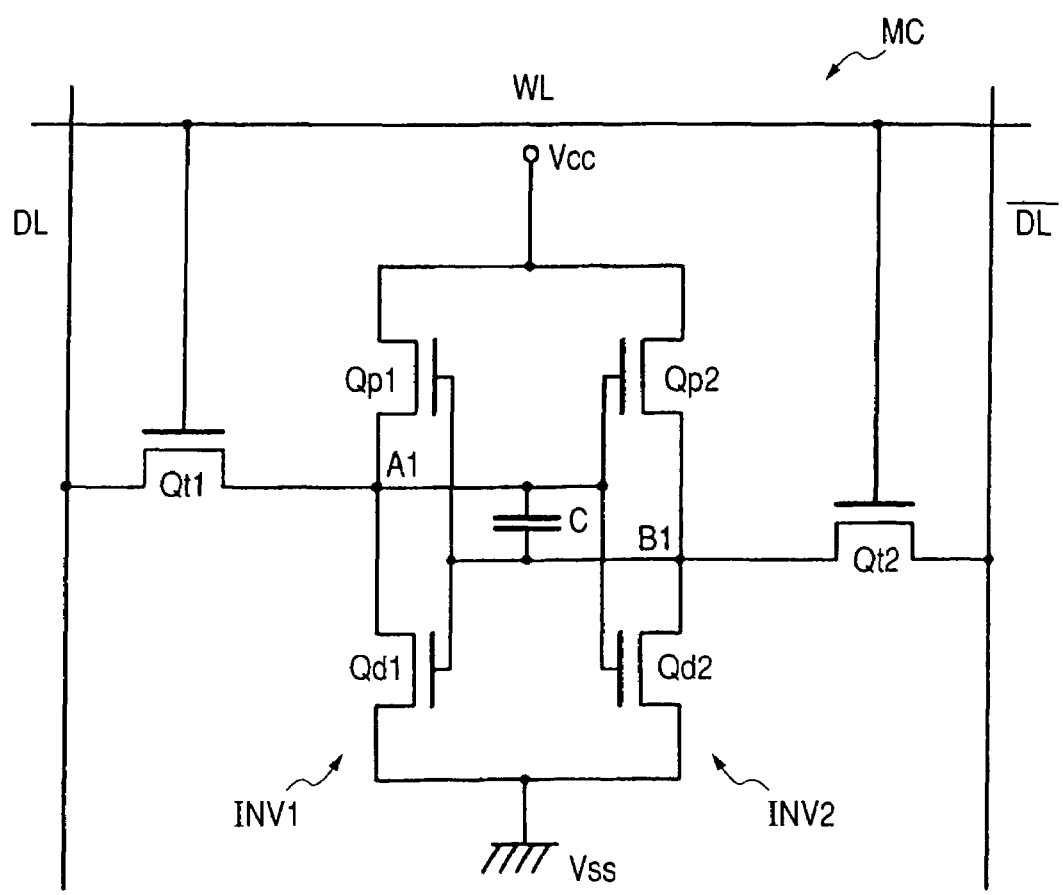
FIG. 3 is an equivalent circuit diagram of a further memory cell of the SRAM according to Embodiment 1 of the present invention.

FIGS. 1 to 3 are each an equivalent circuit diagram of a memory cell of an SRAM according to the present invention. As illustrated in these diagrams, the memory cell is disposed at the intersection between a pair of complementary data lines (data line DL and barred data line /DL) and a word line WL. The drive MISFETs Qd1 and Qd2 and the transfer MISFETs Qt1 and Qt2 are n-channel type MISFETs, while the load MISFETs Qp1 and Qp2 are p-channel type MISFETs.

Of these six MISFETs constituting the memory cell MC, the drive MISFET Qd1 and the load MISFET Qp1 constitute an inverter INV1, and the drive MISFET Qd2 and the load MISFET Qp2 constitute an inverter INV2. These paired inverters INV1 and INV2 have their input/output terminals (storage nodes A1 and B1) cross-coupled to constitute a flip-flop circuit serving as an information storage portion for storing information of 1 bit. This flip-flop circuit has one input/output terminal (the storage node A1) connected to one of the source and drain of the transfer MISFET Qt1 and the other input/output terminal (the storage node B1) connected to one of the source and drain of the transfer MISFET Qt2. In other words, the drain of the drive MISFET Qd1, the drain of the load MISFET Qp1, the gate of the drive MISFET Qd2 and the gate of the load MISFET Qp2 are electrically connected to each other and constitute the storage node A1; while, the drain of the drive MISFET Qd2, the drain of the load MISFET Qp2, the gate of the drive MISFET Qd1 and the gate of the load MISFET Qp1 are electrically connected to each other and constitute the storage node B1.

The other one of the source and drain of the transfer MISFET Qt1 is connected to the data line DL, while the other one of the source and drain of the transfer MISFET Qt2 is connected to the data line /DL. The flip-flop circuit is, at one end thereof (each of the sources of the load MISFETs Qp1 and Qp2), connected to a supply voltage (Vcc) and, at the other end (each of the source regions of the drive MISFETs Qd1 and Qd2), connected to a reference voltage (ground (substrate) potential) Vss. The supply voltage Vcc has a higher potential than the reference voltage Vss (Vcc>Vss).

In the above-described circuit, a capacitor element C is connected between the storage nodes A1,B1 and the supply voltage Vcc (refer to FIG. 1), between the storage anodes A1,B1 and the reference voltage Vss (refer to FIG. 2) or between the storage anodes A1 and B1 (refer to FIG. 3). Such disposal of the capacitor element C makes it possible to increase the capacitance of the storage nodes A1,B1 of the memory cell MC and prevent lowering in the soft error resistance, which will otherwise occur owing to α radiation.

When the storage node A1 of the one inverter INV1 is at a high ("H") potential, the drive MISFET Qd2 is turned ON and the potential of the storage node B1 of the other inverter NV2 becomes low ("L"). The drive MISFET Qd1 is therefore turned OFF and the storage node A1 is held at a high ("H") potential. In other words, the states of the storage nodes A1,B1 are latched by a latch circuit having the paired inverters INV1,INV2 cross-connected, so that the information is stored while the supply voltage is applied.

The word line WL is connected to each gate of the transfer MISFETs Qt1 and Qt2 and this word line WL controls ON and OFF operation of them. More specifically, when the word line WL is at a high potential ("H"), the transfer MISFETs Qt1 and Qt2 are ON so as to electrically connect the flip flop circuit and the complementary data lines (data lines DL,/DL), so that the potential state ("H" or "L") of the storage nodes A1,B1 appears on the data lines DL,/DL and is read out as the information of the memory cell MC.

In order to write information in the memory cell MC, the information of the data lines DL,/DL is transmitted to the storage nodes A1,B1 by setting the word line WL to the "H" potential level and by turning the transfer MISFETs Qt1 and Qt2 ON.

A method of manufacture of the above-described SRAM of Embodiment 1 will be described next based on FIGS. 4 to 17. In FIGS. 4 to 17, even a plan view is, in some cases, hatched to facilitate understanding of the manufacturing steps in the fabrication of the SRAM of Embodiment 1.

Figure 4:
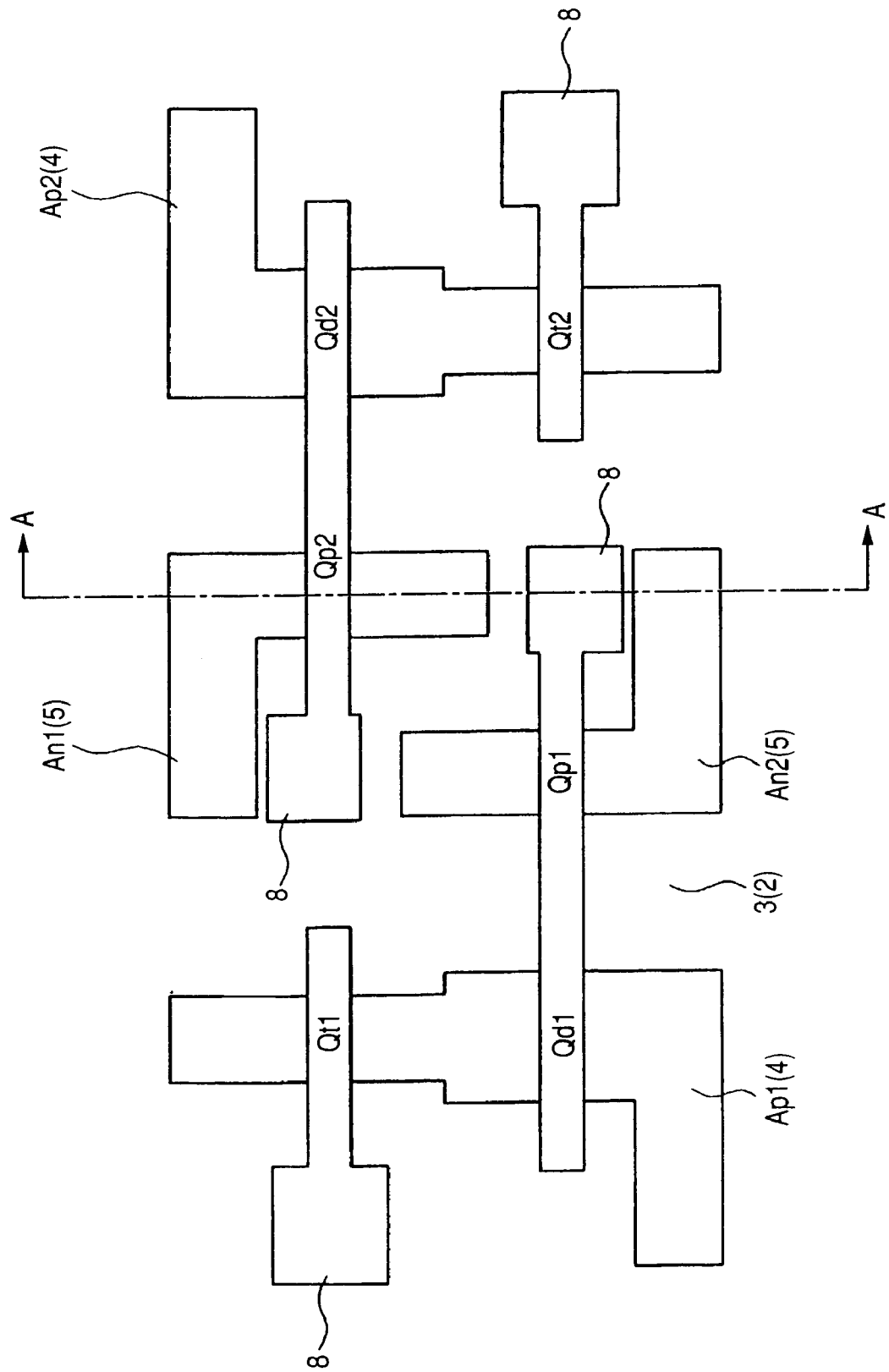
FIG. 4 is a fragmentary plan view illustrating a method of manufacture of the SRAM according to Embodiment 1 of the present invention.
Figure 5:
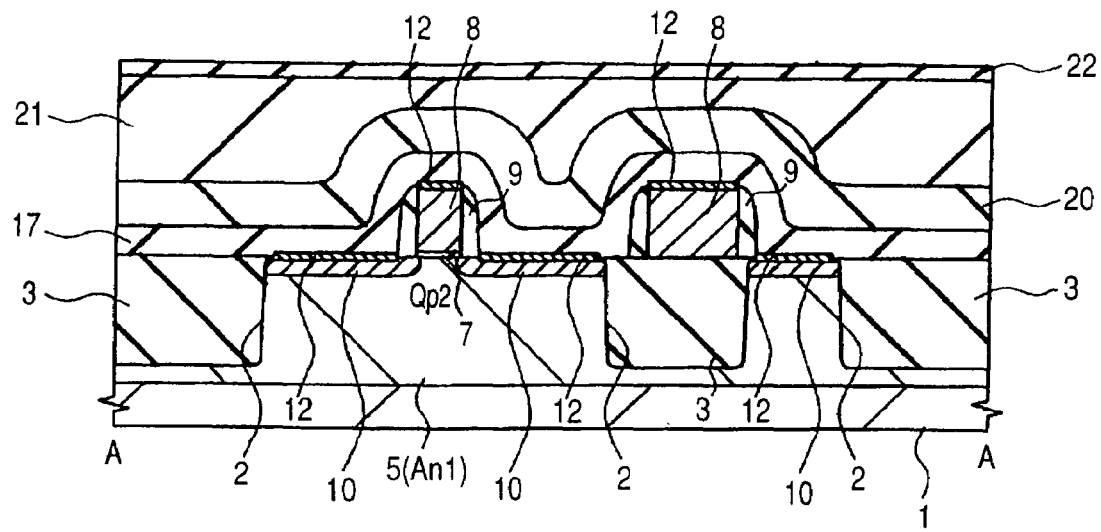
FIG. 5 is fragmentary cross-sectional view taken along line A-A in FIG. 4, showing a step in the manufacture of the SRAM according to Embodiment 1 of the present invention.

As illustrated in FIGS. 4 and 5, an element isolation 2 is formed over the main surface (element formation surface) of a semiconductor substrate (which will hereinafter simply be called a "substrate") 1. FIG. 4 is a plan view of the substrate 1 illustrating a region corresponding to about one memory cell, and FIG. 5 is a cross-sectional view taken along a line A-A of FIG. 4.

This element isolation 2 can be formed, for example, in the following manner. First, the main surface of a substrate 1 made of p type single crystal silicon and having a specific resistance of from about 1 to 10 Ωcm is etched to form a groove therein. The substrate 1 is then thermally oxidized at about 1000° C. to form a thin silicon oxide film (not illustrated) over the inside wall of the groove. This silicon oxide film is formed for the purpose of repairing damage on the inside wall of the groove caused by dry etching and, at the same time, relaxing stress appearing at the interface between the substrate 1 and the silicon oxide film to be embedded inside of the groove in the subsequent step. A silicon oxide film 3 is then deposited as an insulating film over the substrate 1 including the inside of the groove by, for example, CVD (Chemical Vapor Deposition). The silicon oxide film 3 over the groove is polished by chemical mechanical polishing (CMP) so as to leave a portion of the silicon oxide film 3 inside of the groove, whereby the element isolation 2 is formed.

After ion implantation of an impurity having a p type conductivity (for example, B (boron)) and an impurity having an n type conductivity (for example, P (phosphorus)) into the substrate 1, the substrate 1 is heat treated to diffuse these impurities in the substrate 1 to form a p type well 4 and an n type well 5 therein. At this time, active regions An1,An2,Ap1, Ap2 which are main surfaces of two p type wells 4 and 2 two n type wells 5 are formed in the substrate 1 and these active regions are surrounded by the element isolation 2.

As will be described later, of the six MISFETs (transfer MISFETs Qt1,Qt2, drive MISFETs Qd1,Qd2 and the load MISFETs Qp1,Qp2), concerning MISFETs of the n-channel type, the transfer MISFET Qt1 and drive MISFET Qd1 are formed over the active region Ap1 (p type well 3), and the transfer MISFETs Qt2 and the drive MISFET Qd2 are formed over the active region Ap1 (p type well 3). Concerning the MISFETs of the p-channel type, the load MISFET Qp2 is formed over the active region Ap1 (n type well 4), and the load MISFET Qp1 is formed over the active region An2 (n type well 4). As illustrated in FIG. 4, between the transfer MISFET Qt1 and drive MISFET Qd1, and the transfer MISFET Qt2 and drive MISFET Qd2 in the first direction, the load MISFETs Qp1,Qp2 are disposed, and the channel length of each of these MISFETs is defined by the width in the second direction crossing the first direction.

Next, after wet washing of the surface of the substrate 1 (p type well 4 and n type well 5) with, for example, a hydrofluoric acid detergent, the substrate 1 is heat treated to form, over the surface of each of the p type well 4 and n type well 5, a clean gate oxide film 7 serving as a gate insulating film.

A low resistance polycrystalline silicon film of about 100 nm thick is deposited, as a conductive film, by CVD over the substrate 1. Using a photoresist film (not illustrated) that has been patterned by photolithography as a mask, the polycrystalline silicon film is etched to form gate electrodes 8, each made of a polycrystalline silicon film. At this time, over the active region Ap1, gate electrodes 8 of the respective transfer MISFET Qt1 and the drive MISFET Qd1, which MISFETs will be formed later, are formed, while over the active region Ap2, gate electrodes 8 of the respective transfer MISFET Qt2 and the drive MISFET Qd2, which MISFETs will be formed later, are formed. Over the active region An1, a gate electrode 8 of the load MISFET Qp2, which MISFET will be formed later, is formed, and over the active region An2, a gate electrode 8 of the load MISFET Qp1, which MISFET will be formed later, is formed (refer to FIG. 6). These gate electrodes are formed to extend in a direction (first direction) perpendicular to the line A-A of FIG. 6. The gate electrode 8 is formed to be common to the load MISFET Qp1 and the drive MISFET Qd1, and to the load MISFET Qp2 and the drive MISFET Qd2.

After deposition of a silicon oxide film over the substrate 1 by CVD, the silicon oxide film is anisotropically etched by reactive ion etching (RIE) to form a sidewall spacer 9 over the sidewall of the gate electrode 8. An impurity (for example, P) having an n conductivity type is then introduced into both sides of the gate electrode 8 in the upper part of the p type well 4 to form n type semiconductor regions (source and drain, not illustrated) of the drive MISFET Qd and the transfer MISFET Qt, while an impurity (for example, B) having a p conductivity type is introduced into the upper part of the n type well 4 to form p type semiconductor regions (source and drain) 10 of the load MISFET Qp. Alternatively, an LDD (lightly doped drain) structure may be formed by forming the n type semiconductor regions and p type semiconductor regions of a low concentration prior to the formation of the sidewall spacer 9 and forming the n type semiconductor regions and p type semiconductor regions of a high concentration after the formation of the sidewall spacer 9. By the steps so far mentioned, six MISFETs (drive MISFETs Qd1,Qd2, transfer MISFETs Qt1,Qt2, and load MISFETs Qp1,Qp2) constituting the memory cell MC are completed.

After washing the surface of the substrate 1, a Co film and a Ti film are deposited successively over the substrate 1 by sputtering. The substrate 1 is then heat treated to form a $CoSi_2$ layer 12 as a silicide layer over the n type semiconductor regions, p type semiconductor regions 10 and gate electrode 8. In this Embodiment 1, a means for forming such a $CoSi_2$ layer 12 is given as an example, but instead, a refractory metal silicide layer such as $NiSi_x$ layer, $WSi_x$ layer, $MoSi_x$ layer, $TiSi_x$ layer or $TaSi_x$ layer may be formed using Ni (nickel), W (tungsten), Mo (molybdenum), Ti (titanium) or Ta (tantalum).

After removal of unreacted portions of the Co film and Ti film by etching, the substrate 1 is heat treated to lower the resistance of the $CoSi_2$ layer 12.

A silicon nitride film 17 of about 50 nm thick is then deposited over the substrate 1 by, for example, CVD. This silicon nitride film 17 plays the role of an etching stopper layer upon formation of a contact hole, which will be described later.

An interlayer insulating film, for example, PSG (Phosphor Silicate Glass) film (first insulating film) 20 is applied onto the silicon nitride film 17, followed by heat treatment to planarize the film. Over this PSG film 20, a silicon oxide film (first insulating film) 21 is deposited by plasma CVD. Alternatively, after deposition of the silicon oxide film 21 over the silicon nitride film 17 without deposition of the PSG film 20, the surface of the silicon oxide film 21 may be polished by CMP to planarize the surface. A silicon nitride film 22 is then deposited over the silicon oxide film 21 by, for example, CVD.

Figure 6:
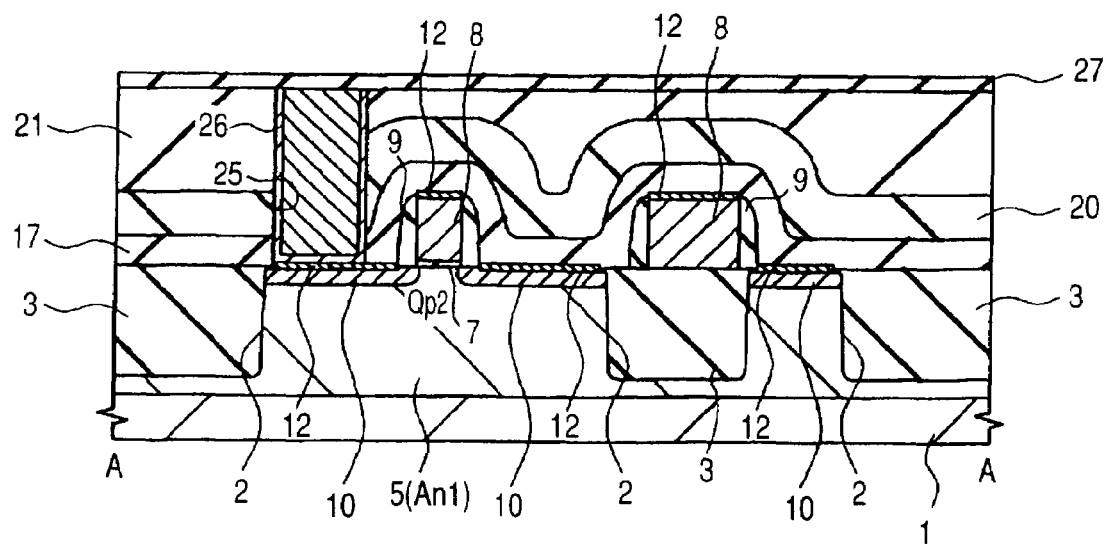
FIG. 6 is a fragmentary cross-sectional view of the SRAM during a manufacturing step following that in FIG. 5.

As illustrated in FIG. 6, by etching using a photoresist film (not illustrated) as a mask, the silicon nitride film 22 is patterned. After removal of the photoresist film, the silicon oxide film 21 and the PSG film 20 are etched successively through a mask of the silicon nitride film 22 to form an opening. The silicon nitride film 22 and the silicon nitride film 17, exposed from the bottom of the opening portion thereof, are etched to form a contact hole (third opening) 25 over n type semiconductor regions, p type semiconductor regions 10 and the gate electrode 8 of each of the transfer MISFETs Qt1,Qt2.

Over the silicon oxide film 21 including the inside of the contact hole 25, a Ti film of about 10 nm thick and a TiN film of about 50 nm thick are deposited successively as a barrier film over the silicon oxide film 21 including the inside of the contact hole 25, followed by heat treatment at 500 to 700° C. for 1 minute. A W film (third conductive film) is deposited as a conductive film over the silicon oxide film 21 and the barrier films by CVD to fill the W film in the contact hole 25. The W film, TiN film and Ti film over the silicon oxide film 21 are removed by etch back or CMP to leave the W film, TiN film and Ti film inside of the contact hole 25. By this step, a plug 26 having the TiN film and Ti film as a barrier film and the W film 26 as a main conductive layer is formed inside of the contact hole 25. A silicon nitride film 27 is deposited over the substrate 1.

Figure 7:
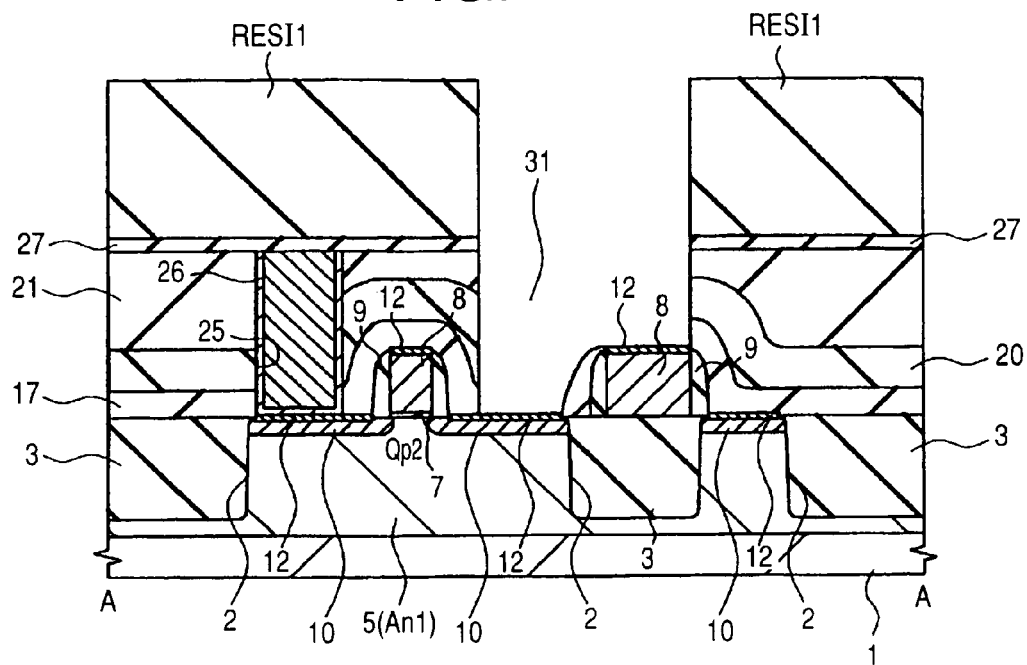
FIG. 7 is a fragmentary cross-sectional view of the SRAM during a manufacturing step following that in FIG. 6.

As illustrated in FIG. 7, using a photoresist film RESI1 as a mask, the silicon nitride film 27, silicon oxide film 21 and PSG film 20 are etched, followed by dry etching of the silicon nitride film 17 to form an interconnect groove 31 over the n type semiconductor regions and p type semiconductor regions 10. In one memory cell, two such interconnect grooves (first openings) 31 are formed. One interconnect groove 31 extends over the drain of the drive MISFET Qd1 and the drain of the load MISFET Qp1 in the first direction, turns toward the second direction, and then, extends over the gate electrode 8 of the drive MISFET Qd2. The other interconnect groove 31 extends over the drain of the drive MISFET Qd2 and the drain of the drive load MISFET Qp2 in the first direction, turns towards the second direction, and extends over the gate electrode 8 of the drive MISFET Qd1. A plan view illustrating a plane pattern of the interconnect groove 31 showing the L-shaped extension will be shown on and after FIG. 9.

Figure 8:
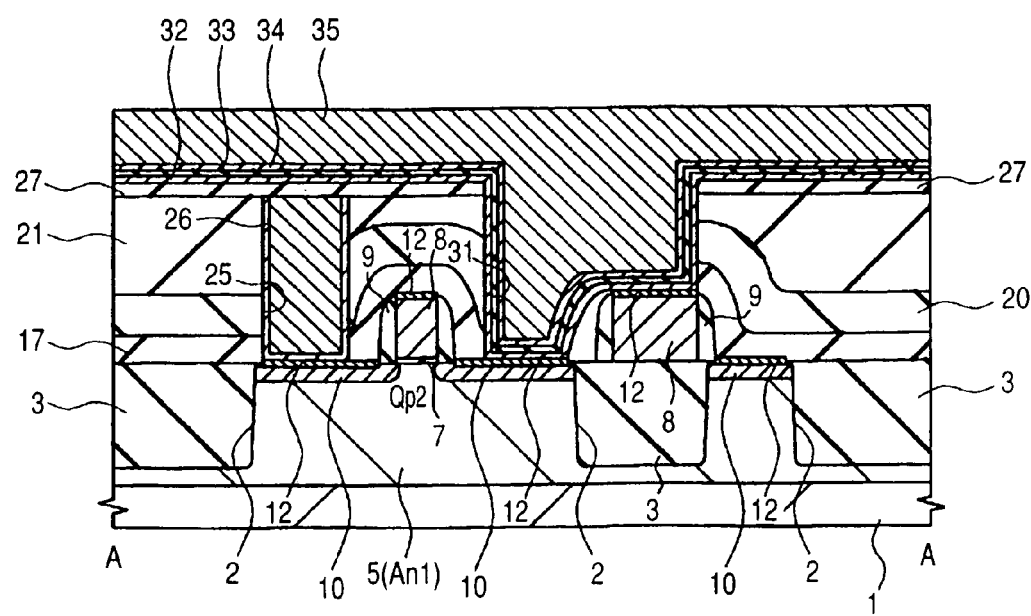
FIG. 8 is a fragmentary cross-sectional view of the SRAM during a manufacturing step following that in FIG. 7.

After removal of the photoresist film RESI1, a titanium nitride (TiN) film (first conductive film) 32 that is about 50 nm thick is deposited over the substrate 1 including the inside of the interconnect groove 31 by, for example, sputtering as illustrated in FIG. 8. A silicon nitride film (second insulating film) 33 that is about 10 to 20 nm thick is deposited over the titanium nitride (TiN) film 32 by, for example, CVD. A titanium nitride (TiN) film (second conductive film) 34 that is about 50 nm thick is then deposited over the silicon nitride film 33 by, for example, sputtering. A W film 35 is deposited over the titanium nitride (TiN) film 34 by, for example, CVD to fill the interconnect groove 31 with the titanium nitride (TiN) film 32, silicon nitride film 33 and W film 35.

Figure 9:
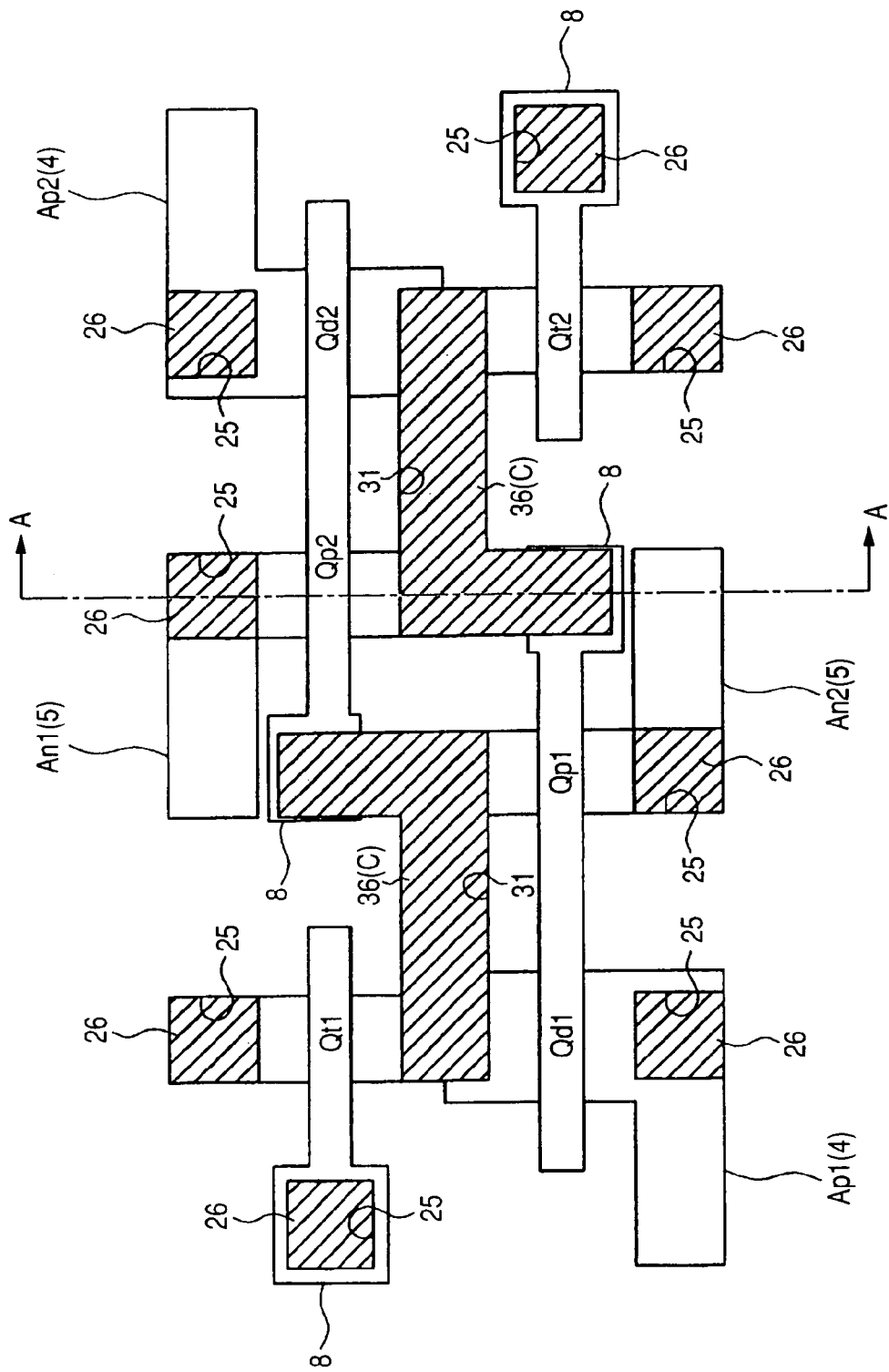
FIG. 9 is a fragmentary plan view of the SRAM according to Embodiment 1 of the present invention during its manufacture.
Figure 10:
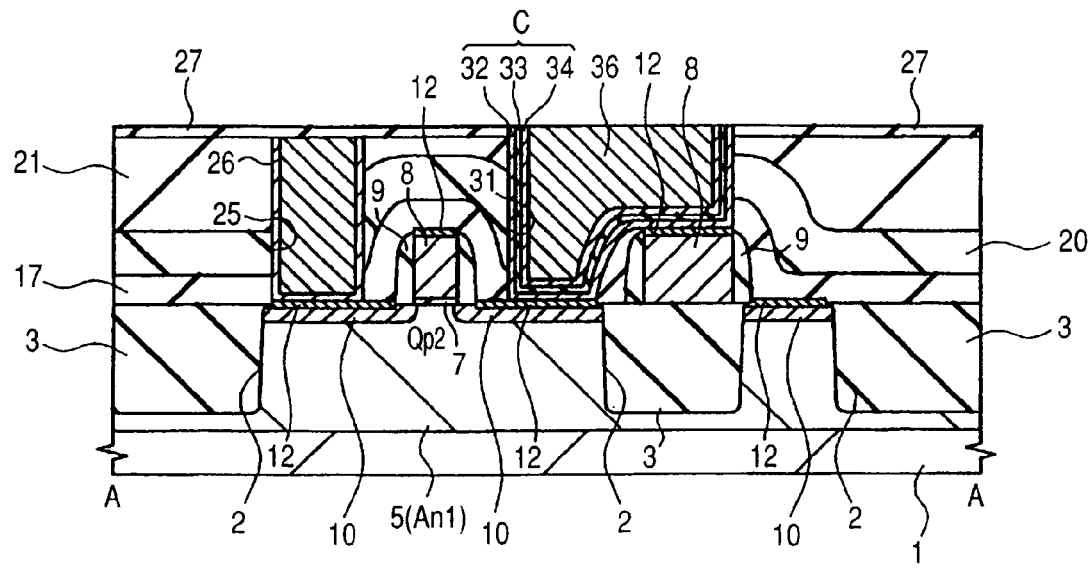
FIG. 10 is a fragmentary cross-sectional view of the SRAM during a manufacturing step following that in FIG. 8.

As illustrated in FIGS. 9 and 10, the W film 35, titanium nitride film 34, silicon nitride film 33 and titanium nitride film 32 over the silicon nitride film 27 are removed by CMP with the silicon nitride film 27 serving as a terminal point of the polishing. By this step, a capacitor element (first capacitor element) C (refer to FIGS. 1 to 3) having the titanium nitride film 32, silicon nitride film 33 and titanium nitride film 34 as a lower electrode, an insulator and an upper electrode, respectively, and an interconnect 36 made of the W film 35 can be formed in the interconnect groove 31. More specifically, the lower electrode (titanium nitride film 32) of the capacitor element C is formed all over the bottom and circumference of the interconnect groove 31, and, at the same time, it forms a capacitance, together with the upper electrode (titanium nitride film 34) of the capacitor element C via the dielectric film (silicon nitride film 33) of the capacitor element C. This enables the use of the bottom and circumference of the sidewall of the groove 31 as a capacitor element area, leading to an improvement in the capacitance.

In such a capacitor element C of Embodiment 1, the titanium nitride film 32 not only serves as a lower electrode (titanium nitride film 32) of the capacitor element C, but also can operate as an interconnect (local interconnect) for electrically connecting the gate electrode common to the drive MISFET Qd2 (or drive MISFET Qd1) and the load MISFET Qp2 (or load MISFET Qp1), the drain regions of the drive MISFET Qd1 (or drive MISFET Qd2) and the load MISFET Qp1 (or load MISFET Qp2) and the storage node A1 (or storage node B1). This brings about an improvement in the capacitance of the capacitor element C without enlarging the memory size. The titanium nitride film 34 can also operate as a barrier metal film for the interconnect 36 made of the W film 35. Via such an interconnect 36, the drain of the load MISFET Qp1 is electrically connected to the drain of the drive MISFET Qd1 and the drain of the load MISFET Qp2 is electrically connected to the drain of the drive MISFET Qd2. In FIG. 9, the plug 26 and interconnect 36 (capacitor element C) are hatched to facilitate a better understanding of the positional relationship of these members.

By forming the capacitor element C while making use of the bottom and circumference of the sidewall of the interconnect groove 31, the memory cell MC (refer to FIGS. 1 to 3) of the SRAM can be added with a capacitance for preventing a lowering of the soft error resistance due to α radiation without increasing the memory cell area of the SRAM of Embodiment 1. In other words, even if a capacitance for preventing lowering in the soft error resistance is added to the memory cell MC of the SRAM, an increase in the chip size of the memory cell MC of the SRAM of Embodiment 1, which will otherwise occur thereby, can be suppressed.

For example, the capacitance of the capacitor element C can be increased and higher soft error resistance can be realized by thickening at least one of the PSG film 20 and silicon oxide film 21, in which a groove has been formed, to enlarge the areas of the upper electrode and lower electrode of the capacitor element. Alternatively, replacement of the silicon nitride film 33 with an insulating film (for example, tantalum oxide film) having a higher specific dielectric constant than that of the silicon nitride film 33 makes it possible to increase the capacitance of the capacitor element C and realize a higher soft error resistance.

Figure 11:
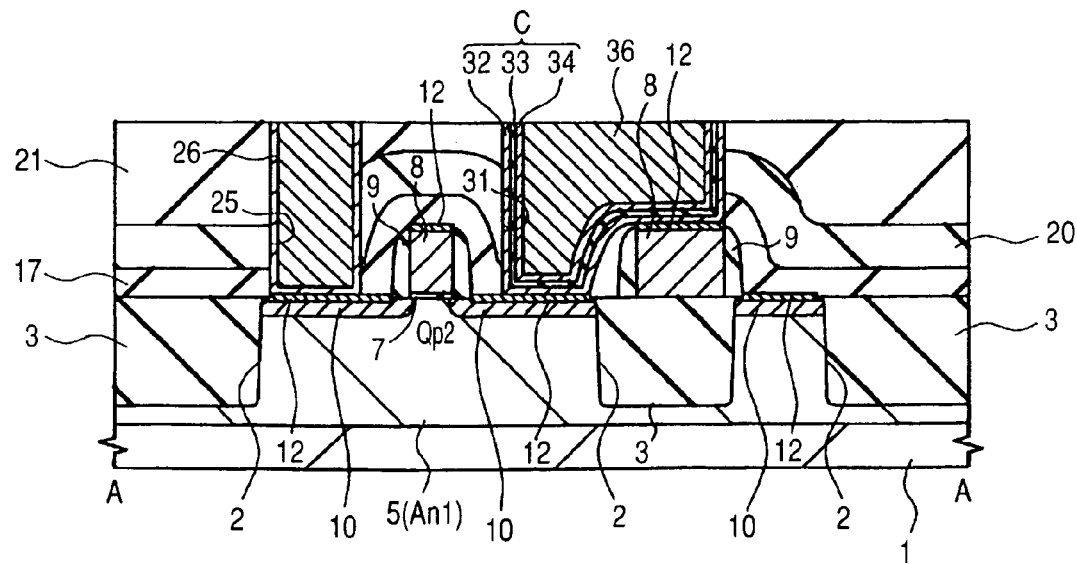
FIG. 11 is a fragmentary cross-sectional view of the SRAM during a manufacturing step following that in FIG. 10.

As illustrated in FIG. 11, the silicon nitride film 27 over the silicon oxide film 21 is then removed by, for example, CMP.

Figure 12:
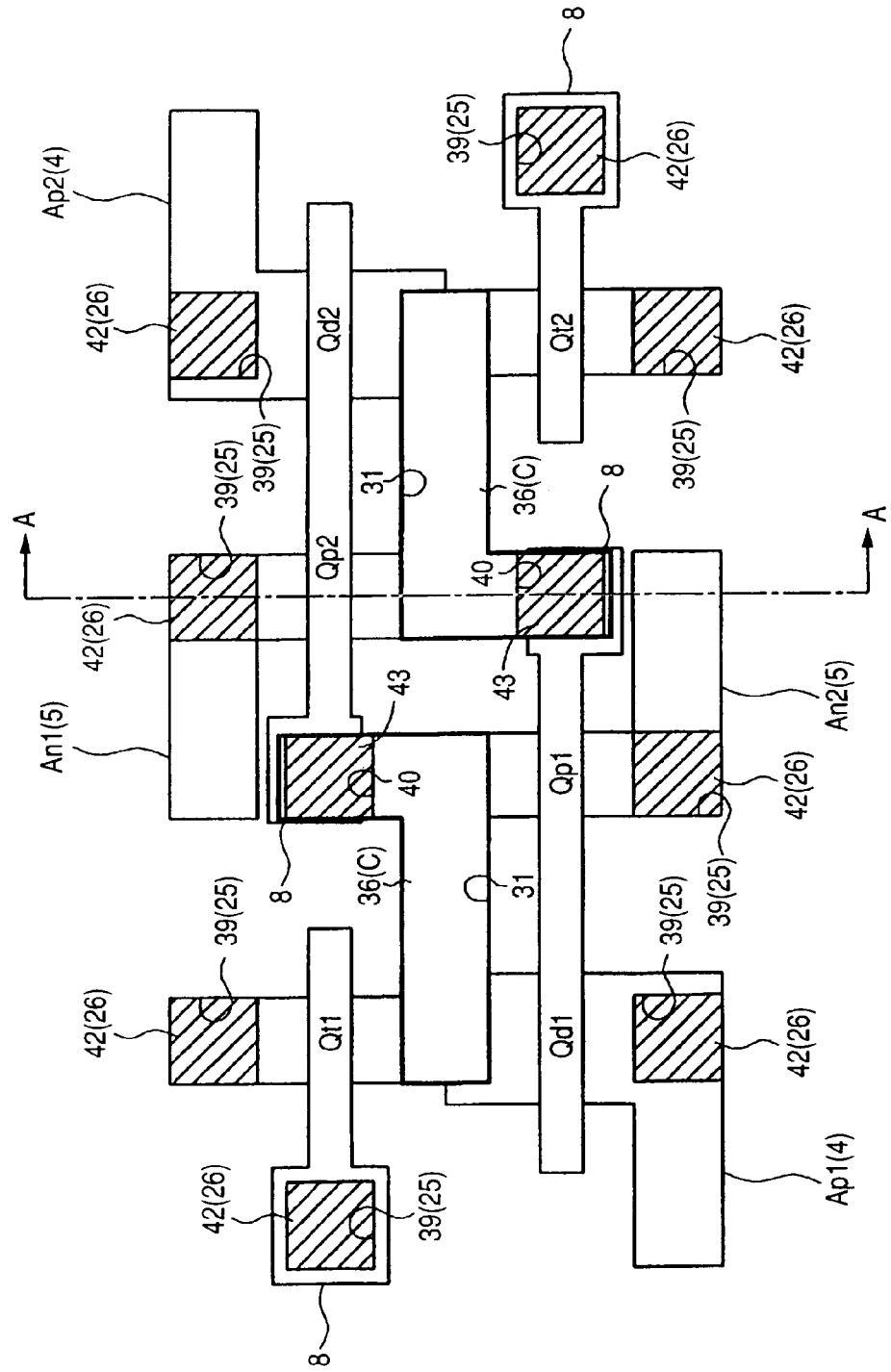
FIG. 12 is a fragmentary plan view of the SRAM according to Embodiment 1 of the present invention during its manufacture.
Figure 13:
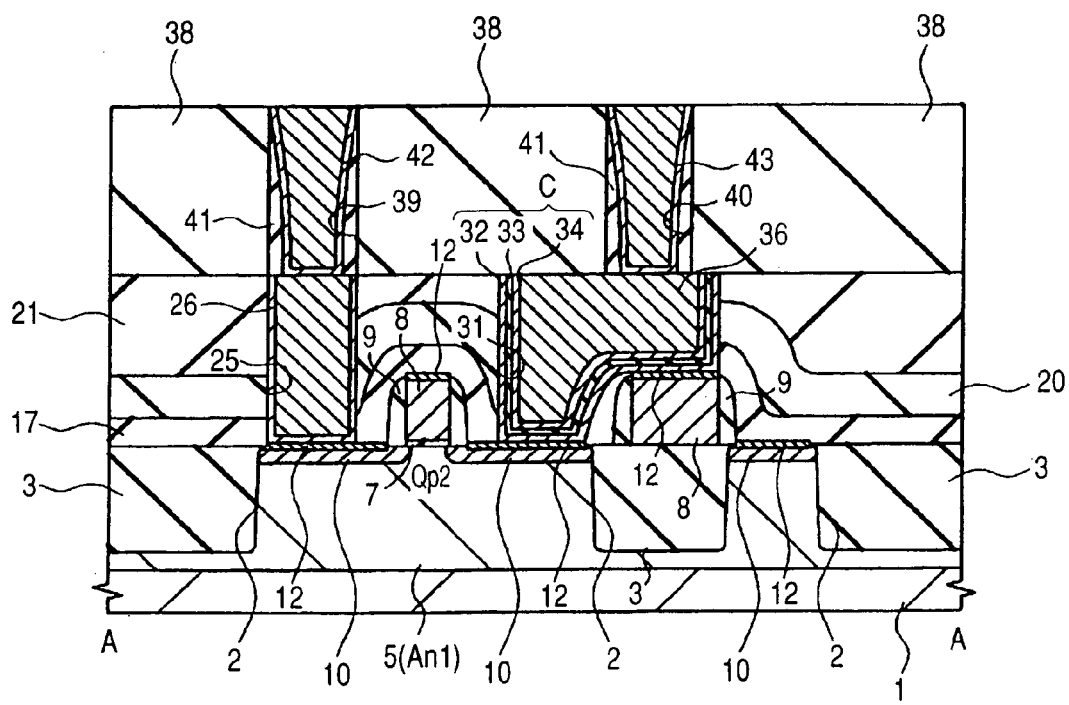
FIG. 13 is a fragmentary cross-sectional view of the SRAM during a manufacturing step following that in FIG. 11.

As illustrated in FIGS. 12 and 13, a silicon oxide film is deposited over the substrate 1 to form an interlayer insulating film 38. Using a photoresist film (not illustrated) patterned by photolithography as a mask, the interlayer insulating film 38 is etched to form a contact hole 39 reaching the plug 26 and a contact hole 40 reaching the interconnect 36. Upon formation, the opening position of the contact hole 40 is adjusted so that the capacitor element C is not exposed from the bottom of the contact hole 40.

Over the interlayer insulating film 38 including the insides of the contact holes 39 and 40, a silicon nitride film 41 is deposited. The thickness of the silicon nitride film 41 is adjusted to as to be thicker than the total thickness of the titanium nitride films 32 and 34 and silicon nitride film 33 constituting the capacitor element C. The silicon nitride film 41 is anisotropically etched to leave the silicon nitride film 41 only over the sidewalls of the contact holes 39 and 40. If the opening position of the contact hole 40 inevitably deviates in the direction over the sidewall of the interconnect groove 31 and the upper electrode and lower electrode of the capacitor element C are exposed from the bottom of the contact hole 40, there is a fear, upon formation of a plug in the contact hole 40 in the step described later, of a short circuit occurring between the upper electrode and lower electrode of the capacitor element C by the plug. In this Embodiment 1, therefore, the silicon nitride film 41 is formed over the sidewall of the contact hole 40 as described above for the purpose of preventing the occurrence of a short circuit between the upper electrode and lower electrode of the capacitor element C. In connection with this Embodiment 1, formation of the silicon nitride film 41 over the sidewall of each of the contact holes 39 and 40 offered as an example, but the silicon nitride film 41 may be replaced with a silicon oxide film. When a silicon oxide film is used, it can be left over the sidewall of each of the contact holes 39 and 40 by forming the silicon oxide film through a method that is capable of increasing the difference in the etching rate between the silicon oxide film and the interlayer insulating film 38.

Then, a TiN film that is about 10 nm thick and a TiN film that is about 50 nm thick are successively deposited as a barrier film over the interlayer insulating film 38 including the insides of the contact holes 39 and 40 by, for example, sputtering, followed by heat treatment at about from 500 to 700° C. for 1 minute. A W film is deposited as a conductive film over the barrier film and interlayer insulating film 38 by, for example, CVD to fill the contact holes 39 and 40 with the W film. Then, the Ti film, TiN film and W film over the interlayer insulating film 38 are removed to leave the Ti film, TiN film and W film in the contact holes 39 and 40, whereby plugs 42 and 43 are formed in the contact holes 39 and 40, respectively. In FIG. 12, the plugs 42 and 43 are hatched.

Figure 14:
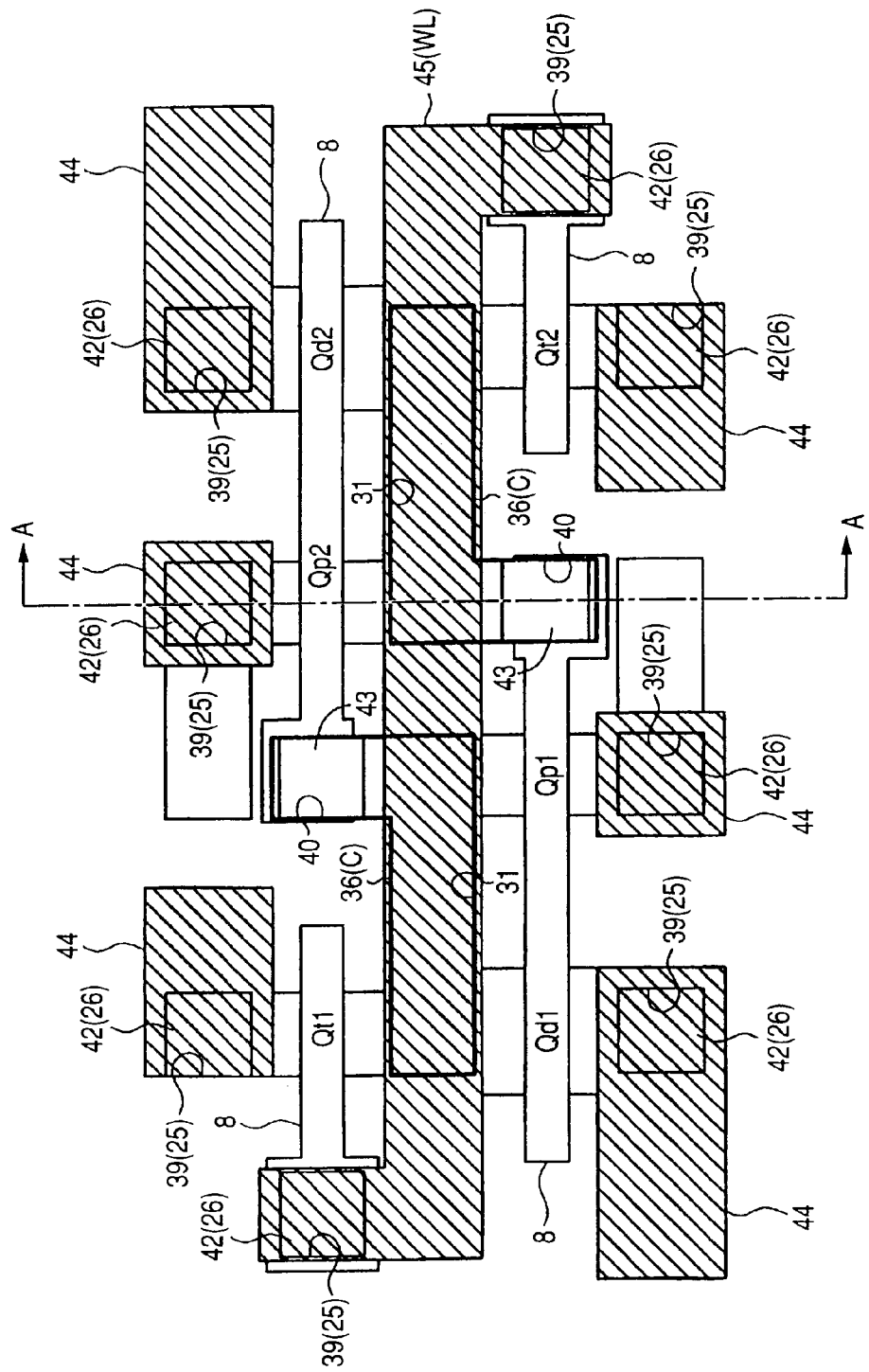
FIG. 14 is a fragmentary plan view of the SRAM during a manufacturing step following that in FIG. 12.
Figure 15:
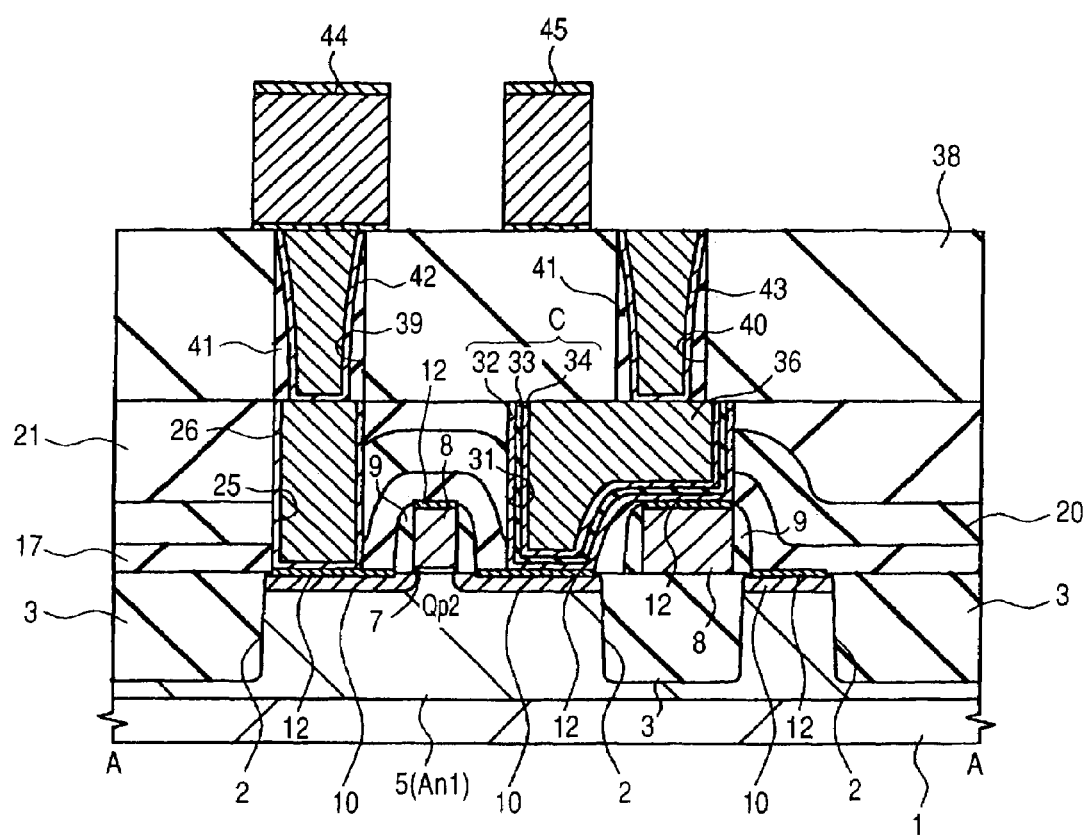
FIG. 15 is a fragmentary cross-sectional view of the SRAM during a manufacturing step following that in FIG. 13.

As illustrated in FIGS. 14 and 15, a Ti film, Al (aluminum) film and titanium nitride film are deposited in this order over the interlayer insulating film 38 successively as a conductive film. Using a photoresist film (not illustrated) patterned by photolithography as a mask, the Ti film, Al film and titanium nitride film are etched to form interconnects 44 and 45. At this time, the interconnect 44 is electrically connected, via the plugs 26 and 42, to any one of the source of each of the drive MISFETs Qd1,Qd2, the source of each of the load MISFETs Qp1,Qp2, and the source and drain of each of the transfer MISFETs Qt1,Qt2. The interconnect 45 that is electrically connected to the gate electrodes 8 of the respective transfer MISFETs Qt1,Qt2 via the plugs 26 and 42 becomes a word line WL (refer to FIGS. 1 to 3). In FIG. 14, the interconnects 44 and 45 are indicated with hatching.

Figure 16:
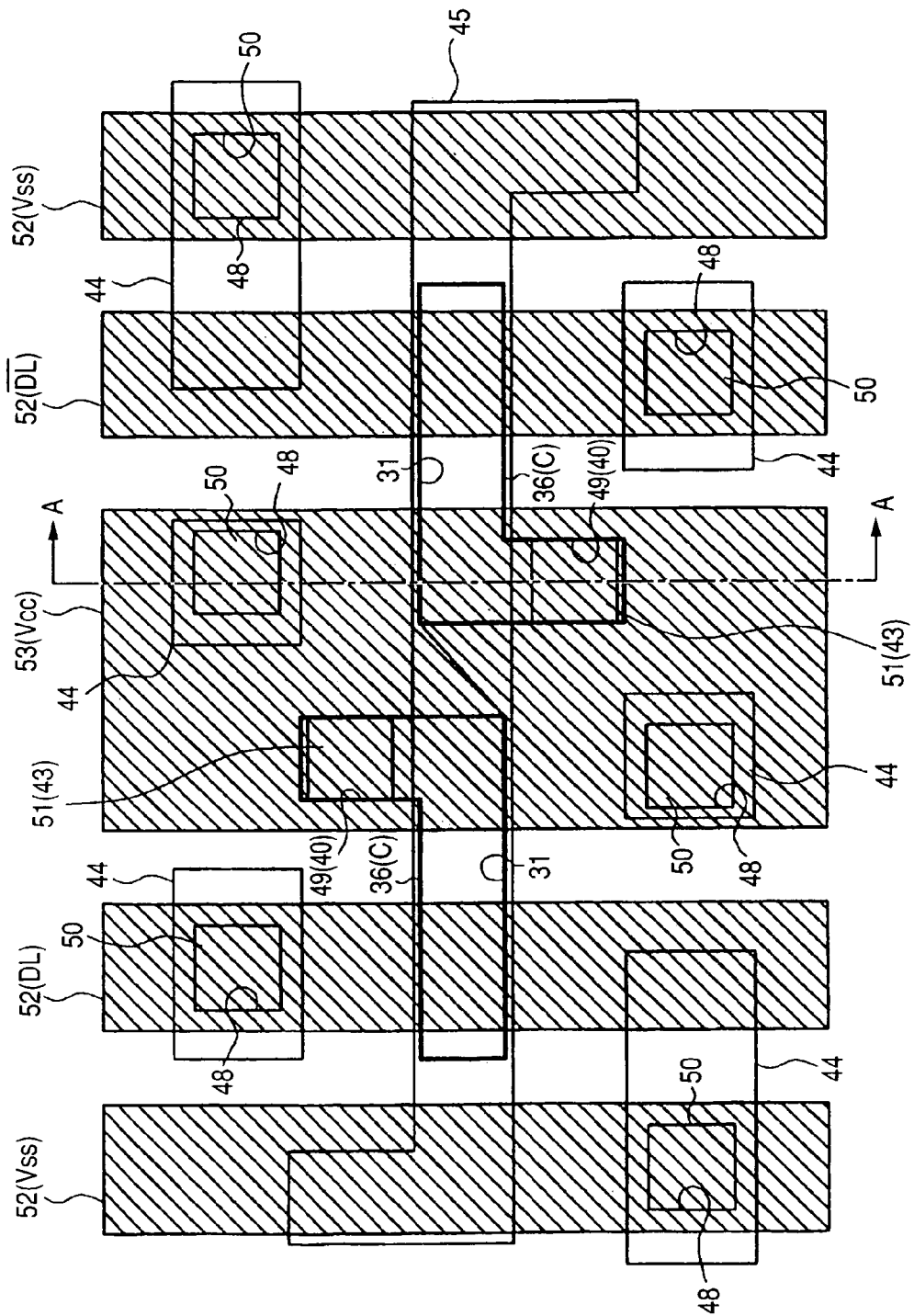
FIG. 16 is a fragmentary plan view of the SRAM during a manufacturing step following that in FIG. 14.
Figure 17:
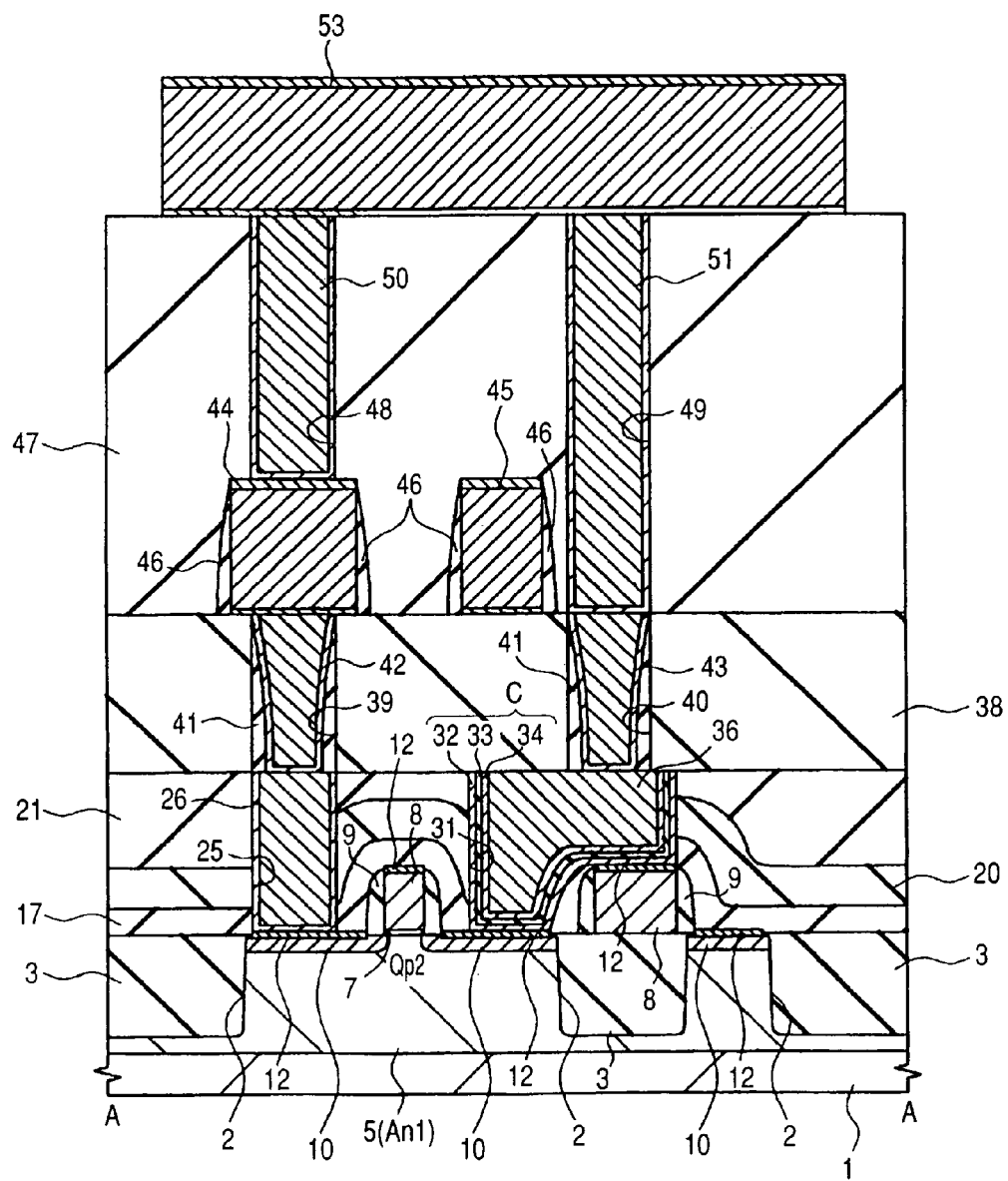
FIG. 17 is a fragmentary cross-sectional view of the SRAM during a manufacturing step following that in FIG. 15.

As illustrated in FIGS. 16 and 17, a silicon nitride film 46 is deposited over the interconnects 44 and 45 as well as over the interlayer insulating film 38. By anisotropic etching of the silicon nitride films 46, the silicon nitride film 46 is left only over the sidewalls of the interconnects 44 and 45.

Then, a silicon oxide film is deposited over the substrate 1 to form an interlayer insulating film 47. Using a photoresist film (not illustrated) patterned by photolithography, the interlayer insulating film 47 is etched to form a contact hole 48 reaching the interconnect 44 and a contact hole 49 reaching the plug 43.

When the opening position of the contact hole 49 deviates in the direction of the sidewall of the interconnect 45 and the interconnect 45 is exposed from the sidewall of the contact hole 49, there is a fear of inconvenience, such as the occurrence of a short circuit, upon formation of a plug in the contact hole 49 in the step which will be described later, between the plug and the interconnect 45. In this Embodiment 1, a silicon nitride film 46, which is a sidewall insulating film, is formed over the sidewall of the interconnect 45, as described above for the purpose of preventing exposure of the interconnect 45 from the sidewall of the contact hole 49 upon opening of the contact hole 49 by making use of a difference in the etching rate between the silicon nitride film 46 and the silicon oxide film forming the interlayer insulating film 47. This makes it possible to prevent in advance a short circuit of the interconnect 45 and the plug to be formed inside of the contact hole 49. In this Embodiment 1, the silicon nitride film 46 is formed over the sidewalls of the interconnects 44 and 45, but the silicon nitride film 46 may be replaced by a silicon oxide film. When a silicon oxide film is employed, on the other hand, it can be left over the sidewalls of the interconnects 44 and 45 by using a method that is capable of widening the difference in etching rate between the silicon oxide film and the interlayer insulating film 47. After formation of the interconnects 44 and 45 and the sidewall insulating film (silicon nitride film 46), but prior to the formation of the interlayer insulating film 47, an etching stopper layer serving as a stopper upon etching of the interlayer insulating film 47 may be deposited. The etching stopper layer is made of, for example, a silicon nitride film that is 100 nm thick or less. It facilitates control of an over etch amount during the formation of the contact holes 48 and 49. It is needless to say that in the below-described modification example or another embodiment, such an etching stopper layer may be disposed prior to the formation of the interlayer insulating film, such as the interlayer insulating film 47.

Plugs 50 and 51 are then formed in the contact holes 48 and 49. These plugs 50 and 51 can be formed, for example, in a similar step to that employed for the formation of the above-described plugs 42 and 43.

Over the interlayer insulating film 47, an interconnect 52 to be connected to the plug 50 and an interconnect 53 to be connected to the plug 50 and the plug 51 are formed to complete the SRAM of this Embodiment 1. These interconnects 52 and 53 can be formed, for example, in a similar step to that employed for the formation of the interconnects 44 and 45. By repeating steps similar to those employed for the formation of the interlayer insulating film 47, plugs 50 and 51 and interconnects 52 and 53, a multilayer interconnect may be formed. In FIG. 16, the interconnects 52 and 53 are hatched.

By the interconnect 52, a reference voltage Vss is fed to the source of each of the drive MISFETs Qd1,Qd2, while by the interconnect 53, a supply voltage Vcc is fed to the source of each of the load MISFETs Qp1,Qp2. By the interconnect 53, a supply voltage Vcc is fed to the upper electrode (titanium nitride film 34 (refer to FIG. 10)) of the capacitor element C. The lower electrode (titanium nitride film 32 (refer to FIG. 10)) of the capacitor element C is electrically connected to the drain of each of the drive MISFETs Qd1,Qd2 and the drain of each of the load MISFETs Qp1,Qp2. As a result, the capacitor element C can be a capacitor element that is electrically connected between the storage anodes A1,B1 and the supply voltage Vcc. Interconnects 52 that is electrically connected to the source and drain of the transfer MISFETs Qt1,Qt2 serve as data lines DL,/DL, respectively. This makes it possible to realize the circuit as illustrated in FIG. 1.

A method of formation of the capacitor element C, to be electrically connected between the storage node A1 and the storage node B1, as illustrated in FIG. 3, will be described.

Figure 18:
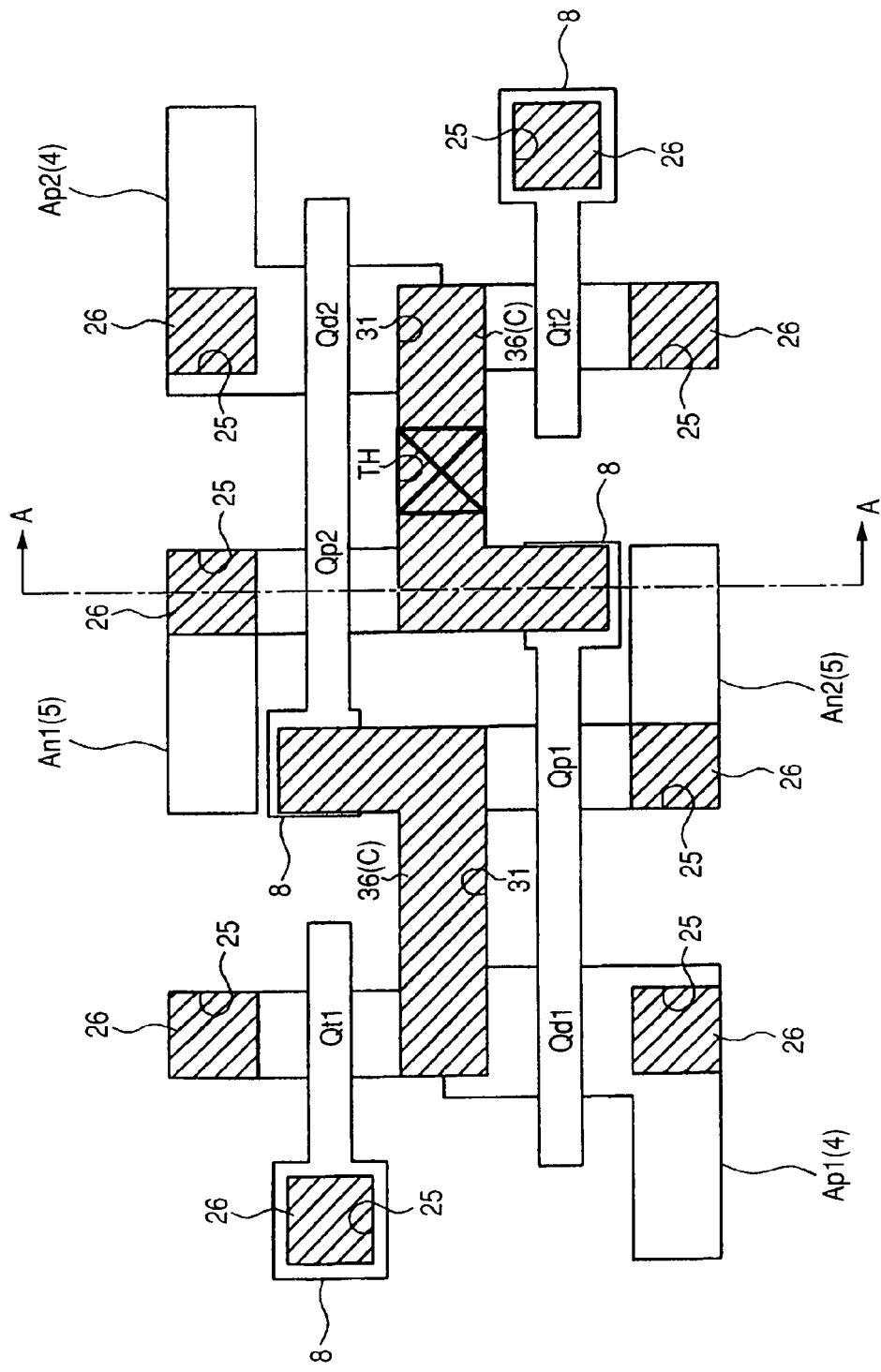
FIG. 18 is a fragmentary plan view of another SRAM according to Embodiment 1 of the present invention during its manufacture.
Figure 19:
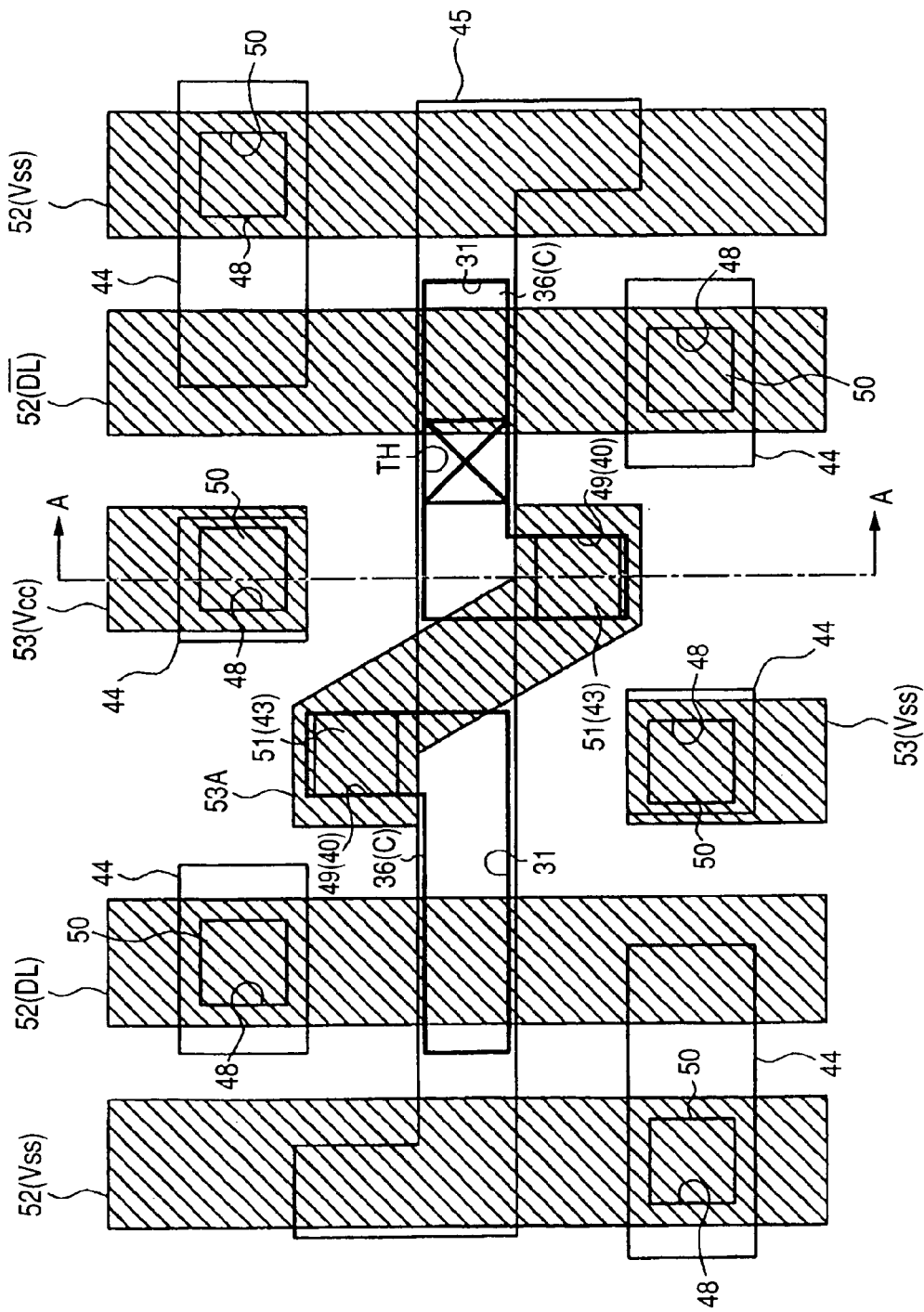
FIG. 19 is a fragmentary plan view of the another SRAM according to Embodiment 1 of the present invention during its manufacture.
Figure 20:
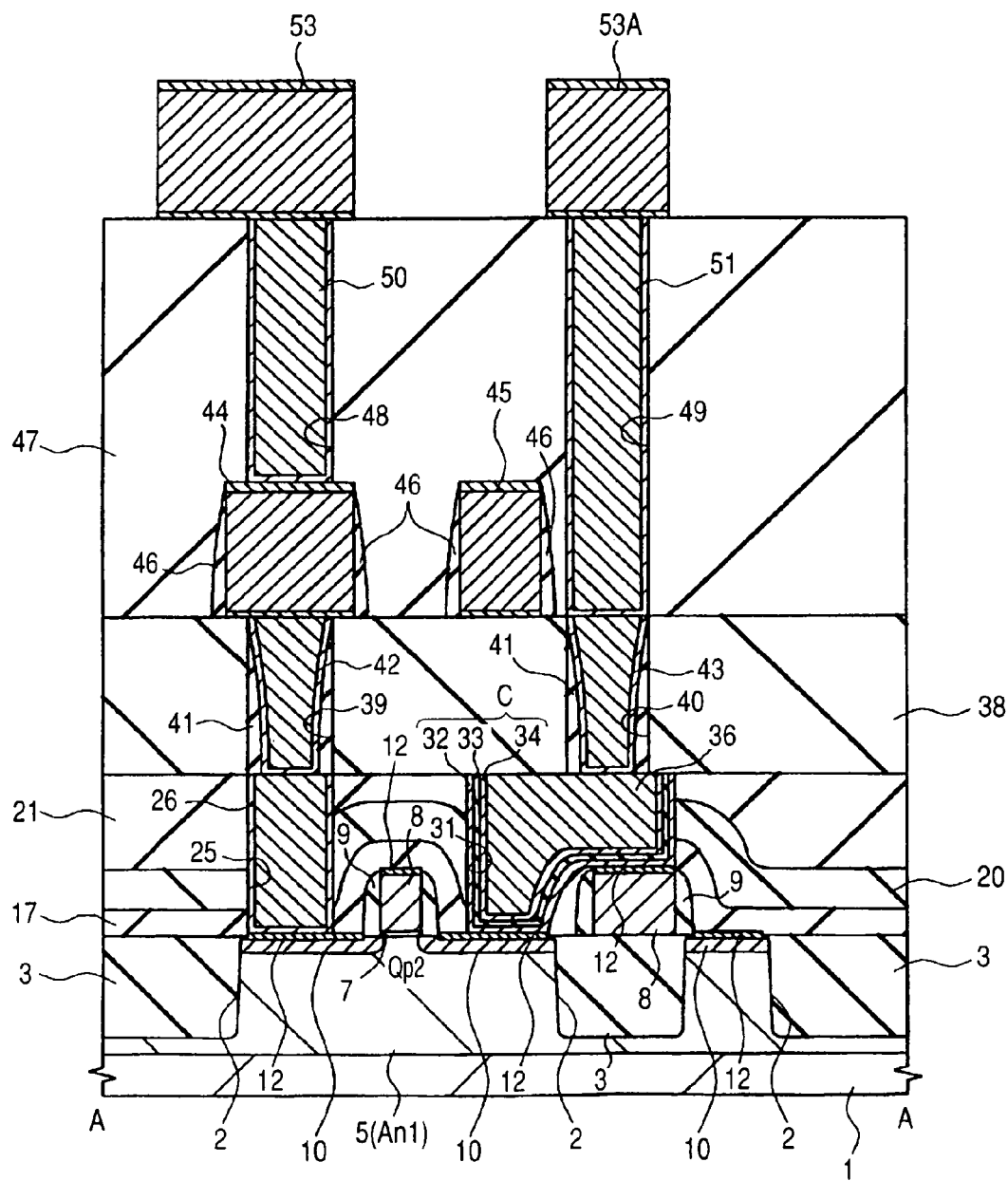
FIG. 20 is a fragmentary cross-sectional view of the another SRAM according to Embodiment 1 of the present invention during its manufacture.

The steps of this method up to the deposition of the titanium nitride (TiN) film (first conductive film) 32 and silicon nitride film (second insulating film) 33, as illustrated in FIG. 8, are similar to those employed above. Prior to the deposition of a titanium nitride film 34, the silicon nitride film 33 is etched in one of the two interconnect grooves 31, and in the silicon nitride film 33, a through-hole TH reaching the titanium nitride film 32, which will be the lower electrode of a capacitor element C, is formed. When the titanium nitride film 34 to be the upper electrode of the capacitor element C is formed in the presence of such a through-hole TH, the titanium nitride film 34 reaches the underlying titanium nitride film 32 through the through-hole TH in one of the two interconnect grooves 31 to electrically connect the titanium nitride film 32 and the titanium nitride film 34. The subsequent steps are essentially similar to the above-described ones, except that, as illustrated in FIGS. 19 and 20, the plane patterns of the interconnects 52 and 53 are different from that illustrated in FIG. 16. More specifically, the interconnect 53 (Vcc), which is electrically connected to the plug 50 and feeds a supply voltage Vcc to the source of each of the load MISFETs Qp1, Qp2, is disposed as an interconnect that is different from an interconnect 53A for electrically connecting two plugs 51 and the upper electrode 34 of the capacitor element C. By the interconnect 53A, two upper electrodes (titanium nitride films 34) formed in two respective interconnect grooves 31 are electrically connected via the plugs 51, and in the other one of the two interconnect grooves 31, the capacitor element C is formed. FIG. 18 illustrates an example in which the lower electrode (titanium nitride film 32) of the capacitor element C is electrically connected to the storage node B1 and the upper electrode (titanium nitride film 34) of the capacitor element C is electrically connected to the storage node A1. In one of the two interconnect grooves 31, the lower electrode (titanium nitride film 32) of the capacitor element C is electrically connected to the storage node A1 (or storage node B1) and the upper electrode (titanium nitride film 34) is electrically connected to the storage node B1 (or storage node A1) so that the capacitor element C can be formed over the bottom and circumference of the sidewall of the interconnect groove 31. This makes it possible to constitute the capacitor element C as a capacitor that is electrically connected between the storage node A1 and storage node B1. In short, the circuit as illustrated in FIG. 3 can be realized.

Although not illustrated, an interconnect is formed for electrically connecting the interconnect 53 (Vcc) to an interconnect layer formed over the interconnects 52 and 53 via an interlayer insulating film and for feeding the memory cell MC with a supply voltage Vcc, for example.

The method of formation of the capacitor element C to be electrically connected between the storage node A1 and storage node B1 is not limited to the above-described one. The capacitor element C can be formed between the storage node A1 and storage node B1 without disposing the through-hole TH illustrated in FIG. 18. In this case, one of the electrodes of the capacitor element C is made of a lower electrode (titanium nitride film 32) formed in one of the interconnect grooves 31, while the other electrode is made of a lower electrode (titanium nitride film 32) formed in the other interconnect groove 31. Between these electrodes (titanium nitride films 21) of the capacitor element C, a floating electrode (titanium nitride film 34) is formed via a dielectric film (silicon nitride film 33). The capacitance of the capacitor element becomes smaller compared with that of the above-described capacitor element between the storage nodes A1 and B1, but the number of manufacturing steps can be reduced.

Embodiment 2

A manufacturing method according to Embodiment 2 will be described next with reference to FIGS. 21 to 28. In this Embodiment 2, some plan views are hatched to facilitate a better understanding of the manufacturing steps used in the fabrication of the SRAM according to Embodiment 2.

The manufacturing method of Embodiment 2 is similar to that of Embodiment 1 in the manufacturing steps as illustrated in FIGS. 4 to 7.

Figure 21:
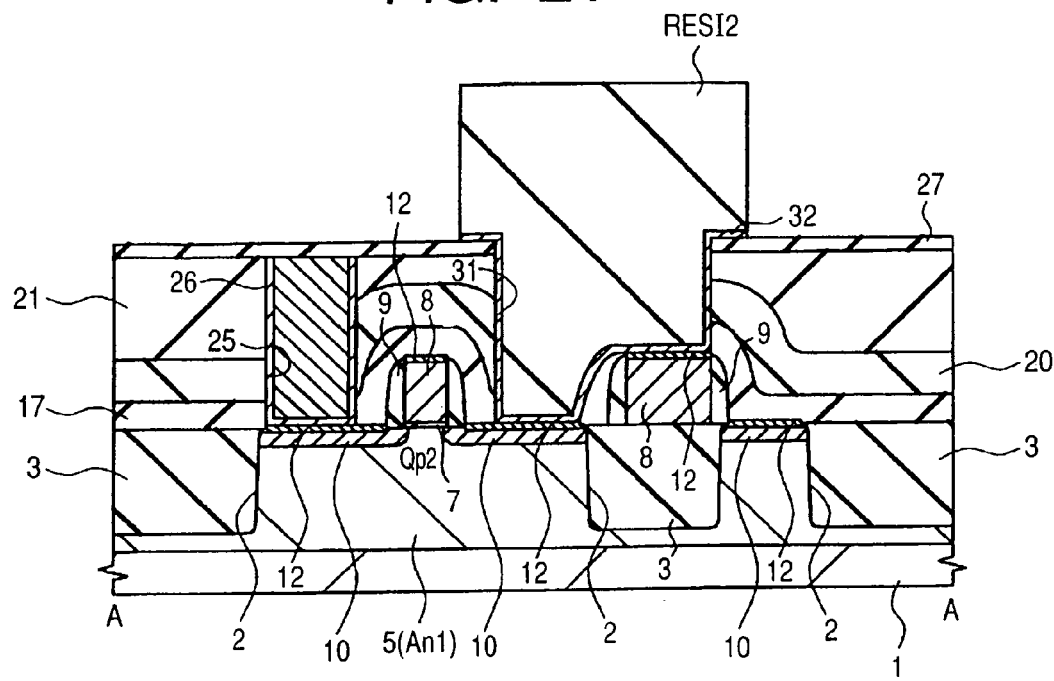
FIG. 21 is a fragmentary cross-sectional view showing a step in the manufacture of an SRAM according to Embodiment 2 of the present invention.
Figure 22:
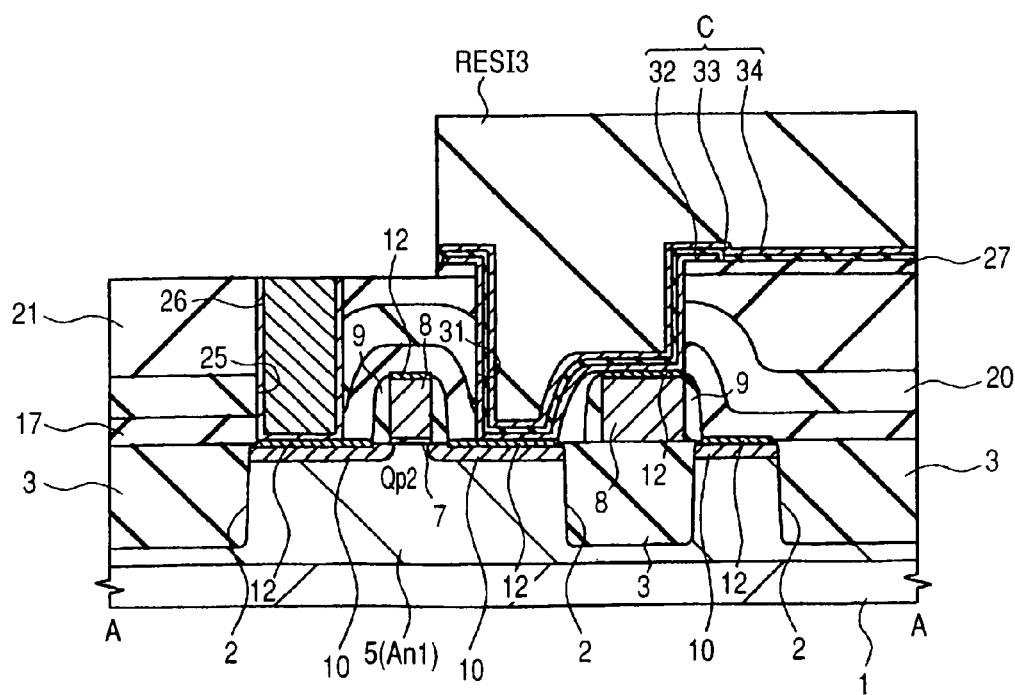
FIG. 22 is a fragmentary cross-sectional view of the SRAM during a manufacturing step following that in FIG. 21.

Then, as illustrated in FIG. 21, a titanium nitride film 32 similar to the titanium nitride film 32 (refer to FIG. 8) of Embodiment 1 is deposited over the substrate 1 including the inside of the interconnect groove 31. By etching using a photoresist film RESI2 patterned by photolithography as a mask, the titanium nitride film 32 over the silicon nitride film 27 is removed, while leaving a predetermined amount of it, and the titanium nitride film 32 (lower electrode of the capacitor element C) is left inside of the interconnect groove 31.

After removal of the photoresist film RESI2, a silicon nitride film 33 similar to the silicon nitride film 33 (refer to FIG. 8) of Embodiment 1, and a titanium nitride film 34 similar to the titanium nitride film 34 (refer to FIG. 8) are successively deposited over the substrate 1 including the inside of the interconnect groove 31. By etching using a photoresist film RESI3 patterned by photolithography as a mask, the silicon nitride film 33 which is to serve as an insulator (dielectric film) of the capacitor element C, and the titanium nitride film 34 (upper electrode of the capacitor element C) are patterned. By the steps so far mentioned, the capacitor element C having the titanium nitride film 32 as a lower electrode, the silicon nitride film 33 as an insulator and the titanium nitride film 34 as an upper electrode can be formed. This patterning is carried out in such a manner as to cover the titanium nitride film 32 (lower electrode) with the silicon nitride film 33 and cause the silicon nitride film 33 and the titanium nitride film 34 (upper electrode) to extend longer than the underlying titanium nitride film 32 on one side (in FIG. 22, a side opposite to the side on which the plug 26 is formed) over the silicon nitride film 27. The reason for this will be described later.

In this embodiment, similar to the above-described Embodiment 1, the lower electrode (titanium nitride film 32) of the capacitor element C is formed over the bottom and circumference of the sidewall of the interconnect groove 31, and, at the same time, over the bottom and circumference of the sidewall of the interconnect groove 31, it forms a capacitance, together with the upper electrode (titanium nitride film 34) of the capacitor element C via the dielectric film (silicon nitride film 33) of the capacitor element C. This makes it possible to use the bottom and circumference of the sidewall of the interconnect groove 31 as a capacitance area, leading to an improvement in capacitance.

Figure 23:
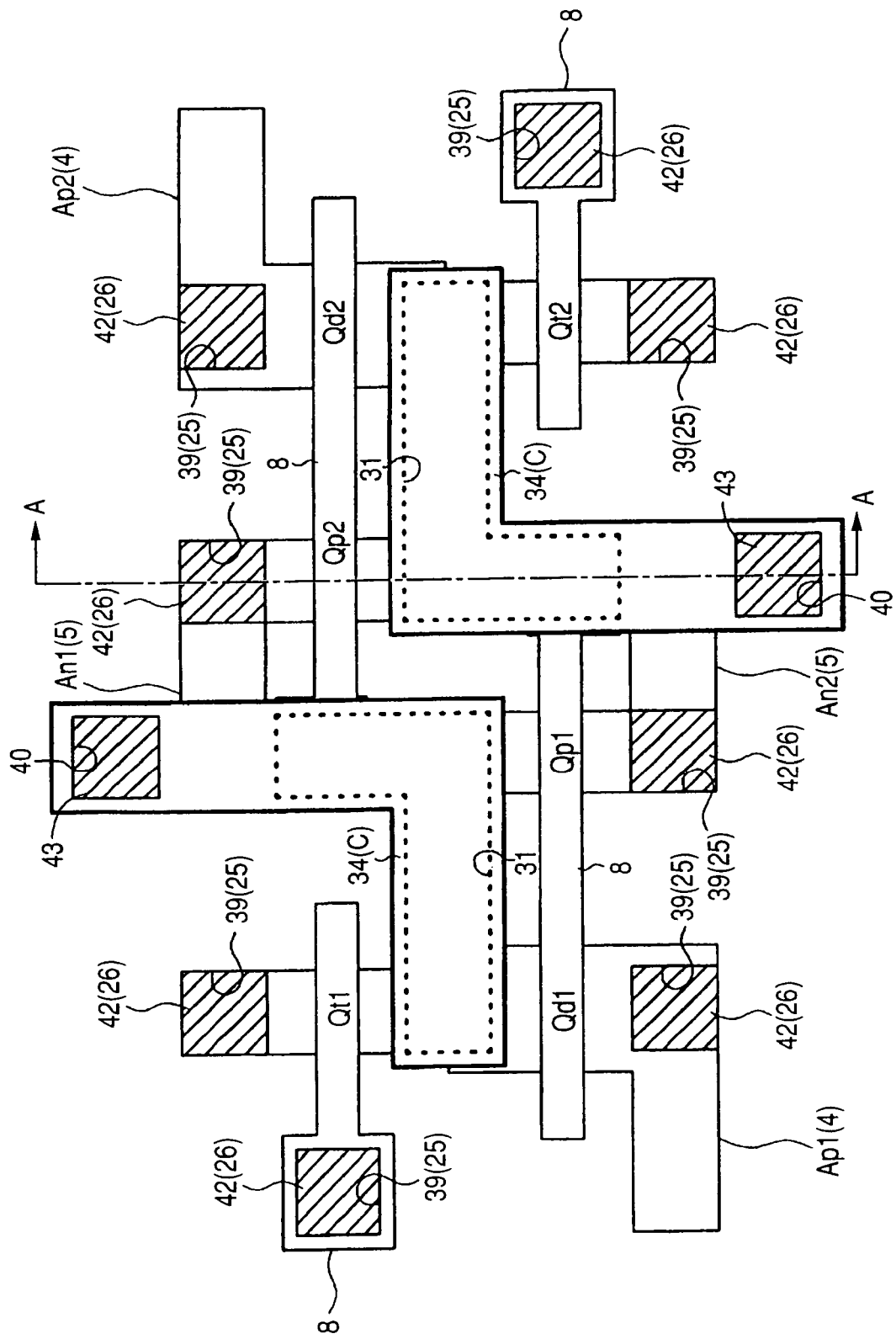
FIG. 23 is a fragmentary plan view of the SRAM according to Embodiment 2 of the present invention during its manufacture.
Figure 24:
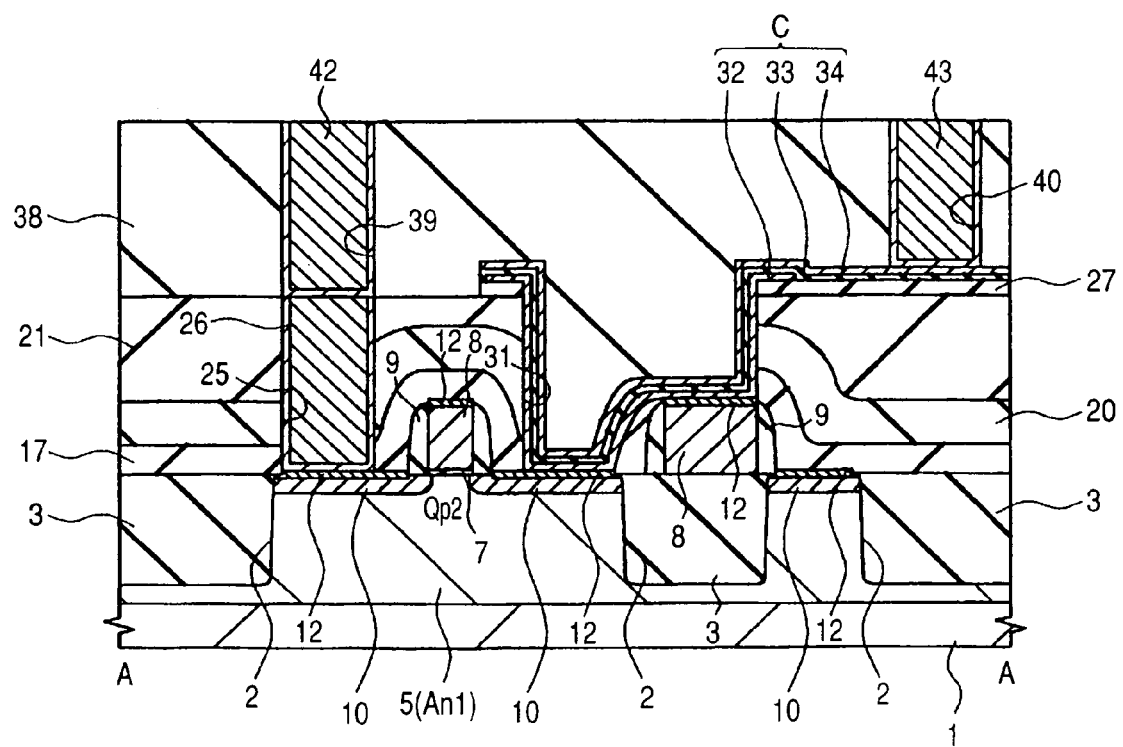
FIG. 24 is a fragmentary cross-sectional view of the SRAM during a manufacturing step following that in FIG. 22.

After removal of the photoresist film RESI3, a silicon oxide film to be filled in the interconnect groove 31 is deposited over the substrate 1, as illustrated in FIGS. 23 and 24, to form an interlayer insulating film (fourth insulating film) 38. Using a photoresist film (not illustrated) patterned by photolithography as a mask, the interlayer insulating film 38 is etched to form a contact hole 39 reaching the plug 26 and a contact hole (connecting hole) 40 reaching the titanium nitride film 34, which serves as an upper electrode of the capacitor element C, over the silicon nitride film 27.

In the contact holes 39 and 40, plugs (conductive layers) 42 and 43 similar to the plugs 42 and 43 (refer to FIGS. 12 and 13) of Embodiment 1 are formed. In FIG. 23, the plugs 42 and 43 are hatched.

As described above, since the silicon nitride film 33 and titanium nitride film 34 are patterned so that the silicon nitride film 33 covers the titanium nitride film 32, and on the silicon nitride film 27, the silicon nitride film 33 and titanium nitride film 34 extend longer than the underlying titanium nitride film 32 on one side of the interconnect groove 31, the contact hole 40 does not reach the titanium nitride film 32, making it possible to prevent occurrence of an inconvenience, such as a short circuit between the upper electrode and lower electrode of the capacitor element by the plug 43. In addition, since the silicon nitride film 33 and titanium nitride film 34 are patterned to extend over the silicon nitride film 27, and the contact hole 40 is made over the titanium nitride film 27, a margin appears at the opening position of the contact hole 40 in the plane. By this, a deviation of the opening position of the contact hole 40 from a predetermined position can be avoided, which makes it possible to prevent the contact hole 40 from reaching the gate electrode 8 below the interconnect groove 31, thereby preventing the occurrence of an inconvenience, such a as short circuit between the plug 43 and gate electrode 8.

Figure 25:
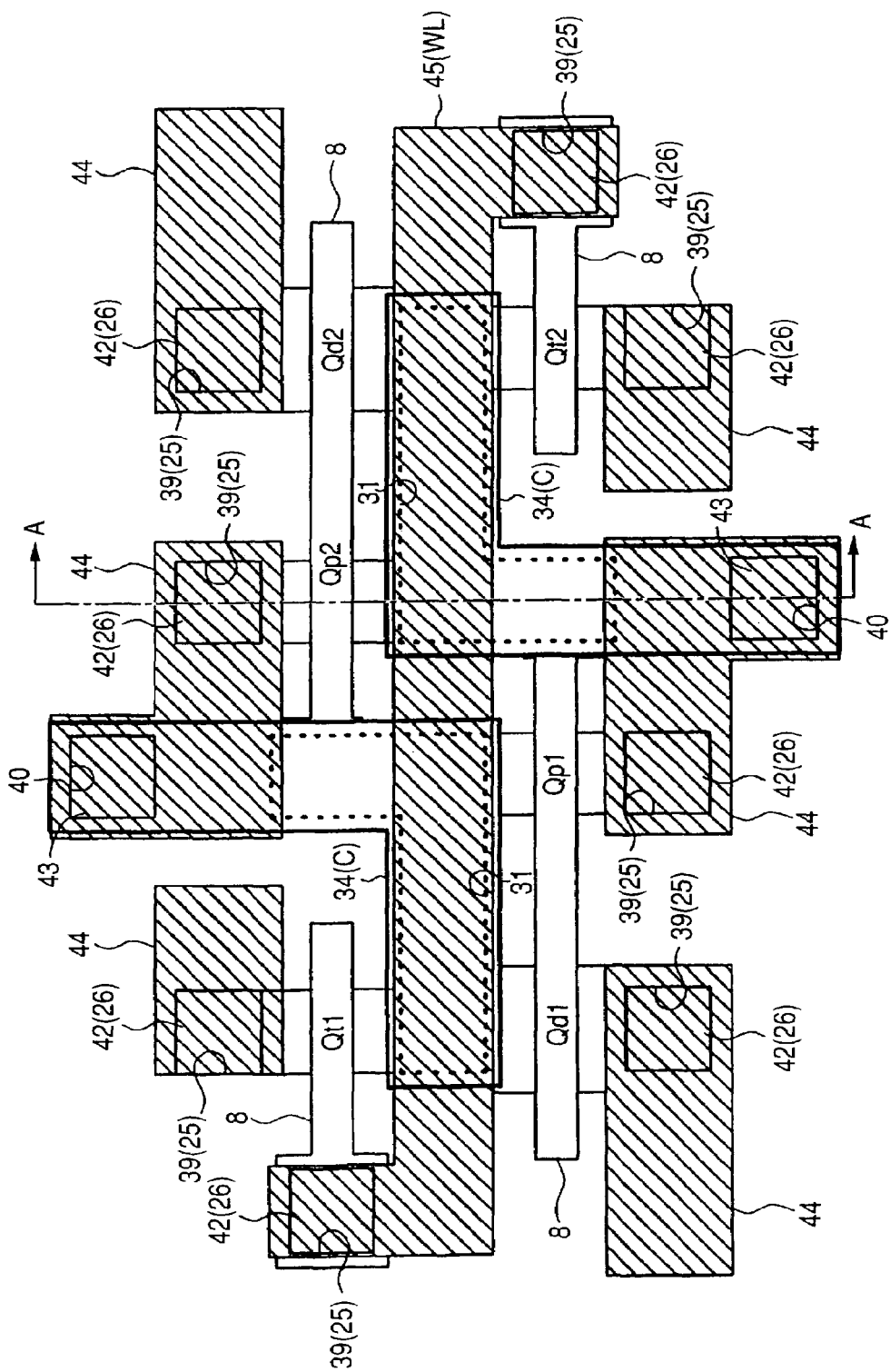
FIG. 25 is a fragmentary plan view of the SRAM during a manufacturing step following that in FIG. 23.
Figure 26:
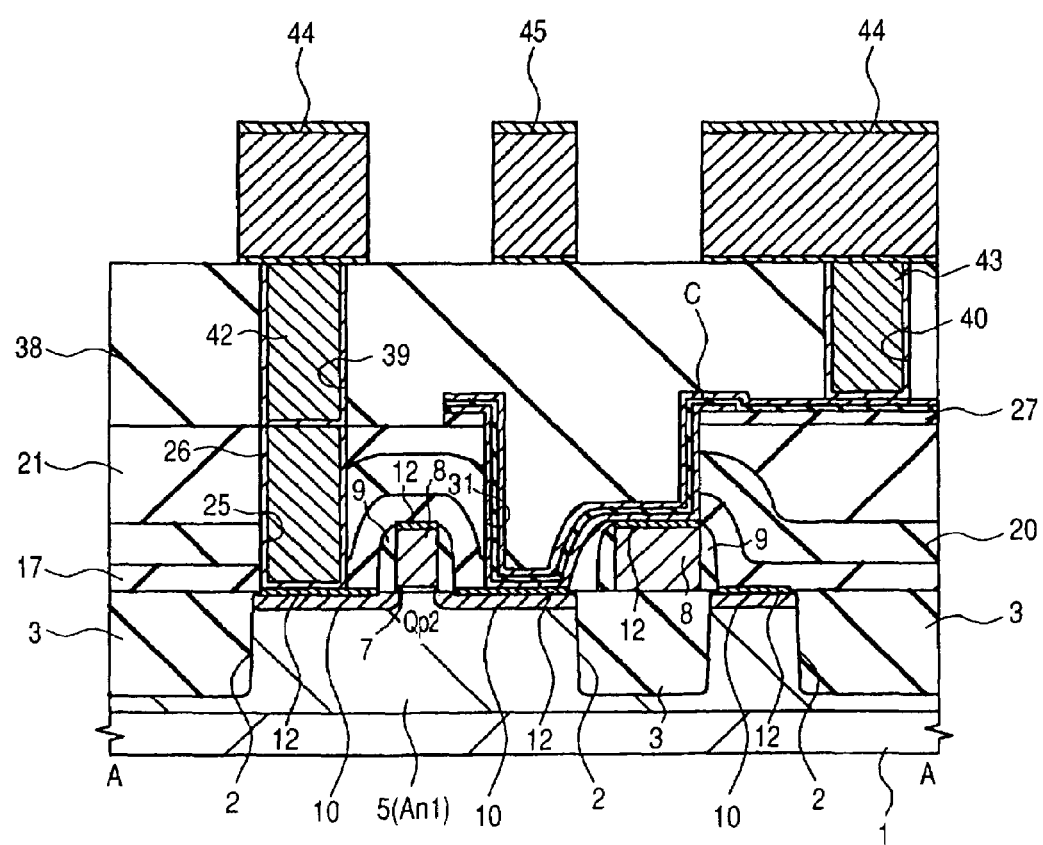
FIG. 26 is a fragmentary cross-sectional view of the SRAM during a manufacturing step following that in FIG. 24.

As illustrated in FIGS. 25 and 26, a Ti film, Al film and titanium nitride film are deposited successively in the order of mention over the interlayer insulating film 38. With a photoresist film (not illustrated) patterned by photolithography as a mask, the Ti film, Al film and titanium nitride film are etched to form interconnects 44 and 45. At this time, the interconnect 44 is electrically connected to any one of the source of each of the drive MISFETs Qd1,Qd2, the source of each of the load MISFETs Qp1,Qp2 and the source and drain of each of the transfer MISFETs Qt1,Qt2 via the plugs 26 and 42. Some of the interconnects 44 are electrically connected to the upper electrode (titanium nitride film 34) of the capacitor element C via the plug 43. The interconnect 45 which electrically connects the gate electrodes 8 of the transfer MISFETs Qt1,Qt2 via the plugs 26 and 42 serves as a word line WL (refer to FIGS. 1 to 3). In FIG. 25, the interconnects 44 and 45 are hatched.

Figure 27:
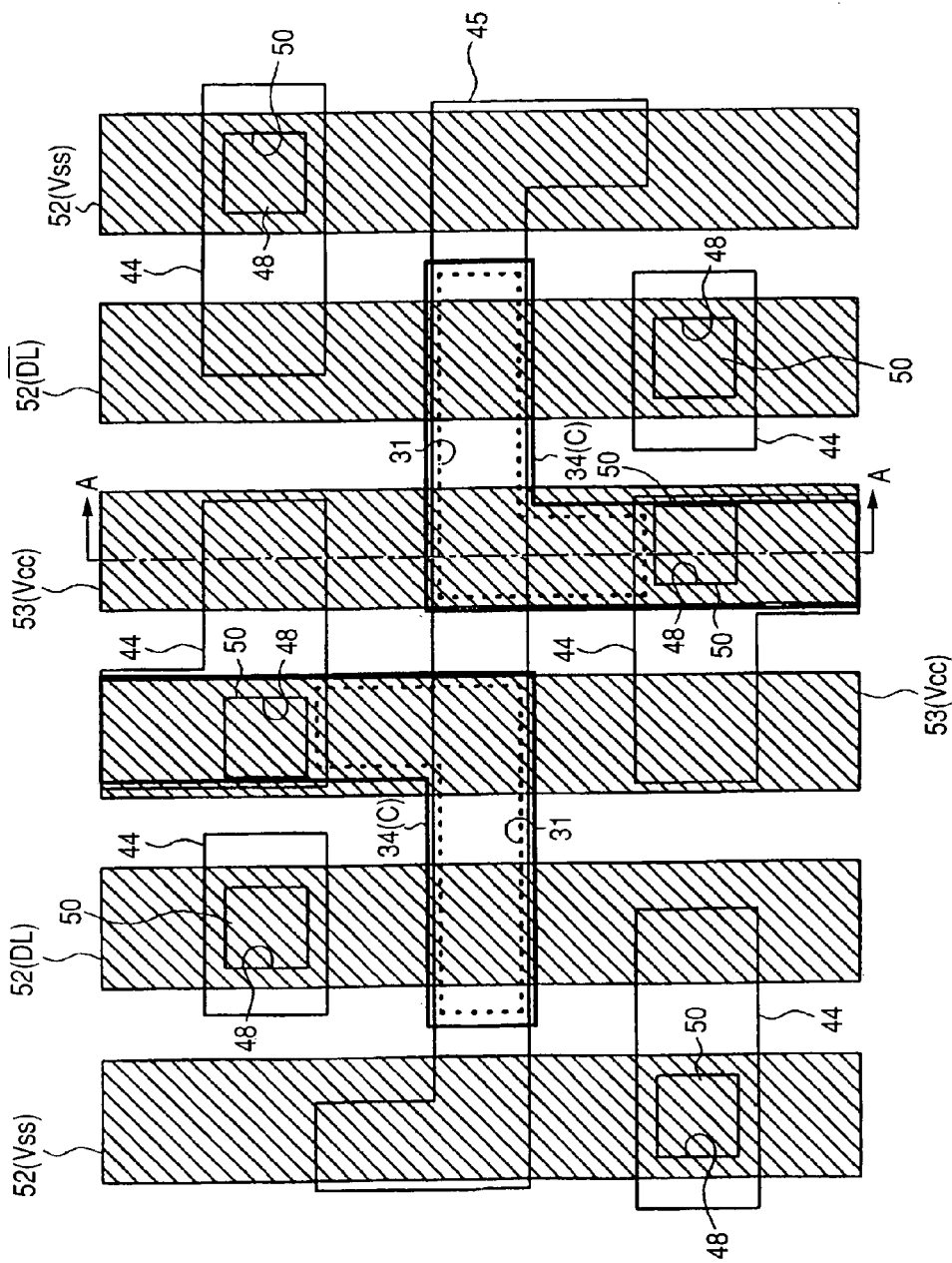
FIG. 27 is a fragmentary plan view of the SRAM during a manufacturing step following that in FIG. 25.
Figure 28:
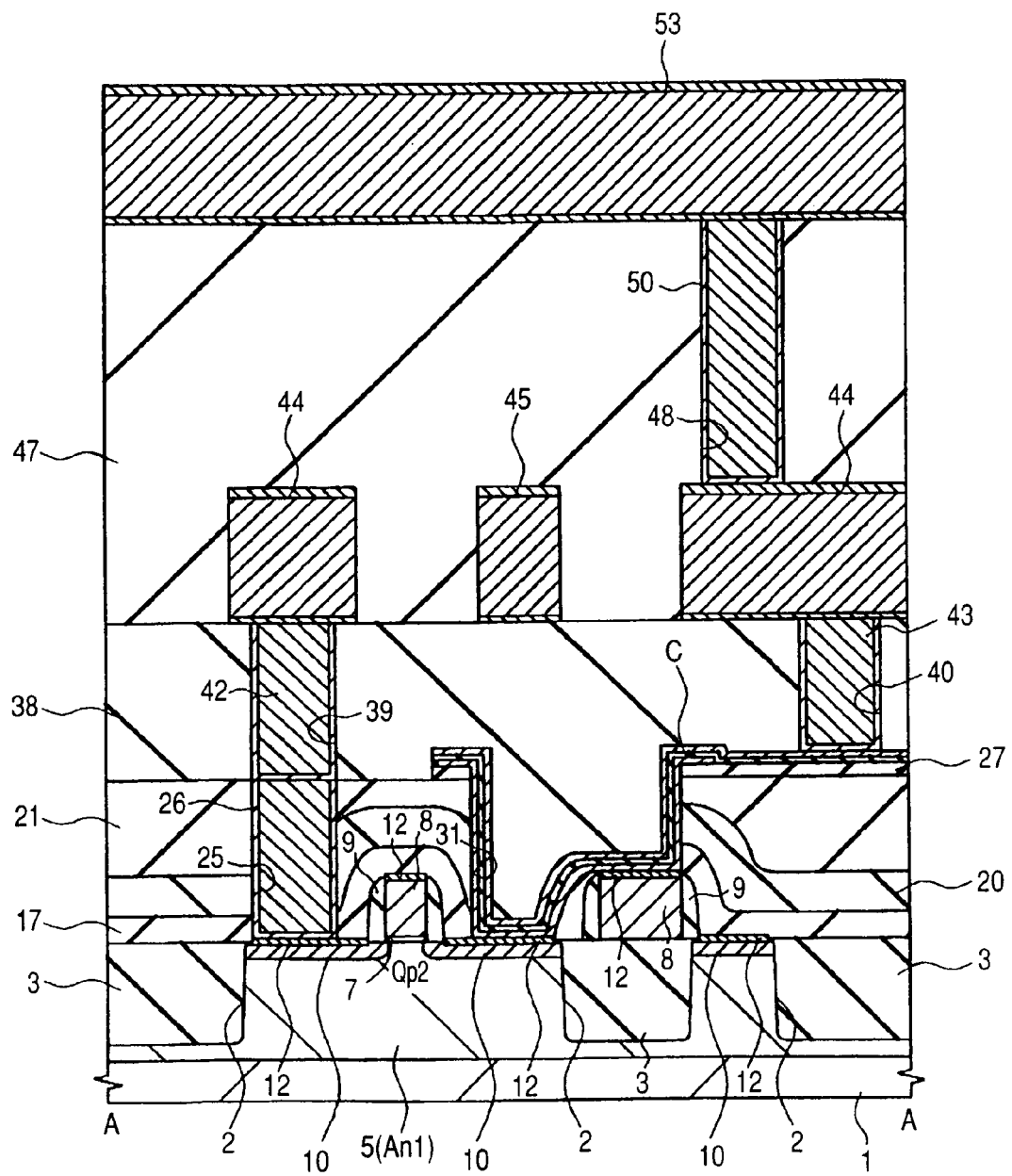
FIG. 28 is a fragmentary cross-sectional view of the SRAM during a manufacturing step following that in FIG. 26.

As illustrated in FIGS. 27 and 28, an interlayer insulating film 47, contact hole 48, plug 50 and interconnects 52 and 53 are formed in similar steps to those described based on FIGS. 16 and 17 of Embodiment 1 to fabricate the SRAM of Embodiment 2. In Embodiment 2, similar to Embodiment 1, by repeating the above-described steps for the formation of the interlayer insulating film 47, plug 50 and interconnect 52, a multilayer interconnect may be formed. In FIG. 27, the interconnects 52 and 53 are hatched.

Via the interconnect 52, a reference voltage Vss is fed to the source of each of the drive MISFETs Qd1,Qd2, while via the interconnect 53, a supply voltage Vcc is fed to the drain of each of the load MISFETs Qp1,Qp2. Via the interconnect 53, a supply voltage Vcc is fed to the upper electrode (titanium nitride film 34 (refer to FIG. 22)) of the capacitor element C. The lower electrode (titanium nitride film 32 (refer to FIG. 22)) of the capacitor element C is electrically connected to the source of the load MISFETs Qp1,Qp2. As a result, the capacitor element C is able to have a capacitance that is electrically connected between the storage nodes A1,B1 and the supply voltage Vcc. Interconnects 52 that are electrically connected to one of the source and drain of the transfer MISFETs Qt1, Qt2 serve as data lines DL,/DL, respectively. As a result, the circuit as illustrated in FIG. 1 in Embodiment 1 can be realized.

Figure 29:
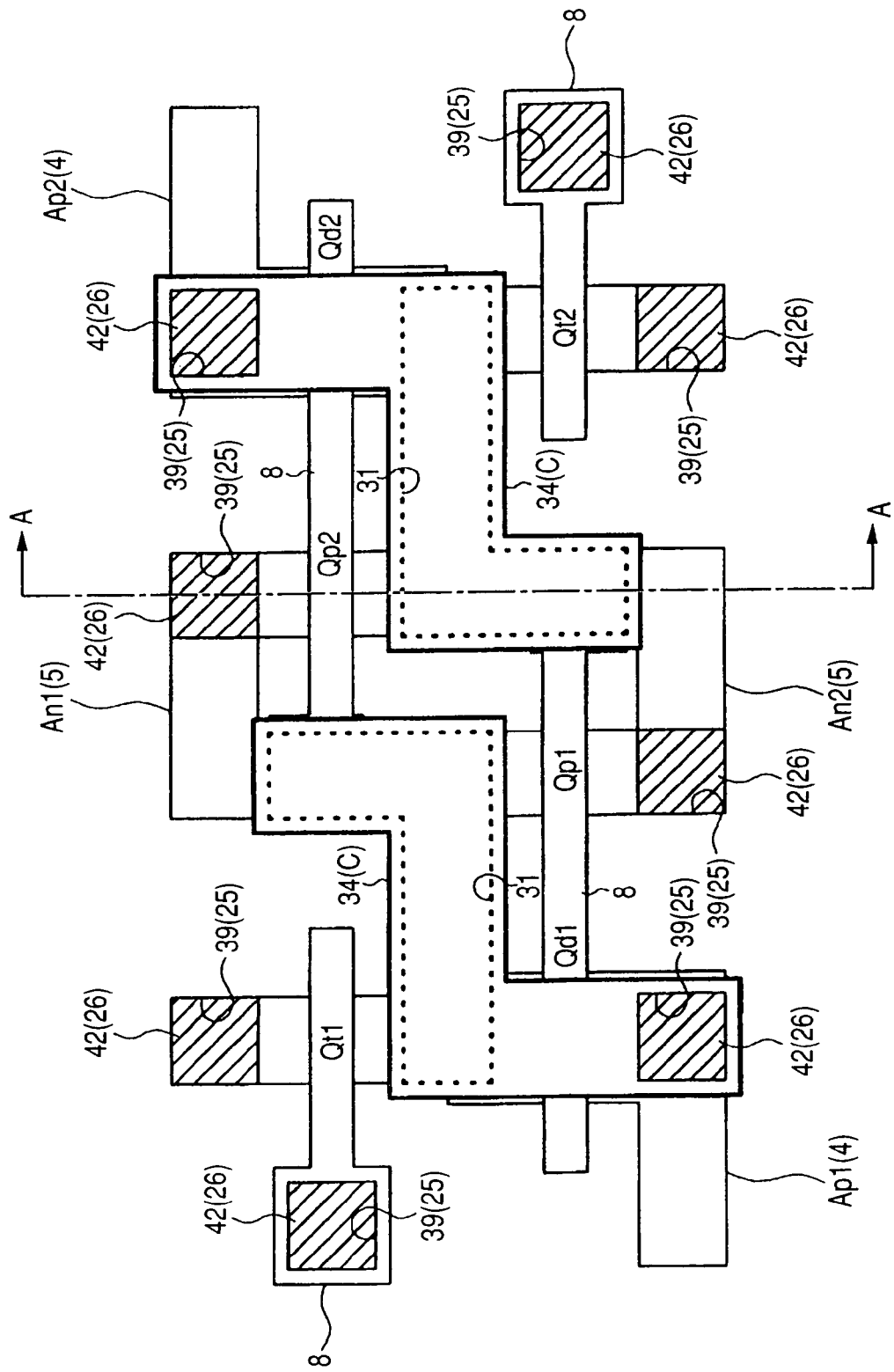
FIG. 29 is a fragmentary plan view of another SRAM according to Embodiment 2 of the present invention during its manufacture.

Upon patterning of the titanium nitride film 34 (refer to FIG. 22), which is to be an upper electrode of the capacitor element C, the pattern adopted is a plane pattern as illustrated in FIG. 29 in which the titanium nitride film 34 is electrically connected not to the interconnect 53 (illustration in FIG. 29 is omitted) but to the interconnect 52 (illustration in FIG. 29 is omitted) to feed the upper electrode (titanium nitride film 34) of the capacitor element C with a reference voltage Vss. This makes it possible to cause the capacitor element C to have a capacitance that is electrically connected between the storage nodes A1,B1 and the reference voltage Vss, and the circuit as illustrated in FIG. 2 in Embodiment 1 can be realized.

Figure 100:
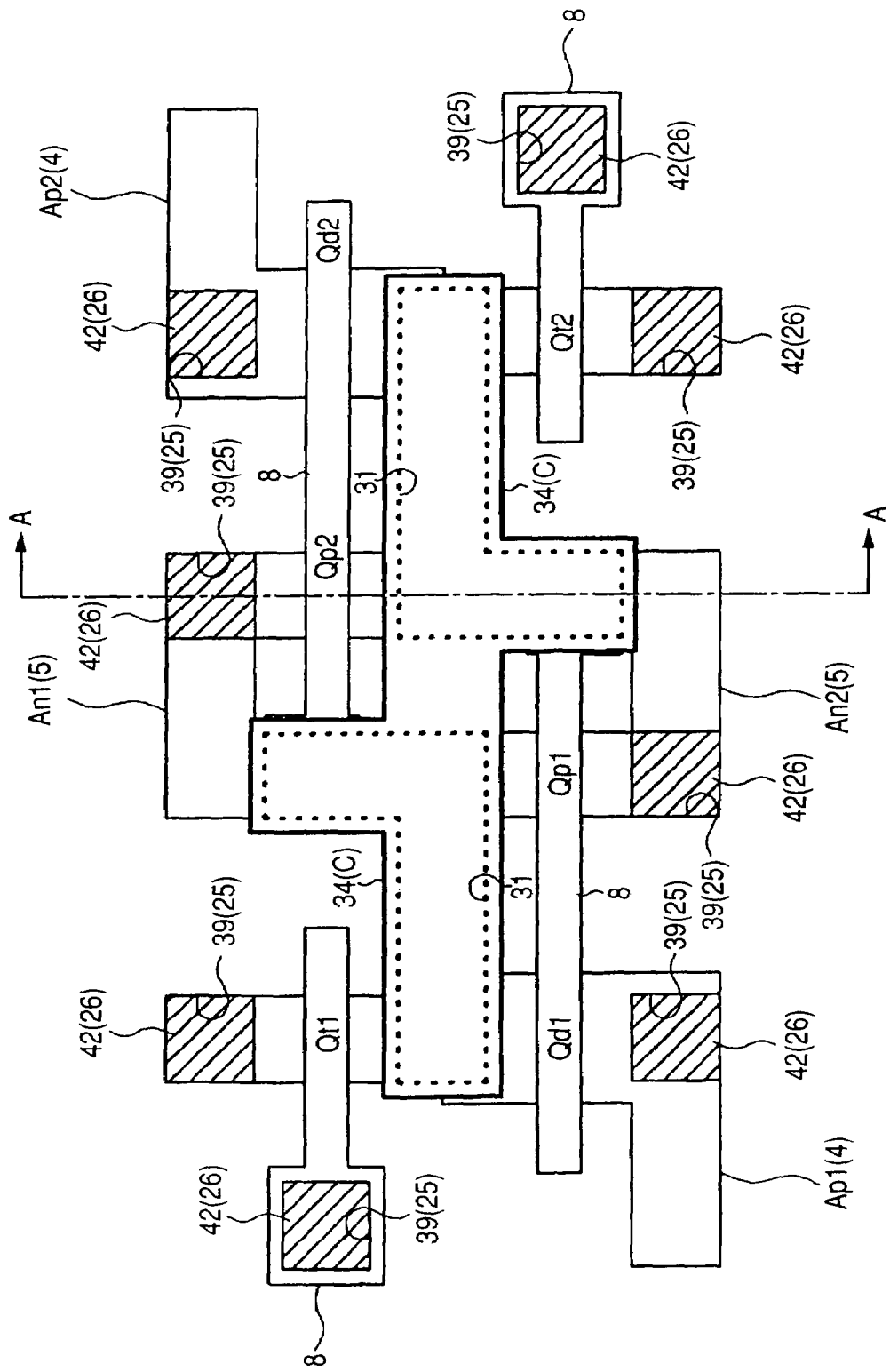
FIG. 100 is a fragmentary plan view of the SRAM according to Embodiment 2 of the present invention during its manufacture.

Upon patterning of the titanium nitride film 34 (refer to FIG. 22), which is to be an upper electrode of the capacitor element C, by adopting a plane pattern as illustrated in FIG. 100 and integrating the upper electrodes (titanium nitride films 34) of the capacitor elements C of two interconnect grooves 31, the capacitor element C is able to have a capacitance that is electrically connected between the storage node A1 and the storage node B1, and the circuit as illustrated in FIG. 3 in Embodiment 1 can be realized.

Also in this SRAM of Embodiment 2, similar advantages to those of the SRAM of Embodiment 1 are available.

Embodiment 3

Figure 30:
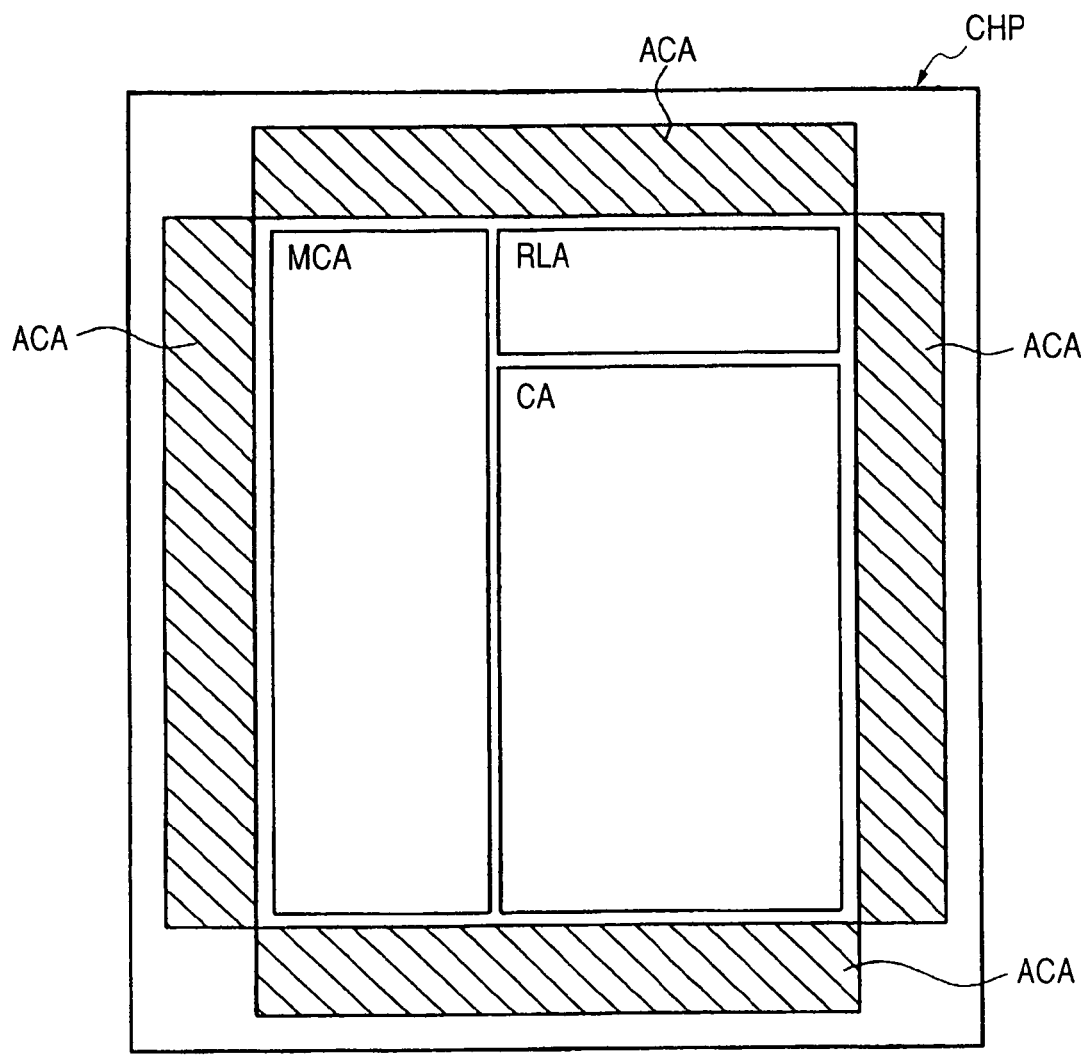
FIG. 30 is a plan view of a chip having a semiconductor integrated circuit device according to Embodiment 3 of the present invention.

FIG. 30 is a plan view of a chip having a memory cell of an SRAM formed thereon.

As illustrated in FIG. 30, a chip CHP has, disposed thereover, a memory cell region MCA in which a memory cell of an SRAM is to be formed, a random logic circuit region RCA, a CPU (Central Processing Unit) region CA and a peripheral circuit region ACA.

In the memory cell region MCA, there is a memory array composed of a plurality of word lines and a plurality of bit lines disposed in a matrix form, and a plurality of memory cells of an SRAM disposed at the intersections between the word lines and bit lines.

In the peripheral circuit region ACA, there are a word driver, a control circuit, such as a data line selecting circuit, an input circuit, an output circuit, an error-correcting circuit for repairing defective memory cells, and a reference power circuit (including step-down circuit).

Figure 31:
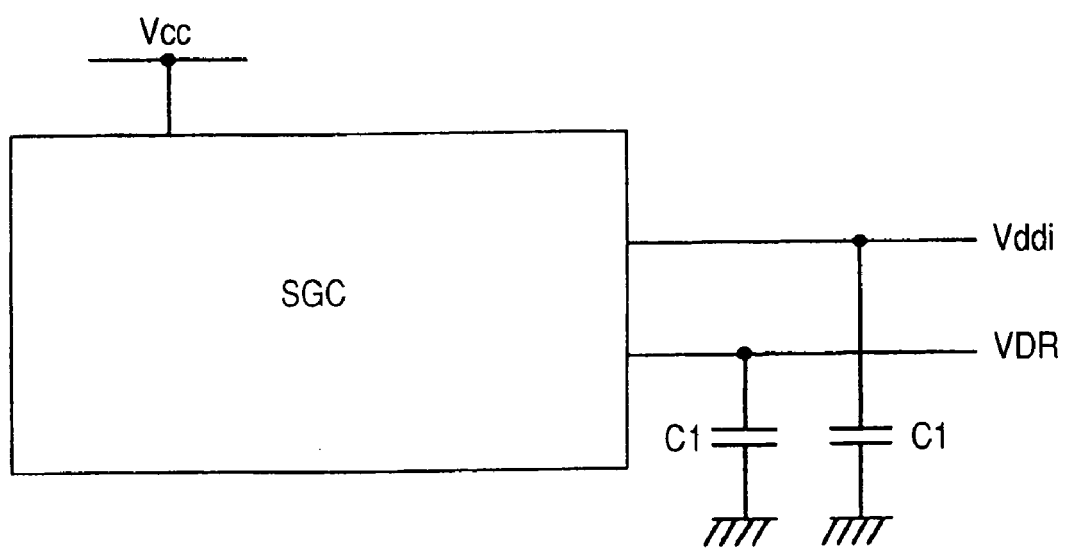
FIG. 31 is a schematic diagram of a reference power circuit formed on the chip illustrated in FIG. 30.

FIG. 31 is a schematic diagram of the above-described reference power circuit.

The reference power circuit SGC as illustrated in FIG. 31 serves to output a predetermined internal operating voltage Vddi (for example, 1.5V) for causing action of the memory cell of an SRAM and a predetermined data retention voltage (for example, 1V) for retaining data in the memory cell of the SRAM, responsive to the input of a supply voltage Vcc (for example, 3.3V). In this Embodiment 3, a capacitor element (second capacitor element) C1 is electrically connected between ground potential and an interconnect through which an internal operating voltage VDDi and data retention voltage VDR are output from the reference power circuit SGC for the purpose of preventing the output of the internal operating voltage VDDi and data retention voltage VDR from becoming unstable, as influenced by, for example, a power surge. The capacitor element C1 is required to have a large capacitance in order to prevent the influence of a large distorted wave such as surge voltage.

Figure 32:
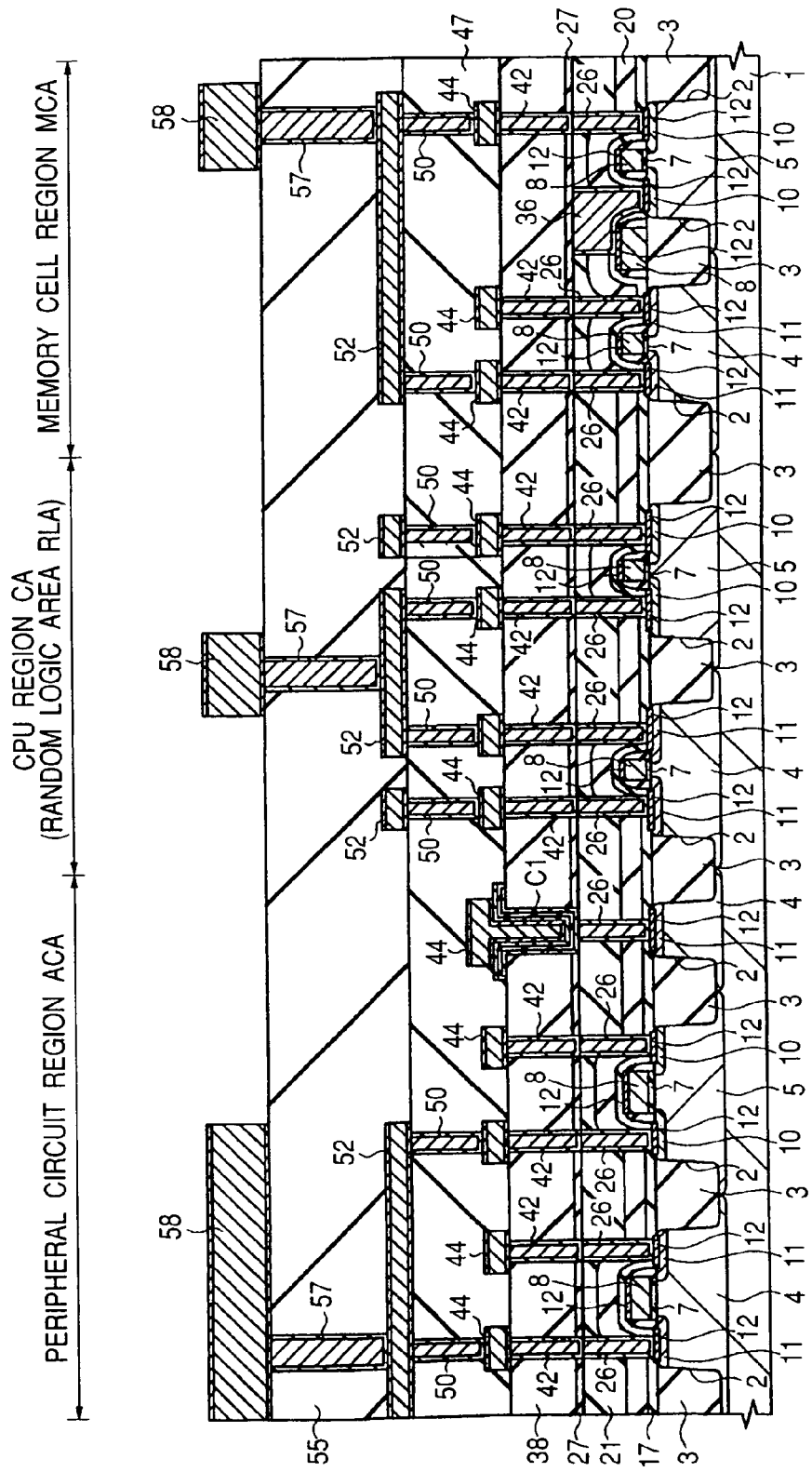
FIG. 32 is a fragmentary cross-sectional view of a semiconductor integrated circuit device which represents one example of Embodiment 3 of the present invention.

FIG. 32 is a fragmentary cross-sectional view illustrating the memory cell region MCA, the CPU region CA (random logic region RLA) and the peripheral circuit region ACA.

The semiconductor integrated circuit device according to Embodiment 3 is manufactured in substantially similar steps to those employed in Embodiment 1 or 2. The manufacturing steps will be described specifically later.

As illustrated in FIG. 32, in each of the memory cell region (first region) MCA, CPU region CA (random logic region RLA) and peripheral circuit region (second region) ACA, a p channel type MISFET having p type semiconductor regions 10 as a source and drain and an n channel type MISFET having n type semiconductor regions 11 as a source and drain are formed. In the peripheral circuit region ACA, the above-described capacitor element C1 is formed in a hole that is formed in an interlayer insulating film 38. The lower electrode of this capacitor element C1 is electrically connected to the n type semiconductor region via a plug 26. In this Embodiment 3, an interlayer insulating film 55 is formed over an interconnect 52, which is similar to the interconnect 52 as described in connection with Embodiments 1 and 2; and, via a plug 57 formed in the interlayer insulating film 55, the interconnect 52 is electrically connected to an interconnect 58 which lies thereover.

Figure 33:
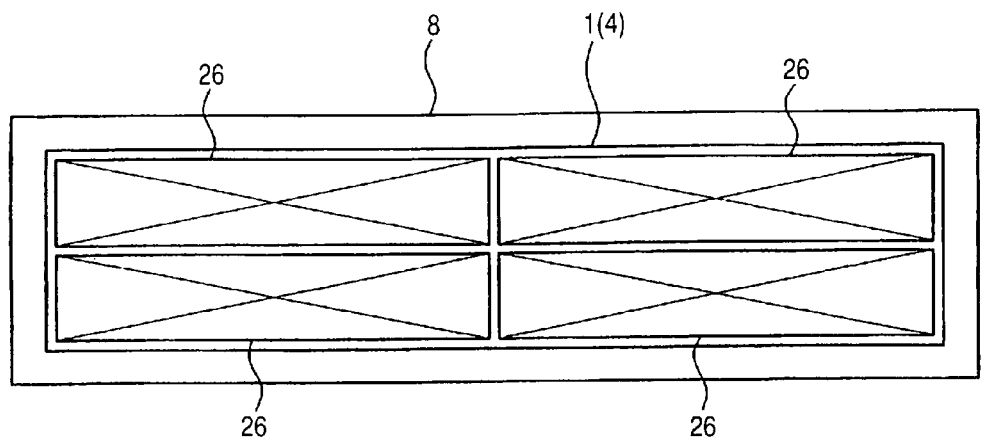
FIG. 33 is a diagrammatic plan view of a capacitor element compared with the above-described capacitor element formed in the semiconductor integrated circuit device which represents one example of Embodiment 3 of the present invention.
Figure 34:
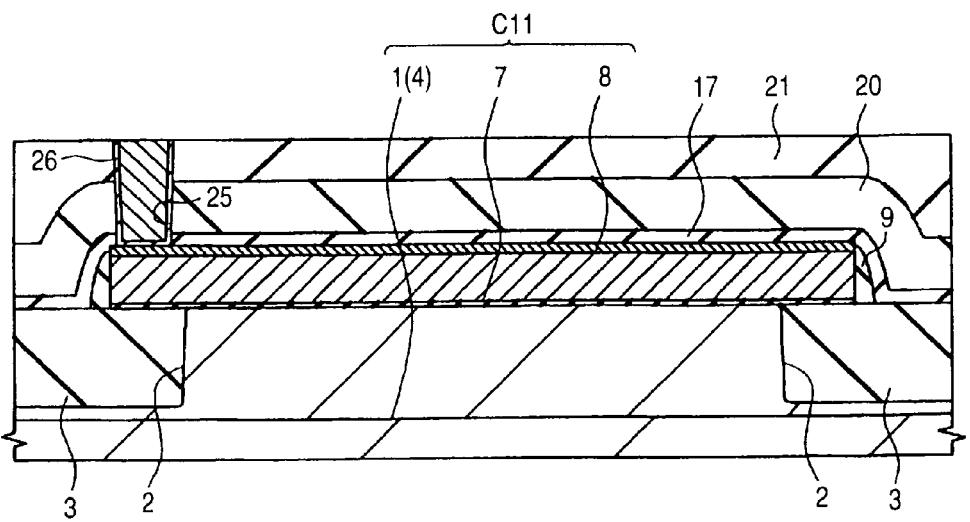
FIG. 34 is a cross-sectional view of the capacitor element compared with the above-descried capacitor element formed in the semiconductor integrated circuit device which represents one example of Embodiment 3 of the present invention.

FIGS. 33 and 34 are a plan view and cross-sectional view, respectively, of a capacitor element C11 having a so-called MOS structure, with which the present inventors have compared the above-described capacitor element C1. This capacitor element for comparison has the above-described substrate 1 (p type well (which may be an n type well)) as a lower electrode, a gate insulating film 7 as an insulator and a gate electrode 8 as an upper electrode.

According to the calculation by the present inventors, when the electrode of the capacitor element C11 is 4.4 µm by 56.7 µm, the area of the electrode (area of the capacitor element C11 over the substrate 1) given by 4.34×56.7 is 246.078 µm². Supposing that the thickness of the gate oxide film 7 is, for example, 2 µm, the capacitance of the capacitor element C11 given by $3.9 \times 8.854 \times 10^{-12} \times 246.078 \times 10^{-12}/2/10^{-9}$ is 4.2846 pF.

With regards to the capacitor element C1 of Embodiment 3, as illustrated in FIG. 32, on the other hand, supposing that the thickness of the interlayer insulating film 38 in which the capacitor element C1 has been formed and the diameter of the hole opened in the interlayer insulating film 38 for forming the capacitor element C1 are, for example, 0.8 μm and 0.18 μm, respectively, the capacitance of the capacitor element C1 given by $3.9 \times 8.854 \times 10^{-12} \times 0.477594 \times 10^{-12}/2/10^{-9}$ is 8.2458 fF. In other words, a capacitance similar to that of the capacitor element C11 can be realized by arranging about 520 capacitor elements C1 of Embodiment 3.

Judging from the fact that these 520 capacitor elements C1 of Embodiment 3 can be formed by disposing them in 13 columns and 40 rows, when the capacitor elements C can be formed at the minimum pitch of 0.18 μm, the length of the 520 capacitor elements C1 in the direction of columns given by 13×(0.18+0.18)+0.18 is 4.86 μm, while their length in the direction of rows given by 40×(0.18+0.18)+0.18 is 14.58 μm. The area of a region in which 520 capacitor elements C1 are formed is 70.8588 μm$^2$, given by 4.86×14.58. As result, the area in which the capacitor element C1 is formed over the substrate 1 is about one third of that of the capacitor element C11. In other words, use of the capacitor element C1 of Embodiment 3 enables a reduction in the size of a chip having the semiconductor integrated circuit device of Embodiment 3.

Figure 35:
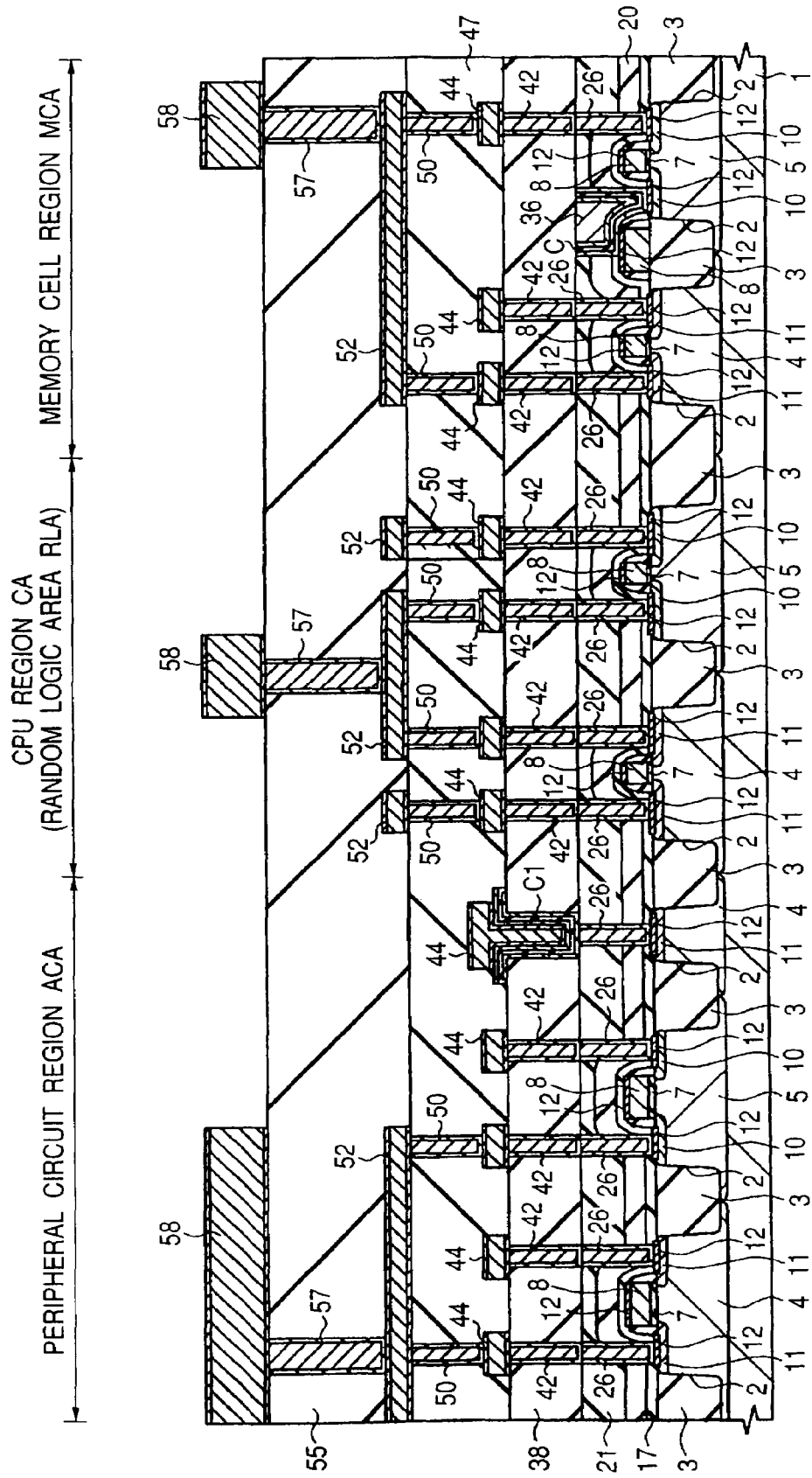
FIG. 35 is a fragmentary cross-sectional view of a semiconductor integrated circuit device which represents another example of Embodiment 3 of the present invention.

FIG. 32 illustrates the memory cell (memory cell region MCA) of an SRAM in which no capacitor element C (refer to FIG. 10 or FIG. 22) as described in connection with Embodiment 1 or 2 has been formed. As illustrated in FIG. 35, the memory cell (memory cell region MCA) of an SRAM may have a capacitor element C formed therein.

The manufacturing steps used in the fabrication of the semiconductor integrated circuit device according to Embodiment 3 will be described next with reference to FIGS. 36 to 48. FIGS. 36 to 48 are enlarged views of a part of the peripheral circuit region ACA of FIG. 32. In particular, FIG. 38 is a plan view of a region in which the capacitor element C1 is to be formed. FIGS. 39, 44 and 47 are cross-sectional views of respective steps taken along a line A-A of FIG. 38.

Figure 36:
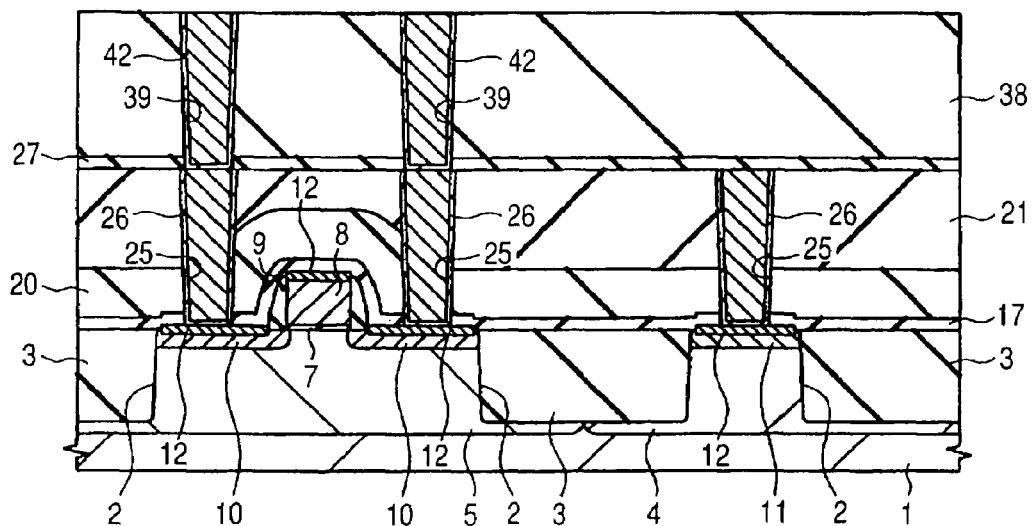
FIG. 36 is a fragmentary cross-sectional view showing a step in the manufacture of the semiconductor integrated circuit device which represents one example of Embodiment 3 of the present invention.

The steps in the manufacture of the semiconductor integrated circuit device according to Embodiment 3 are similar to those in Embodiment 1 up to the steps described with reference to FIGS. 4 to 6. Then, as illustrated in FIG. 36, a similar interlayer insulating film 38 (refer to FIG. 13), contact hole 39 (refer to FIG. 13) and plug 42 (refer to FIG. 13) to those described in connection with Embodiment 1 are formed.

Figure 37:
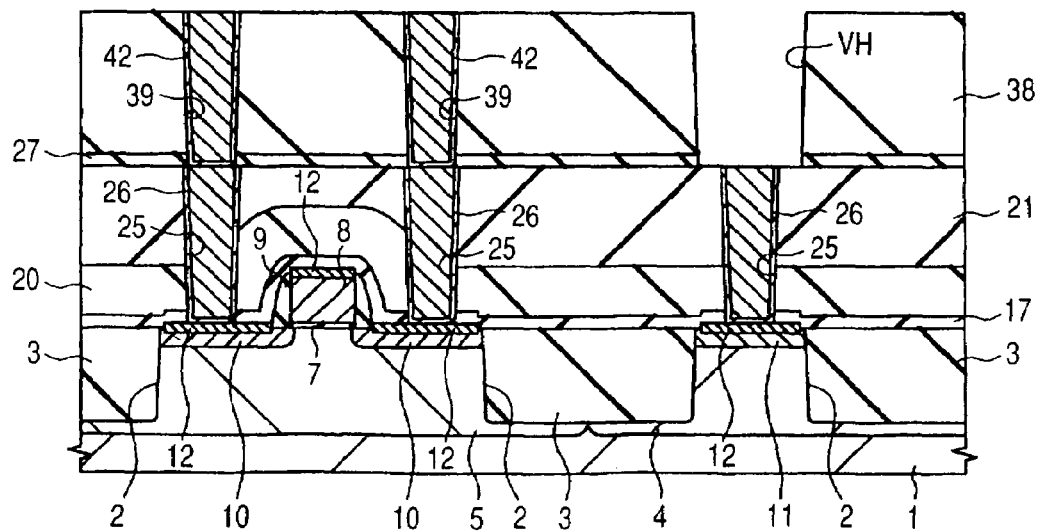
FIG. 37 is a fragmentary cross-sectional view of the semiconductor integrated circuit device during a manufacturing step following that in FIG. 36.
Figure 38:
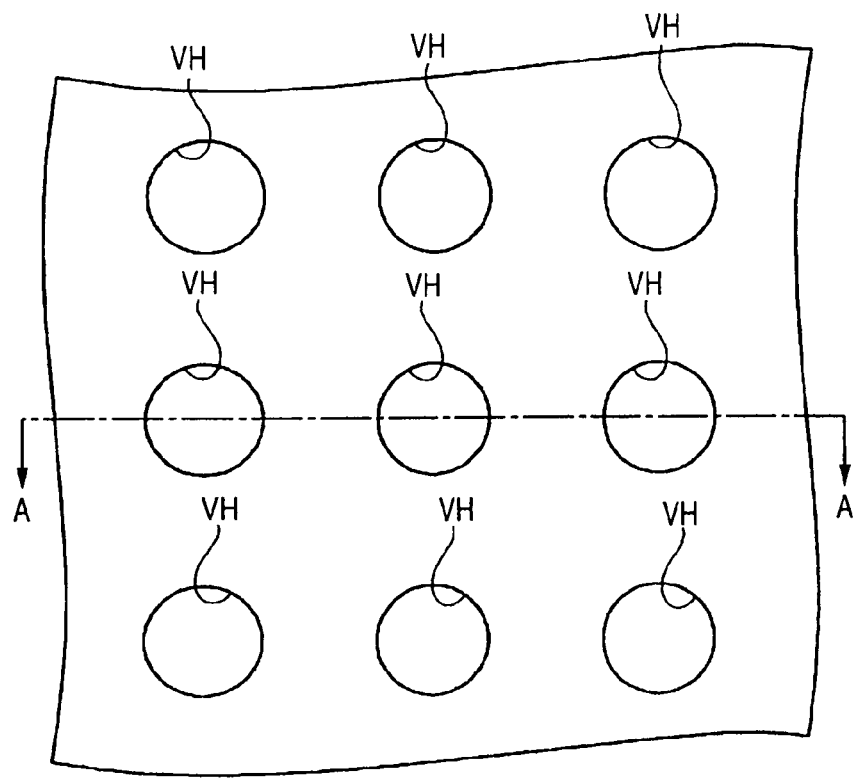
FIG. 38 is a fragmentary plan view of the semiconductor integrated circuit device which represents one example of Embodiment 3 of the present invention during its manufacture.
Figure 39:
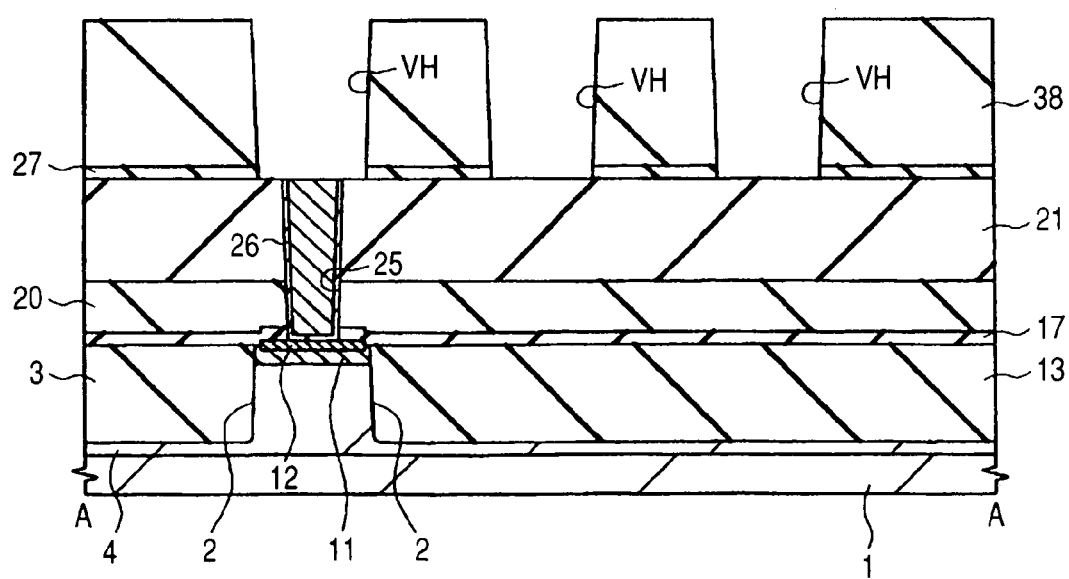
FIG. 39 is a fragmentary cross-sectional view of the semiconductor integrated circuit device which represents one example of Embodiment 3 of the present invention during its manufacture.
Figure 40:
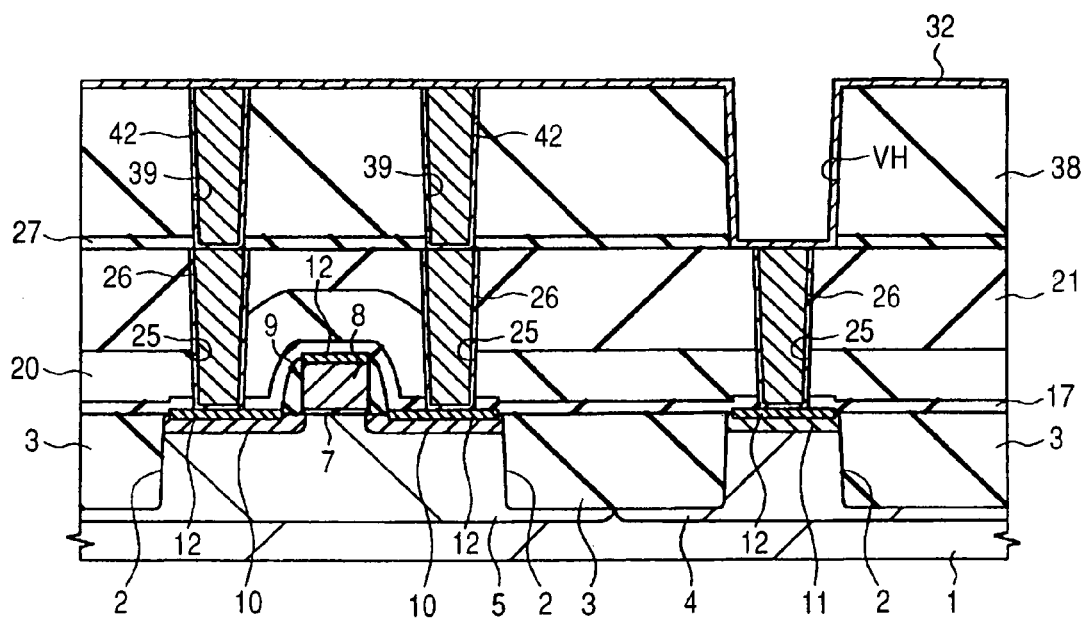
FIG. 40 is a fragmentary cross-sectional view of the semiconductor integrated circuit device during a manufacturing step following that in FIG. 37.

As illustrated in FIGS. 37 to 39, using a photoresist mask (not illustrated) as a mask, the interlayer insulating film (first insulating film) 38 and silicon nitride film (first insulating film) 27 are etched to form a hole (second opening) VH reaching the plug 26 at a position in which the capacitor element C1 (refer to FIG. 33) is to be formed. The number of holes VH is plural, for example, 13 columns×40 rows as described above. Over the interlayer insulating film 38 including the inside of each of the holes VH, a titanium nitride film 32 similar to the titanium nitride film 32 (refer to FIG. 8) used in Embodiment 1 is deposited, as illustrated in FIG. 40.

Figure 41:
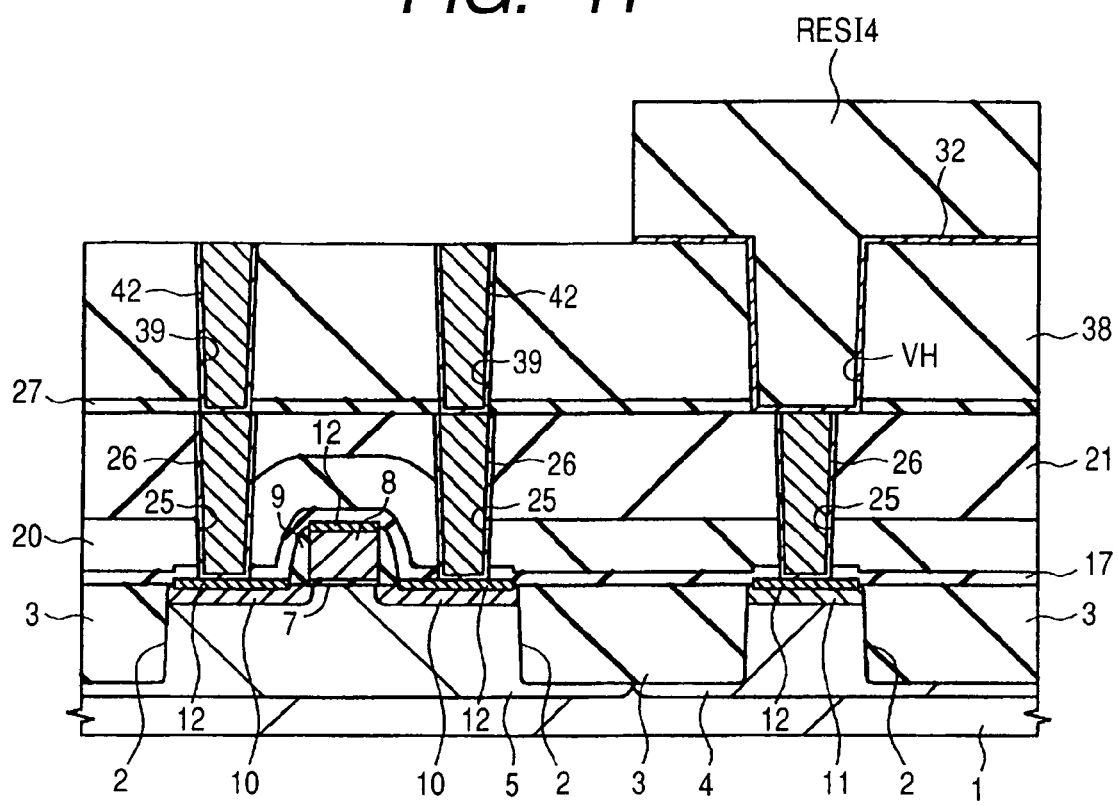
FIG. 41 is a fragmentary cross-sectional view of the semiconductor integrated circuit device during a manufacturing step following that in FIG. 40.

Then, as illustrated in FIG. 41, by etching using a photoresist film RESI 4 patterned by photolithography as a mask, the titanium nitride film 32 is patterned, by which a lower electrode (titanium nitride film 32) of the capacitor element C1 which will be completed by later steps, is formed in the hole VH.

After removal of the photoresist film RESI4, a silicon nitride film 33 and a titanium nitride film 34 similar to the silicon nitride film 33 (refer to FIG. 8) and titanium nitride film 34 (refer to FIG. 8) used in Embodiment 1 are deposited successively over the interlayer insulating film 38 including the inside of the hole VH.

Figure 43:
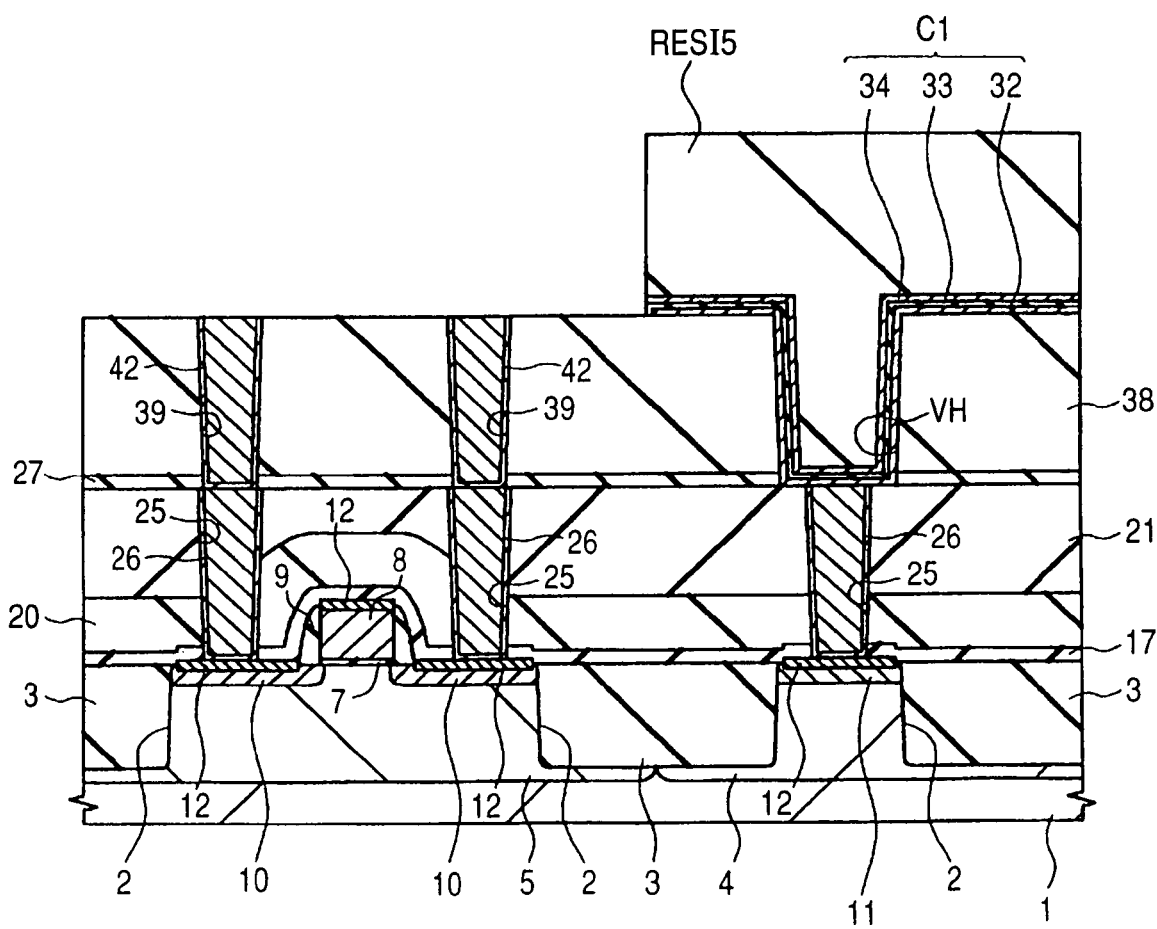
FIG. 43 is a fragmentary cross-sectional view of the semiconductor integrated circuit device during a manufacturing step following that in FIG. 42.
Figure 44:
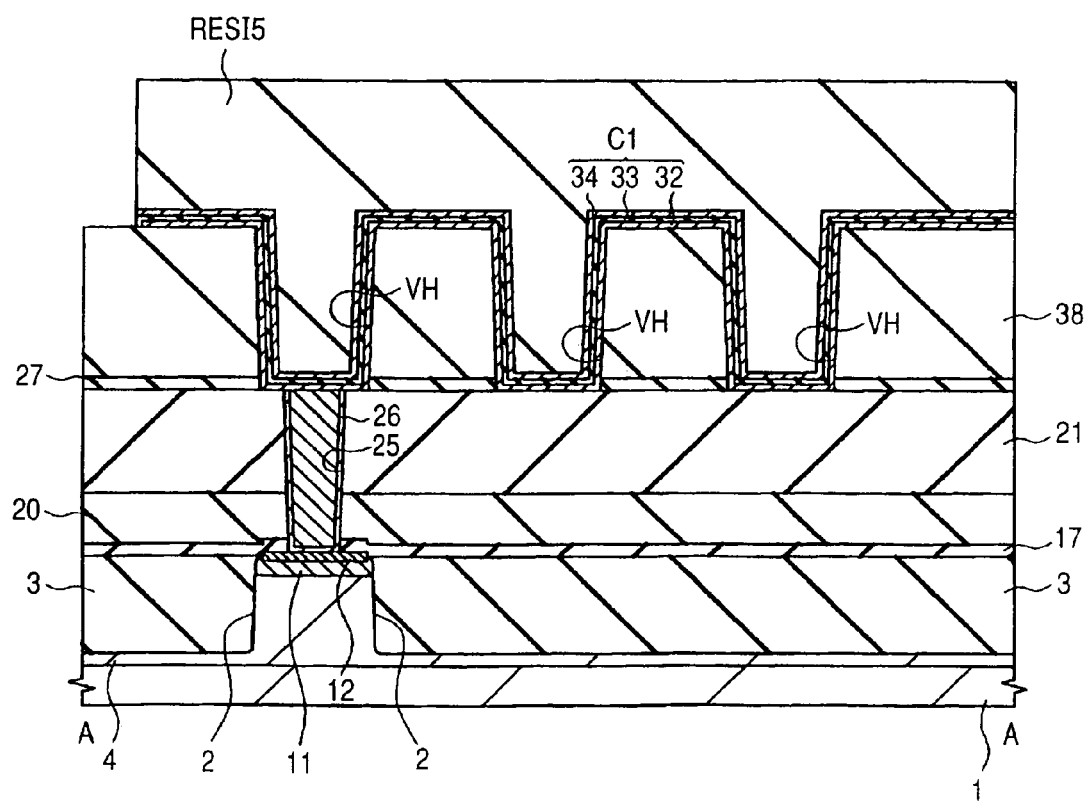
FIG. 44 is a fragmentary cross-sectional view of the semiconductor integrated circuit device which represents one example of Embodiment 3 of the present invention during its manufacturing.

As illustrated in FIGS. 43 and 44, using a photoresist film RESI5 patterned by photolithography as a mask, the silicon nitride film 33 and titanium nitride film 34 are patterned, by which a capacitor element C1 having the titanium nitride film 32 as a lower electrode, the silicon nitride film 33 serving as an insulator and the titanium nitride film 34 serving as an upper electrode, is formed in the hole VH. In this manner, the lower electrode (titanium nitride film 32) of the capacitor element C is formed over the bottom and the circumference of the sidewall of the hole VH; and, at the same time, it constitutes a capacitance, together with the upper electrode (titanium nitride film 34) of the capacitor element C via a dielectric film (silicon nitride film 33) of the capacitor element C, over the bottom and circumference of the sidewall of the hole VH. This makes it possible to improve the capacitance, because the bottom and circumference of the sidewall of the hole VH can be used as a capacitance area.

In this Embodiment 3, the silicon nitride film 33 is employed as an insulator of the capacitor element C1, but the silicon nitride film 33 may be replaced with an insulating film (for example, tantalum oxide film) having a higher dielectric constant than the silicon nitride film 33. This makes it possible to increase the capacitance of the capacitor element C1.

Figure 45:
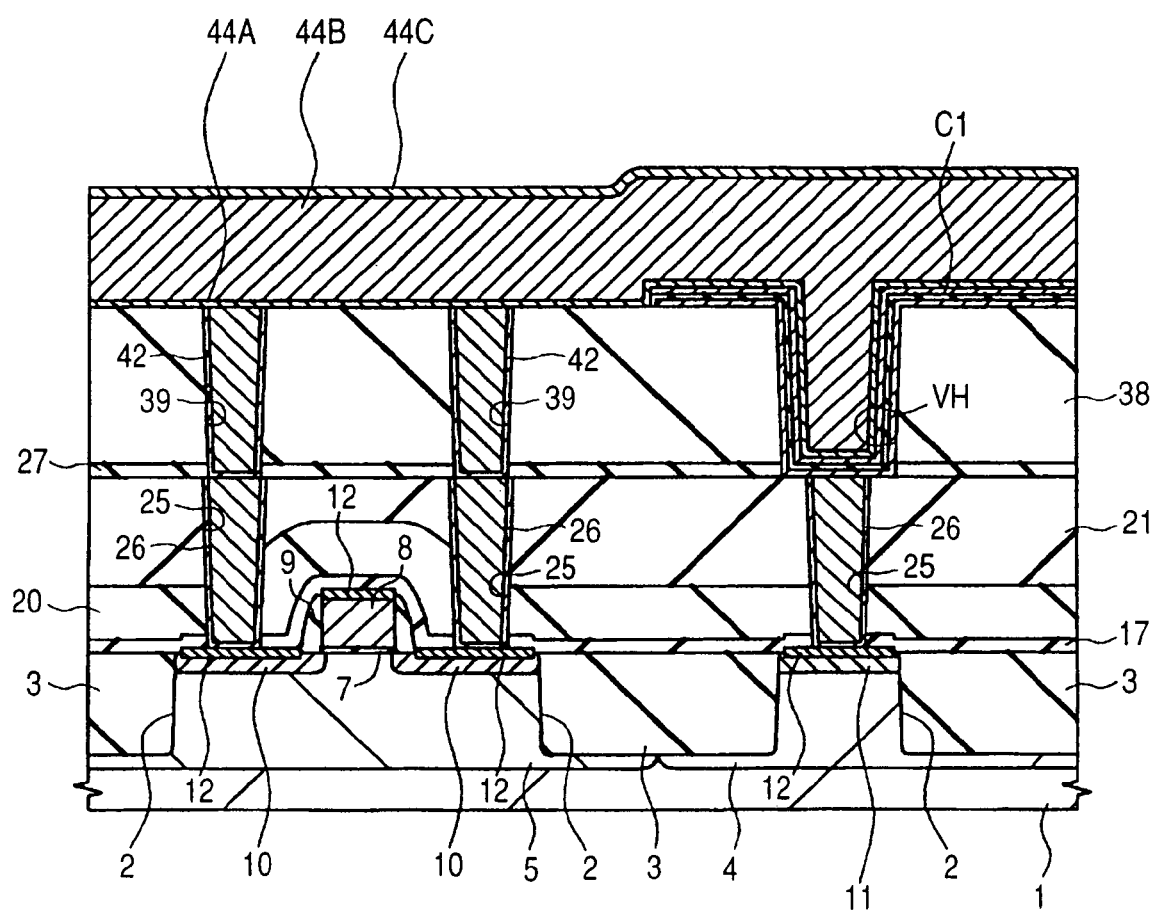
FIG. 45 is a fragmentary cross-sectional view of the semiconductor integrated circuit device during a manufacturing step following that in FIG. 43.

After removal of the photoresist film RESI5, a Ti film 44A is deposited over the interlayer insulating film 38 including the inside of the hole VH by, for example, sputtering, as illustrated in FIG. 45. An Al film 44B for filling the hole VH therewith is then deposited over the interlayer insulating film 38 by sputtering. A titanium nitride film 44C is deposited over the Al film 44B.

Figure 46:
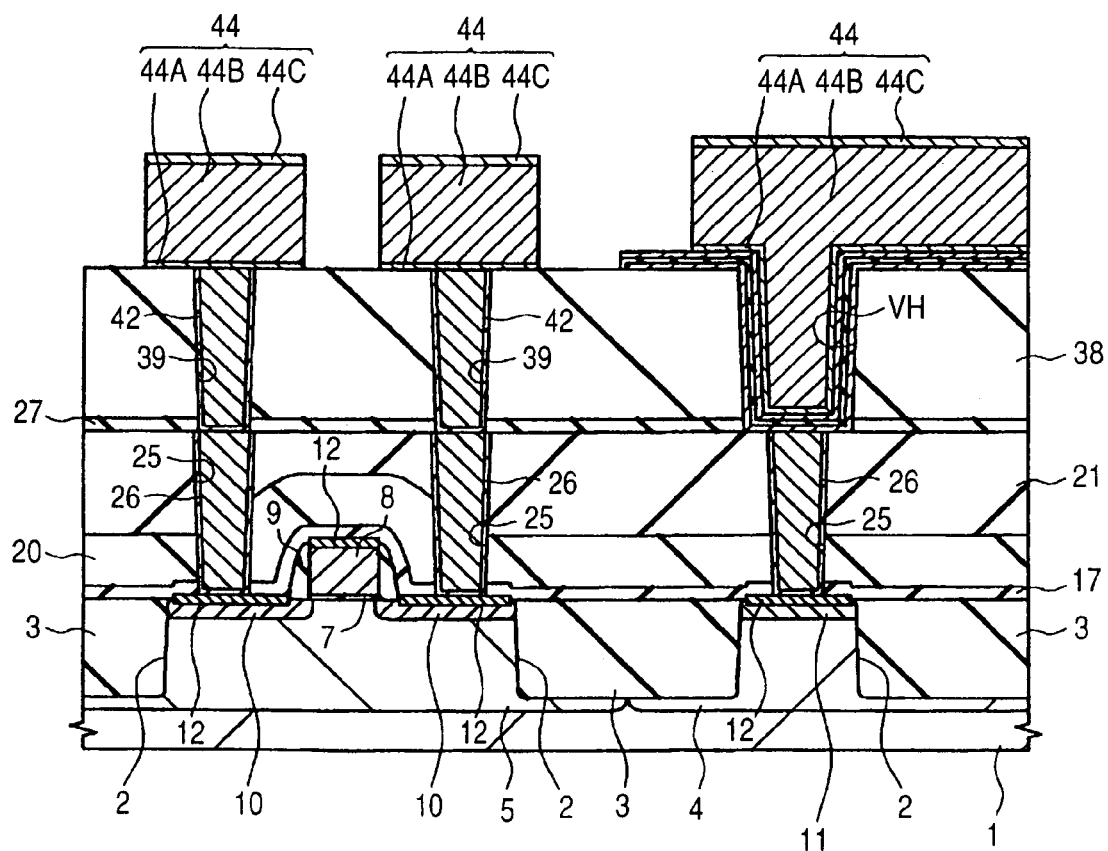
FIG. 46 is a fragmentary cross-sectional view of the semiconductor integrated circuit device during a manufacturing step following that in FIG. 45.
Figure 47:
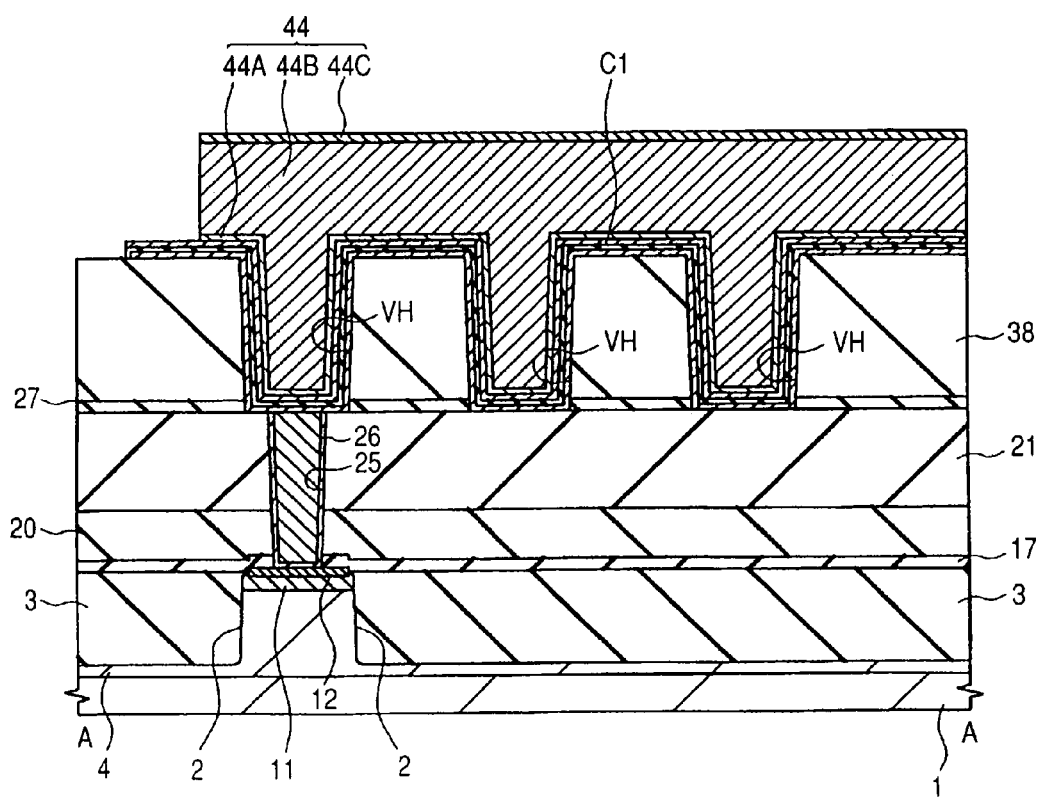
FIG. 47 is a fragmentary cross-sectional view of the semiconductor integrated circuit device which represents one example of Embodiment 3 of the present invention during its manufacture.

As illustrated in FIGS. 46 and 47, using a photoresist film (not illustrated) patterned by photolithography as a mask, the Ti film 44A, Al film 44B and titanium nitride film 44C are etched to form an interconnect 44.

Figure 48:
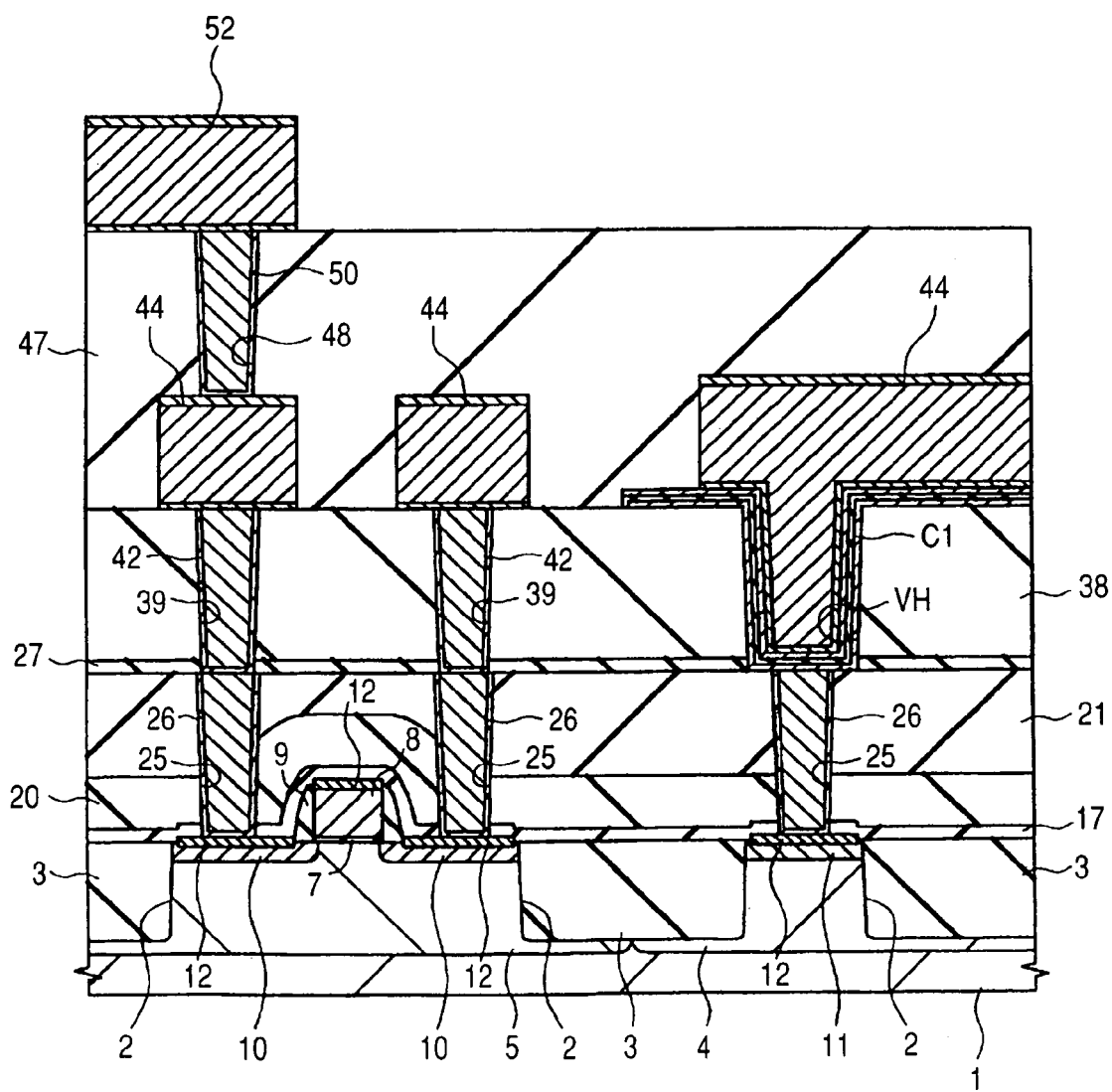
FIG. 48 is a fragmentary cross-sectional view of the semiconductor integrated circuit device during a manufacturing step following that in FIG. 46.
Figure 49:
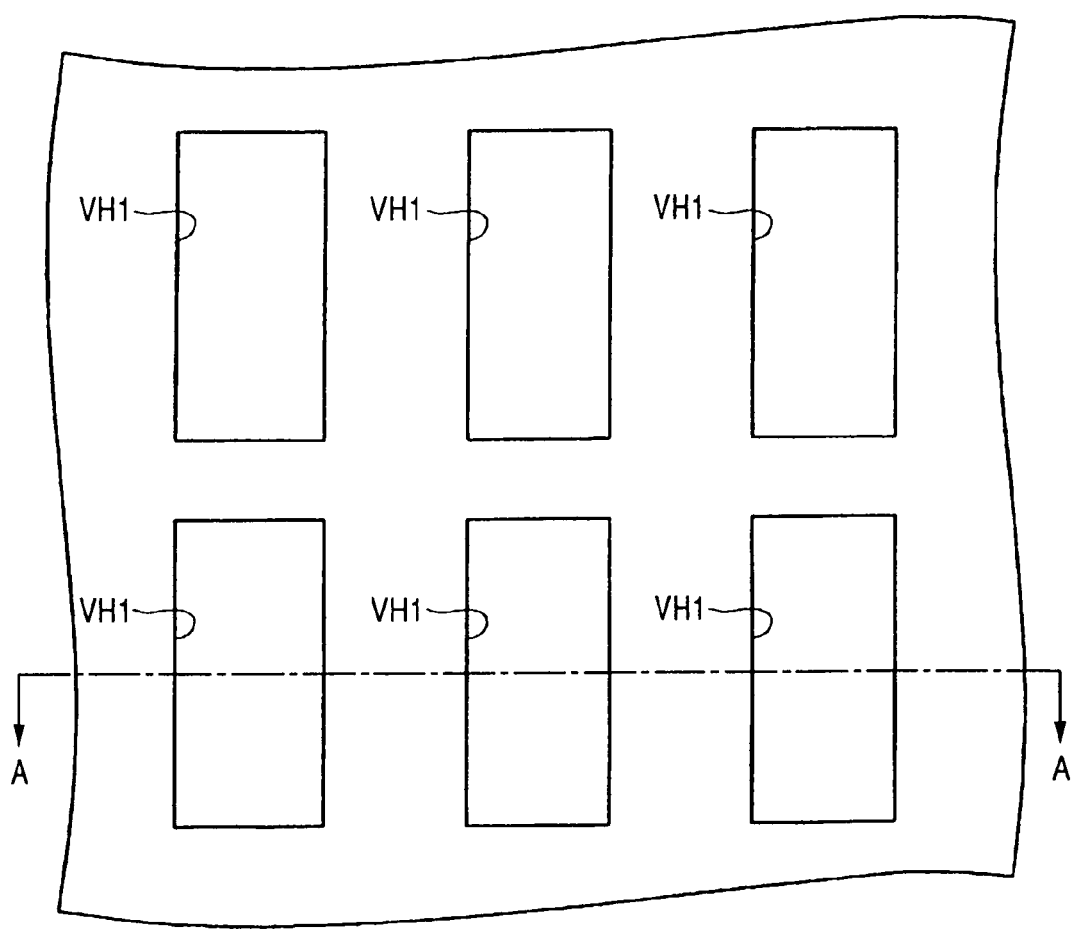
FIG. 49 is a fragmentary plan view of a semiconductor integrated circuit device which represents another example of Embodiment 3 of the present invention.

As illustrated in FIG. 48, an interlayer insulating film 47, a contact hole 48, a plug 50 and an interconnect 52 are formed over the interconnect 44 by steps similar to those employed for the formation of the interlayer insulating film 38, contact hole 39, plug 42 and interconnect 44. The interconnect 52 is electrically connected to the interconnect 44 via the plug 50. By repeating the above-described step, an interlayer insulating film 55 (refer to FIG. 32), a plug 57 (refer to FIG. 32) and an interconnect 58 (refer to FIG. 32) are formed to fabricate the semiconductor integrated circuit device of Embodiment 3.

In Embodiment 3, the hole VH having a circular plane for the formation of the capacitor element C1 (refer to FIG. 38) is described. Alternatively, it is possible to form a plurality of grooves (second openings) VH1, instead of the hole VH, in the interlayer insulating film 38 and to form the capacitor element C1 in these grooves VH1.

In Embodiment 3, the capacitor element C1 is formed using a plurality of holes VH. Alternatively, it is possible to add, to a chip CHP (refer to FIG. 30) having such a capacitor element C1 formed thereon, a capacitor element C11 having an MOS structure as described above with reference to FIGS. 33 and 34. When the capacitor element C11 having an MOS structure is formed, a gate oxide film 7 which will be an insulator is formed by thermal oxidation so that the insulator thus formed is thinner than that of the capacitor element C1 of Embodiment 3. When the area of the capacitive electrode is equal, the capacitance of the capacitor element C11 can be made greater than that of the capacitor element C1.

Embodiment 4

In Embodiment 4, the capacitor element C1 (refer to FIG. 43) described in connection with Embodiment 3 is formed by another manufacturing method.

The semiconductor integrated circuit device of Embodiment 4 is manufactured in a similar manner to Embodiment 3 up to the steps described with reference to FIGS. 36 and 40.

Figure 50:
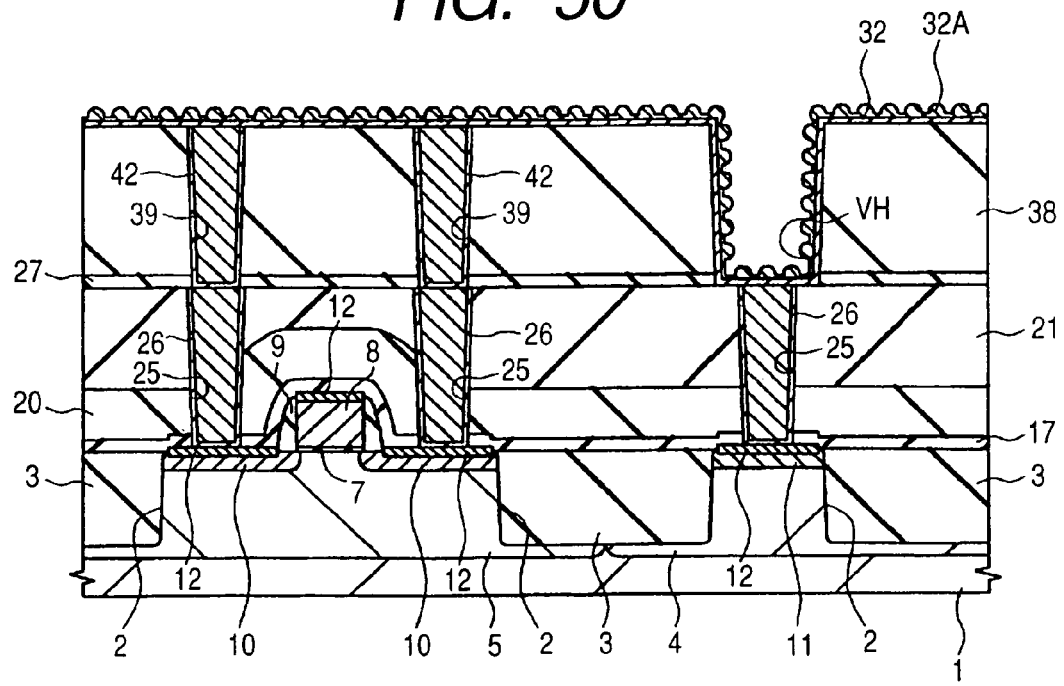
FIG. 50 is a fragmentary cross-sectional view showing a step in the manufacture of a semiconductor integrated circuit device according to Embodiment 4 of the present invention.

Then, an amorphous silicon film (first conductive film) 32A having an impurity of an n conductivity type, such as having P (phosphorus) doped therein, is deposited over the titanium nitride film 32 by CVD, as illustrated in FIG. 50. Under a vacuum atmosphere, an $SiH_4$ (monosilane) gas is fed to the surface of the amorphous silicon film 32A, followed by heat treatment of the substrate 1. By this treatment, the amorphous silicon film 32A is made polycrystalline and has a roughened surface (by silicon grains).

Figure 51:
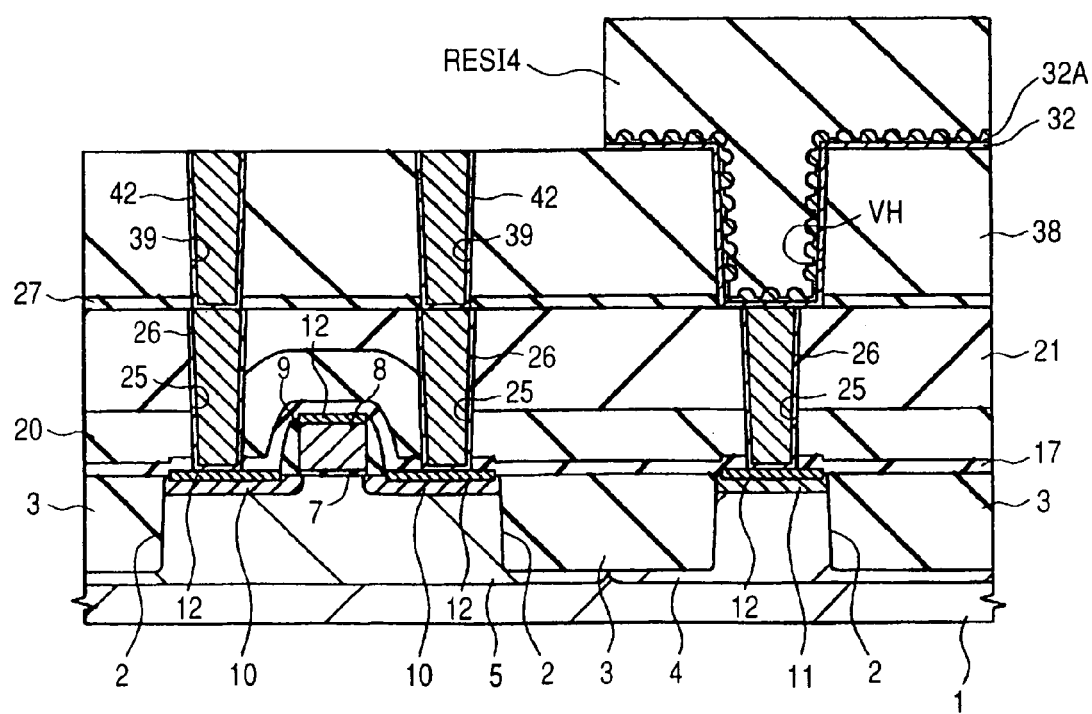
FIG. 51 is a fragmentary cross-sectional view of the semiconductor integrated circuit device during a manufacturing step following that in FIG. 50.
Figure 52:
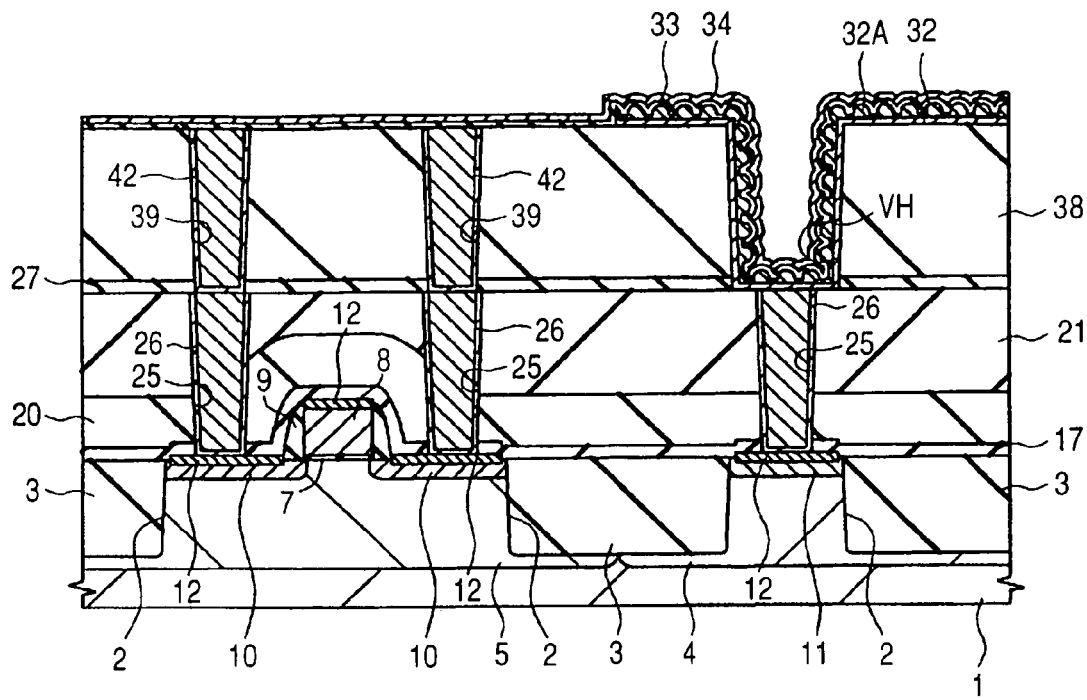
FIG. 52 is a fragmentary cross-sectional view of the semiconductor integrated circuit device during a manufacturing step following that in FIG. 51.

As illustrated in FIG. 51, by etching using a photoresist film RESI4 as a mask, the amorphous silicon film 32A and titanium nitride film 32 are patterned, by which the lower electrode of the capacitor element C which will be completed by later steps is formed in the hole VH.

Figure 42:
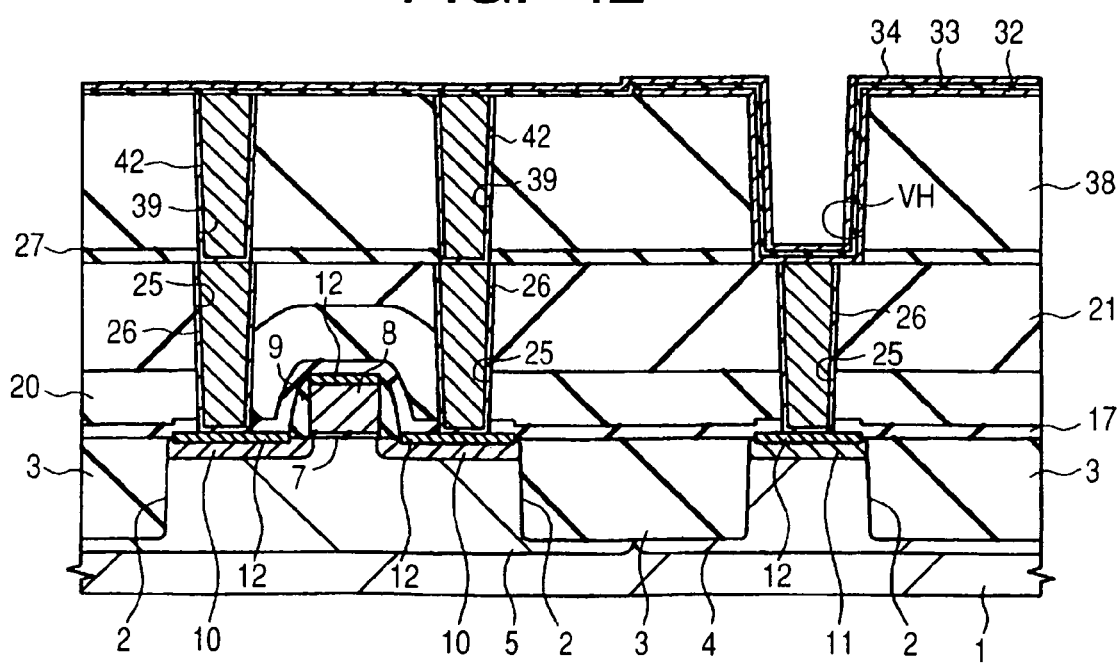
FIG. 42 is a fragmentary cross-sectional view of the semiconductor integrated circuit device during a manufacturing step following that in FIG. 41.
Figure 53:
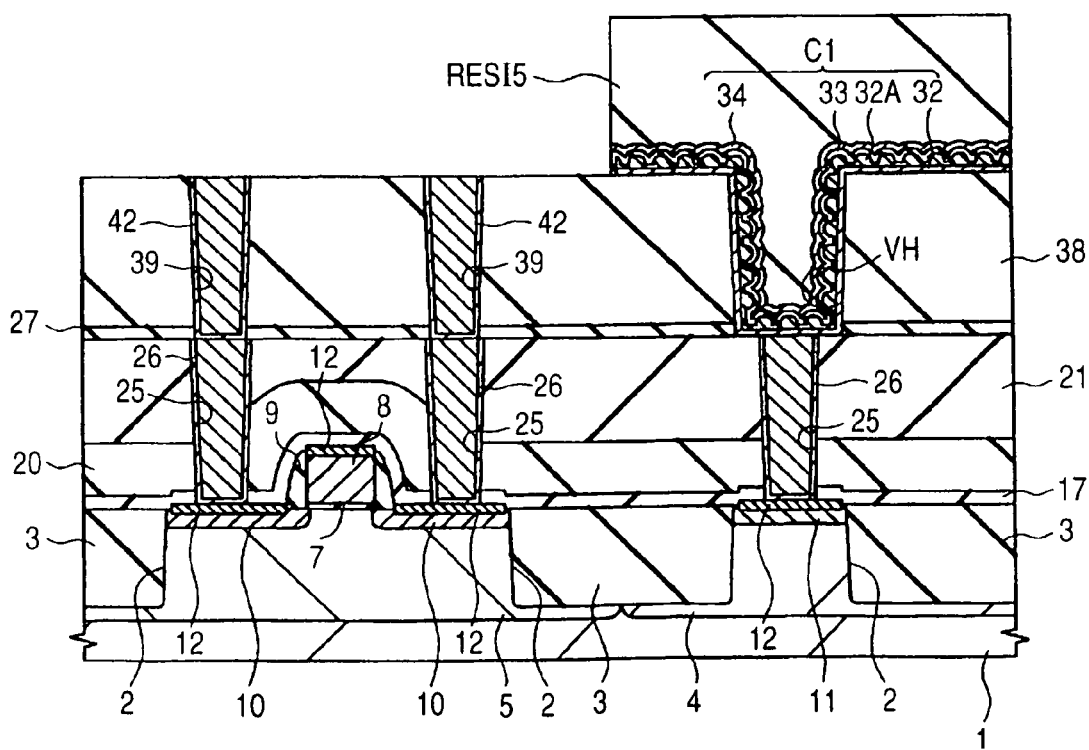
FIG. 53 is a fragmentary cross-sectional view of the semiconductor integrated circuit device during a manufacturing step following that in FIG. 52.
Figure 54:
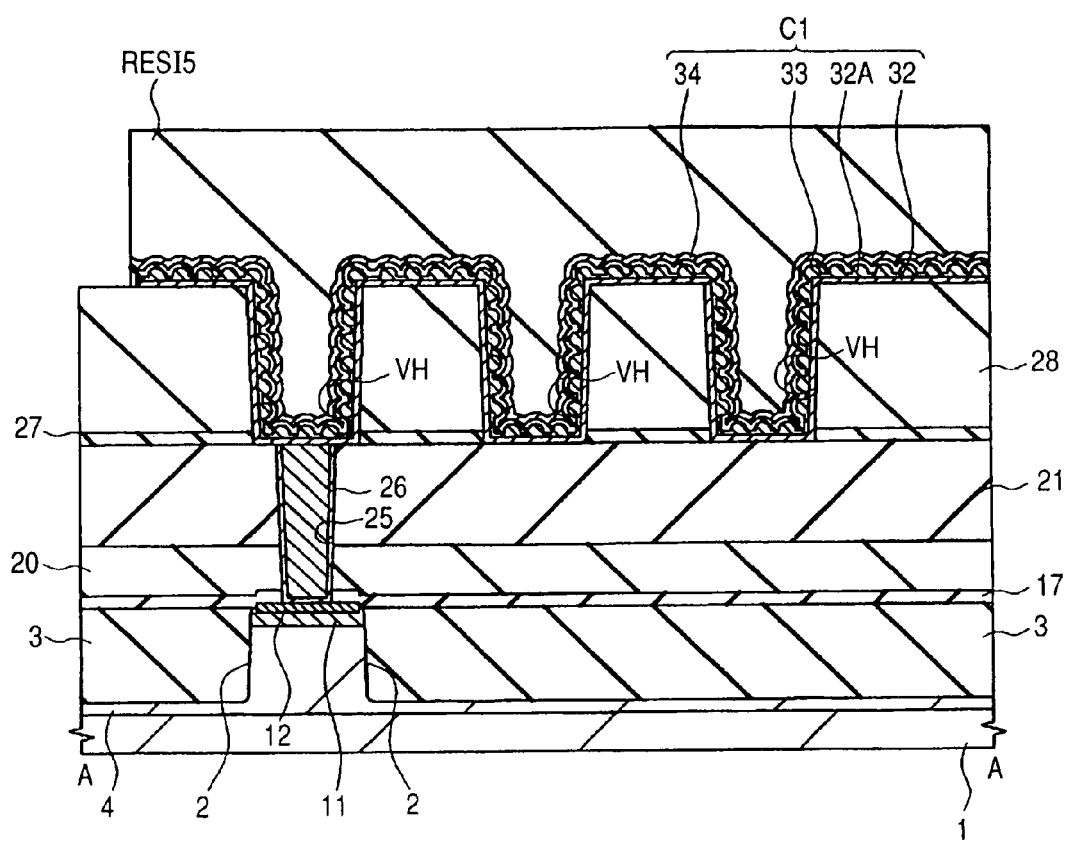
FIG. 54 is a fragmentary cross-sectional view of the semiconductor integrated circuit device according to Embodiment 4 of the present invention during its manufacture.
Figure 55:
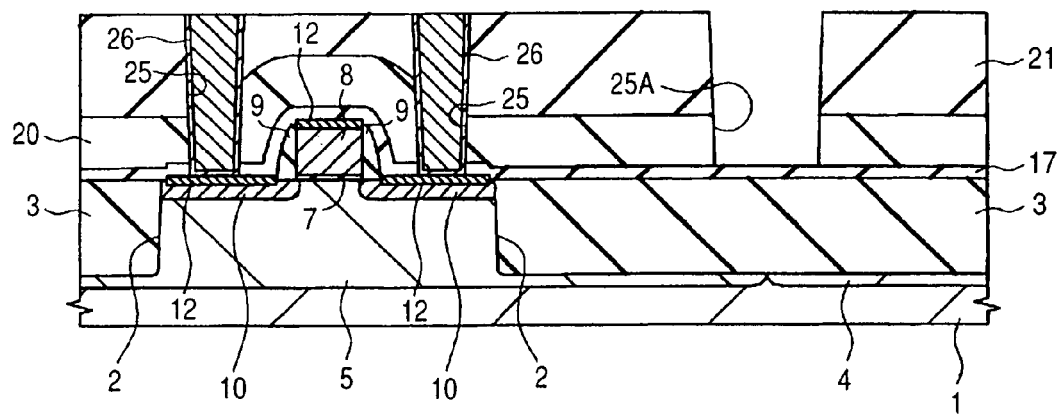
FIG. 55 is a fragmentary cross-sectional view showing a step in the manufacture of a semiconductor integrated circuit device according to Embodiment 5 of the present invention.

After removal of the photoresist film RESI4, in a similar manner to that described in connection with Embodiment 3, by using FIG. 42, a silicon nitride film 33 and a titanium nitride film 34 are deposited successively over the interlayer insulating film 38 including the inside of the hole VH. As illustrated in FIGS. 53 and 54, by etching using a photoresist film RESI5 as a mask, the silicon nitride film 33 and titanium nitride film 34 are patterned to form, in the hole VH, a capacitor element C1 having the titanium nitride film 32 and amorphous silicon film 32A as a lower electrode, the silicon nitride film 33 as an insulator and the titanium nitride film 343 as an upper electrode. FIG. 54 is a cross-sectional view of a region in which the capacitor element C1 is to be formed.

By such a method of formation of the capacitor element C1 according to Embodiment 4, the surface of the lower electrode (amorphous silicon film 32A) of the capacitor element C1 is roughened, making it possible to increase the electrode area of the capacitor element C1 by about twice or greater. According to the capacitor element C1 of Embodiment 4, therefore, a capacitance greater than that of the capacitor element C1 in Embodiment 3 is available.

Then, the semiconductor integrated circuit device of Embodiment 4 is manufactured by steps similar to those described with reference to FIGS. 45 to 48 in Embodiment 3.

Such a roughening of the lower electrode of the capacitor element C1 also may be applied to the manufacture of the capacitor element C of Embodiment 1 or 2. If it is applied, a greater capacitance can be attained even in Embodiment 1 or 2.

Embodiment 5

In Embodiment 5, a capacitor element similar to the capacitor element C1 (refer to FIG. 43) described in connection with Embodiment 3 is formed by another manufacturing method.

The semiconductor integrated circuit device of Embodiment 5 is manufactured in a similar manner to Embodiment 1 up to the steps described with reference to FIGS. 4 to 6. Then, using a photoresist film (not illustrated) patterned by photolithography, the silicon oxide film 21 and PSG film 20 over the element isolation 2 (silicon oxide film 3) are etched to form a hole (second opening) 25A reaching the silicon nitride film (third insulating film) 17. In this Embodiment 5, similar to the holes VH in Embodiment 3, the number of holes 25A is plural. For example, they are arranged in a plane by 13 columns and 40 rows (refer to FIG. 59 which will be described later).

Figure 56:
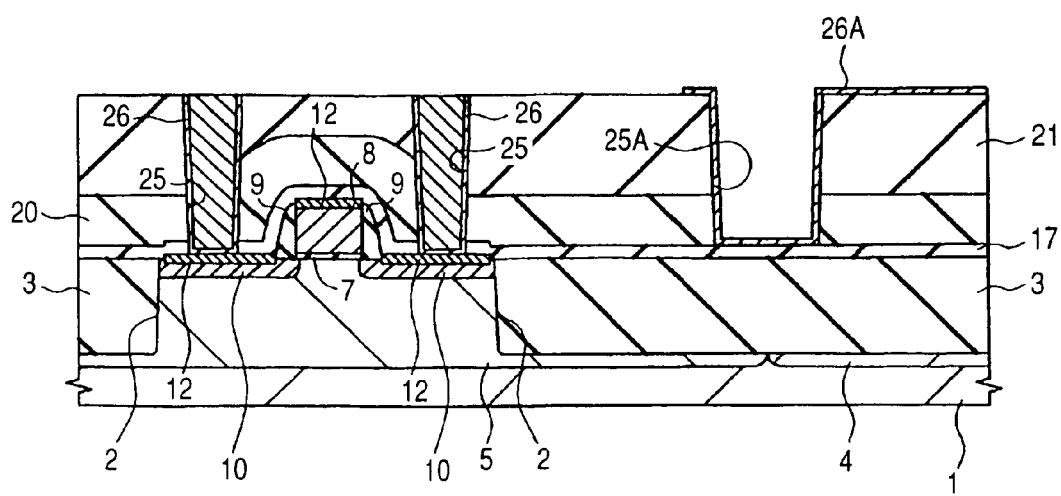
FIG. 56 is a fragmentary cross-sectional view of the semiconductor integrated circuit device during a manufacturing step following that in FIG. 55.

As illustrated in FIG. 56, a titanium nitride film (first conductive film) 26A similar to the titanium nitride film 32 (refer to FIG. 8) as provided in Embodiment 1 is deposited over the substrate 1 including the inside of the hole 25A. By etching using a photoresist film as a mask, the titanium nitride film 26A is then patterned.

Figure 57:
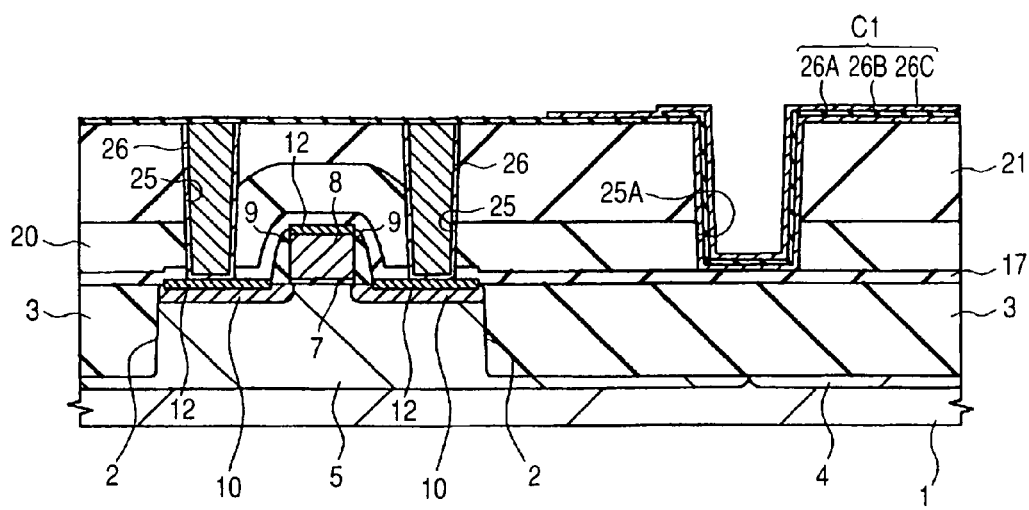
FIG. 57 is a fragmentary cross-sectional view of the semiconductor integrated circuit device during a manufacturing step following that in FIG. 56.

As illustrated in FIG. 57, a silicon nitride film (second insulating film) 26B and a titanium nitride film (second conductive film) 26C similar to the silicon nitride film 33 (refer to FIG. 8) and the titanium nitride film 34 (refer to FIG. 8) are deposited over the substrate 1 including the inside of the hole 25A. By etching using a photoresist film as a mask, the titanium nitride film 26C is patterned to form, in the hole 25A, a capacitor element Ca having the titanium nitride film 26A as an upper electrode, the silicon nitride film 26B as an insulator and the titanium nitride film 26C as an upper electrode. In this manner, the lower electrode (titanium nitride film 26A) of the capacitor element C is formed over the bottom and circumference of the sidewall of the hole 25A, and at the same time, over the bottom and the circumference of the sidewall of the hole 25A, so that it forms a capacitance together with the upper electrode (titanium nitride film 26C) of the capacitor element C via a dielectric film (silicon nitride film 26B) of the capacitor element C. This makes it possible to use the bottom and the circumference of the sidewall of the hole 26A as a capacitance area, leading to an improvement in capacitance.

In this Embodiment 5, the capacitor element C1 exists over the element isolation (silicon oxide film 3) so that a plug for extracting each of the upper electrode and lower electrode of the capacitor element C1 must be formed over the silicon oxide film 21. In Embodiment 5, patterning of the titanium nitride films 26A, 26C is carried out so as to form the lower electrode to extend over the silicon oxide film 21 and so that the upper electrode will not extend over the lower electrode in a region in which a plug (formed in later steps) to be connected to the lower electrode is formed, while patterning is conducted so that the upper electrode extends over the silicon oxide film 21 and the lower electrode does not extend thereover in a region in which a plug (formed in later steps) connected to the upper electrode is formed. By patterning the upper electrode and lower electrode, as described above, in a region in which a plug connected to the upper electrode is formed, it is possible to prevent an inconvenience, such as short circuit, via the plug, between the upper electrode and the lower electrode, which will otherwise occur because the contact hole in which the plug is formed reaches the lower electrode.

Figure 58:
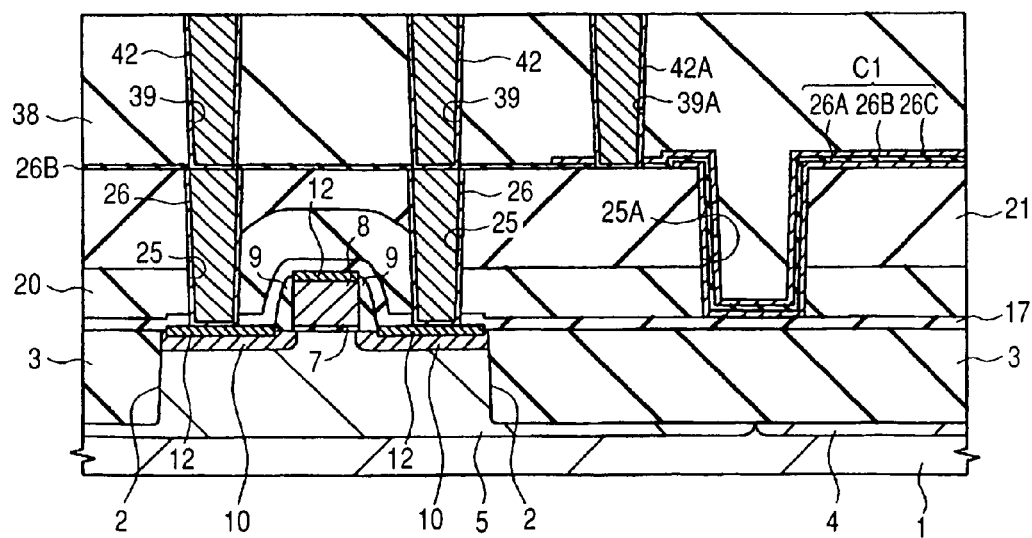
FIG. 58 is a fragmentary cross-sectional view of the semiconductor integrated circuit device during a manufacturing step following that in FIG. 57.
Figure 59:
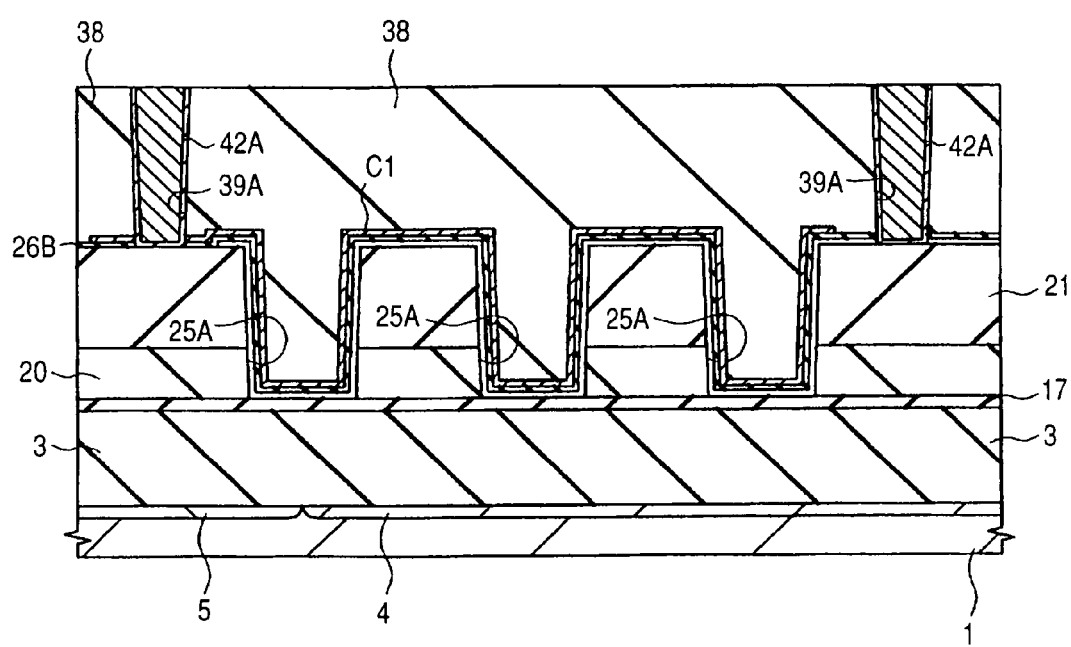
FIG. 59 is a fragmentary cross-sectional view of another semiconductor integrated circuit device according to Embodiment 5 of the present invention during its manufacture.

As illustrated in FIGS. 58 and 59, an interlayer insulating film 38 is formed by depositing, for example, a silicon oxide film over the substrate 1. FIG. 59 is a cross-sectional view of a region in which a capacitor element C1 has been formed. As illustrated in the diagram, a plurality of holes 25A have been formed in the interlayer insulating film 38. The holes 25A are formed as illustrated in FIG. 38 or FIG. 39 of the above-described embodiment. Then, using a photoresist film as a mask, the interlayer insulating film 38 and the silicon nitride film 26B are etched to make a contact hole 39 reaching the plug 26, a contact hole 39A reaching the upper electrode (titanium nitride film 26C) of the capacitor element C1 and a contact hole 39B reaching the lower electrode (titanium nitride film 26A) of the capacitor element C1. By steps similar to those employed for the formation of the plug 42 (refer to FIG. 13) in Embodiment 1, plugs (conductive layers) 42, 42A, and 42B are formed in the contact holes 39, 39A, and 39B, respectively.

The upper electrode (titanium nitride film 26C) and lower electrode (titanium nitride film 26C) of the capacitor element C1 are places through which no large electric current passes, but on which only a bias is applied, so that the plugs 42A,42B are only required to be formed to have a contact with the upper electrode and lower electrode at their side portions thereof, respectively. In other words, in this Embodiment 5, the contact holes 39A,39B may reach the silicon oxide film 21, going through the titanium nitride films 26A,26C and silicon nitride film 26B.

Figure 60:
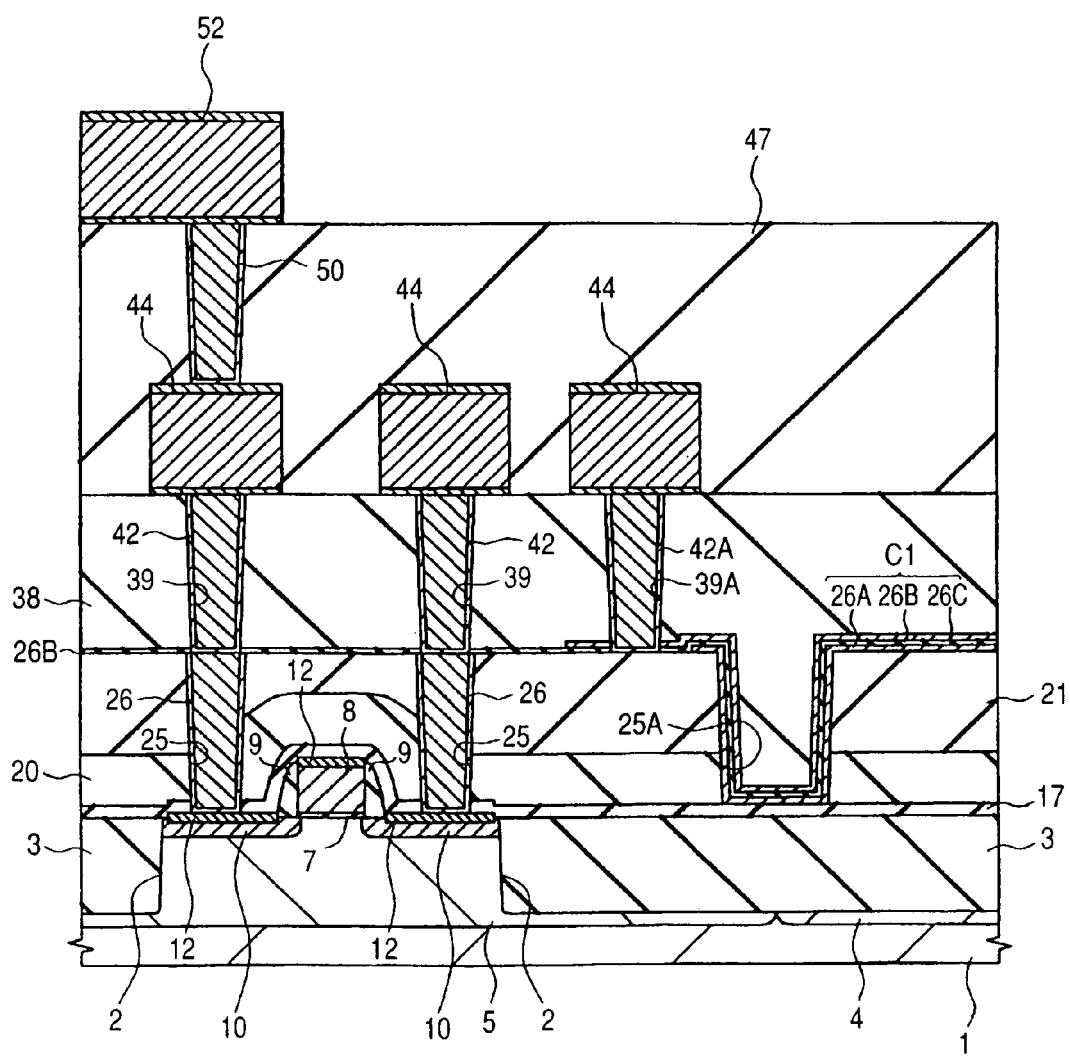
FIG. 60 is a fragmentary cross-sectional view of the semiconductor integrated circuit device during a manufacturing step following that in FIG. 58.

As illustrated in FIG. 60, by steps similar to those employed for the formation of the interconnect 44 (refer to FIG. 15), interlayer insulating film 47 (refer to FIG. 17), plug 50 (refer to FIG. 17) and interconnect 52 (refer to FIG. 17) in Embodiment 1, an interconnect 44, an interlayer insulating film 47, a plug 50 and an interconnect 52 are formed to fabricate the semiconductor integrated circuit device of Embodiment 5.

In this Embodiment 5, the capacitor element C1 formed in the undermost interconnect layer or plug layer was described, but it may be formed in the upper layer.

Figure 61:
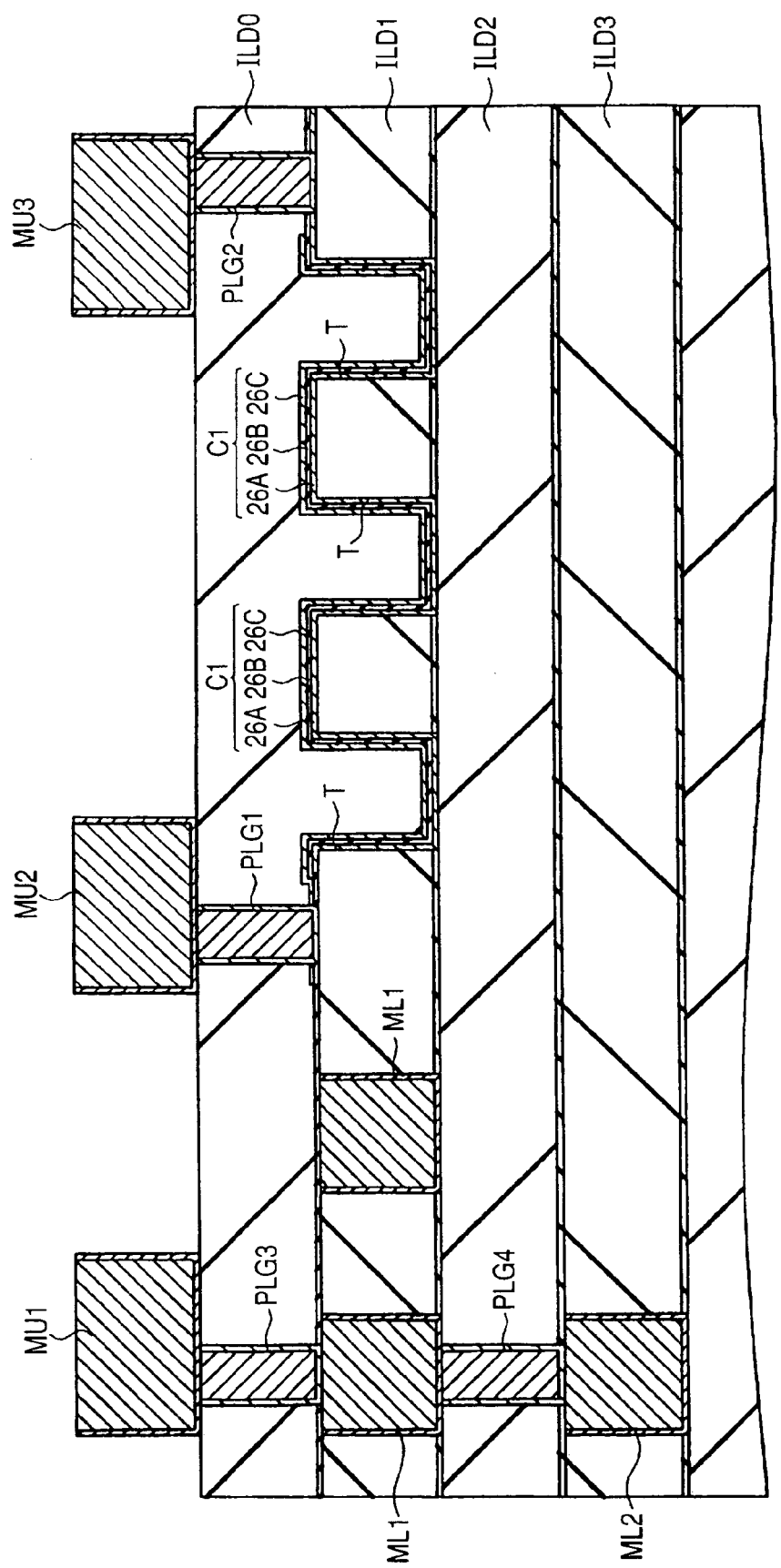
FIG. 61 is a fragmentary cross-sectional view of another example of the semiconductor integrated circuit device according to Embodiment 5 of the present invention during its manufacture.
Figure 62:
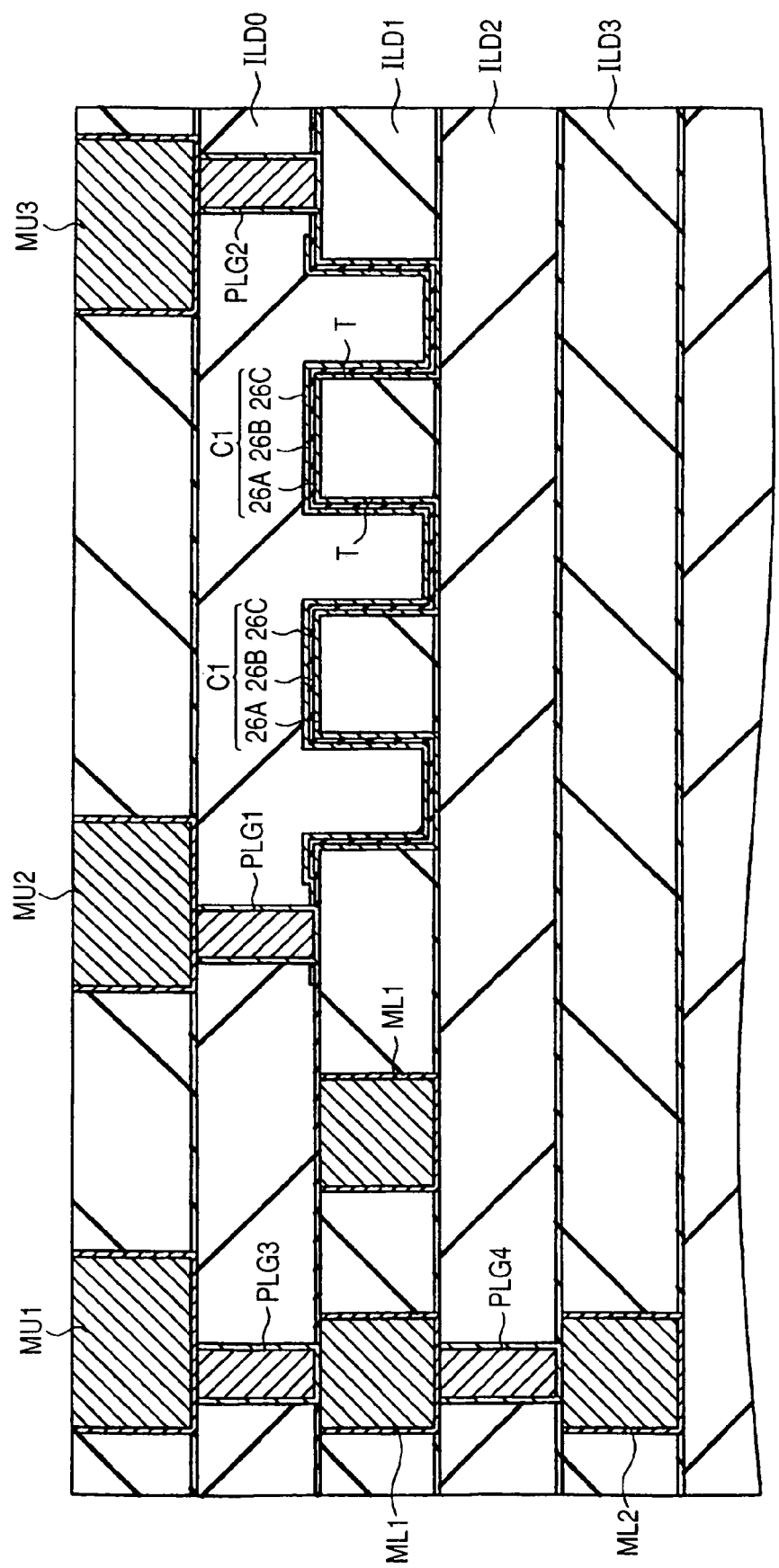
FIG. 62 is a fragmentary cross-sectional view of a further example of the semiconductor integrated circuit device according to Embodiment 5 of the present invention during its manufacture.

FIGS. 61 and 62 each illustrates the capacitor element C1 formed in an interconnect layer near the top layer (the second top layer). In FIG. 61, uppermost-level interconnects MU1, MU2,MU3 having Al (aluminum) as a main conductive layer are illustrated, while in FIG. 62, the uppermost-level interconnects MU1,MU2,MU3 are formed by filling, in an interconnect groove formed in the insulating film, a conductive material having Cu (copper) as a main conductive material. In FIGS. 61 and 62, interconnect layers ML1,ML2 below the uppermost-level interconnects MU1,MU2,MU3 are formed by (damascene method) filling, interconnect grooves formed in the interlayer insulating films ILD1,ILD3, with a conductive material having Cu or W as a main conductive layer by, for example, CMP, and plugs PLG1 to PLG4 are formed in these interconnect layers by filling, in connecting holes formed in interlayer insulating films ILD0,ILD2, a conductive material having Cu or W as a main conductive layer by, for example, CMP.

The capacitor element C1 is formed in a plurality of grooves (second openings) T formed in the interlayer insulating film ILD1 which is on the same level with the underlying interconnect layer ML1. It has, similar to the capacitor element of FIG. 59, a lower electrode (titanium nitride film 26A), an insulator (silicon nitride film 26B) and an upper electrode (titanium nitride film 26C). The groove (second opening) T is formed as illustrated in FIG. 38 or 39 of Embodiment 3.

In this manner, the lower electrode (titanium nitride film 26A) of the capacitor element C is formed over the bottom and circumference of the sidewall of a plurality of the grooves (second openings) T and at the same time, constitutes a capacitance, together with the upper electrode (titanium nitride film 26C) of the capacitor element C via the dielectric film (silicon nitride film 26B) of the capacitor element C. This makes it possible to heighten the capacitance, because the bottom and circumference of the sidewall of the grooves (second openings) T can be used as a capacitance area.

The uppermost-level interconnect MU2 is electrically connected to the upper electrode (titanium nitride film 26C) of the capacitor element C1 via the plug PLG1 having Cu or W (tungsten) as a main conductive layer, while the uppermost-level interconnect MU3 is electrically connected to the lower electrode (titanium nitride film 26A) of the capacitor element C1 via the plug PLG2 similar to PLUG1. The uppermost-level interconnect MU1 has electrical continuity with the underlying interconnect layers ML1,ML2 via plugs PLGs 3,4 having Cu or W as a main conductive layer. FIGS. 61 and 62 illustrate the interconnect layers ML1,ML2 that are formed by filling, in interconnect grooves formed in an insulating film, a conductive material having Cu or W as a main conductive layer. It is also possible to form them by using Al as a main conductive layer as the uppermost-level interconnects MU1,MU2,MU3 illustrated in FIG. 61. The interconnect MU2 may be formed by filling an interconnect with a conductive material having Cu or W as a main conductive layer.

By Embodiment 5, similar advantages to those of Embodiment 3 are available.

It is possible to apply the structure of the capacitor element C of Embodiment 4 to the capacitor element C1 of Embodiment 5, by which a greater capacitance can be attained.

Embodiment 6

Figure 63:
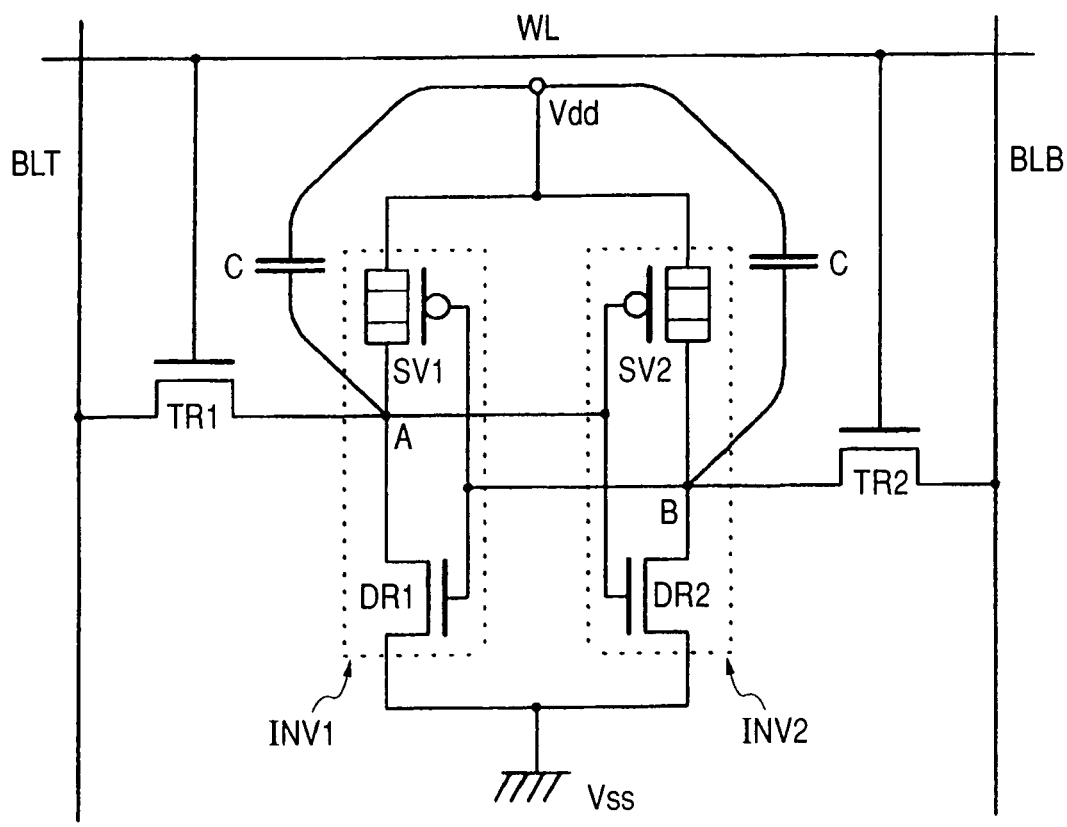
FIG. 63 is an equivalent circuit diagram of a memory cell of an SRAM according to Embodiment 6 of the present invention.
Figure 64:
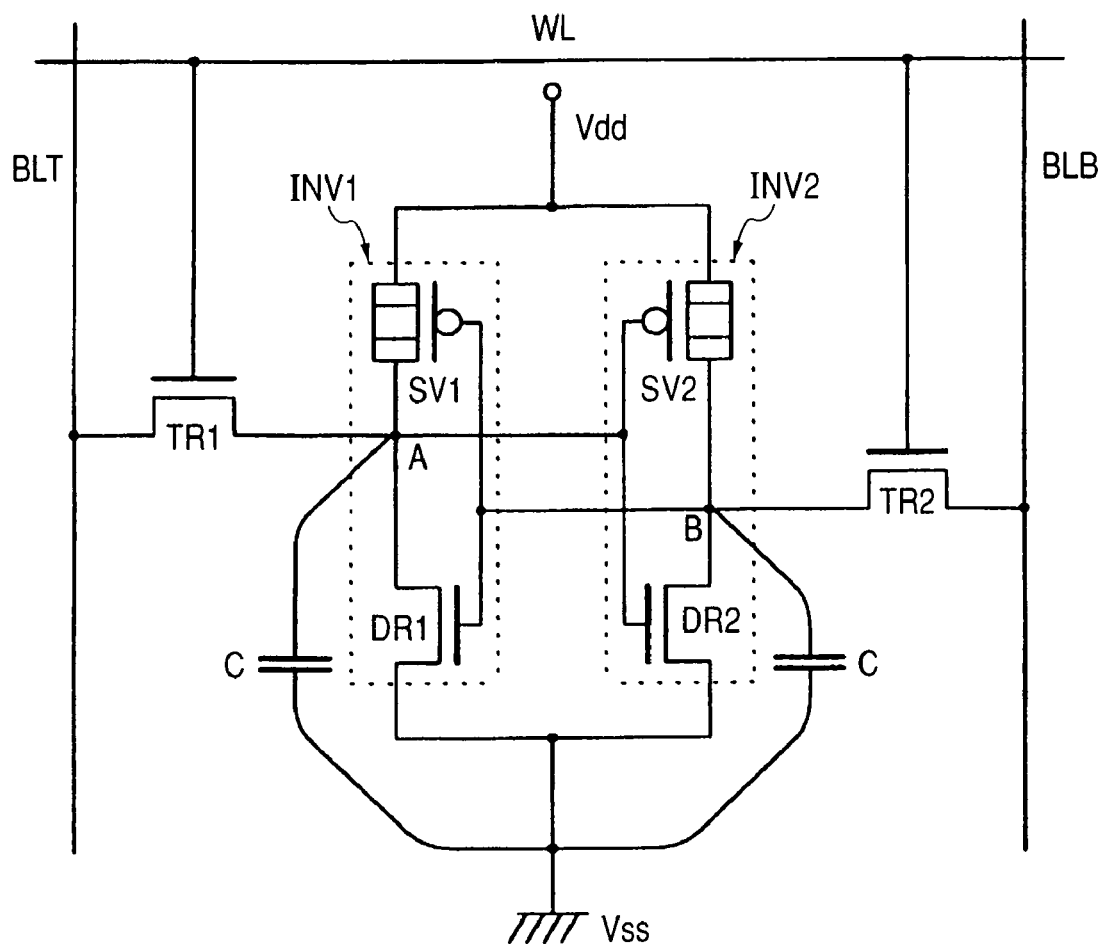
FIG. 64 is an equivalent circuit diagram of another memory cell of the SRAM according to Embodiment 6 of the present invention.
Figure 65:
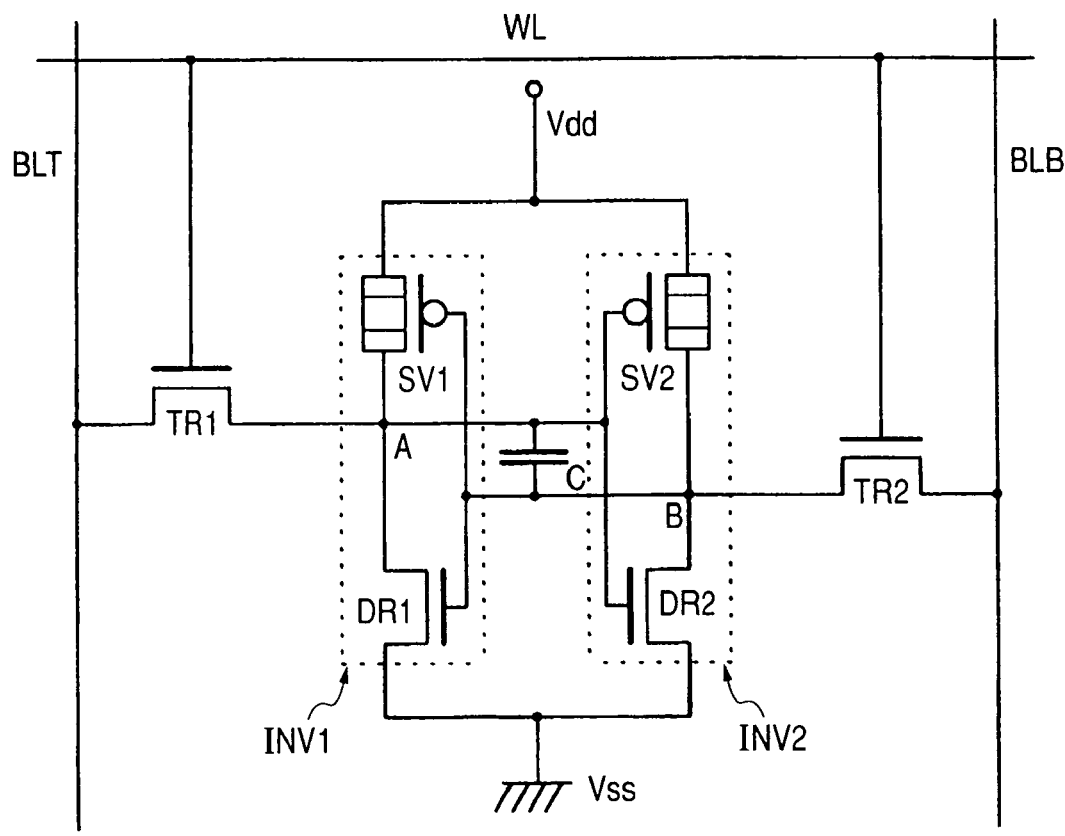
FIG. 65 is an equivalent circuit diagram of a further memory cell of the SRAM according to Embodiment 6 of the present invention.

FIGS. 63 to 65 are equivalent circuit diagrams of the memory cell of an SRAM according to Embodiment 6. As illustrated in FIGS. 63 to 65, the memory cell (MC) of this SRAM has two transfer MISFETs (TR1,TR2), two drive MISFETs (DR1,DR2) and two vertical MISFETs (SV1, SV2), each disposed at the intersections between a pair of complementary data lines (BLT,BLB) and a word line (WL).

Of the six MISFETs constituting the memory cell (MC), the two transfer MISFETs (TR1,TR2) and two drive MISFETs (DR1,DR2) are n channel type MISFETs, while the two vertical MISFETs (SV1,SV2) are p channel type MISFETs. These vertical MISFETs (SV1,SV2) correspond to load MISFETs of a known complete CMOS type SRAM, but in contrast to the ordinary load MISFET, they have a vertical structure, as will be described later, and, at the same time, they are disposed over the formation regions of the drive MISFETs (DR1,DR2) and transfer MISFETs (TR1,TR2).

The drive MISFET (DR1) and the vertical MISFET (SV1) of the memory cell (MC) constitute an inverter INV1, and the drive MISFET (DR2) and the vertical MISFET (SV2) constitute a second inverter INV2. These paired inverters INV1 and INV2 are cross-coupled in the memory cell (MC) and constitute a flip-flop circuit serving as an information storage portion for storing information of 1 bit.

More specifically, the drain of the drive MISFET (DR1), the drain of the vertical MISFET (SV1), the gate of the drive MISFET (DR2) and the gate of the vertical MISFET (SV2) are electrically connected to each other and constitute one storage node (A) of the memory cell, while the drain of the drive MISFET (DR2), the drain of the vertical MISFET (SV2), the gate of the drive MISFET (DR1) and the gate of the vertical MISFET (SV1) are electrically connected to each other and constitute the other storage node (B) of the memory cell.

One of the input/output terminals of the flip flop circuit is electrically connected to one of the source and drain of the transfer MISFET (TR1) and the other input/output terminal is electrically connected to one of the source and drain of the transfer MISFET (TR2). The other one of the source and drain of the transfer MISFET (TR1) is electrically connected to one data line BLT of the paired complementary data lines, and the other one of the source and drain of the transfer MISFET (TR2) is electrically connected to the other data line BLB of the paired complementary data lines. One end of the flip flop circuit, that is, the source of two vertical MISFETs (SV1, SV2), is electrically connected to a supply voltage line (Vdd) for feeding a supply voltage (Vdd) that is higher in potential than a reference voltage (Vss), for example, 3V. The other end of the flip flop circuit, that is, the source of each of the two drive MISFETs (DR1,DR2), is electrically connected to a reference voltage line (Vss) for feeding the reference voltage (Vss), for example, 0V. The gate electrode of each of the transfer MISFETs (TR1,TR2) is electrically connected to the word line (WL). The above-described memory cell (MC) stores data by turning one of a pair of storage nodes (A,B) High and the other one Low.

In the above-described circuit, a capacitor element C is connected between the storage nodes (A,B) and supply voltage (Vdd) (refer to FIG. 63), between the storage nodes (A,B) and reference voltage Vss (refer to FIG. 64), or between the storage nodes (A,B) (refer to FIG. 65). Such disposal of the capacitor element C makes it possible to increase the capacitance of the storage nodes (A,B) of the memory cell and prevent a lowering of the soft error resistance.

Retention, reading and writing operations of the information in the memory cell (MC) are essentially similar to those of a known complete CMOS SRAM. More specifically, upon reading of the information, a supply voltage (Vdd) is applied to a selected word line (WL) to turn the transfer MISFETs (TR1,TR2) ON and a potential difference between the pair of storage nodes (A,B) is read from the complementary data lines (BLT,BLB). Upon writing, a supply voltage (Vdd) is applied to a selected word line (WL) to turn the transfer MISFETs (TR1,TR2) ON and, at the same time, to connect one of the complementary data lines (BLT,BLB) to a supply voltage (Vdd) and the other one to a reference voltage (Vss), by which ON and OFF operations of the drive MISFETs (DR1,DR2) are inverted.

Based on FIGS. 66 to 95, a detailed structure of the SRAM according to Embodiment 6, as well as its manufacturing method, will be described next. In each cross-sectional view illustrating steps of the manufacturing method used in fabrication of the SRAM, a portion indicated by A,A is a cross-section of the memory cell taken along a line A-A of each related plan view, a portion indicated by B,B is a cross-section of the memory cell taken along a line B-B of each related plan view, a portion indicated by C,C is a cross-section of the memory cell taken along a line C-C of each related plan view and the other portion is a partial cross-section of a peripheral circuit region.

The peripheral circuit of the SRAM has an n channel MISFET and a p channel MISFET. These two MISFETs have a substantially similar structure except that their conductivity types are reverse relative to each other. In the diagrams, one conductivity type (p channel MISFET) is shown. In each plan view (plan view of a memory array), only main conductive layers constituting the memory cell and connected regions thereof are illustrated, but an insulating film formed between the conductive layers or the like is omitted in principle. In each plan view, a rectangular region surrounded by four marks (+) represents an occupied area of one memory cell. By the n channel and p channel MISFETs constituting the peripheral circuit, circuits such as an X decoder circuit, Y decoder circuit, sense amplifier circuit, input/output circuit and logic circuit are formed. Not only these circuits, but also logic circuits, such as a microprocessor and a CPU, may be formed.

Figure 66:
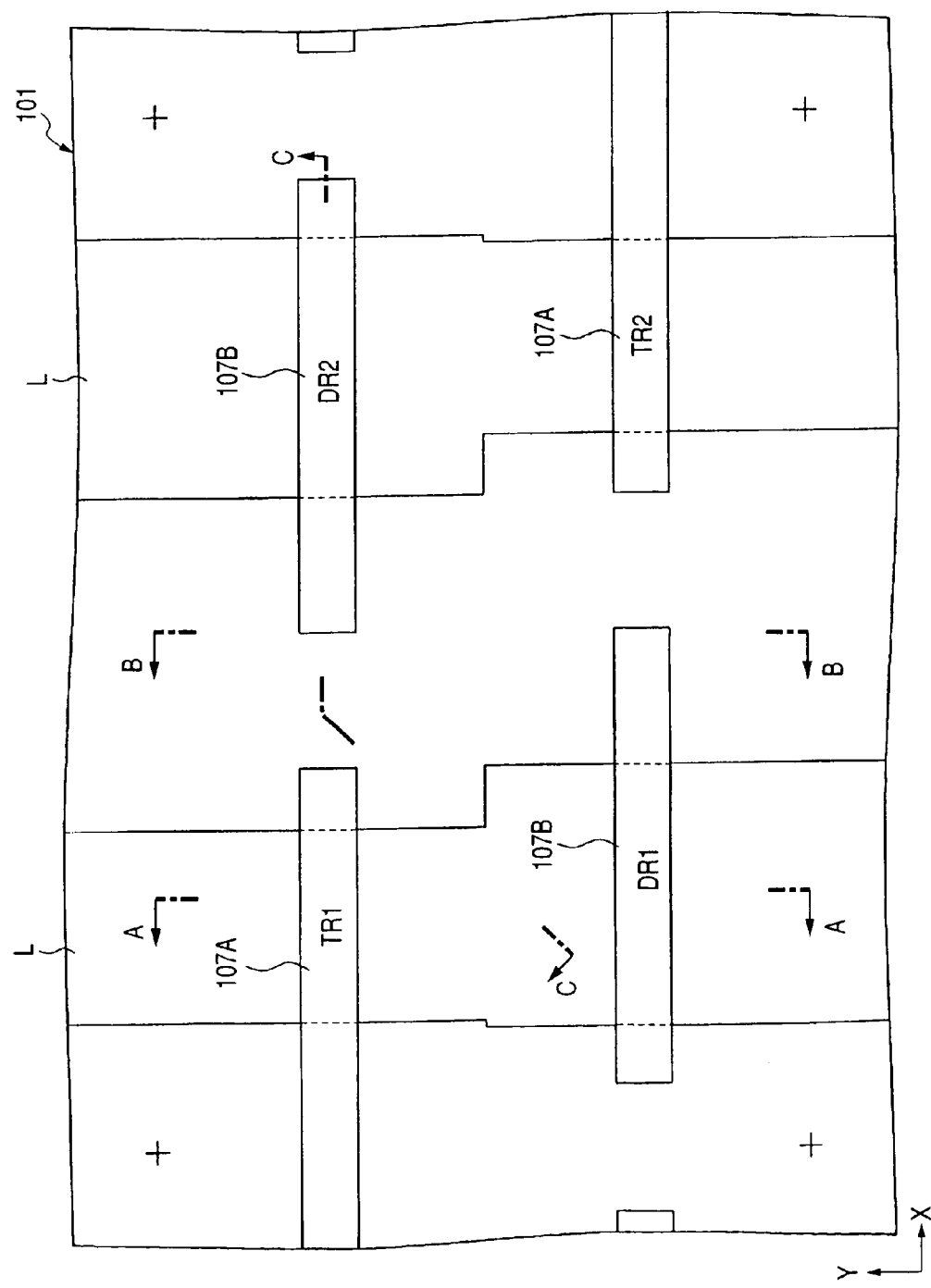
FIG. 66 is a fragmentary plan view illustrating a method of manufacture of the SRAM according to Embodiment 6 of the present invention.
Figure 67:
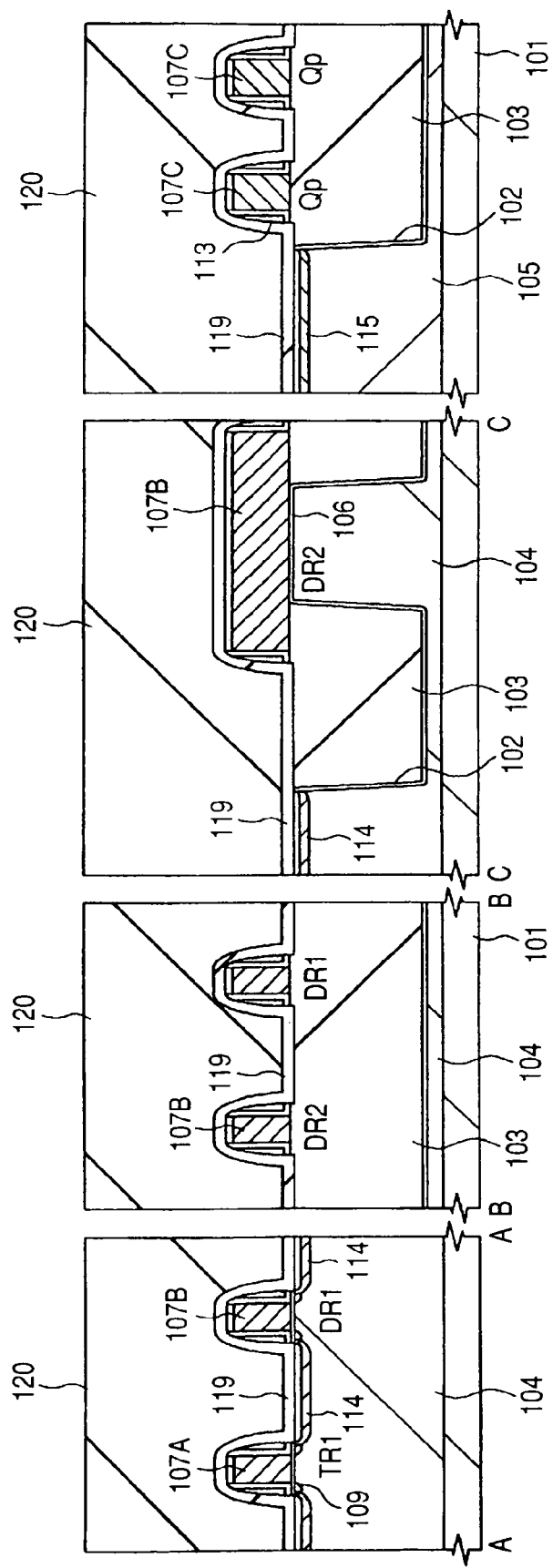
FIG. 67 is a fragmentary cross-sectional view showing a step in the manufacture of the SRAM according to Embodiment 6 of the present invention.

As illustrated in FIGS. 66 and 67, an isolation groove 102 is formed in an element isolation region over the main surface of a substrate 101 made of, for example, p type single crystal silicon. This isolation groove 102 is formed, for example, by dry etching the main surface of the substrate 101 to form a groove, depositing an insulating film, such as a silicon oxide film 103, over the substrate 101 including the inside of this groove by CVD, and polishing and removing an unnecessary portion of the silicon oxide film 103 outside the groove so as to leave the silicon oxide film 103 inside of the groove. By forming this isolation groove 102, an island-like active region (L) having its periphery defined by the isolation groove 102 is formed over the main surface of the substrate 101 of the memory array.

Then, phosphorus (P) is introduced into a portion of the substrate 101, while boron (B) is introduced into another portion, followed by heat treatment of the substrate 101 to diffuse these impurities in the substrate 101, by which a p type well 104 and an n type well 105 are formed in the main surface of the substrate 101. As illustrated in FIG. 66, not the n type well 105, but the p type well 104 is formed in the substrate 101 of the memory array region. In the substrate 101 of the peripheral circuit region, the n type well 105 and an unillustrated p type well are formed.

By thermal oxidation of the substrate 101, a gate insulating film 106, that is about 3 nm to 4 nm thick and is made of, for example, silicon oxide, is formed over the surface of each of the p type well 104 and n type well 105. Then, an n type polycrystalline silicon film is formed, as a conductive film, over the gate insulating film 106 of the p type well 104, while a p type polycrystalline silicon film is formed, as a conductive film, over the gate insulating film 106 of the n type well 105. A silicon oxide film is then deposited as a cap insulating film over each of the n type polycrystalline silicon film and p type polycrystalline silicon film by, for example, CVD.

The n type polycrystalline silicon film and p type polycrystalline silicon film are formed, for example, by depositing a non-doped polycrystalline silicon film (or amorphous silicon film) over the gate insulating film 106 by CVD, introducing phosphorus (or arsenic) into the non-doped polycrystalline silicon film (or amorphous silicon film) over the p type well 104 and boron into the non-doped polycrystalline silicon film (or amorphous silicon film) over the n type well 105.

By dry etching of the n type polycrystalline silicon film and p type polycrystalline silicon film, gate electrodes 107A, 107B, each made of an n type polycrystalline silicon film, are formed over the p type well 104 in the memory array and a gate electrode 107C made of a p type polycrystalline silicon film is formed over the n type well 105 in the peripheral circuit region. Over the p type well 104 in the peripheral circuit region, a gate electrode made of an n type polycrystalline silicon film is formed, but is not illustrated.

A gate electrode 107A constitutes the gate electrode of each of the transfer MISFETs (TR1,TR2), a gate electrode 107B constitutes the gate electrode of each of the drive MISFETs (DR1,DR2), and a gate electrode 107C constitutes the gate electrode of the p channel type MISFET of the peripheral circuit.

The gate electrodes 107A,107B,107C are formed, for example, by patterning the cap insulating film to have the same planar shapes as the gate electrodes 107A,107B,107C by dry etching using a photoresist film as a mask, and then dry etching the n type polycrystalline silicon film and p type polycrystalline silicon film using the patterned cap insulating film with a mask. Silicon oxide for the formation of the cap insulating film has a greater etching selectivity to polycrystalline silicon than to the photoresist so that the gate electrodes 107A,107B,107C having a minute gate length can be patterned with good accuracy compared with successive etching of the cap insulating film and polycrystalline silicon film using a photoresist film as a mask.

Into the p type well 104, phosphorus or arsenic is introduced as an n type impurity to form n⁻ type semiconductor regions 109 of a relatively low concentration, while boron is introduced into the n type well 105 as a p type impurity to form p⁻ type semiconductor regions (illustration is omitted) of a relatively low concentration. These n⁻ type semiconductor regions 109 are formed to impart the source and drain regions of each of the transfer MISFETs (TR1,TR2), drive MISFETs (DR1,DR2) and the n channel MISFET of the peripheral circuit with an LDD (Lightly Doped Drain) structure, while the p⁻ type semiconductor regions are formed to impart the source and drain regions of the p channel MISFET of the peripheral circuit with an LDD structure.

Over the sidewall of each gate electrode 107A,107B,107C, a sidewall spacer 113 made of an insulating film is formed. The sidewall spacer 113 is formed, for example, by depositing a silicon oxide film and a silicon nitride film over the substrate 101 by CVD, followed by anisotropic etching of these silicon nitride film and silicon oxide film. At this time, by etching the cap insulating film covering the upper surface of each of the gate electrodes 107A,107B,107C and the silicon oxide film (gate insulating film 106) over the surface of the substrate 101, the surface of each of the gate electrodes 107A,107B,107C and the surface of each of the n⁻ type semiconductor regions 109 and p⁻ type semiconductor regions are exposed.

Phosphorus or arsenic is then introduced as an n type impurity into the p type well 104 to form n⁺ type semiconductor regions 114 of a relatively high concentration, while boron is introduced into the n type well 105 as a p type impurity to form p⁺ type semiconductor regions 115 of a relatively high concentration. The n⁺ type semiconductor regions 114 that are formed in the p type well 104 of the memory array constitute the source and drain of each of the transfer MISFETs (TR1,TR2) and the drive MISFETs (DR1, DR2), while the p⁺ type semiconductor regions 115 formed in the n type well 105 of the peripheral circuit region constitute the source and drain of the p channel type MISFET. Into an unillustrated p type well of the peripheral circuit region, phosphorus or arsenic is introduced as an n type impurity to form n⁺ type semiconductor regions of a relatively high concentration which constitute the source and drain of the n channel type MISFET.

A cobalt (Co) film is then deposited over the substrate 101 by sputtering. The substrate 101 is then heat treated to cause a silicide reaction on the interface between the Co film and the gate electrodes 107A,107B,107C and between the Co film and the substrate 101, followed by removal of an unreacted portion of the Co film by etching, by which a Co silicide layer which is a silicide layer is formed over the surface of the gate electrodes 107A,107B,107C and the surface of the source and drain (n⁺ type semiconductor region 114, p⁺ type semiconductor region 115). By the steps so far mentioned, the n channel type transfer MISFETs (TR1,TR2), and drive MISFETs (DR1,DR2) are formed in the memory array, while the p channel type MISFET (Qp) and n channel type MISFET (not illustrated) are formed in the peripheral circuit region.

As illustrated in FIG. 66, the transfer MISFET (TR1) and drive MISFET (DR1) are disposed so as to be separated from the transfer MISFET (TR2) and drive MISFET (DR2) in a lateral direction (X direction) in the diagram via an element isolation, and, at the same time, they are disposed so as to be point symmetrical relative to the central point of the memory cell formation region. The gate electrode 107B of each of the drive MISFET (DR2) and drive MISRFET (DR1) is disposed to extend in the lateral direction (X direction) of this diagram. In the X direction, the gate electrode 107B will have one terminal on the element isolation between the transfer MISFET (TR1) and drive MISFET (DR1) and between the transfer MISFET (TR2) and drive MISFET (DR1). Over this end, each of the vertical MISFETs (SV1,SV2), which will be described later, is formed.

A silicon nitride film 119 and a silicon oxide film 120 are deposited as an insulating film covering MISFETs (TR1, TR2,DR1,DR2,Qp) by, for example, CVD, followed by planarization of the surface of the silicon oxide film 120 by chemical mechanical polishing.

Figure 68:
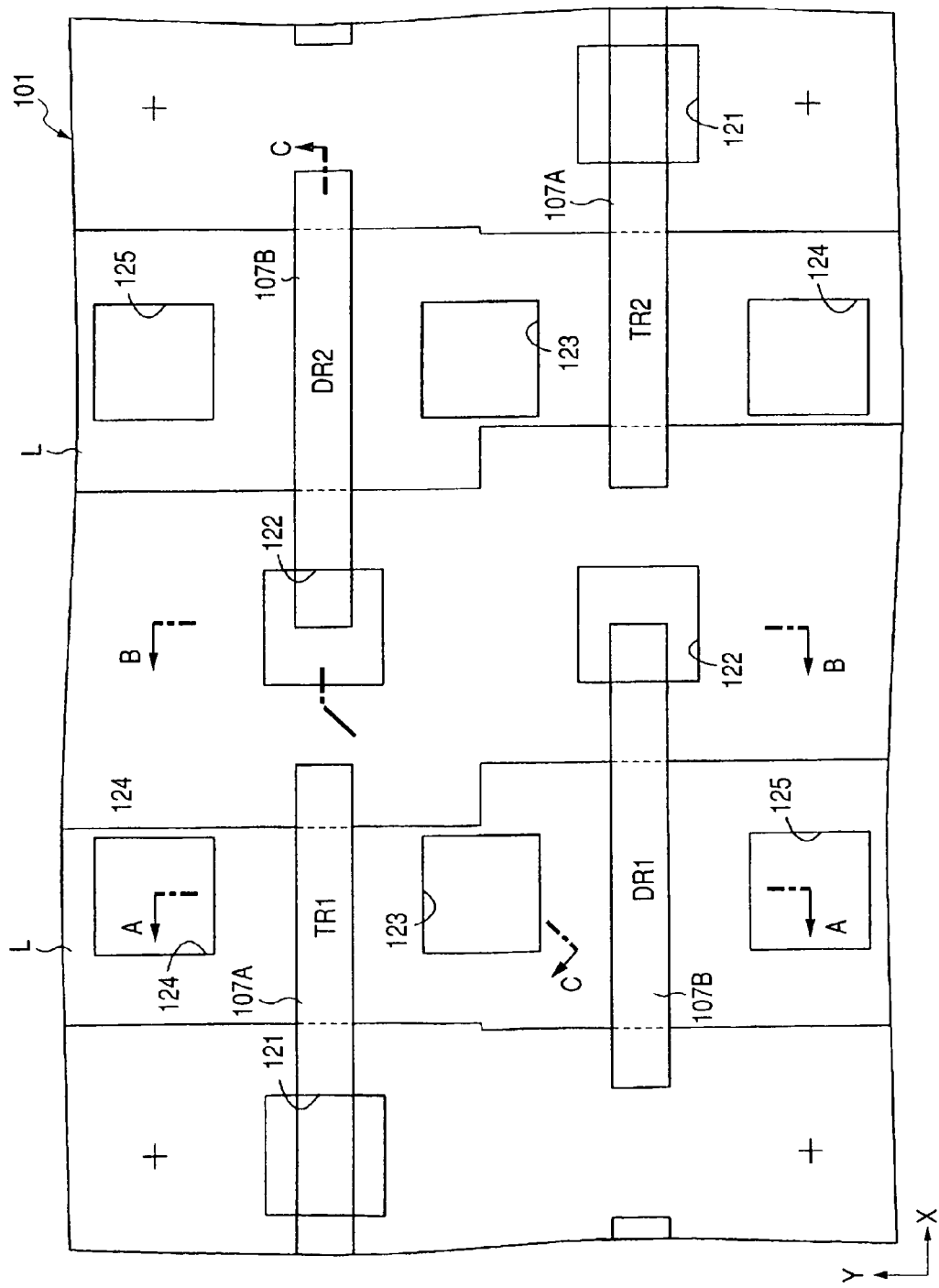
FIG. 68 is a fragmentary plan view of the SRAM during a manufacturing step following that shown in FIG. 66.
Figure 69:
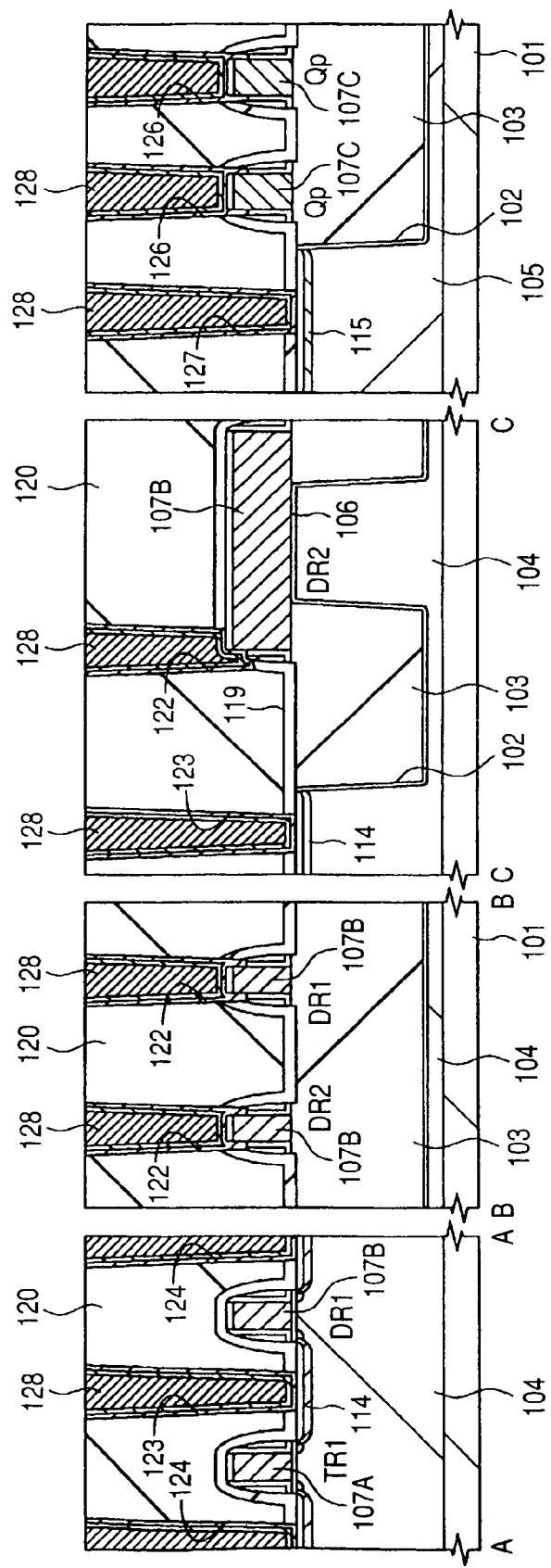
FIG. 69 is a fragmentary cross-sectional view of the SRAM during a manufacturing step following that shown in FIG. 67.

As illustrated in FIGS. 68 and 69, using a photoresist film as a mask, the silicon oxide film 120 and the silicon nitride film 119 are dry etched to form a contact hole 121 over the gate electrode 107A of the transfer MISFETs (TR1,TR2), a contact hole 122 over the gate electrode 107B of the drive MISFETs (DR1,DR2), contact holes 123,124,125 over the source and drain (n⁺ type semiconductor regions 114) of each of the transfer MISFETs (TR1,TR2) and drive MISFETs (DR1,DR2), and contact holes 126 and 127 over each of the gate electrode 107C and the source and drain (p⁺ type semiconductor regions 115) of the p channel type MISFET (Qp) of the peripheral circuit region.

Inside of the contact holes 121 to 127, a plug 128 is formed. This plug 128 is formed, for example, by depositing a titanium (Ti) film and a titanium nitride (TiN) film over the silicon oxide film 120 including the insides of the contact holes 121 to 127 by sputtering, depositing a TiN film and, as a metal film, a tungsten (W) film by CVD and then removing the W film, TiN film and Ti film outside the contact holes 121 to 127 by CMP.

Figure 70:
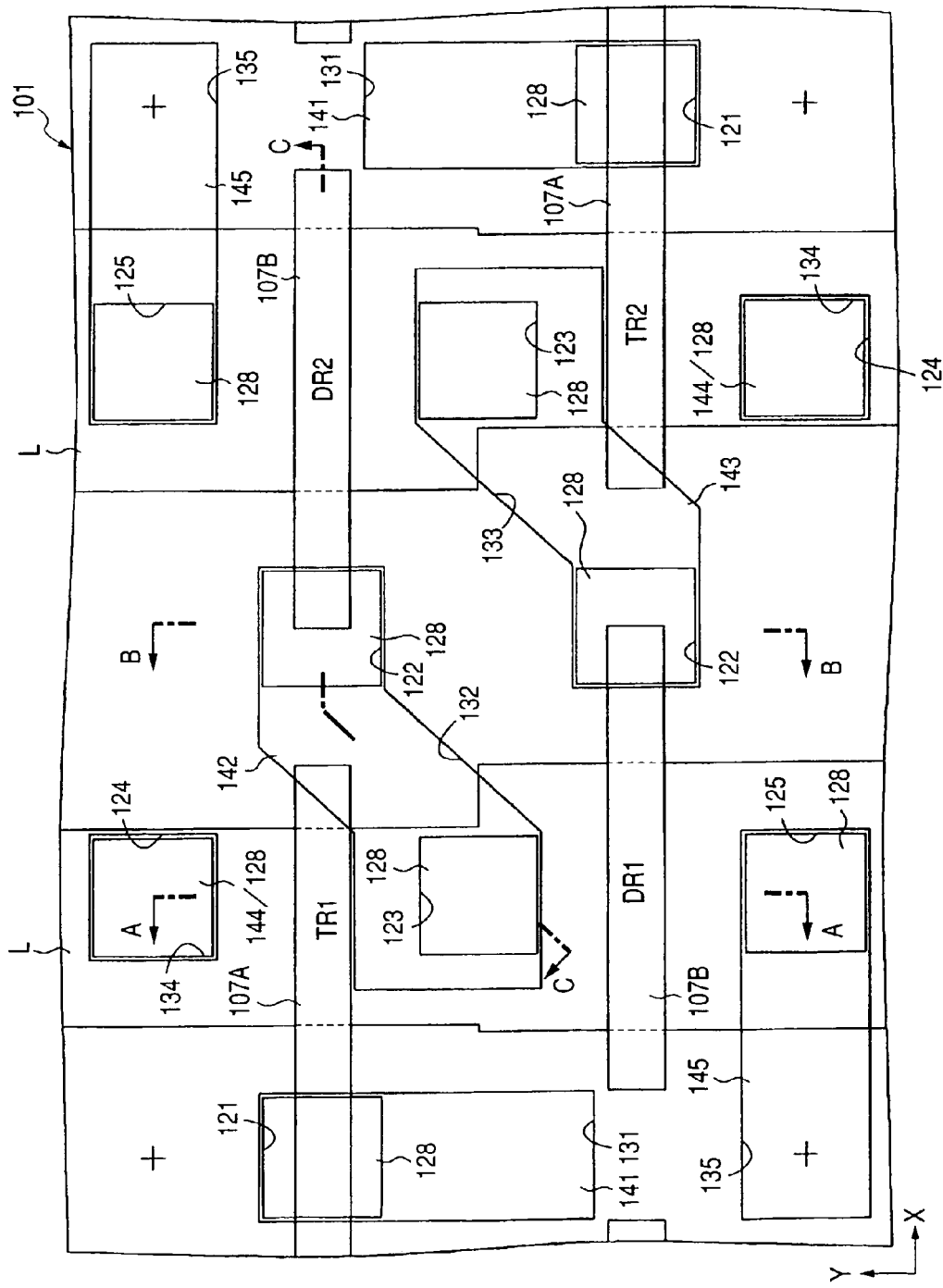
FIG. 70 is a fragmentary plan view of the SRAM during a manufacturing step following that shown in FIG. 68.
Figure 71:
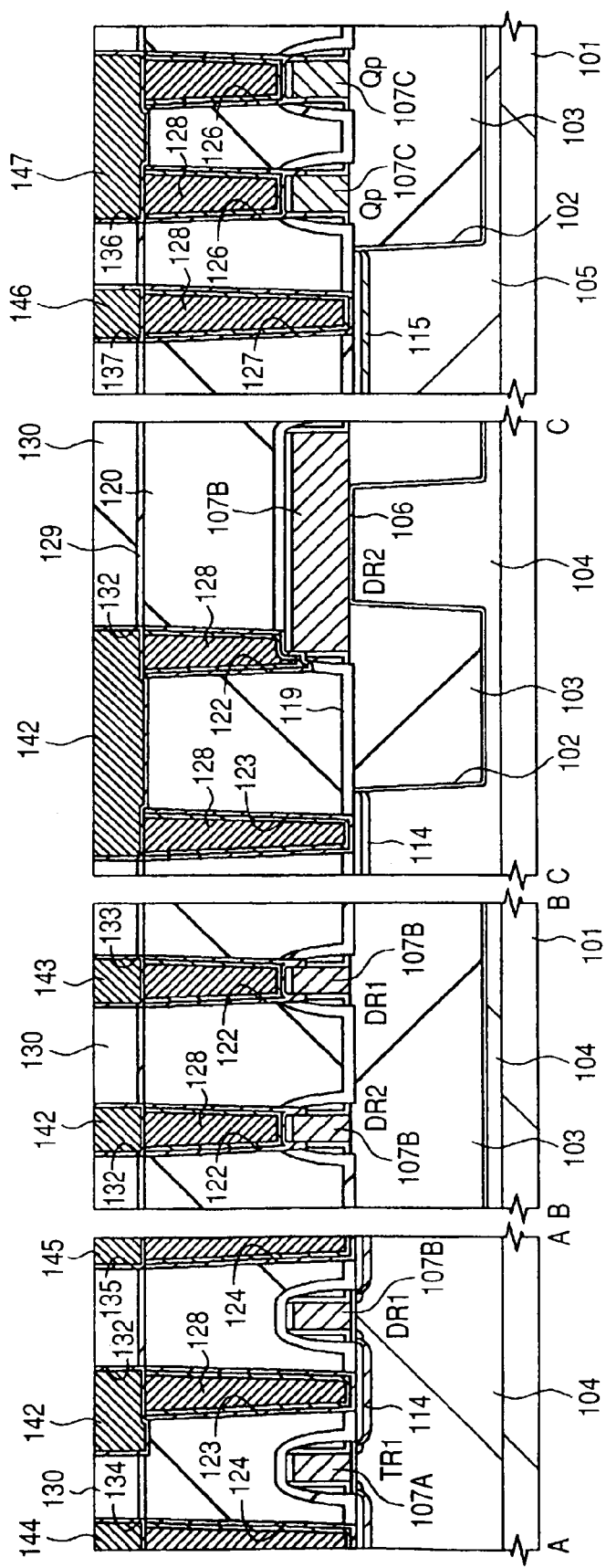
FIG. 71 is a fragmentary cross-sectional view of the SRAM during a manufacturing step following that shown in FIG. 69.

As illustrated in FIGS. 70 and 71, after deposition of a silicon nitride film 129 and a silicon oxide film 130 over the substrate 101 as an insulating film by CVD, the silicon oxide film 130 and silicon nitride film 129 are dry etched using a photoresist film as a mask to form grooves 131 to 137 over the contact holes 121 to 127, respectively. Of these grooves 131 to 137, the grooves 132 and 133 formed in the memory array are formed to extend over both the contact hole 122 and the contact hole 123, as illustrated in FIG. 70.

Intermediate conductive layers 141 to 145 are formed inside of the grooves 131 to 135 that are formed in the memory array, respectively, and first-level interconnects 146 and 147 are formed inside of the grooves 136 and 137 that are formed in the peripheral circuit region, respectively. The intermediate conductive layers 141 to 145 and first-level interconnects 146 and 147 are formed, for example, by depositing a TiN film over the silicon oxide film 130 including the insides of the grooves 131 to 137 by sputtering, followed by deposition of a W film as a metal film by CVD. Then, the W film and TiN film outside the grooves 131 to 137 are removed by CMP.

Of the intermediate conductive layers 141 to 145 that are formed in the memory array, the intermediate conductive layer 141 is used for electrically connecting the gate electrode 107A of each of the transfer MISFETs (TR1,TR2) to a word line (WL) which will be formed later. The intermediate conductive layer is used for electrically connecting the n⁺ type semiconductor region 114 (one of the source and drain) of each of the transfer MISFETs (TR1,TR2) to the complementary data lines (BLT,BLT). The intermediate conductive layer 145 is used for electrically connecting the n⁺ type semiconductor region 114 (source) of each of the drive MISFETs (DR1,DR2) to a reference voltage line (Vss) which will be formed later.

One (intermediate conductive layer 142) of a pair of the intermediate conductive layers 142 and 143 formed almost at the center part of each memory cell region is used as a local interconnect for electrically connecting the n⁺ type semiconductor region 114 constituting one of the source and drain of the transfer MISFET (TR1) and drain of the drive MISFET (DR1), the gate electrode 107B of the drive MISFET (DR2) and a lower semiconductor layer (drain) of the vertical MISFET (SV1) which will be formed later. The other layer (intermediate conductive layer 143) is used as a local interconnect for electrically connecting the n$^+$ type semiconductor region 114 constituting one of the source and drain of the transfer MISFET (TR2) and drain of the drive MISFET (DR2), gate electrode 107B of the drive MISFET (DR1) and a lower semiconductor layer (drain) of the vertical MISFET (SV2) which will be formed later.

The intermediate conductive layers 141 to 145 are each made of a metal film, such as a W film. This makes it possible to reduce the number of manufacturing steps in the fabrication of the SRAM and the number of masks used therefor, because metal interconnects (first-level interconnects 146 and 147) of the peripheral circuit can be formed simultaneously with the formation of the intermediate conductive layers 141 to 145.

Figure 72:
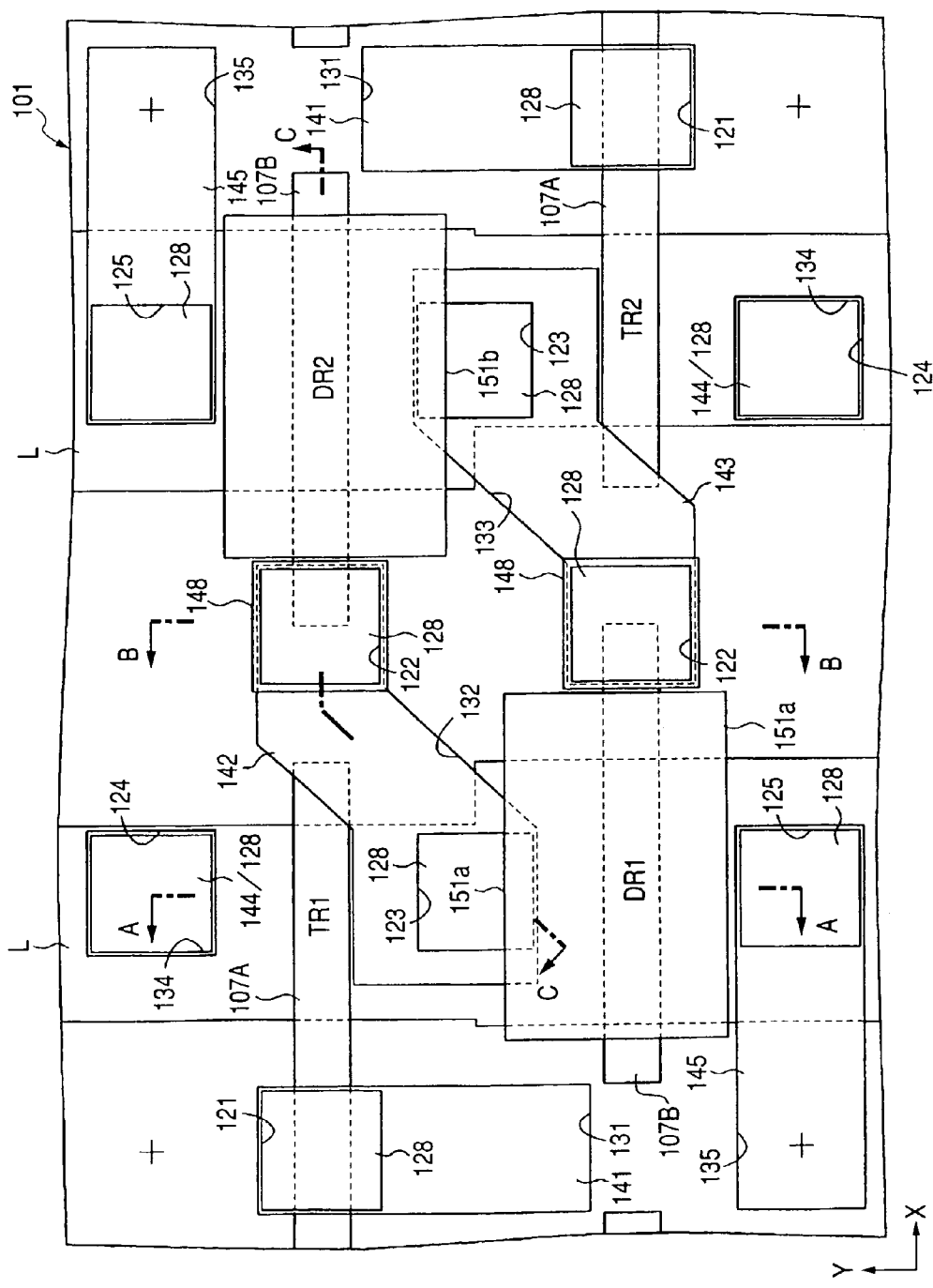
FIG. 72 is a fragmentary plan view of the SRAM during a manufacturing step following that shown in FIG. 70.
Figure 73:
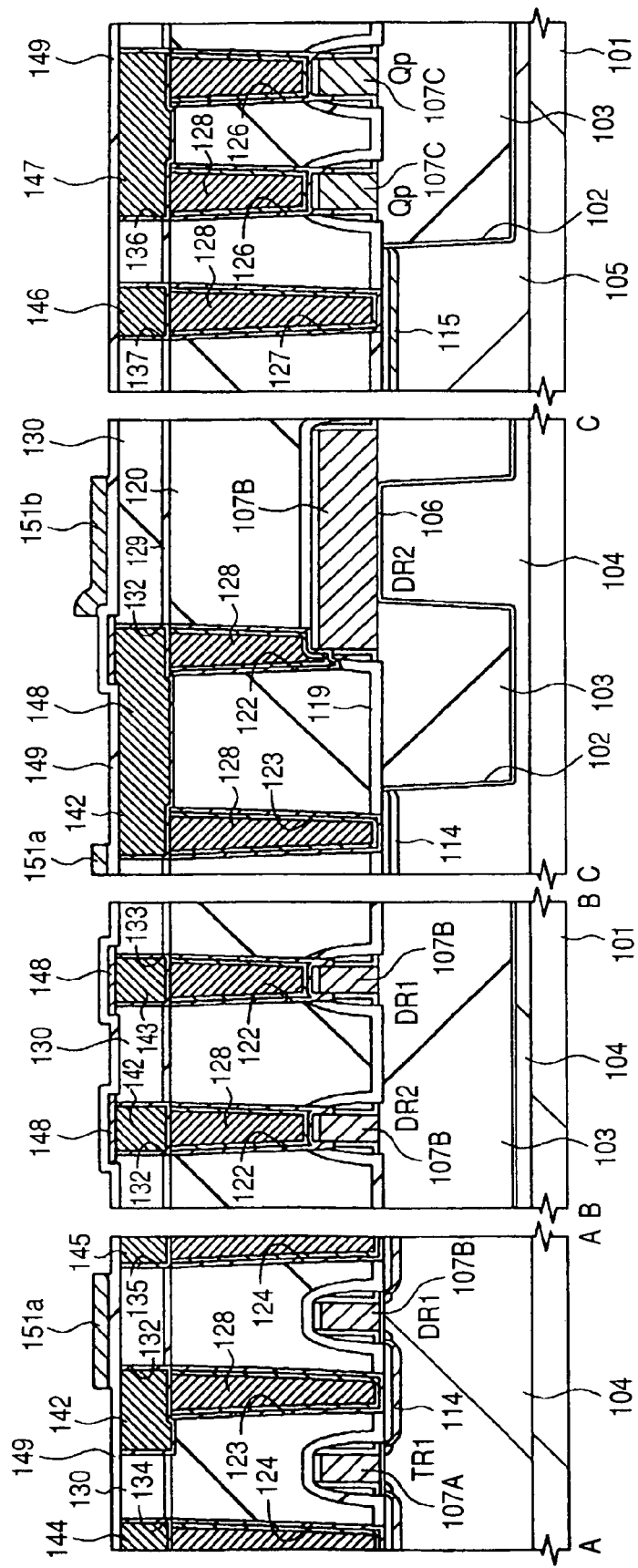
FIG. 73 is a fragmentary cross-sectional view of the SRAM during a manufacturing step following that shown in FIG. 71.

As illustrated in FIGS. 72 and 73, a barrier layer 148 is formed over the surface of each of the intermediate conductive layers 142 and 143. This barrier layer 148 is formed mainly in a region, of the surface region of the intermediate conductive layers 142 and 143, existing below a region in which the vertical MISFETs (SV1,SV2) are formed. The barrier layer 148 is formed by depositing a WN film over the substrate 101 by sputtering and then patterning the WN film by dry etching using a photoresist film as a mask. In such a manner, the barrier layer 148, which is capable of preventing occurrence of an undesired silicide reaction on the interface between the silicon film and the intermediate conductive layers 142 and 143 is interposed between the silicon film and the W film constituting the intermediate conductive layers 142 and 143.

The barrier layer 148 may not only be made of the WN film, a Ti film, and a TiN film, but also of a laminate of WN and W films, or a laminate of TiN and W films. The thin Ti-based film features better adhesion with a silicon oxide film than the WN film. The WN film, on the other hand, is immobilized easily by oxidation so that it is unlikely to contaminate apparatuses and can be handled conveniently. The film can be selected, depending on which is important, adhesion or convenience. When a barrier film is required in a step with less fear of fluctuations in the properties of the MISFET even if a thin Ti film is re-deposited on the substrate 101 as an interconnect formation step after the formation of MISFET, use of not a WN film, but a thin Ti-based film is recommended.

By constituting the intermediate conductive layers 142 and 143 from a metal film such as tungsten (W) and forming a vertical MISFET made of a silicon film over the intermediate conductive layers 142 and 143 via the barrier layer 148, the connection resistance between MISFETs can be lowered, the properties of the memory cell can be improved and the memory size can be reduced. Instead of forming the barrier layer 148, the surface of the intermediate conductive layers 142 and 143 made of tungsten may be nitrided into tungsten nitride. Then, a mask for the formation of the barrier layer 148 becomes unnecessary.

After deposition of a silicon nitride film 149 over the substrate 101 by CVD, a polycrystalline silicon film (or amorphous silicon film) is deposited over the silicon nitride film 149 by CVD. This silicon nitride film 149 is used as an etching stopper film, upon etching of a silicon oxide film to be deposited over the silicon nitride film 149 in a later step, for preventing etching of the underlying silicon oxide film 130 (refer to FIG. 71). Upon or after formation of the polycrystalline silicon film, boron is doped thereinto in order to match its conductivity type with that of the polycrystalline silicon film constituting the gate electrode of the vertical MISFETs (SV1,SV2) which will be formed later.

By dry etching using a photoresist film as a mask, the polycrystalline silicon film is patterned to form a pair of gate extraction electrodes 151a,151b over the silicon nitride film 149. The gate extraction electrodes 151a,151b are disposed in a region adjacent to the vertical MISFETs (SV1,SV2) which will be formed later, and they are used for connecting the gate electrode of each of the vertical MISFETs (SV1,SV2) to the transfer MISFETs (TR1,TR2) and drive MISFETs (DR1, DR2) which lie therebelow.

Figure 74:
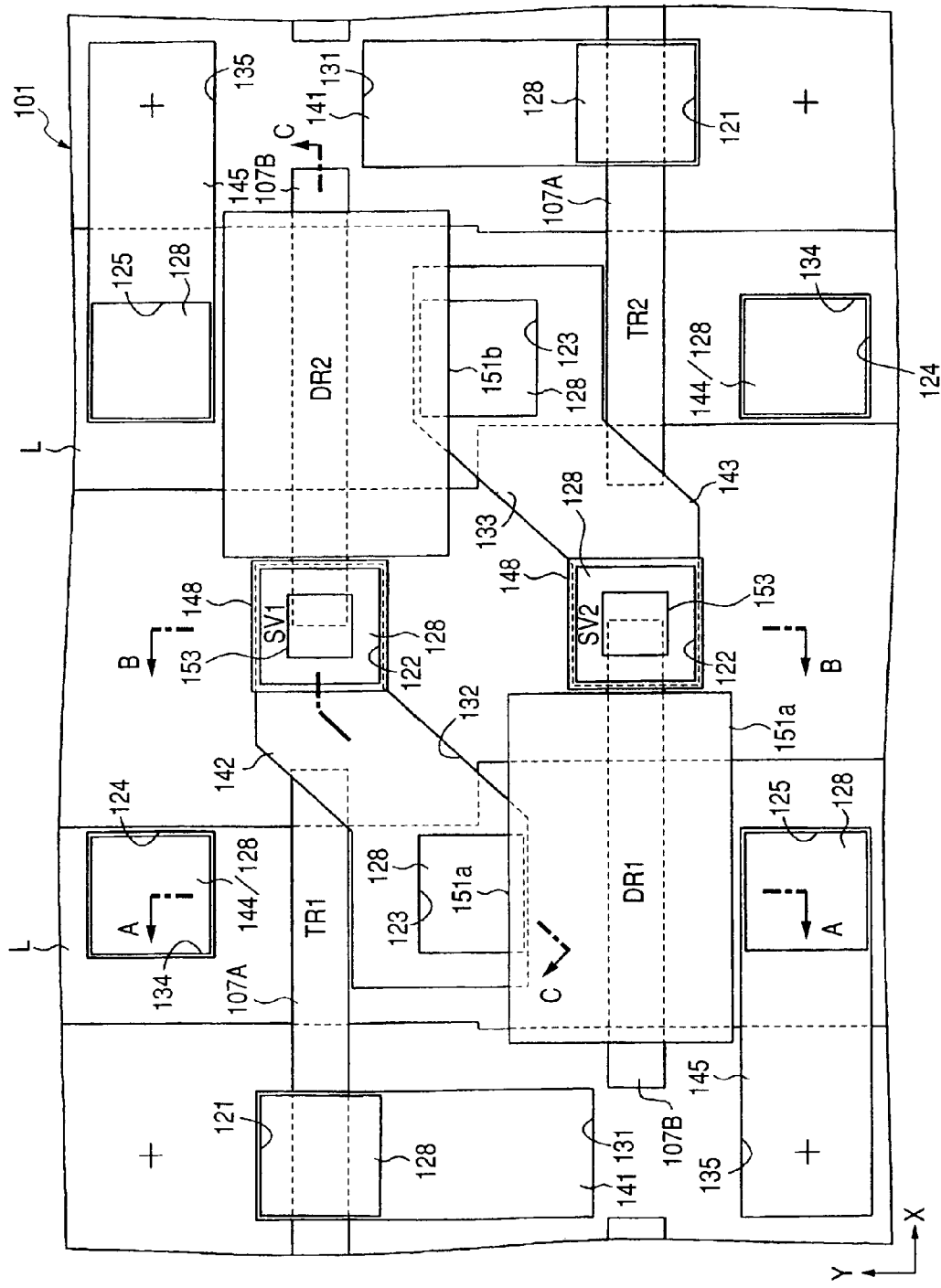
FIG. 74 is a fragmentary plan view of the SRAM during a manufacturing step following that shown in FIG. 72.
Figure 75:
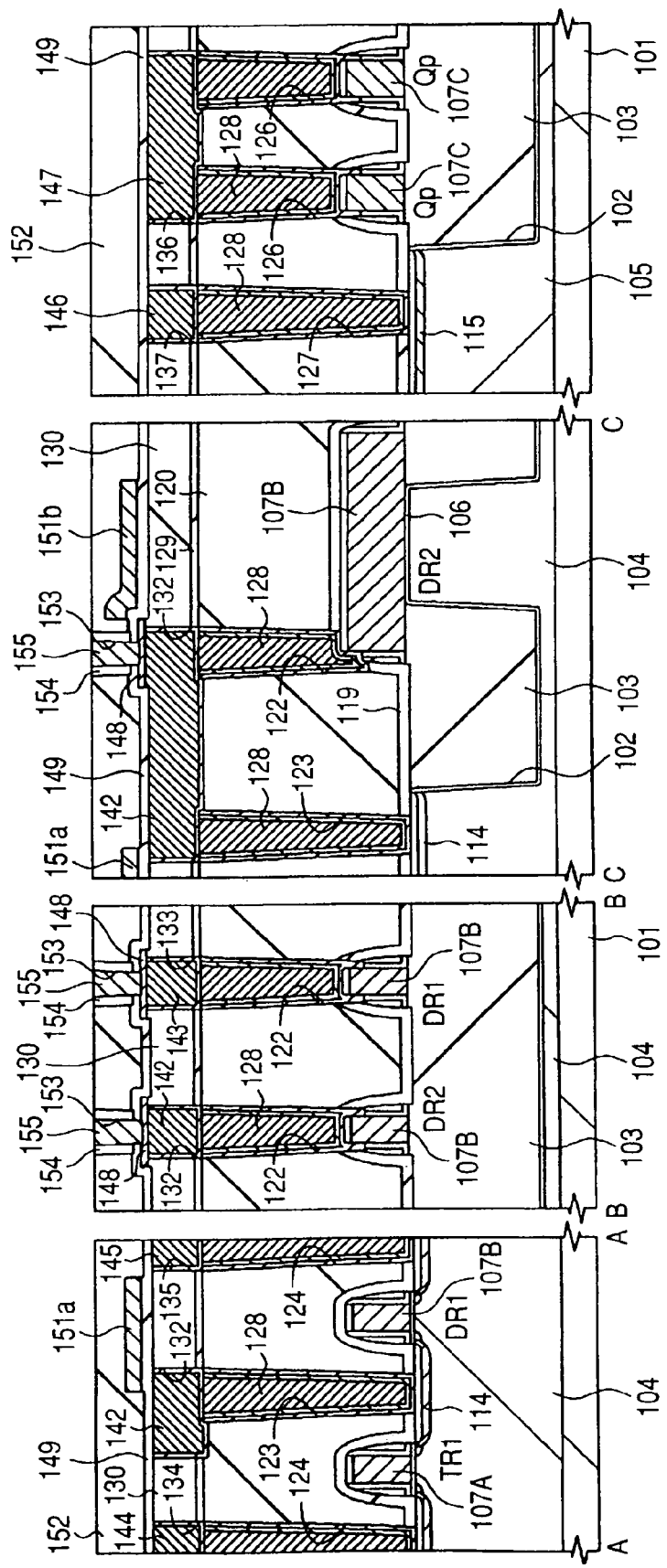
FIG. 75 is a fragmentary cross-sectional view of the SRAM during a manufacturing step following that in shown FIG. 73.

As illustrated in FIGS. 74 and 75, a silicon oxide film 152 is deposited, as an insulating film, over the silicon nitride film 148 by CVD to cover the gate extraction electrodes 151a, 151b. Using a photoresist film as a mask, the silicon oxide film 152 is dry etched to form a through-hole 153 in the silicon oxide film 152 in an upper region of the barrier layer 148, that is, in a region in which the vertical MISFETs (SV1, SV2) are formed.

Then, a sidewall spacer 154 made of an insulating film are formed over the sidewall of the through-hole 153. The sidewall spacer 154 is formed by depositing a silicon oxide film over the silicon oxide film 152 including the inside of the through-hole 153 by CVD and then anisotropically etching the silicon oxide film to leave it over the sidewall of the through-hole 153. At this time, the etching of the silicon oxide film is followed by etching of the silicon nitride film 149 on the bottom of the through-hole 153 to expose the barrier layer 148 from the bottom of the through-hole 153.

By reducing the diameter of the through-hole 153 by forming the sidewall spacer 154 made of an insulating film over the sidewall, the through-hole 153 has a smaller size than that of the barrier layer 148 as illustrated in FIG. 74. Even if the position of the through-hole 153 deviates from the barrier layer 148, owing to misalignment of the photomask, only the barrier layer 148 can be exposed from the bottom of the through-hole 153, making it possible to maintain a contact area between the barrier layer 148 and a plug to be formed inside of the through-hole 53 in the subsequent step.

A plug 155 is then formed inside of the through-hole 153. This plug 155 is formed by depositing a polycrystalline silicon film (or amorphous silicon film) over the silicon oxide film 152 including the inside of the through-hole 153 by CVD and then removing the polycrystalline silicon film (or amorphous silicon film) outside the through-hole 153 by CMP (or etch back). In order to match the conductivity type of the polycrystalline silicon film (amorphous silicon film) constituting the plug 155 with that of a polycrystalline silicon film constituting a lower semiconductor layer of the vertical MISFETs (SV1,SV2) which will be formed later, boron is doped upon or after film formation.

The plug 155 formed inside of the through-hole 153 is electrically connected, via the barrier layer 148, to the underlying intermediate conductive layers 142 and 143. It is possible to prevent occurrence of an undesired silicide reaction on the interface between the plug 155 and intermediate conductive layers 142 and 143 by interposing the barrier layer 148 made of a WN film between the polycrystalline silicon film (or amorphous silicon film) constituting the plug 155 and the W film constituting the intermediate conductive layers 142 and 143. As an alternative to making the plug 155 of a polycrystalline silicon film (or amorphous silicon film), it may be made of tungsten, followed by conversion into tungsten nitride by nitriding treatment. This makes it possible to omit a mask for the formation of the barrier layer 148.

Figure 76:
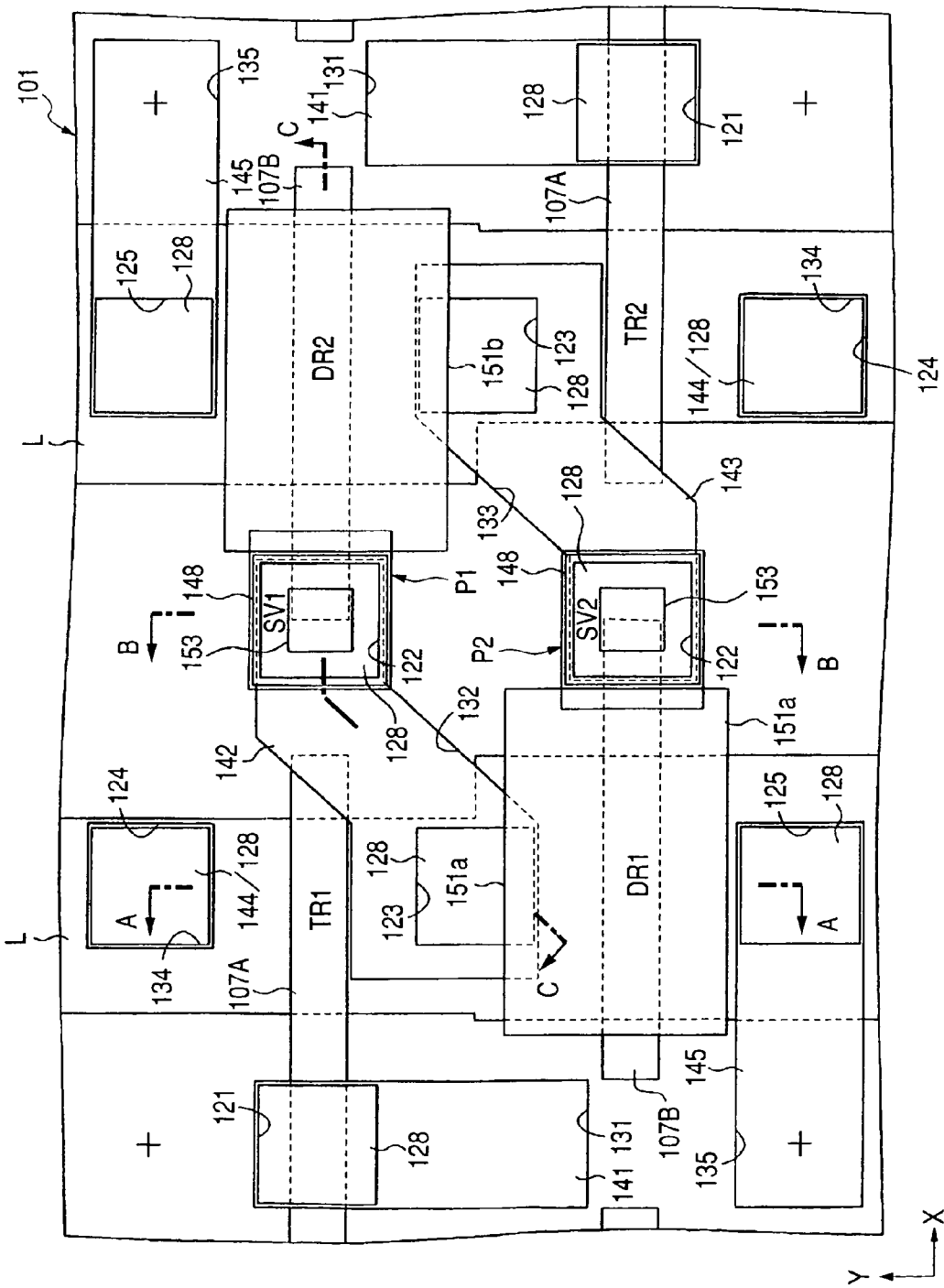
FIG. 76 is a fragmentary plan view of the SRAM during a manufacturing step following that shown in FIG. 74.
Figure 77:
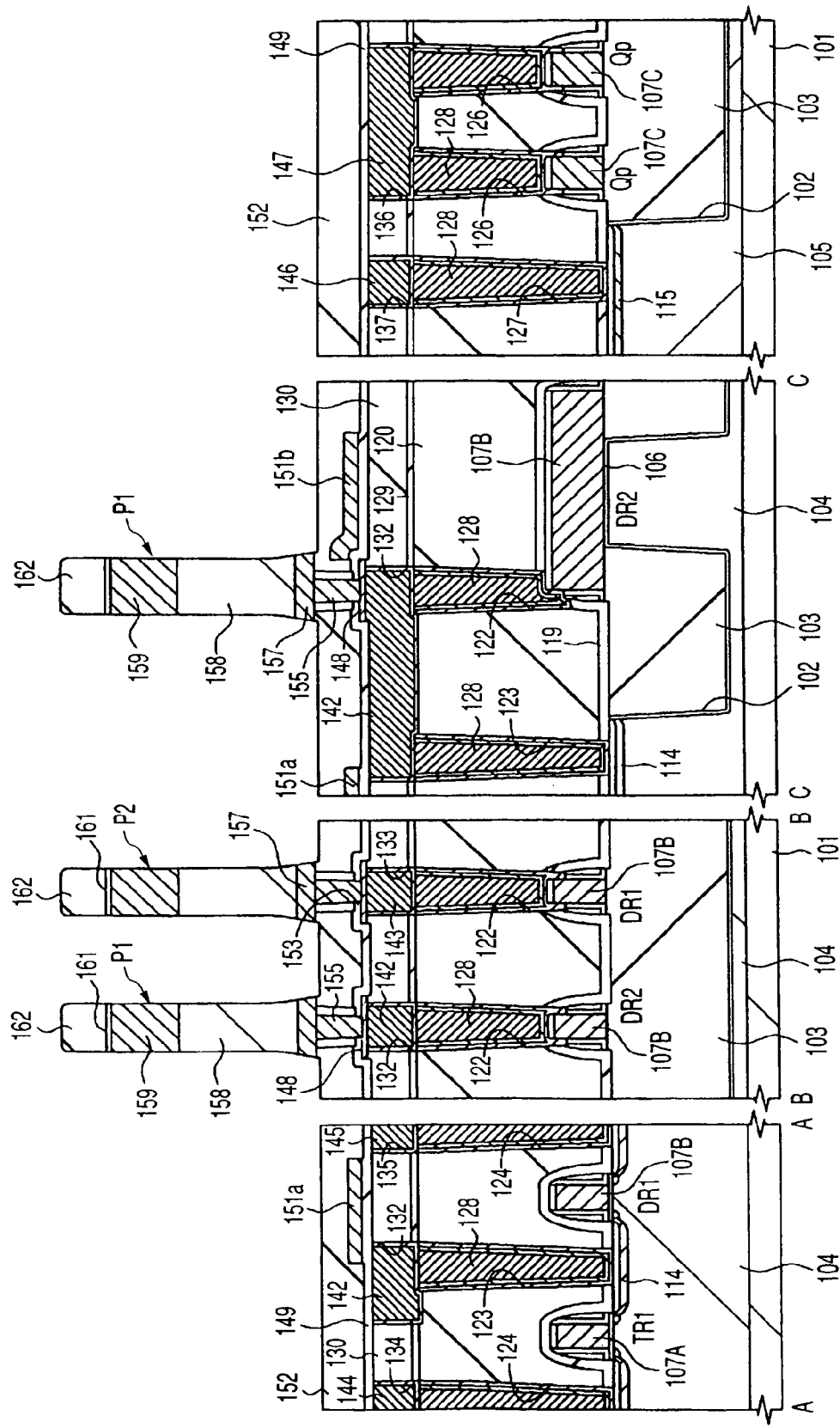
FIG. 77 is a fragmentary cross-sectional view of the SRAM during a manufacturing step following that shown in FIG. 75.

As illustrated in FIGS. 76 and 77, a p type silicon film 157, a silicon film 158 and a p type silicon film 159 are successively deposited over the silicon oxide film 152. These three silicon film layers (157,158,159) are formed in the following manner. An amorphous silicon film doped with boron and a non-doped amorphous silicon film are deposited successively by CVD, followed by heat treatment of these amorphous silicon films so as to crystallize the same to form the p type silicon film 157 and silicon film 158. After introduction, into the silicon film, of an n type or p type impurity for the channel formation, an amorphous silicon film doped with boron is deposited over the resulting silicon film by CVD, followed by heat treatment to crystallize the amorphous silicon film, thereby to form the p type silicon film 159.

By crystallizing the amorphous silicon film to form these three silicon film layers (157,158,159), crystal grains in the film can be made greater than those of the polycrystalline silicon film, which brings about an improvement in the properties of the vertical MISFETs (SV1,SV2). Upon introduction of the channel forming impurity into the silicon film 158, it is possible to form a through insulating film made of a silicon oxide film over the surface of the silicon film 158 and then introduce the impurity through this through-insulating film. The amorphous silicon film may be crystallized upon a thermal oxidation step for the formation of a gate insulating film, which will be described later.

After successive deposition of a silicon oxide film 161 and a silicon nitride film 162 over the p type silicon film by CVD, the silicon nitride film 162 is dry etched using a photoresist film as a mask so as to leave the silicon nitride film 162 over a region in which the vertical MISFETs (SV1,SV2) are to be formed. This silicon nitride film 162 serves as a mask upon etching of the three silicon film layers (157,158,159). Since the etching selectivity of silicon nitride to silicon is greater than it is to the photoresist, three silicon film layers (157,158, 159) can be patterned with good accuracy compared with etching using the photoresist film as a mask.

Using the silicon nitride film 162 as a mask, the three silicon film layers (157,158,159) are dry etched to form laminates (P1,P2) in a square pole form, each having a lower semiconductor layer made of the p type silicon film 157, an intermediate semiconductor layer made of the silicon film 158 and an upper semiconductor layer made of the p type silicon film 159.

The p type silicon film 157 which is a lower semiconductor layer of the laminate (P1) constitutes the drain of the vertical MISFET (SV1), while the p type silicon film 159 which is an upper semiconductor layer constitutes its source. The silicon film 158, which is an intermediate semiconductor layer lying between the lower semiconductor layer and the upper semiconductor layer, substantially constitutes the substrate of the vertical MISFET (SV1) and the sidewall of it constitutes a channel region. The p type silicon film 157, which is a lower semiconductor layer of the laminate (P2), constitutes the drain of the vertical MISFET (SV2), and the p type silicon film 159, which is an upper semiconductor layer, constitutes the source. The silicon film 158 which is an intermediate semiconductor layer substantially constitutes the substrate of the vertical MISFET (SV2) and the sidewall of it constitutes a channel region.

In a plan view, the laminate (P1) is disposed so as to overlap with the through-hole 153, the barrier layer 148, an end portion of the intermediate conductive layer 142, the contact hole 122 and an end portion of the gate electrode 107B of the drive MISFET DR2, which lie under the laminate. The laminate (P2) is disposed so as to overlap with the through-hole 153, the barrier layer 148, an end portion of the intermediate conductive layer 143, the contact hole 122 and an end portion of the gate electrode 107B of the drive MISFET DR1, which lie under the laminate.

The three silicon film layers (157,158,159) are dry etched, for example, by forming a taper, as illustrated in FIG. 77, for example, on the bottom of the sidewall of each of the laminates (P1,P2) to make the area of the lower part (the p type silicon film 157 as the lower semiconductor layer) of each of the laminates (P1,P2) greater than that of the upper part (the silicon film 158 as an intermediate semiconductor layer and the p type silicon film 159 as an upper semiconductor layer). This makes it possible to prevent a decrease in the contact area between the plug 155 and the lower semiconductor layer (p type silicon film 157) inside of the through-hole 153 even if the position of each of the laminates (P1,P2) deviates from the through-hole 153 owing to misalignment of a photomask, leading to prevention of a rise in the contact resistance between the lower semiconductor layer (p type silicon film 157) and the plug 155.

Upon formation of the laminates (P1,P2), one or plural tunnel insulating film layers, each composed of a silicon nitride film or the like, may be disposed at a portion of the silicon film 158 in the vicinity of the interface between the p type silicon film 159, which is an upper semiconductor layer, and the silicon film 158, which is an intermediate semiconductor layer, or in the vicinity of the interface between the p type silicon film 157, which is a lower semiconductor layer, and the silicon film 158. This makes it possible to prevent diffusion, inside of the intermediate semiconductor layer, of an impurity in the p type silicon films (157,159) constituting the lower and upper semiconductor layers, bringing about an improvement in the performance of the vertical MISFETs (SV1,SV2). In this case, the tunnel insulating film is formed to have a thickness that is thin enough (several nm or less) to suppress a lowering in the drain current (Ids) of the vertical MISFETs (SV1,SV2).

Figure 78:
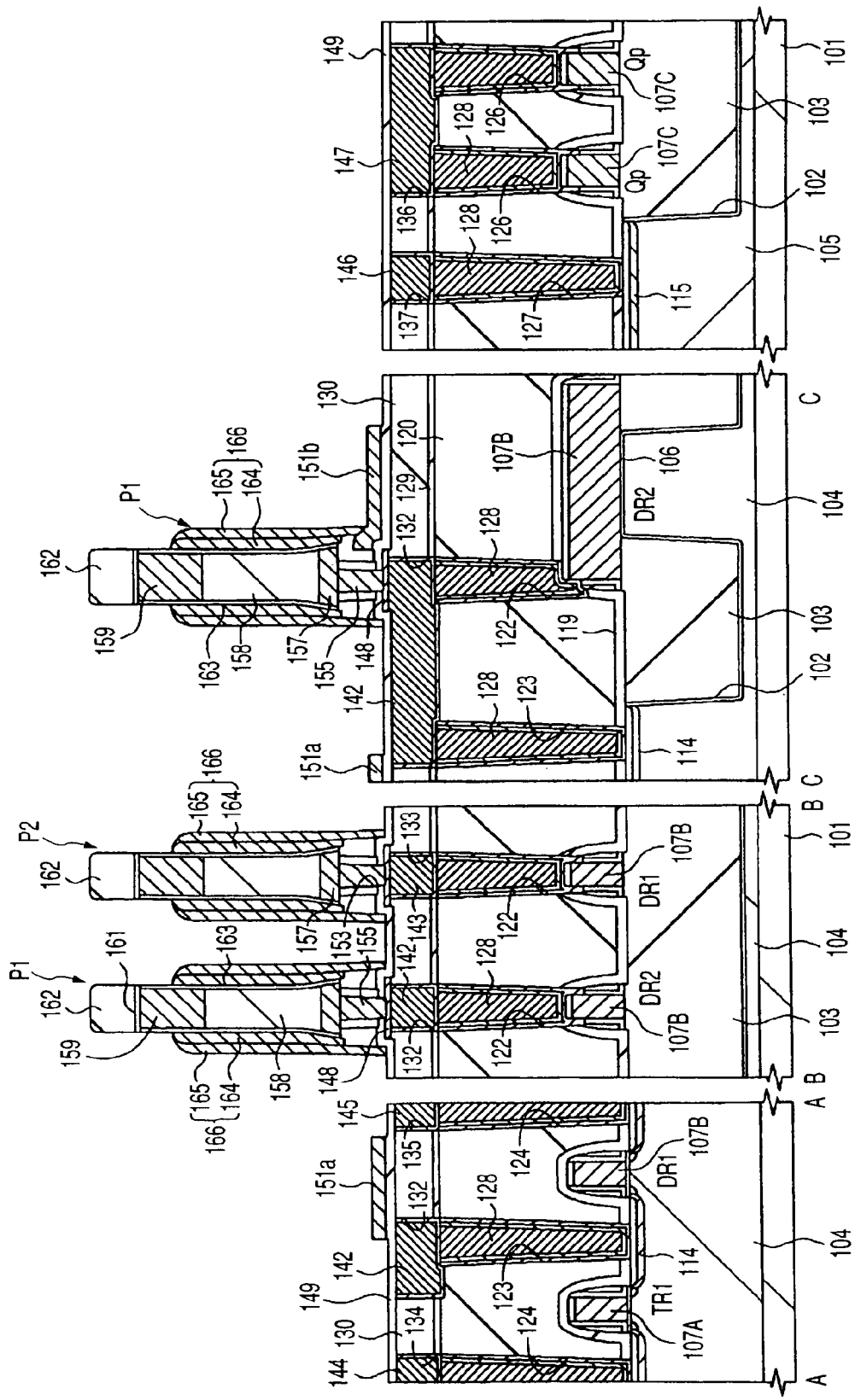
FIG. 78 is a fragmentary cross-sectional view of the SRAM during a manufacturing step following that shown in FIG. 77.

As illustrated in FIG. 78, by thermal oxidation of the substrate 101, a gate insulating film 163 made of a silicon oxide film is formed over the surface of the sidewall of each of the lower semiconductor layer (p type silicon film 157), the intermediate semiconductor layer (silicon film 158) and upper semiconductor layer (p type silicon film 159) constituting each of the laminates (P1,P2). At this time, there is no danger of the surface of each of the gate extraction electrodes 151a, 151b and the plug 155 in the through-hole 153, which are formed below the laminates (P1,P2) and made of a polycrystalline silicon film, being oxidized and having an increased resistance, because the gate extraction electrodes 151a,151b and the plug 155 in the through-hole 153 are covered with a silicon-oxide-based insulating film (silicon oxide film 152, sidewall spaces 154). Between each of the laminates (P1,P2) and the silicon nitride film 162 thereover, a silicon oxide film 161 is formed so that contact between the silicon nitride film 162 with a gate insulating film 163 to be formed over the upper semiconductor layer is prevented, making it possible to avoid a reduction in withstand voltage of the gate insulating film 163 in the vicinity of the upper end portion of the laminates (P1,P2).

The gate insulating film 163 on the sidewall of each of the laminates (P1,P2) is formed, for example, by low-temperature thermal oxidation (for example, wet oxidation) at 800° C. or less. The formation method is not limited thereto, but the film may be made of a silicon oxide film deposited by CVD, or a high dielectric film, such as hafnium ($HfO_2$) or tantalum oxide ($Ta_2O_5$) deposited by CVD. When such a film is employed, the gate insulating film 163 can be formed at a temperature lower than the above, making it possible to suppress fluctuations of a threshold voltage of the vertical MISFETs (SV1,SV2) resulting from diffusion of impurities.

Then, as a conductive film constituting a portion of the gate electrode of each of the vertical MISFETs (SV1,SV2) over the sidewall of the laminates (P1,P2) in the square pole form and the silicon nitride film 162 thereover, a first polycrystalline silicon layer 164 is formed, for example. This first polycrystalline silicon layer 164 is formed by depositing a polycrystalline silicon film over the silicon oxide film 152 by CVD, and by anisotropically etching the resulting polycrystalline silicon film to leave it in the sidewall spacer form so as to encompass therewith the sidewall of each of the square-pole laminates (P1,P2) and the silicon nitride film 162. The first polycrystalline silicon layer 164 constituting a portion of the gate electrode is formed in self alignment with the square-pole laminates (P1,P2) and gate insulating film 163 so that the memory cell size can be reduced. Into the polycrystalline silicon film constituting the first polycrystalline silicon layer 164, boron is doped to impart it with p conductivity.

When the first polycrystalline silicon layer 164 is formed by etching of the polycrystalline silicon film, the etching of the polycrystalline silicon film is followed by the etching of the silicon oxide film 152 lying therebelow, by which the silicon oxide film 152 in a region other than a region just below the square-pole laminates (P1,P2) is removed to expose the gate extraction electrodes 151a,151b and the silicon oxide film 149. The silicon oxide film 152 remains between the lower end portion of the first polycrystalline silicon layer 164 and the gate extraction electrodes 151a,151b so that the first polycrystalline silicon layer 164 is not electrically connected to the gate extraction electrodes 151a, 151b.

Then, a second polycrystalline silicon layer 165 is formed, for example, as a conductive film over the surface of the first polycrystalline silicon layer 164. This second polycrystalline silicon layer 165 is formed by depositing a polycrystalline silicon film over the silicon oxide film 152 by CVD, and anisotropically etching this polycrystalline silicon film to leave it in the form of a sidewall spacer so as to encompass the surface of the first polycrystalline silicon layer 164. The polycrystalline silicon film constituting the second polycrystalline silicon layer 165 is doped with boron to impart it with p conductivity.

The polycrystalline silicon film constituting the second polycrystalline silicon layer 165 is deposited over the sidewall of the silicon oxide film 152 remaining just below the square-pole laminates (P1,P2) or the surface of the gate extraction electrodes 151a,151b so that by anisotropic etching of this polycrystalline silicon film, the lower end portion thereof is brought into contact with the surface of the gate extraction electrodes 151a,151b.

Since the second polycrystalline silicon layer 165 which is electrically connected, at the lower end portion thereof, to the gate extraction electrodes 151a,151b is thus formed in self alignment with the first polycrystalline silicon layer 164, the memory size can be reduced.

By the steps so far described, the gate electrode 166 of each of the vertical MISFETs (SV1,SV2) made of a laminate of the first polycrystalline silicon layer 164 and the second polycrystalline silicon film 165 is formed over the sidewall of each of the square-pole laminates (P1,P2) and the silicon nitride film 162. This gate electrode 166 is electrically connected to the gate extraction electrodes 151a,151b via the second polycrystalline silicon layer 165 constituting a portion of the gate electrode.

In this manner, the first polycrystalline silicon layer 164 constituting a portion of the gate electrode (166) is formed, in the form of a sidewall spacer, in self alignment with the square-pole laminates (P1,P2) and the gate insulating film 163, while the second polycrystalline silicon layer 165 which is electrically connected, at the lower end portion thereof, to the gate extraction electrodes 151a,151b is formed, in the form of a sidewall spacer, in self alignment with the first polycrystalline silicon layer 164, which enables a reduction of the memory size. In other words, the gate electrode (166) is formed in self alignment with the square-pole laminates (P1, P2) and the gate insulating film 163. The gate electrode (166) is connected in self alignment with the gate extraction electrode 151a, which enables a reduction in memory size.

When the gate electrode 166 is composed of two conductive film layers (first polycrystalline silicon layer 164 and second polycrystalline silicon layer 165) as described above, the second polycrystalline layer 165 may be replaced with a W silicide film or W film to impart to the gate electrode 166 a low-resistance silicide structure or polymetal structure.

Figure 79:
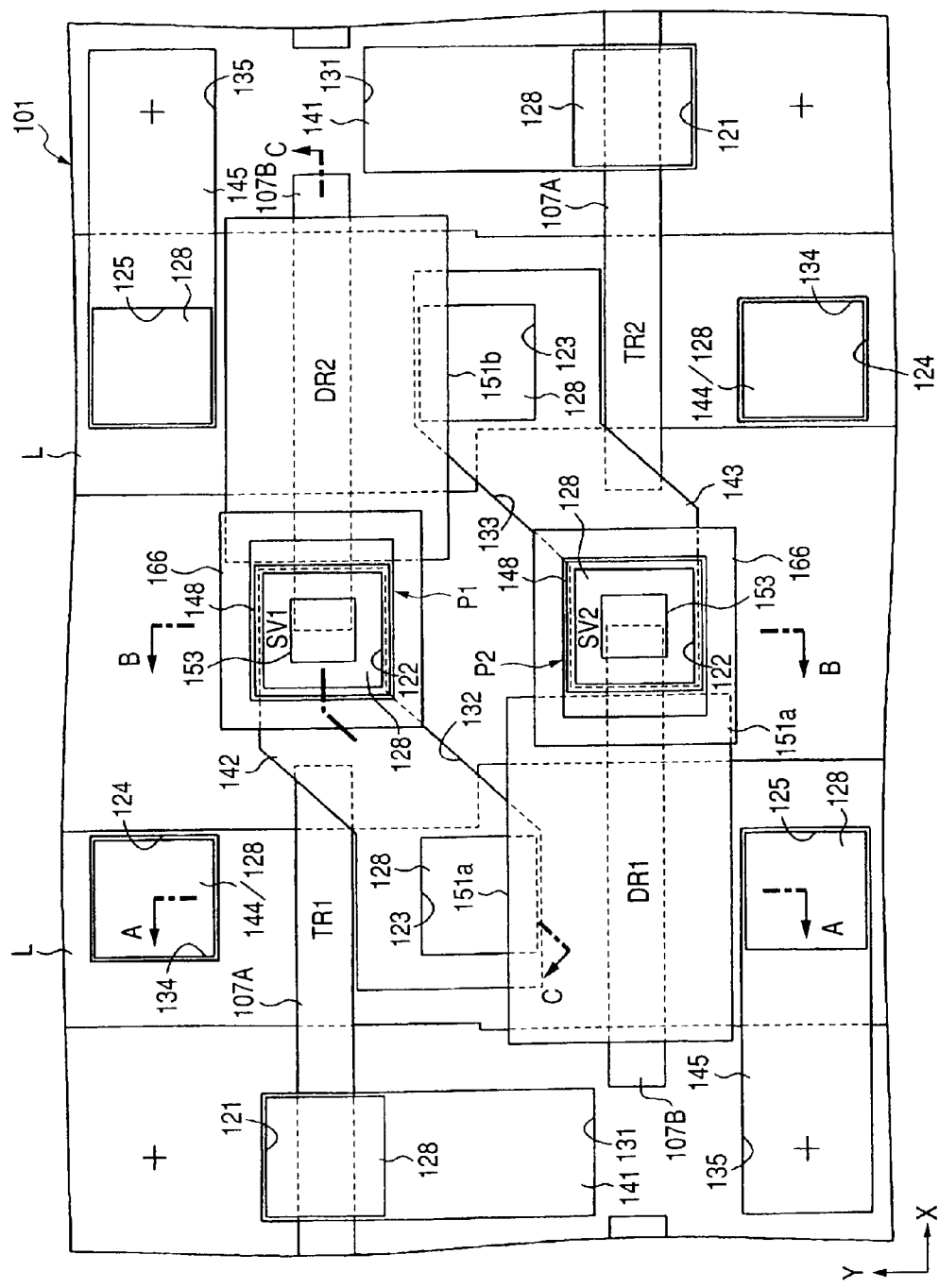
FIG. 79 is a fragmentary plan view of the SRAM according to Embodiment 6 of the present invention during its manufacture.
Figure 80:
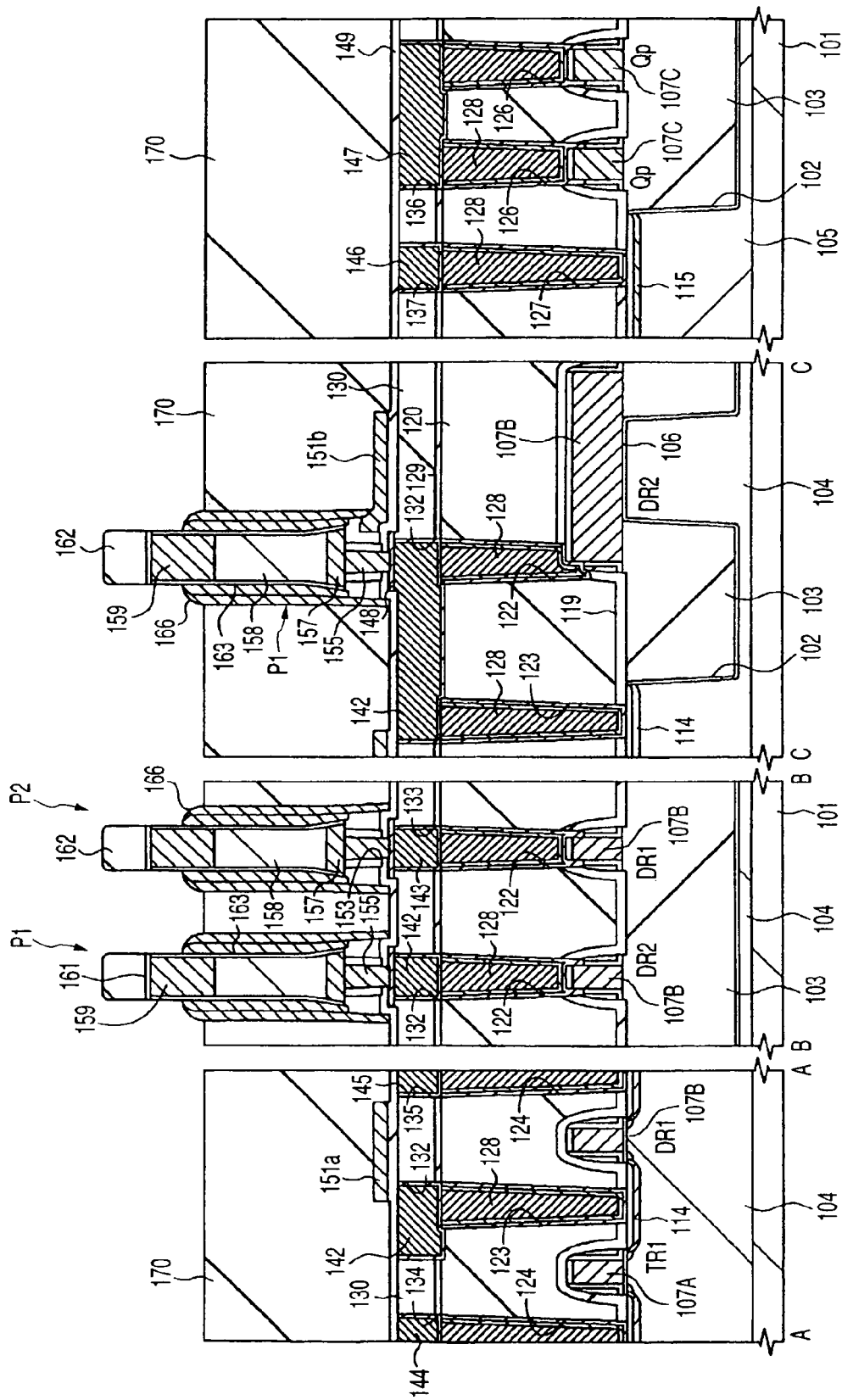
FIG. 80 is a fragmentary cross-sectional view of the SRAM during a manufacturing step following that shown in FIG. 78.

As illustrated in FIGS. 79 and 80, after a silicon oxide film 170 is deposited, as an insulating film, over the substrate 101 by CVD, its surface is planarized by CMP. The silicon oxide film (first insulating film) 170 is deposited so as to have a surface height after planarization that is higher than that of the silicon nitride film 162, by which etching of the surface of the silicon nitride film 162 can be avoided upon planarization.

After etching of the silicon oxide film 170 to retreat its surface height to a level lower than the upper end of each of the laminates (P1,P2), the gate electrode 166 formed over the sidewall of each of the laminates (P1,P2) and the silicon nitride film 162 is etched to lower its upper end.

The above-described etching of the gate electrode 166 is performed for preventing a short-circuit between the gate electrode 166 and a supply voltage line to be formed over the laminates (P1,P2) later. The upper end portion of the gate electrode 166 is therefore lowered to a position lower than the upper end portion of the p type silicon film 159 serving as an upper semiconductor layer. For the purpose of preventing an offset between the gate electrode 166 and the upper semiconductor layer (source (p type silicon film 159)), however, the etching amount is controlled so that the upper end portion of the gate electrode 166 exists above the upper end portion of the silicon film 158 serving as an intermediate semiconductor layer.

By the steps so far described, p channel type vertical MISFETs (SV1,SV2) are formed, having laminates (P1,P2) composed of the p type silicon film 157 serving as a lower semiconductor layer (drain), the silicon film 158 serving as an intermediate semiconductor layer (substrate) and the p type silicon film 159 serving as an upper semiconductor layer (source), and the gate insulating film 163 and gate electrode 166 formed over the sidewall of the laminates (P1,P2).

Figure 81:
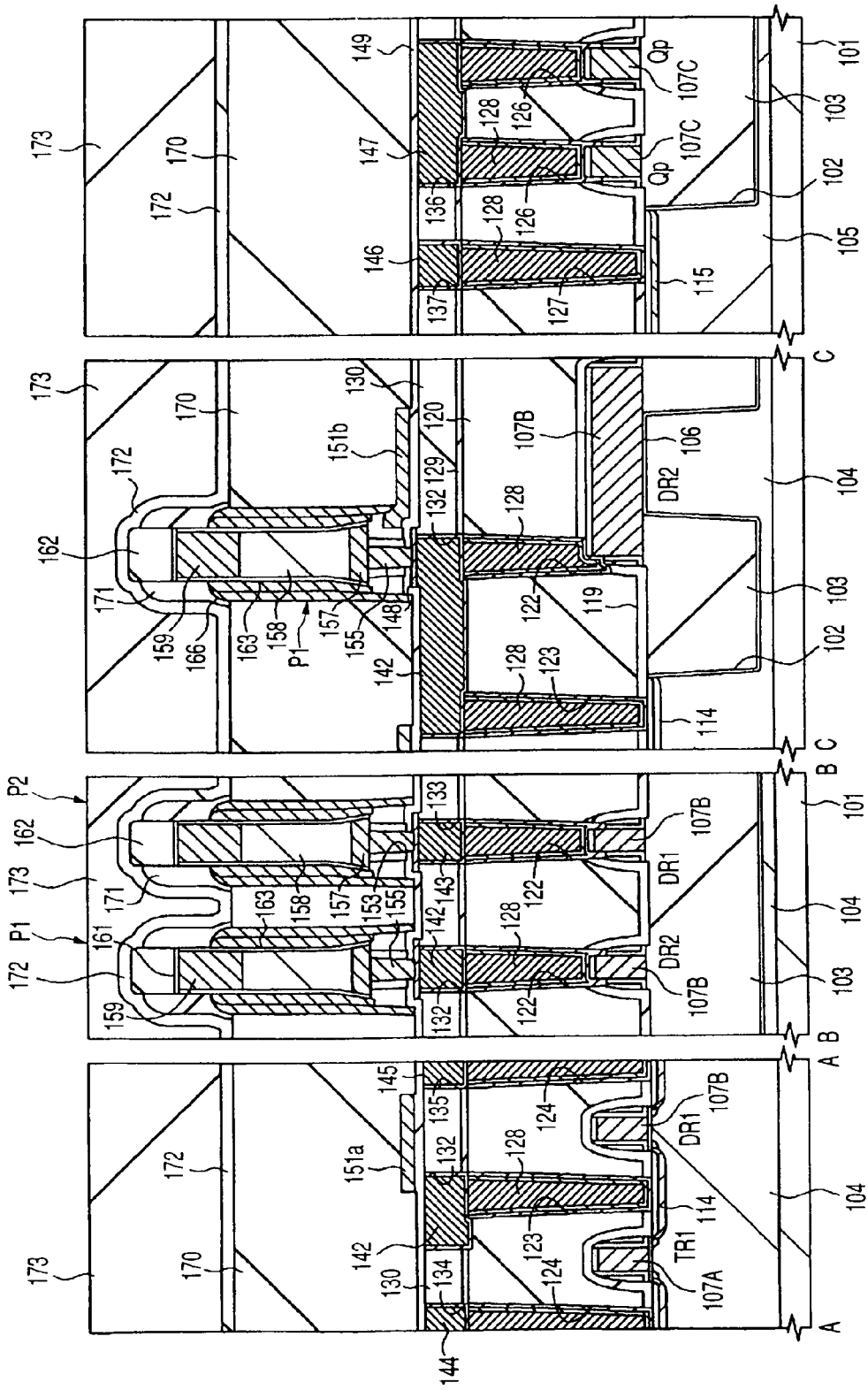
FIG. 81 is a fragmentary cross-sectional view of the SRAM during a manufacturing step following that shown in FIG. 80.

As illustrated in FIG. 81, after formation of the sidewall spacer 171 over the side walls of the gate electrode 166 of each of the vertical MISFETs (SV1,SV2) and the p type silicon film 159 serving as an upper semiconductor layer, each exposed above the silicon oxide film 170, and the silicon nitride film 162 lying over the p type silicon film, a silicon nitride film (first insulating film) 172 is deposited over the silicon oxide film 170 by CVD. The sidewall spacer 171 is formed by anisotropic etching of the silicon oxide film deposited by CVD.

A silicon oxide film (first insulating film) 173 is deposited by CVD over the silicon nitride film 172, followed by planarization of the surface of the silicon oxide film 173 by CMP.

Figure 82:
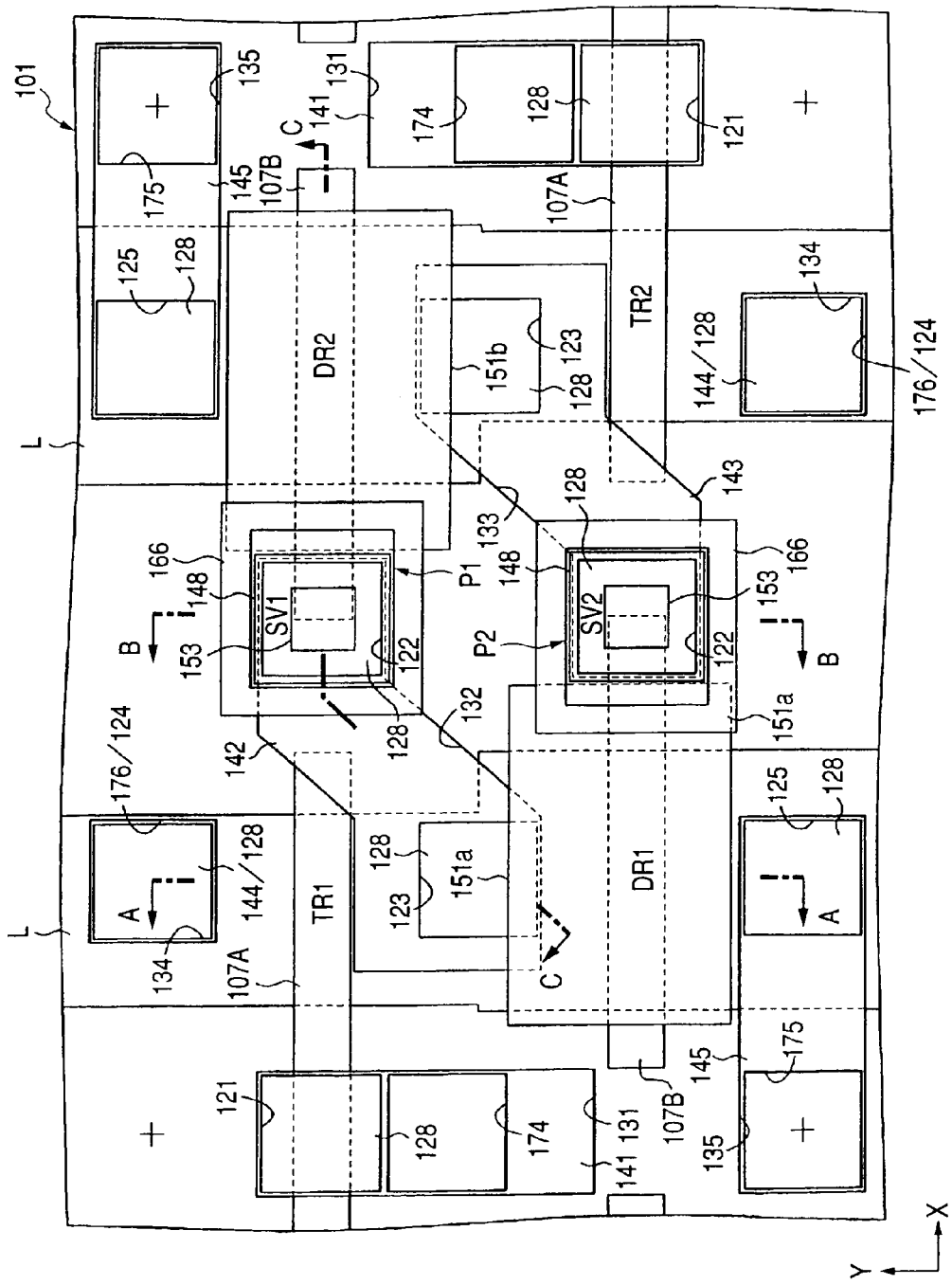
FIG. 82 is a fragmentary plan view of the SRAM according to Embodiment 6 of the present invention during its manufacture.
Figure 83:
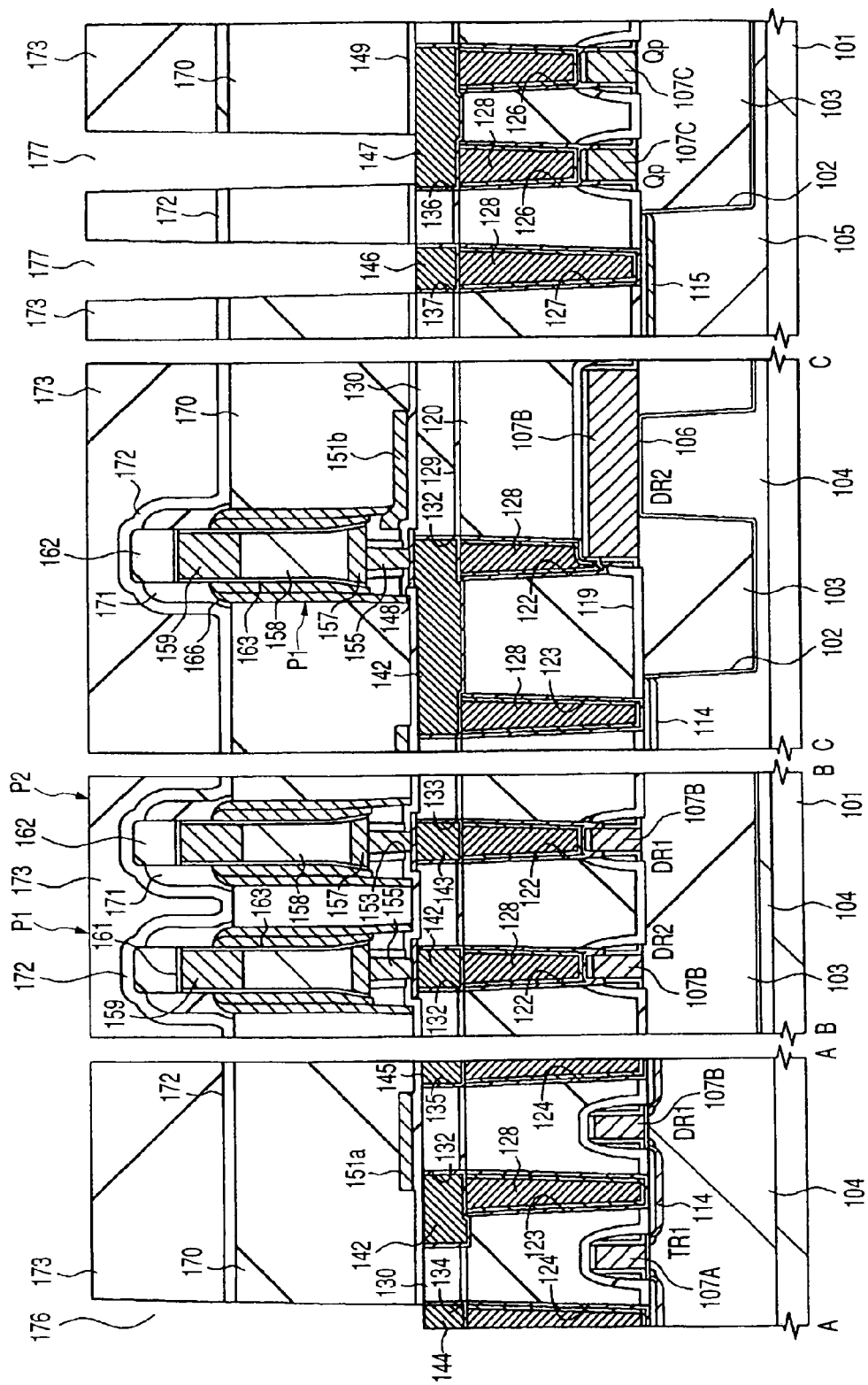
FIG. 83 is a fragmentary cross-sectional view of the SRAM during a manufacturing step following that shown in FIG. 81.

As illustrated in FIGS. 82 and 83, the silicon oxide film 173, silicon nitride film 172 and silicon oxide film 170 are dry etched using a photoresist film as a mask to form through-holes (third openings) 174,175,176 from which the surface of the intermediate conductive layers 141,144,145 are exposed, respectively, and a through-hole (third opening) 177 from which the surfaces of the first-level interconnects 146,147 of the peripheral circuit are exposed.

Figure 84:
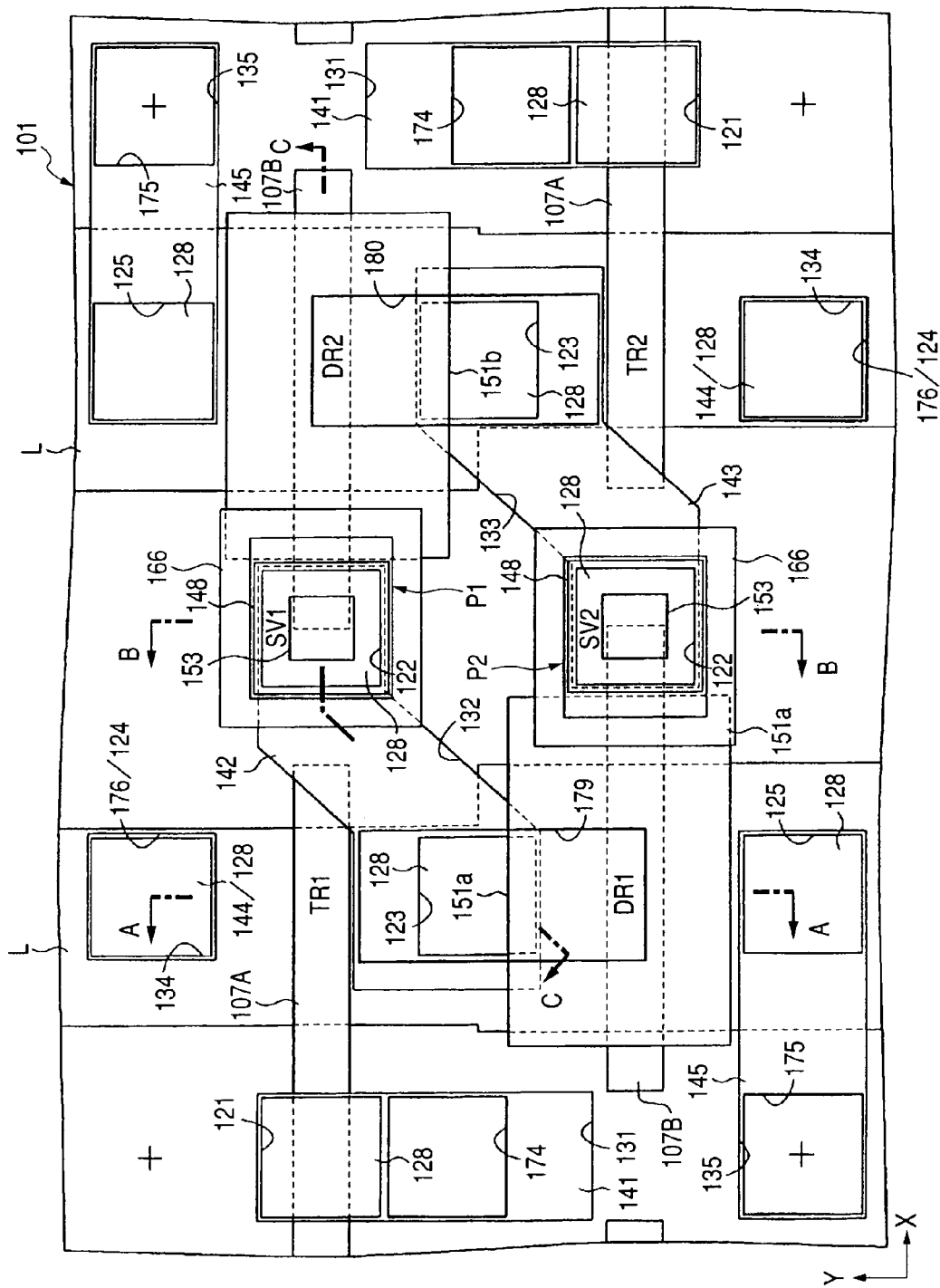
FIG. 84 is a fragmentary plan view of the SRAM during a manufacturing step following that shown in FIG. 82.
Figure 85:
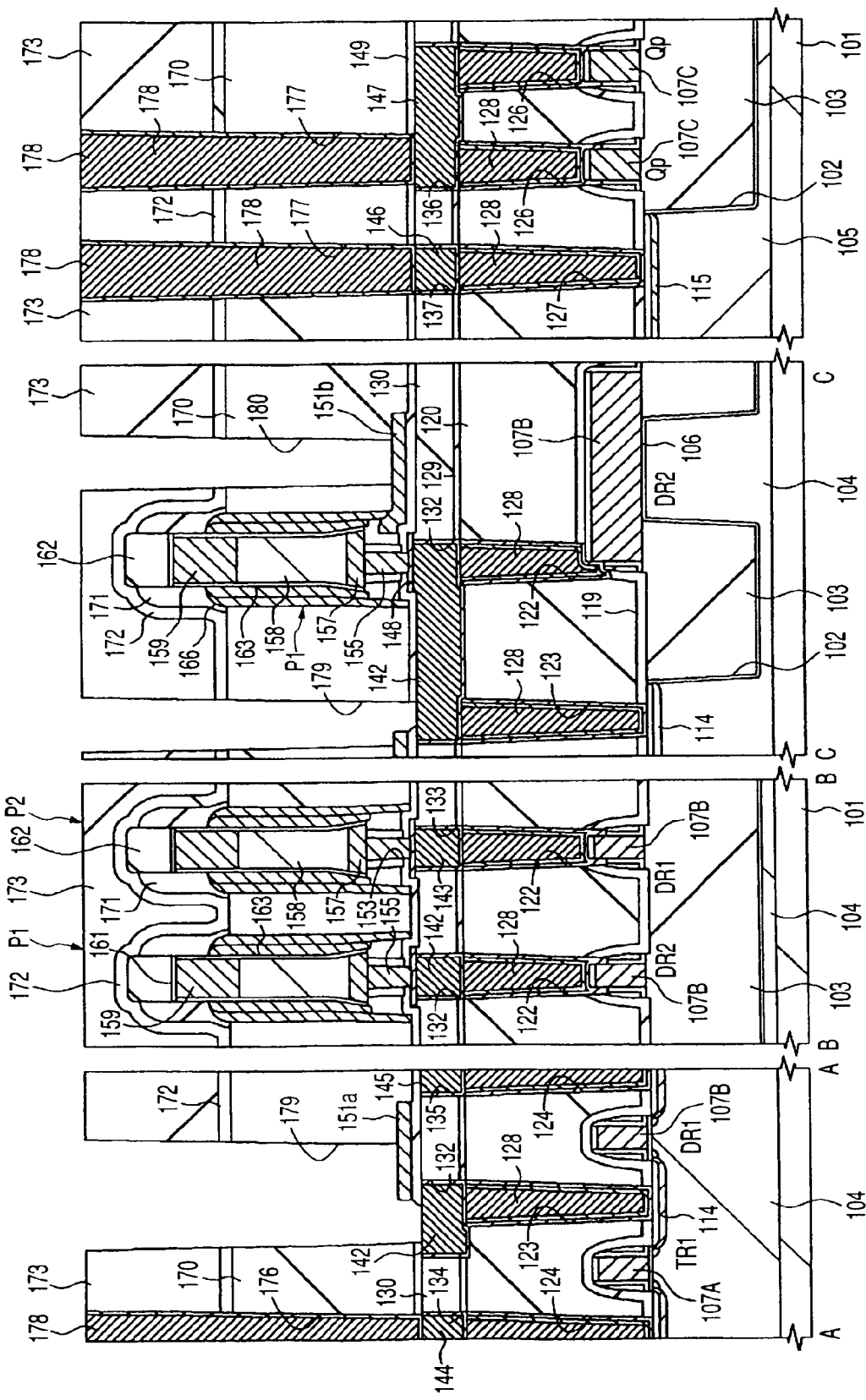
FIG. 85 is a fragmentary cross-sectional view of the SRAM during a manufacturing step following that shown in FIG. 83.

As illustrated in FIGS. 84 and 85, a plug 178 is formed inside of each of the through-holes 174 to 177. This plug 78 is formed, for example, by depositing a Ti film and a TiN film over the silicon oxide film 173 including the insides of the through-holes 174 to 177 by sputtering, depositing a TiN film and a W film by CVD and then, removing the W film, TiN film and Ti film outside the through-holes 174 to 177 by CMP.

Using a photoresist film as a mask, the silicon oxide film 173, silicon nitride film 172 and silicon oxide film 170 are dry etched to form a through-hole (first opening) 179 from which the surface of each of the gate extraction electrode 151a and intermediate conductive layer 142 are exposed and a through-hole (first opening) 180 from which the surface of each of the gate extraction electrode 151b and intermediate conductive layer 143 are exposed.

Figure 86:
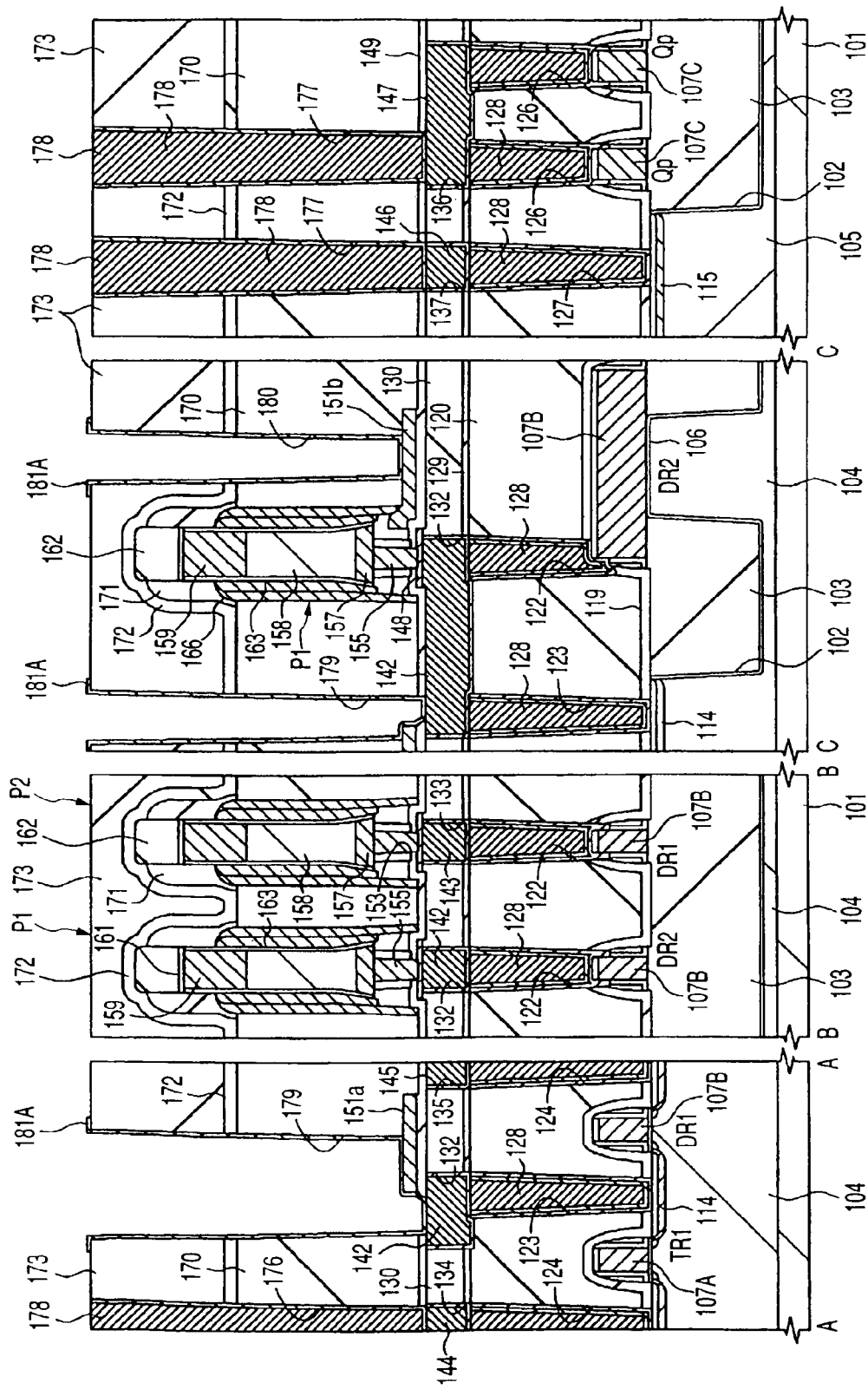
FIG. 86 is a fragmentary cross-sectional view of the SRAM during a manufacturing step following that shown in FIG. 85.

As illustrated in FIG. 86, a TiN film (first conductive film) 181A that is about 50 nm thick is deposited over the silicon oxide film 173 including the insides of the through-holes 179 and 180 by sputtering. Using a photoresist film as a mask, the TiN film 181A is dry etched to leave the TiN film 181A inside of the through-holes 179 and 180. By this TiN film 181A, a potential can be gained from the drive MISFETs DR1,DR2 and transfer MISFETs TR1,TR2.

Figure 87:
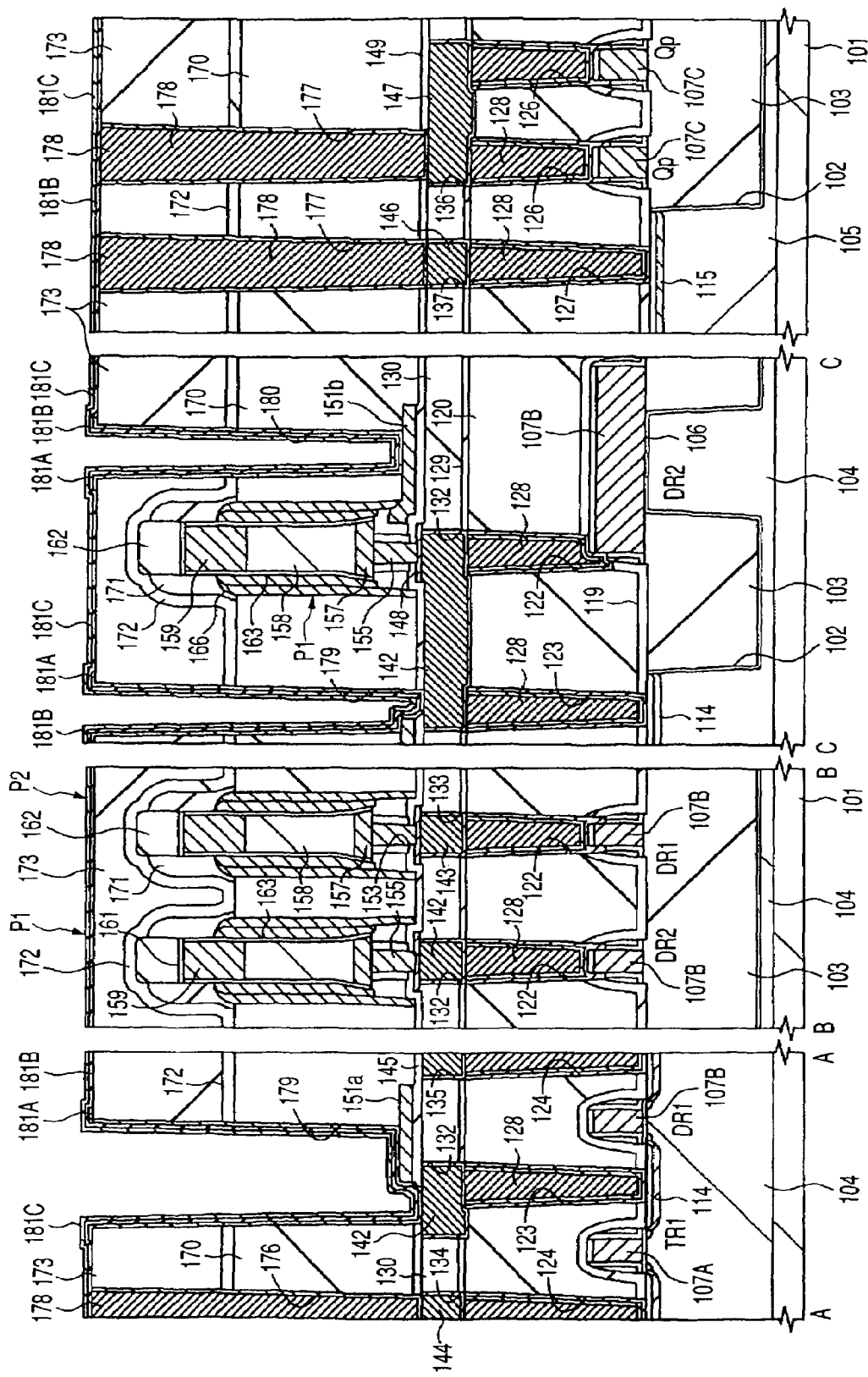
FIG. 87 is a fragmentary cross-sectional view of the SRAM during a manufacturing step following that shown in FIG. 86.

As illustrated in FIG. 87, a silicon nitride film (second insulating film) 181B that is about 10 nm to 20 nm thick is deposited over the silicon oxide film 173 including the insides of the through-holes 179 and 180 and TiN film 181A by CVD. Over the silicon nitride film 181B, then, a TiN film (second conductive film) 181C that is about 50 nm thick is deposited by, for example, sputtering.

Figure 88:
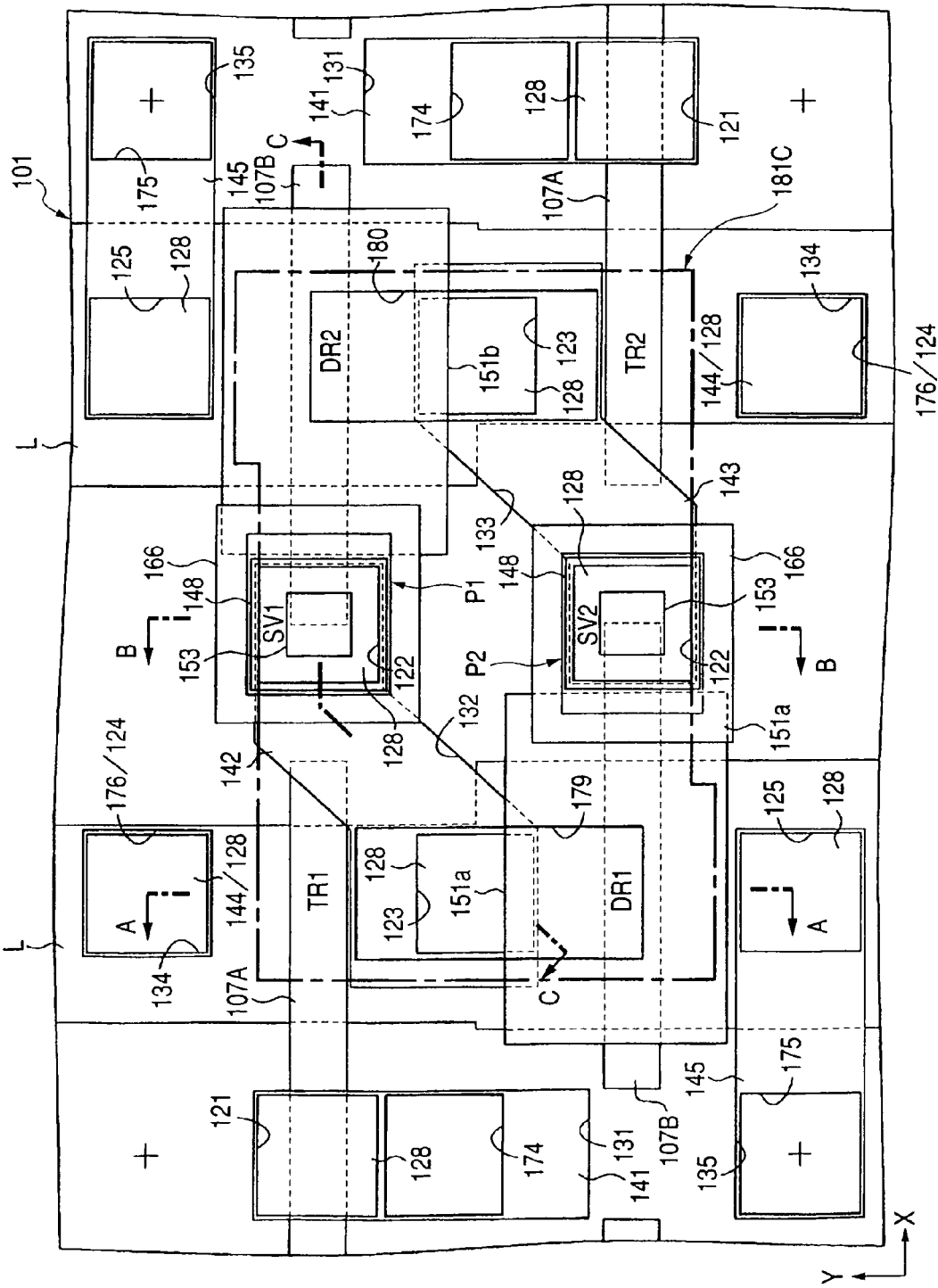
FIG. 88 is a fragmentary plan view of the SRAM according to Embodiment 6 of the present invention during its manufacture.
Figure 89:
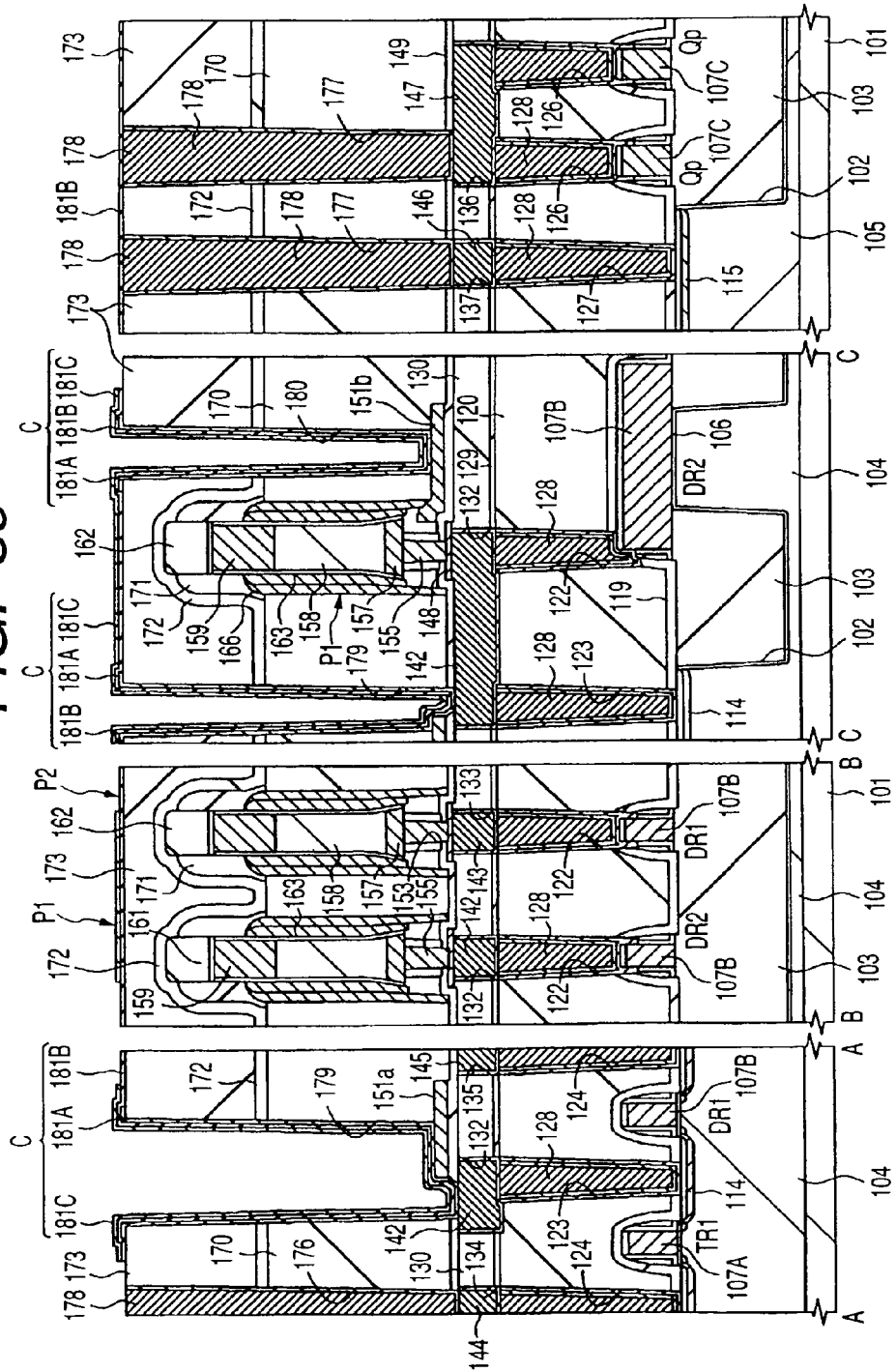
FIG. 89 is a fragmentary cross-sectional view of the SRAM during a manufacturing step following that shown in FIG. 87.

By dry etching using a photoresist film as a mask, the TiN film 181C is patterned as illustrated in FIGS. 88 and 89. Using another photoresist mask, the silicon nitride film 181B is patterned by dry etching, by which a capacitor element (first capacitor element) C having the TiN film 181A as a lower electrode, the silicon nitride film 181B as an insulator and the TiN film 181C as an upper electrode is formed in the through-holes 179 and 180. The lower electrode of this capacitor element C is electrically connected to the gate extraction electrodes 151a,152b. In such a capacitor element C of Embodiment 6, the TiN film 181A can function not only as a lower electrode (TiN film 181A) of the capacitor element C but also as an interconnect for electrically connecting the gate electrode of each of the drive MISFET DR2 (or drive MISFET DR1) and vertical MISFET SV2 (or vertical MISFET SV1) to a storage node A (storage node B). The upper electrode (TiN film 181C) of the capacitor element C is electrically connected to the p type silicon film 159 serving as an upper semiconductor layer (source) of the vertical MISFETs (SV1,SV2) via a plug which will be formed later. In short, the upper electrode of the capacitor element C is electrically connected to a supply voltage line (Vdd), which will be described later, together with a plug formation step. In FIG. 88, the TiN film 181C remaining after patterning is illustrated as a region surrounded by a dashed line.

As described above, the lower electrode (TiN film 181A) of the capacitor element C is formed over the bottom and circumference of the sidewall inside of each of the through-holes 179 and 180, and, at the same time, it constitutes, together with the upper electrode (TiN film 181C) of the capacitor element C, a capacitance via a dielectric film (silicon nitride film 181B) of the capacitor element C. Such a constitution makes it possible to use the bottom and circumference of the sidewall of each of the through-holes 179 and 180 as a capacitance area, leading to an improvement of the capacitance. In addition, by forming the capacitor element C while making use of the through-holes 179 and 180, the memory cell of the SRAM (refer to FIGS. 63 to 65) can be provided with a capacitance sufficient to prevent lowering of the soft error resistance without increasing the memory cell area of the SRAM of Embodiment 6. In other words, even if the capacitance for preventing lowering of the soft error resistance is added to the memory cell of the SRAM, it is possible to suppress a size increase of the chip having a memory cell of the SRAM of Embodiment 6.

In Embodiment 6, the two silicon oxide film layers 173 and 170 are formed to cover the plug 155 for electrically connecting the vertical MISFETs SV1,SV2 to the intermediate conductive layers 142 and 143, and the p type silicon film 157, silicon film 158, p type silicon film 159 and silicon nitride films 162 and 172 constituting the vertical MISFETs SV1, SV2. The total thickness of the two silicon oxide film layers 173 and 170 therefore becomes greater so that the through-holes 179 and 180 formed to penetrate through the silicon oxide films 173 and 170 are deep (have a high aspect ratio). A capacitor element C having a large electrode area can therefore be formed in the through-holes 179 and 180. In other words, since a capacitor element C having a large capacitance can be formed according to Embodiment 6, a SRAM having higher a soft error resistance can be manufactured.

In this Embodiment 6, a silicon nitride film 181B is employed as an example of the insulator, but it may be replaced with a tantalum oxide film or a silicon oxide film. In particular, use of a tantalum oxide film increases the capacitance of the capacitor element C because it has a high specific dielectric constant, leading to actualization of higher soft error resistance in the SRAM of Embodiment 6. Alternatively, it is also possible to increase the capacitance of the capacitor element C by using the amorphous silicon film 32A (refer to FIG. 50) doped with an impurity as described in connection with Embodiment 4 to roughen the surface of the upper electrode, thereby increasing the electrode area of the capacitor element C.

Figure 90:
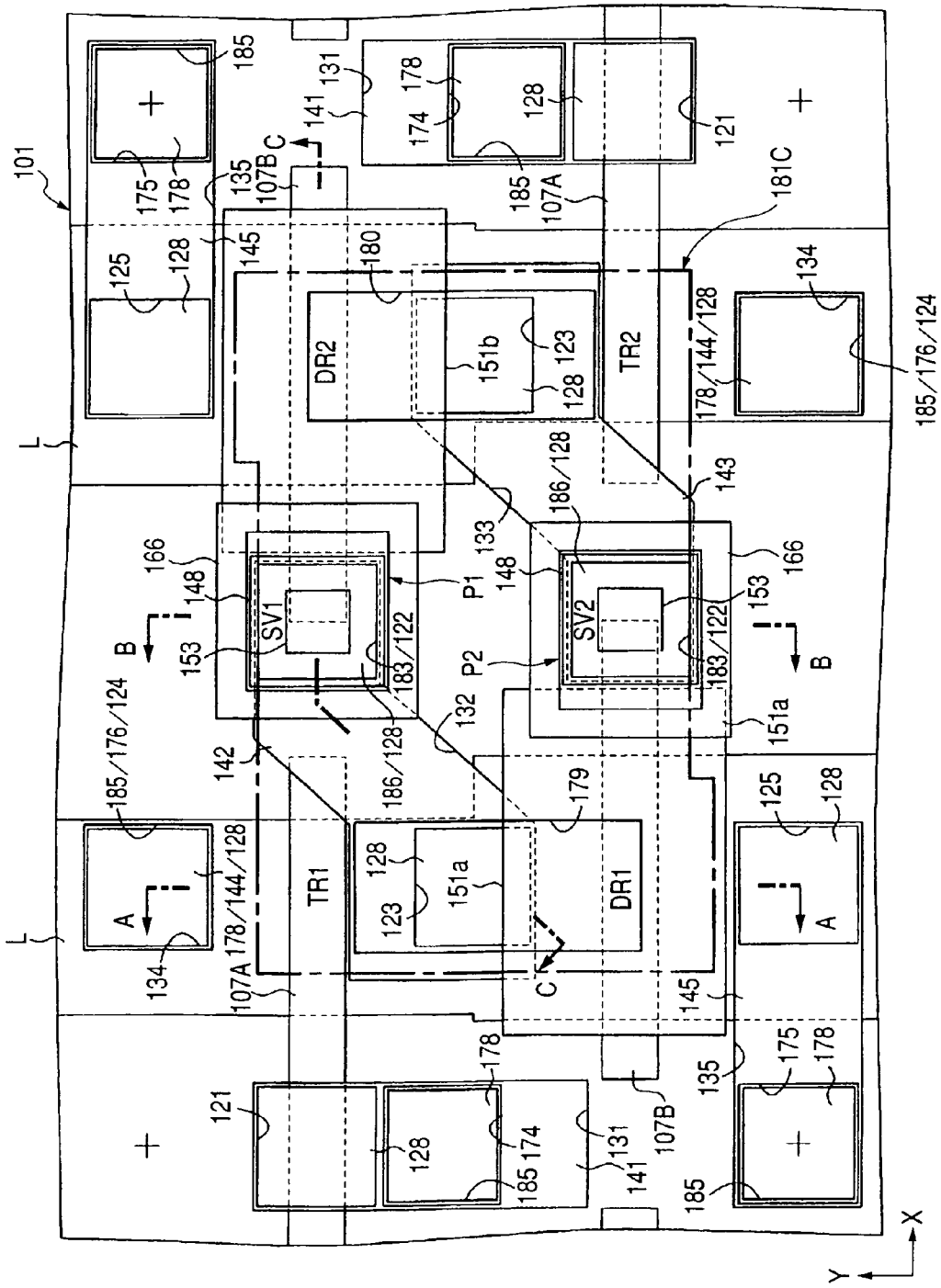
FIG. 90 is a fragmentary plan view of the SRAM during a manufacturing step following that shown in FIG. 88.
Figure 91:
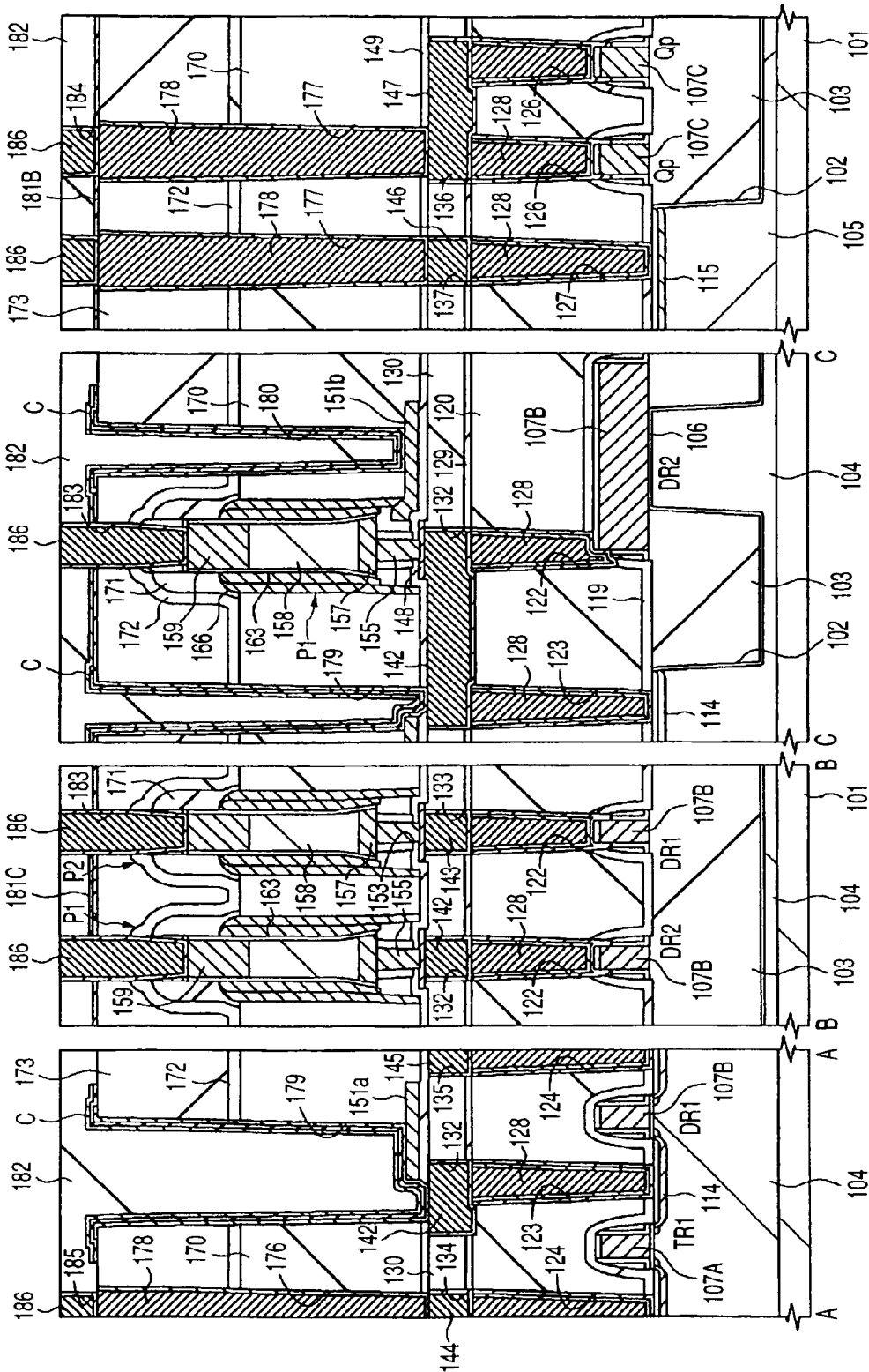
FIG. 91 is a fragmentary cross-sectional view of the SRAM during a manufacturing step following that shown in FIG. 89.

As illustrated in FIGS. 90 and 91, after deposition of a silicon oxide film 182 as an insulating film over the silicon oxide film 173 by CVD, the silicon oxide film 182 is filled in the through-holes 179 and 180. Then, the surface of the silicon oxide film 182 is planarized by CMP to relax step differences on the surface. Since the aspect ratio of the through-holes 179 and 180 is large, the through-holes 179 and 180 are not necessarily filled completely with the silicon oxide film 182. The presence of some spaces, if any, in the silicon oxide film 182 inside of the through-holes 179 and 180 does not pose any problem if the silicon oxide film 182 does not open at the opening portions of the through-holes 179 and 180 and seals the opening portion of the through-holes 179 and 180 completely.

By dry etching using a photoresist film as a mask, the silicon oxide film 182, TIN film 181C (refer to FIG. 89), silicon nitride film 181B (refer to FIG. 89), silicon oxide film 173 and silicon nitride films 172 and 162, each over the laminates (P1,P2), are removed to form a through-hole 183 from which the p type silicon film 159 serving as an upper semiconductor layer (source) of the vertical MISFETs (SV1, SV2) is exposed.

Upon dry etching, after etching is once stopped when the silicon oxide film 182, TiN film 181C, silicon nitride film 181B and silicon oxide film 173 over the laminates (P1,P2) are removed, the silicon nitride films 172 and 162 are etched.

Since the sidewall spacer 171 made of a silicon oxide film is formed over the sidewall of the silicon nitride film 162 and p type silicon film 159, the upper portion of the gate electrode 166 is protected by the side wall spacer 171 from etching of the silicon nitride films 172 and 162 and exposure of the gate electrode 166 is prevented, even if the relative position of the p type silicon film 159 serving as an upper semiconductor layer deviates from the through-hole 183, for example, in the direction of a line B-B owing to misalignment of a photomask.

The silicon oxide film 182 and silicon nitride film 181B covering the upper portion of the through-hole 177 of the peripheral circuit are etched to form a through-hole 184, by which the surface of the plug 178 filled in the through-hole 177 is exposed. In addition, by etching the silicon oxide film 182 covering the upper portion of the through-holes 174 to 176 formed in the memory array to form a through-hole 185, the surface of the plug 178 filled in the through-holes 174 to 176 is exposed.

A plug 186 is then formed inside of each of the through-holes 183 to 185. The plug 186 is formed, for example, by depositing a TiN film over the silicon oxide film 182 including the inside of the through-holes 183 to 185 by sputtering, depositing a TiN film and W film by CVD and then removing the TiN film and W film outside the through-hole 183 to 185 by CMP.

By the formation of the plug 186, the upper electrode (TiN film 181C (refer to FIG. 89)) of the capacitor element C is connected to the side surface of the plug 186 which is to be connected with the p type silicon film 159 serving as an upper semiconductor layer (source) of the vertical MISFETs (SV1, SV2). It is not necessary to cause a large current to pass through the capacitor element C, but it is only necessary to apply an adequate voltage to the capacitor element C, so that a large contact area is not required between the plug 186 and the upper electrode of the capacitor element C.

Figure 92:
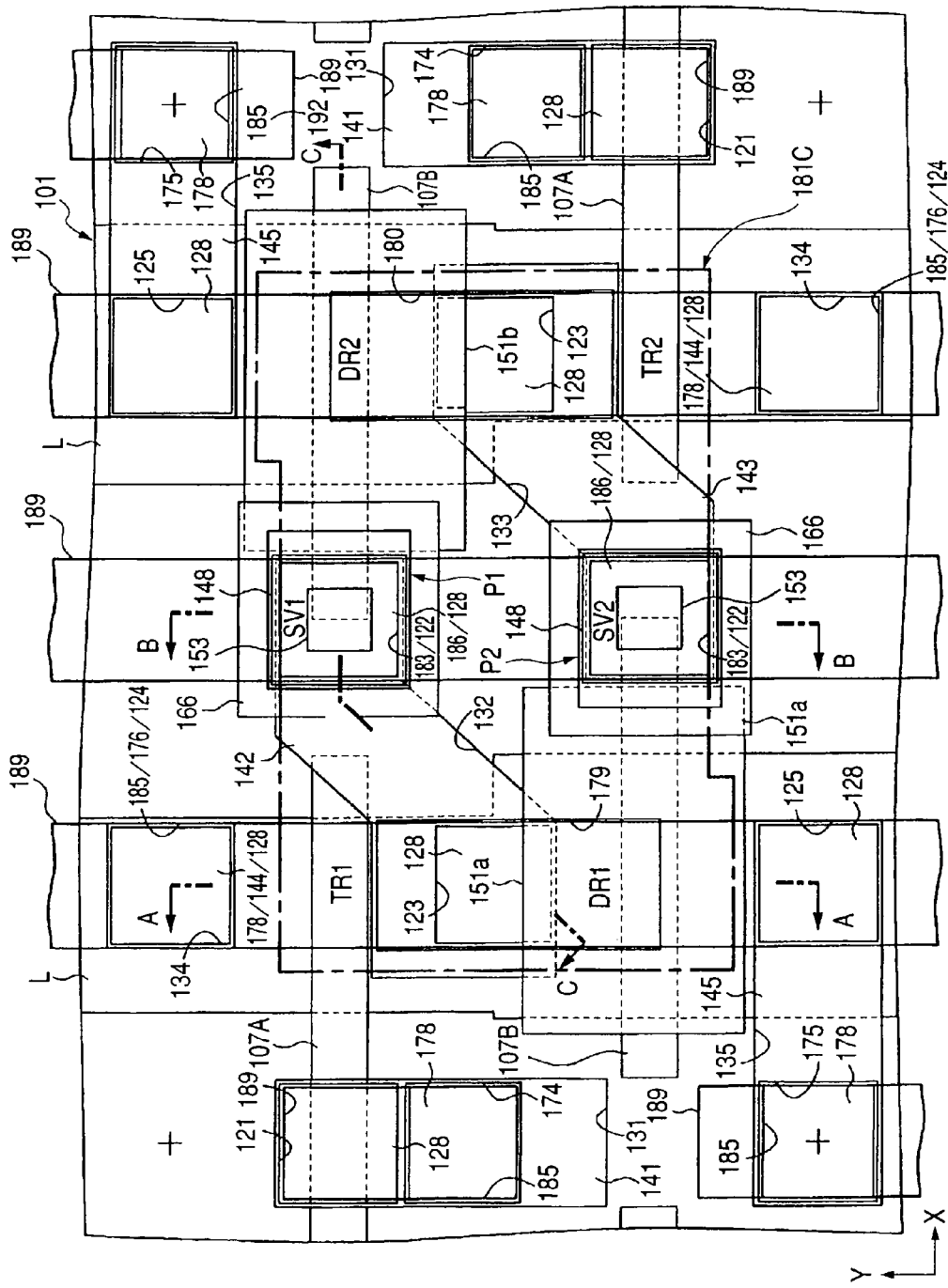
FIG. 92 is a fragmentary plan view of the SRAM during a manufacturing step following that shown in FIG. 90.
Figure 93:
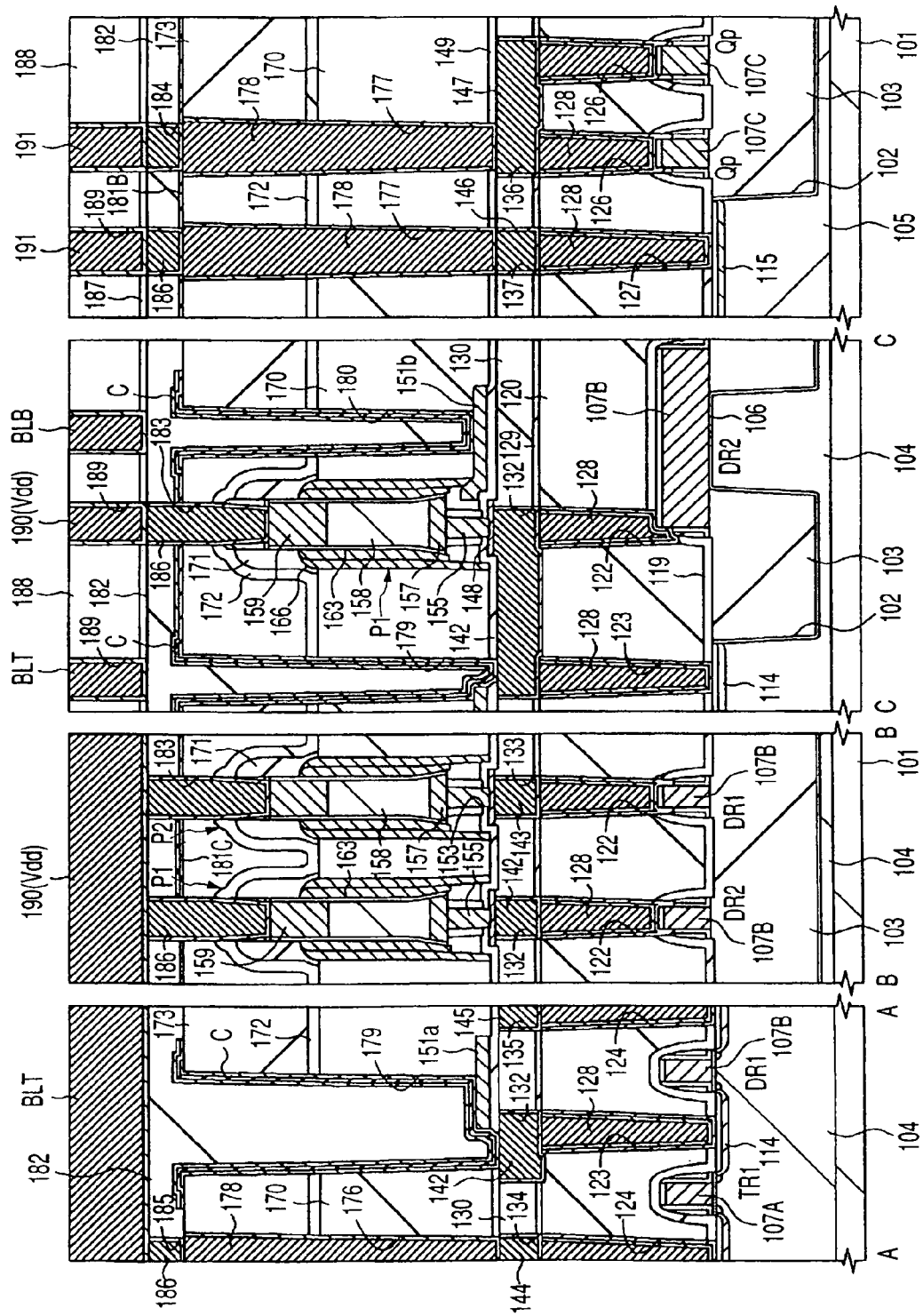
FIG. 93 is a fragmentary cross-sectional view of the SRAM during a manufacturing step following that shown in FIG. 91.

As illustrated in FIGS. 92 and 93, after deposition of a silicon carbide film 187 and a silicon oxide film 188 over the silicon oxide film 182 by CVD, the silicon oxide film 188 and silicon carbide film 187 over the through-holes 183,184,185 are dry etched using a photoresist film as a mask, by which interconnect grooves 189 are formed. As illustrated in FIG. 92, the interconnect groove 189 formed over the through-hole 183 lying above the vertical MISFETs (SV1,SV2) and two interconnect grooves 189 formed adjacent to both sides of the above-described interconnect groove 189 each has a planar strip-shaped pattern extending in the Y direction. Four interconnect grooves 189 are formed at the end portions of the memory cell, each having a rectangular plane pattern having a long side in the Y direction.

A supply voltage line 190 (Vdd) is formed inside of the interconnect grooves 189 running above the vertical MISFETs (SV1,SV2), while a second-level interconnect 191 is formed inside of the interconnect grooves 189 in the peripheral circuit region. One (date line BLT) of the complementary data lines (BLT,BLB) is formed inside of the interconnect groove 189 running above the n+ type semiconductor regions 114 (source, drain) of the transfer MISFET (TR1) and drive MISFET (DR1) and the plug 178, while the other one (data line BLB) of the complementary data lines (BLT,BLB) is formed inside of the interconnect groove 189 running above the n+ type semiconductor regions 114 (source, drain) of the transfer MISFET (TR2) and drive MISFET (DR2) and the plug 178. Interconnects 192 (illustrated in FIG. 94) are formed inside of the four interconnect grooves 189 that are formed at the end portions of the memory cell.

The supply voltage line 190 (Vdd), complementary data lines (BLT,BLB), second-level interconnect 191 and extraction interconnect 192 are formed by depositing a tantalum nitride (TaN) film or Ta film as a conductive barrier film over the silicon oxide film 188 including the inside of the interconnect groove 189 by, for example, sputtering, depositing a Cu film, which is a metal film, by sputtering or plating and then removing an unnecessary portion of the Cu film and TaN film outside the interconnect groove 189 by CMP.

The supply voltage line (Vdd) is electrically connected to the p type silicon film 159, which is an upper semiconductor layer (source) of the vertical MISFETs (SV1,SV2), via the plug 186. One (data line BLT) of the complementary data lines (BLT,BLB) is electrically connected to the n+ semiconductor region 114 (either one of the source and drain) of the transfer MISFET (TR1) via the plugs 186 and 178, intermediate conductive layer 144 and plug 128, while the other one (data line BLB) is electrically connected to the n+ semiconductor region 114 (the other one of the source and drain) of the transfer MISFET (TR2) via the plugs 186 and 178, intermediate conductive layer 144 and plug 128.

Figure 94:
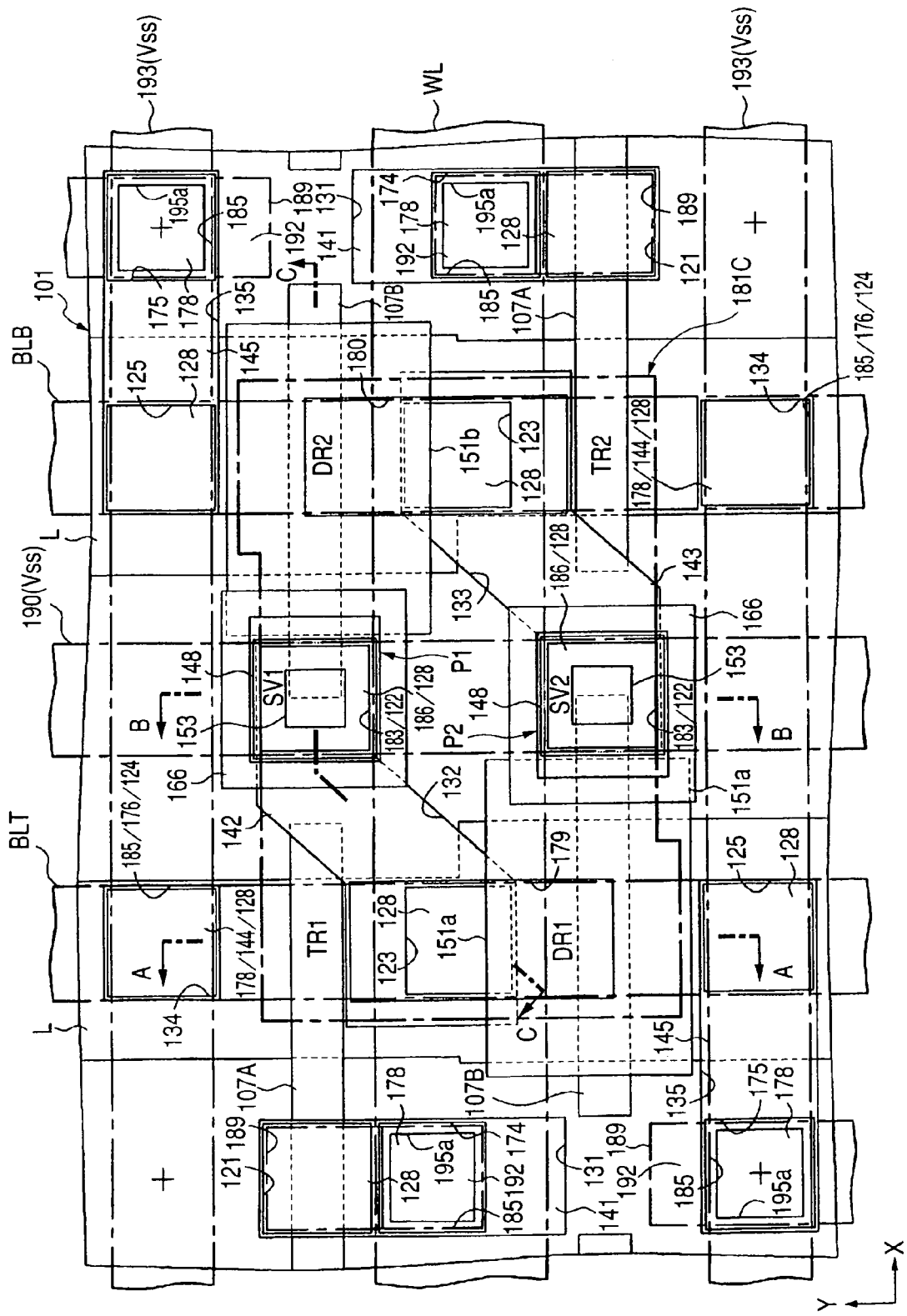
FIG. 94 is a fragmentary plan view of the SRAM during a manufacturing step following that shown in FIG. 92.
Figure 95:
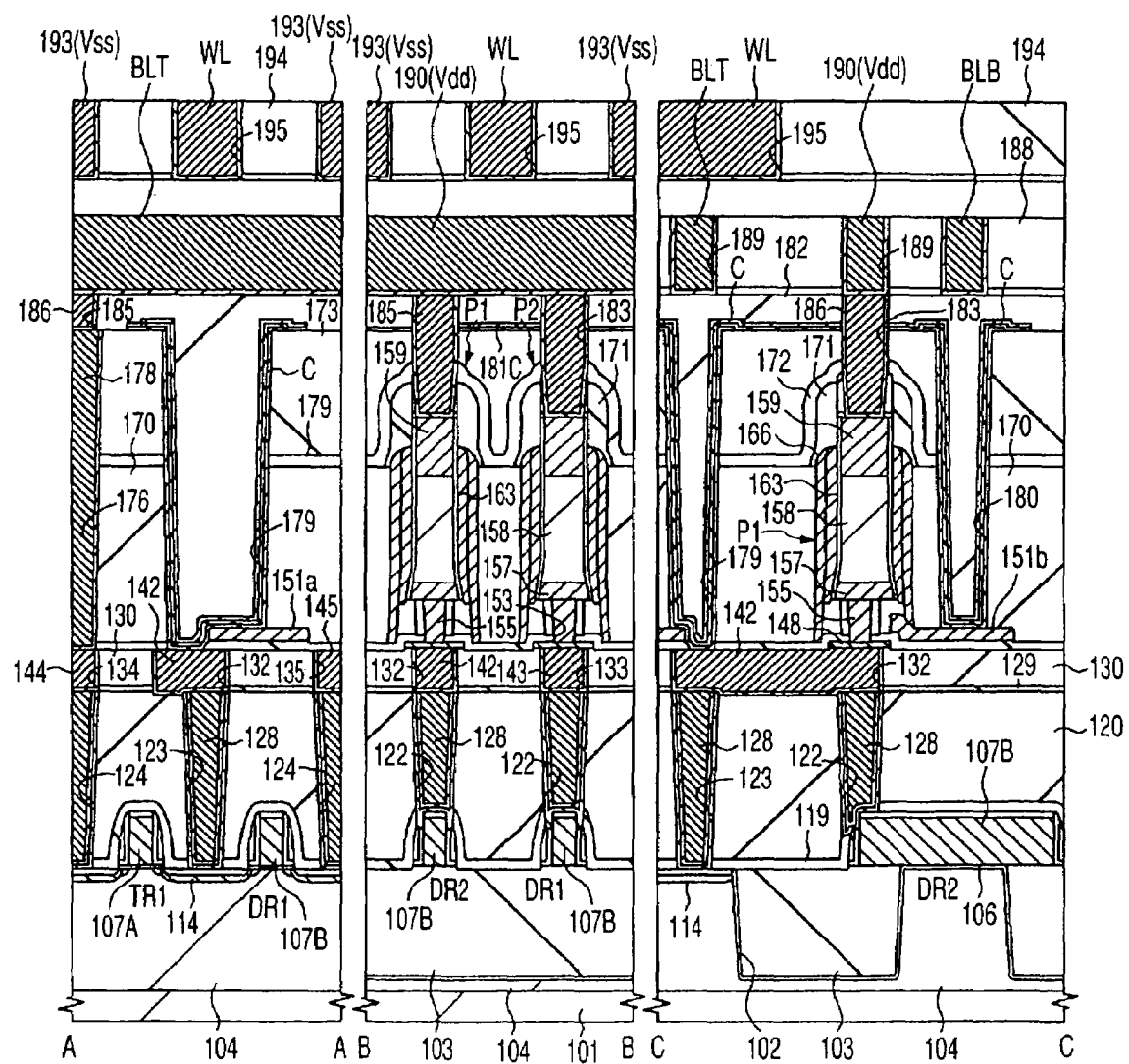
FIG. 95 is a fragmentary cross-sectional view of the SRAM during a manufacturing step following that shown in FIG. 93.

As illustrated in FIGS. 94 and 95, a reference voltage line 193 (Vss) and a word line (WL) are formed over the interconnect layer having the supply voltage line 190 (Vdd), complementary data lines (BLT,BLB), second-level interconnect 191 and extraction interconnect 192. The reference voltage line 193 (Vss) and word line (WL) have a stripped planar pattern extending in the X direction of FIG. 9.

The reference voltage line 193 (Vss) and word line (WL) are formed, for example, by depositing an insulating film 194 over the silicon oxide film 188, forming an interconnect groove 195 in this insulating film 194, depositing a Cu film and TaN film over the insulating film 194 including the inside of the interconnect groove 195 in the above-described manner, and removing an unnecessary portion of the Cu film and TaN film outside the interconnect groove 195 by CMP. The insulating film 194 is constituted of a laminate of a silicon oxide film, a silicon carbide film and a silicon oxide film deposited by CVD. Upon formation of the interconnect groove 195 in the insulating film 194, an opening 195a is made in the interconnect groove 195 above each of the four extraction interconnects 192 formed at the end portion of the memory cell and through the opening 195a, a portion of each of the four extraction interconnects is exposed from the bottom of the interconnect groove 195.

The reference voltage line 193 (Vss) is electrically connected to the n+ semiconductor region 114 (source) of each of the drive MISFETs (DR1,DR2) via the extraction interconnect 192, plugs 186 and 178, intermediate conductive layer 144 and plug 128. The word line (WL) is electrically connected to the n+ semiconductor region 114 (the other one of the source and drain) of each of the transfer MISFETs (DR1, DR2) via the extraction interconnect 192, plugs 186 and 178, intermediate conductive layer 144 and plug 128. By the steps so far described, the SRAM of Embodiment 6 is completed and the circuit shown in FIG. 63 can be actualized. The upper electrode (TiN film 181C) of the capacitor element C is electrically connected to the source voltage line 190 (Vdd) and it always serves as a supply voltage (Vdd), making it possible to cause the capacitor element C to generate a capacitance when the storage nodes (A,B) are at 0V (Low).

Figure 96:
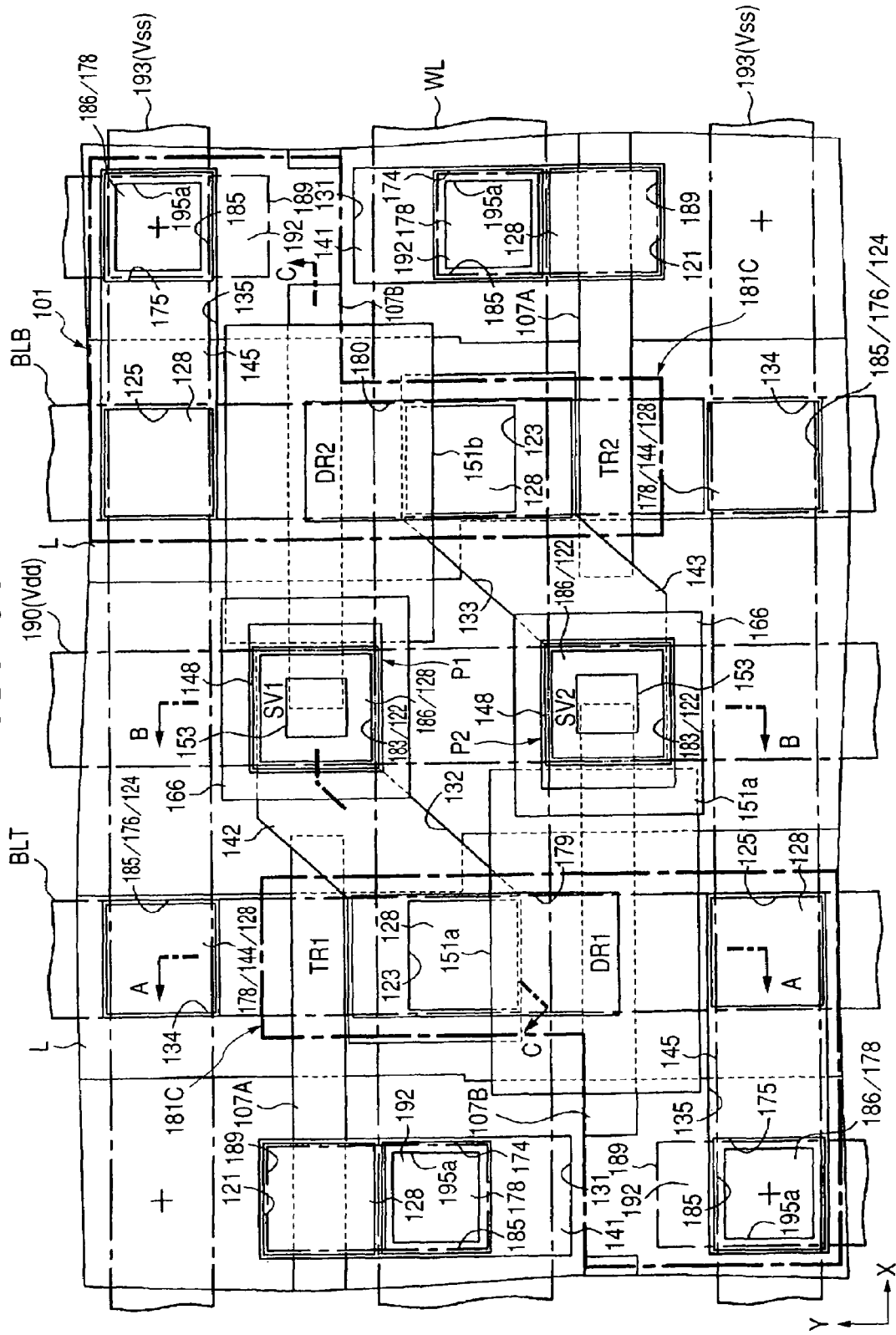
FIG. 96 is a fragmentary plan view of the SRAM according to Embodiment 6 of the present invention during its manufacture.

As illustrated in FIG. 96, patterning of the TiN film 181C which serves an upper electrode of the capacitor element C, is carried out to electrically connect it to the reference voltage line 193 (Vss) without forming an electric connection with the supply voltage line (190). In other words, patterning of the TiN film 181C is carried out so as not to connect to the plug

186 which is formed in the through-hole 183 and is electrically connected to the supply voltage line 190 (Vdd), but to connect to the side surface of the plug 186 which is formed in the through-hole 186 and is electrically connected to the reference voltage line 190 (Vdd). By this patterning, the circuit as illustrated in FIG. 64 can be actualized. The upper electrode (TiN film 181C) of the capacitor element C is electrically connected to the reference voltage line 193 (Vss), and its voltage always becomes a reference voltage so that the capacitor element C can be caused to generate capacitance when the storage nodes (A,B) are high.

Embodiment 7

Figure 97:
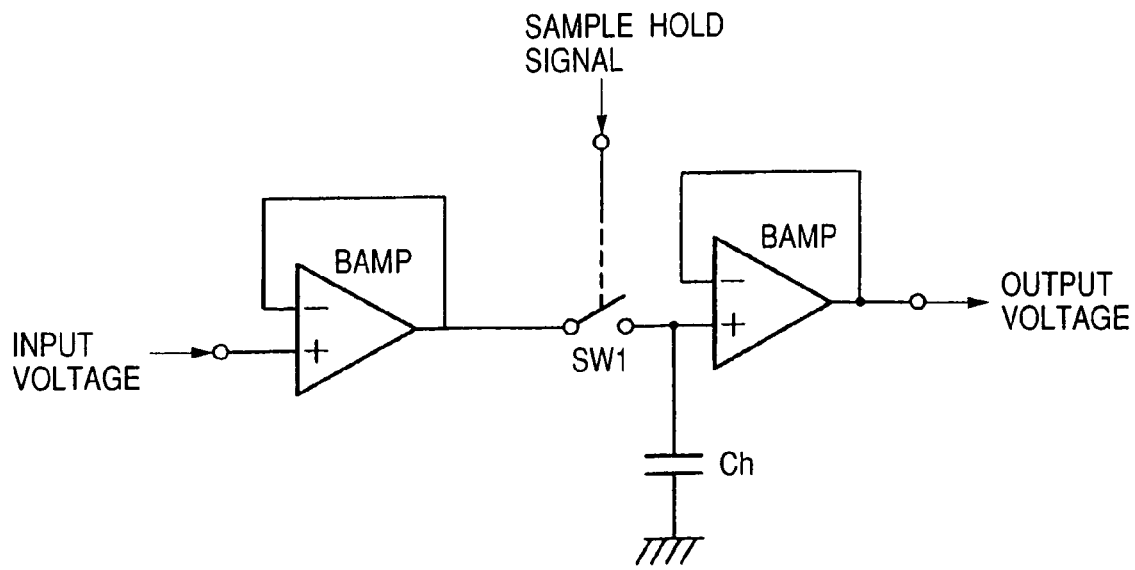
FIG. 97 is a schematic circuit diagram showing one example of an analog circuit according to Embodiment 7 of the present invention.
Figure 98:
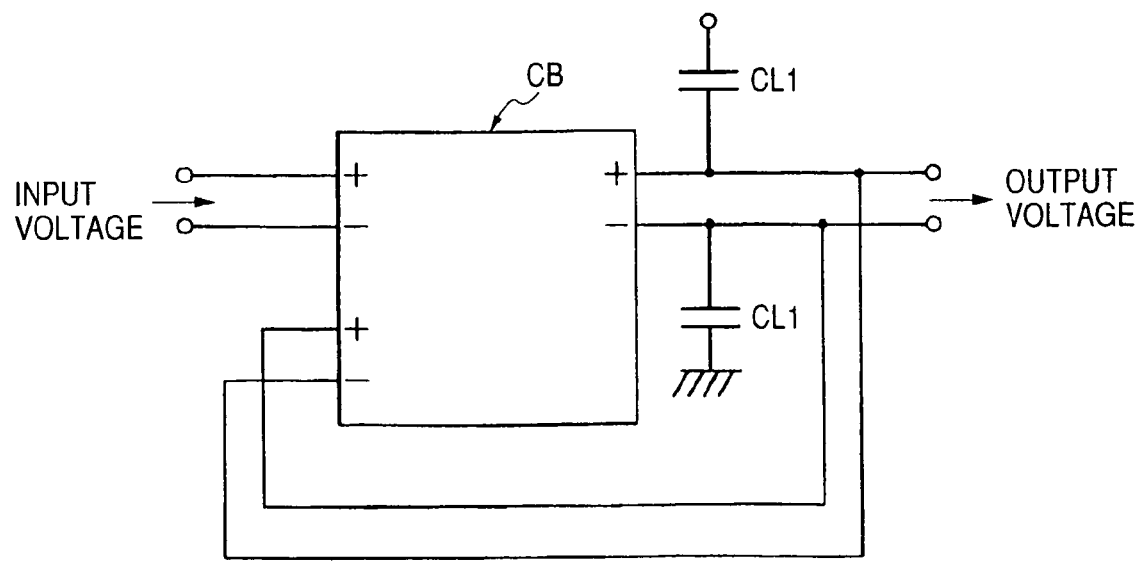
FIG. 98 is a schematic circuit diagram showing another example of the analog circuit according to Embodiment 7 of the present invention.
Figure 99:
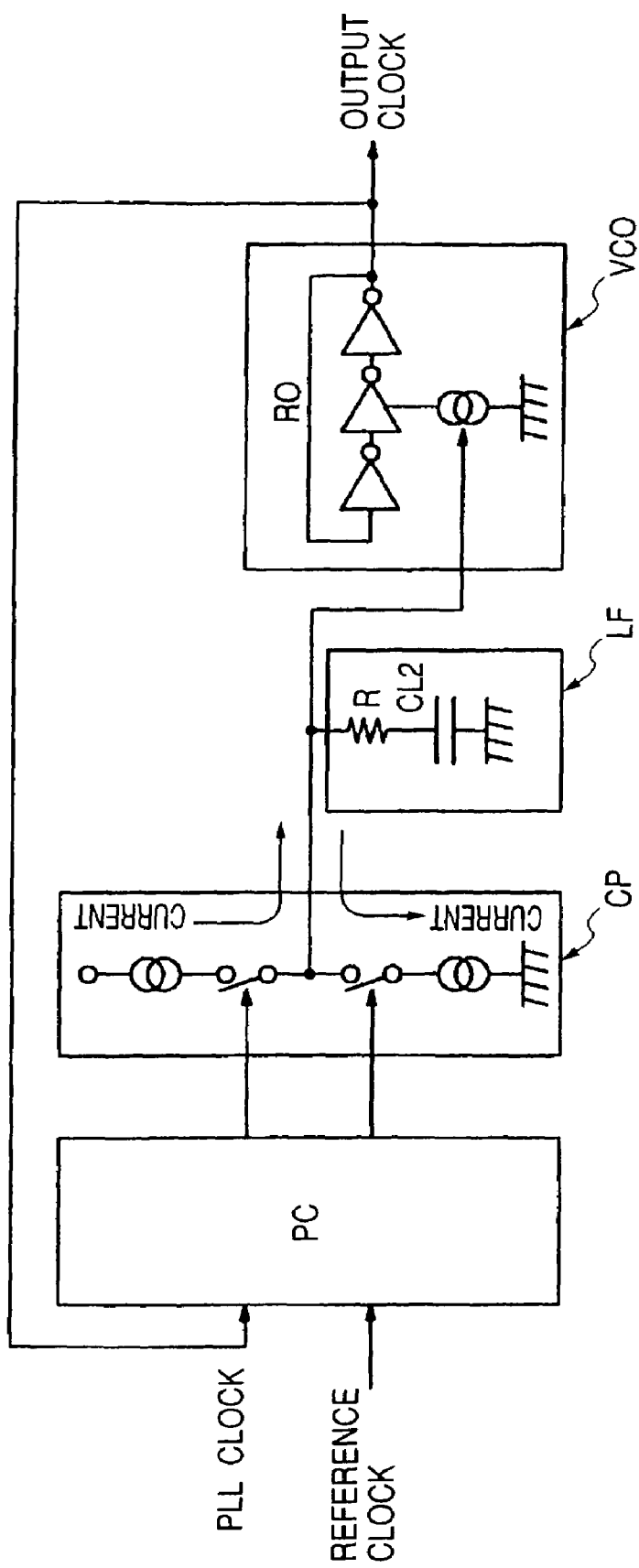
FIG. 99 is a block diagram showing a further example of the analog circuit according to Embodiment 7 of the present invention.

FIGS. 97 to 99 are circuit diagrams or block diagrams illustrating examples of the analog circuit of Embodiment 7. In this Embodiment 7, a capacitor element formed in a similar manner to, for example, that employed for the capacitor element C1 (refer to FIG. 32) which is formed in the peripheral circuit region ACA (refer to FIG. 32) in connection with Embodiment 3 is applied as a capacitor element of these analogue circuits.

FIG. 97 illustrates one example of a sample hold circuit according to Embodiment 7. This sample hold circuit has a switch SW1 for signal sample, a hold condenser Ch for holding a voltage and a buffer amplifier BAMP having a gain of 1. When the switch S1 is closed (sample mode), an input voltage becomes an output voltage as is. When the switch S1 is open (hold mode), the voltage of the hold condenser Ch becomes an output voltage. Since the hold condenser Ch maintains the voltage upon sampling, the input voltage upon sampling is maintained as the output voltage until the next sample mode.

FIG. 98 illustrates one example of a primary filter (low pass filter) circuit according to Embodiment 7. This primary filter circuit has, for example, a circuit block CB including a resistance component and a condenser CL1. An input voltage from which an unnecessary high-frequency component has been removed by this primary filter circuit is an output voltage.

FIG. 99 illustrates one example of a PLL (Phase Locked Loop) circuit according to Embodiment 7. This PLL circuit has, for example, a phase comparator circuit PC, a charge pump CP, a loop filter LF having a resistance R and condenser CL2, and a voltage controlled oscillator VCO having a ring oscillator RO. The phase comparator PC outputs a differential signal voltage, representing a phase difference between a reference clock to be input and a PLL clock (output clock) from the voltage controlled oscillator VCO. This differential signal voltage is transmitted to the loop filter LF via the charge pump. After an unnecessary high-frequency component is removed by the loop filter LF, the voltage is applied to a control voltage terminal of the voltage controlled oscillator. The voltage controlled oscillator changes the frequency of the output clock so as to decrease the difference in the frequency between the reference clock and the output clock. When the frequency of the output clock becomes equal to that of the reference clock by repeating the above-described operation, the above-described phase difference becomes 0 and the loop keeps a stable state (phase locked state), by which the operation is completed. The loop filter LF also serves to determine the response characteristics and stationary characteristics.

The hold condenser Ch and condensers CL1,CL2 require a relatively large capacitance in order to prevent a surge or output of a high-frequency noise and to stabilize the output voltage. When such a hold condenser Ch and condensers CL1,CL2 having a large capacitance are each formed as a capacitor element having, for example, a similar constitution to that of the capacitor element C11, as described using FIGS. 33 and 34 in connection with Embodiment 3, the area of the capacitor element on the chip increases, inevitably leading to an increase in the size of the chip having the analog circuit of Embodiment 7. By forming each of the hold condenser Ch and condensers CL1,CL2 as a capacitor element having a similar constitution to that of the capacitor element C1, as described in connection with Embodiment 3, therefore, the area of the hold condenser Ch and condensers CL1,CL2 on the chip can be reduced greatly. In other words, the area necessary for the formation of the analog circuit of Embodiment 7 can be reduced drastically so that the size of the chip having the analogue circuit of Embodiment 7 can be decreased.

The present invention have been described specifically based on various Embodiments. The present invention is not limited to or by these embodiments, and it is needless to say that it can be modified to an extent not departing from the gist of the invention.

In Embodiments 1 to 5, interconnects having an Al film as a main conductive layer were described as examples, but interconnects may be formed by making an interconnect formation groove in an interlayer insulating film and filling the groove with a conductive film composed mainly of copper.

Of the aspects of the invention disclosed with reference to the present embodiments, typical ones will next be described briefly.

In a semiconductor integrated circuit device comprising a memory cell having first and second transfer MISFETs, first and second drive MISFETs, and first and second load MISFETs, each disposed at an intersection between a pair of complementary data lines and a word line, the first drive MISFET and the first load MISFET being cross-coupled with the second drive MISFET and second load MISFET, the first and second transfer MISFETs and the first and second drive MISFETs are formed over the main surface of a semiconductor substrate, a first insulating film is formed over the semiconductor substrate and a first opening is formed in the first insulating film, a first capacitor element having, as a lower electrode, a first conductive film formed along the sidewall and bottom of the first opening, as a capacitor, a second insulating film formed over the first conductive film, and as an upper electrode, a second conductive film formed over the second insulating film is formed over the sidewall and bottom of the first opening, a supply voltage line to be electrically connected to the first and second load MISFETs, the first and second drive MISFETs and a reference voltage line are formed over the first capacitor element, the lower electrode constitutes a first storage node of the memory cell by electrically connecting a drain of the first drive MISFET, a drain of the first load MISFET, a gate electrode of the second drive MISFET and a gate electrode of the second load MISFET, and a second storage node of the memory cell by electrically connecting a drain of the second drive MISFET, a drain of the second load MISFET, a gate electrode of the first drive MISFET and a gate electrode of the first load MISFET, the first capacitor element is electrically connected between the first storage node and second storage node, and the supply voltage line, between the first storage node and second storage node, and the reference voltage line, or between the first storage node and the second storage node, and the first opening reaches the gate electrode of the each of first and second drive MISFETs and the drain of each of the first and second load MISFETs.

In the above-described semiconductor integrated circuit device, the first conductive film contains silicon and at the interface between the first insulating film and the second insulating film, the first conductive film has silicon grains.

In a semiconductor integrated circuit device comprising a memory cell having first and second transfer MISFETs, first and second drive MISFETs and first and second load MIS-FETs, each disposed at an intersection between a pair of complementary data lines and a word line, the first drive MISFET and first load MISFET being cross-coupled with the second drive MISFET and second load MISFET, the first and second transfer MISFETs and the first and second drive MISFETs are formed over the main surface of a semiconductor substrate, a first insulating film is formed over the semiconductor substrate and a first opening is formed in the first insulating film, a first capacitor element having, as a lower electrode, a first conductive film formed along the sidewall and bottom of the first opening, as an insulator, a second insulating film formed over the first conductive film, and as an upper electrode, a second conductive film formed over the second insulating film is formed over the sidewall and bottom of the first opening, a supply voltage line to be electrically connected to the first and second load MISFETs, the first and second drive MISFETs and a reference voltage line are formed over the first capacitor element, the lower electrode constitutes a first storage node of the memory cell by electrically connecting a drain of the first drive MISFET, a drain of the first load MISFET, a gate electrode of the second drive MISFET and a gate electrode of the second load MISFET, and a second storage node of the memory cell by electrically connecting a drain of the second drive MISFET, a drain of the second load MISFET, a gate electrode of the first drive MISFET and a gate electrode of the first load MISFET, the first capacitor element is electrically connected between the first storage node and second storage node, and the supply voltage line, between the first storage node and second storage node, and the reference voltage line, or between the first storage node and the second storage node, and the first and second load MISFETs are formed at a position higher than that of each of the first and second transfer MISFETs, and the first and second drive MISFETs, the first load MISFET has a source, channel region and a drain which is formed in a first laminate and extends in a direction perpendicular to the main surface of the semiconductor substrate, and a gate electrode formed over the sidewall of the first laminate via a gate insulating film, the second load MISFET has a source, channel region and a drain which is formed in a second laminate and extends in a direction perpendicular to the main surface of the semiconductor substrate and a gate electrode formed over the sidewall of the second laminate via a gate insulating film; and the first insulating film is formed to cover the first and second load MISFETs.

In the above-described semiconductor integrated circuit device, the first conductive film contains silicon and at the interface between the first insulating film and the second insulating film, the first conductive film has silicon grains.

In a semiconductor integrated circuit device comprising a memory cell having first and second transfer MISFETs, first and second drive MISFETs and first and second load MIS-FETs, each disposed at an intersection between a pair of complementary data lines and a word line, the first drive MISFET and first load MISFET being cross-coupled with the second drive MISFET and second load MISFET, the first and second transfer MISFETs and the first and second drive MISFETs are formed over the main surface of a semiconductor substrate, a first insulating film is formed over the semiconductor substrate and a first opening is formed in the first insulating film, a first capacitor element having, as a lower electrode, a first conductive film formed along the sidewall and bottom of the first opening, as an insulator, a second insulating film formed over the first conductive film, and as an upper electrode, a second conductive film formed over the second insulating film is formed over the sidewall and bottom of the first opening, a supply voltage line to be electrically connected to the first and second load MISFETs, the first and second drive MISFETs and a reference voltage line are formed over the first capacitor element, the lower electrode constitutes a first storage node of the memory cell by electrically connecting a drain of the first drive MISFET, a drain of the first load MISFET, a gate electrode of the second drive MISFET and a gate electrode of the second load MISFET, and a second storage node of the memory cell by electrically connecting a drain of the second drive MISFET, a drain of the second load MISFET, a gate electrode of the first drive MISFET and a gate electrode of the first load MISFET, the first capacitor element is electrically connected between the first storage node and second storage node, and the supply voltage line, between the first storage node and second storage node, and the reference voltage line, or between the first storage node and the second storage node, the memory cell is formed in a first region over the main surface of the semiconductor substrate and a power supply circuit is formed in a second region over the main surface of the semiconductor substrate, in a second opening formed in the first insulating film in the second region, a second capacitor element having, as a lower electrode, the first conductive film formed along the sidewall and bottom of the second opening, as an insulator, the second insulating film formed over the first conductive film, and as an upper electrode, the second conductive film formed over the second insulating film, and the power supply circuit feeds the memory cell with an operating voltage and the second capacitor element is electrically connected between the operating voltage and ground voltage.

In the above-described semiconductor integrated circuit device, the first conductive film contains silicon and at the interface between the first insulating film and the second insulating film, the first conductive film has silicon grains.

In a semiconductor integrated circuit device comprising a memory cell having first and second transfer MISFETs, first and second drive MISFETs and first and second load MIS-FETs, each disposed at an intersection between a pair of complementary data lines and a word line, the first drive MISFET and first load MISFET being cross-coupled with the second drive MISFET and second load MISFET, and a power supply circuit, the memory cell is formed in a first region over the main surface of the semiconductor substrate and the power supply circuit is formed in a second region over the main surface of the semiconductor substrate, a first insulating film is formed over the semiconductor substrate, in a second opening formed in the first insulating film in the second region, a second capacitor element having, as a lower electrode, a first conductive film formed along the sidewall and bottom of the second opening, as an insulator, a second insulating film formed over the first conductive film, and as an upper electrode, a second conductive film formed over the second insulating film is formed, the power supply circuit feeds the memory cell with an operating voltage, and the second capacitor element is electrically connected between the operating voltage and ground voltage.

In the above-described semiconductor integrated circuit device, the first conductive film contains silicon and at the interface between the first insulating film and the second insulating film, the first conductive film has silicon grains.

A semiconductor integrated circuit device, comprising a first insulating film formed over a semiconductor substrate and a second opening formed in the first insulating film, wherein over the sidewall and the bottom of the second opening, a capacitor element having, as a lower electrode, a first conductive film formed along the sidewall and bottom of the second opening, as an insulator, a second insulating film formed over the first conductive film, and as an upper electrode, a second conductive film formed over the second insulating film is formed, and the capacitor element constitutes an analog circuit.

In the above-described semiconductor integrated circuit device, the first conductive film contains silicon and at the interface between the first insulating film and the second insulating film, the first conductive film has silicon grains.

A manufacturing method of a semiconductor integrated circuit device comprising a memory cell having first and second transfer MISFETs, first and second drive MISFETs and first and second load MISFETs, each disposed at an intersection between a pair of complementary data lines and a word line, the first drive MISFET and first load MISFET being cross-coupled with the second drive MISFET and second load MISFET, which comprises:

(a) forming the first and second transfer MISFETs and the first and second drive MISFETs over the main surface of a semiconductor substrate, (b) forming a first insulating film over the semiconductor substrate and making a first opening in the first insulating film, (c) forming a first conductive film over the sidewall and bottom of the first opening, forming a first node of the memory cell by electrically connecting, via the first conductive film, a drain of the first drive MISFET, a drain of the first load MISFET, a gate electrode of the second drive MISFET and a gate electrode of the second load MISFET, and forming a second node by electrically connecting, via the first conductive film, a drain of the second drive MISFET, a drain of the second load MISFET, a gate electrode of the first drive MISFET and a gate electrode of the first load MISFET, (d) forming a second insulating film over the first conductive film, forming a second conductive film over the second insulating film and forming a first capacitor element having the first conductive film as a lower electrode, the second insulating film as an insulator and the second conductive film as an upper electrode, and (e) forming a supply voltage line and a reference voltage line over the first capacitor element, wherein:

the first capacitor element electrically connects between the first storage node and second storage node, and the supply voltage line, between the first storage node and second storage node, and the reference voltage line, or between the first storage node and the second storage node.

In the above-described manufacturing method, the first conductive film is formed by steps including:

(c1) forming, over the first insulating film including the inside of the first opening, an amorphous silicon film containing an impurity, and (c2) feeding the surface of the amorphous silicon film with an $SiH_4$-gas-containing gas in an atmosphere of reduced pressure.

A manufacturing method of a semiconductor integrated circuit device comprising a memory cell having first and second transfer MISFETs, first and second drive MISFETs and first and second load MISFETs, each disposed at an intersection between a pair of complementary data lines and a word line, the first drive MISFET and first load MISFET being cross-coupled with the second drive MISFET and second load MISFET, which comprises:

(a) forming the first and second transfer MISFETs and the first and second drive MISFETs over the main surface of a semiconductor substrate, (b) forming a first insulating film over the semiconductor substrate and making a first opening formed in the first insulating film, (c) forming a first conductive film over the sidewall and bottom of the first opening, forming a first storage node of the memory cell by electrically connecting, via the first conductive film, a drain of the first drive MISFET, a drain of the first load MISFET, a gate electrode of the second drive MISFET and a gate electrode of the second load MISFET, and forming a second storage node by electrically connecting, via the first conductive film, a drain of the second drive MISFET, a drain of the second load MISFET, a gate electrode of the first drive MISFET and a gate electrode of the first load MISFET, (d) forming a second insulating film over the first conductive film, forming a second conductive film over the second insulating film and forming a first capacitor element having the first conductive film as a lower electrode, the second insulating film as an insulator and the second conductive film as an upper electrode, and (e) forming a supply voltage line and a reference voltage line over the first capacitor element, said first capacitor element being electrically connected between the first storage node and second storage node, and the supply voltage line, between the first storage node and second storage node, and the reference voltage line, or between the first storage node and the second storage node, and forming the memory cell in a first region over the main surface of the semiconductor substrate and forming a power supply circuit for feeding an operating voltage to the memory cell in a second region over the main surface of the semiconductor substrate, (f) forming a second opening in the first insulating film in the second region, and (g) forming the first conductive film along the sidewall and bottom of the second opening portion, forming the second insulating film over the first conductive film in the second opening, and forming the second conductive film over the second insulating film in the second opening to form a second capacitor element which has the first conductive film as a lower electrode, the second insulating film as an insulator and the second conductive film as an upper electrode and is connected between the power supply circuit and memory cell, and a ground potential.

In the above-described method, the first conductive film is formed by the steps including:

(c1) forming, over the first insulating film including the inside of the first opening, an amorphous silicon film including an impurity, and (c2) feeding the surface of the amorphous silicon film with an $SiH_4$-containing gas in an atmosphere of reduced pressure to form silicon grains over the surface of the amorphous silicon film.

The above-described manufacturing method further comprises a step of forming a third insulating film over the semiconductor substrate prior the step (b), said first opening and second opening being formed so that the bottom of at least one of them reaches the third insulating film and the first conductive film and second conductive film are formed to extend over the first insulating film, and the step (d) further comprises:

(d1) forming a fourth insulating film over the first insulating film, (d2) perforating the fourth insulating film to form a connecting hole reaching the first conductive film which extends over the first insulating film and another connecting hole reaching the second conductive film which extends over the first insulating film, and (d3) forming a conductive layer in the connecting holes.

A manufacturing method of a semiconductor integrated circuit device having a memory cell having first and second transfer MISFETs, first and second drive MISFETs and first and second load MISFETs, each disposed at an intersection between a pair of complementary data lines and a word line, the first drive MISFET and first load MISFET being cross-coupled with the second drive MISFET and second load MISFET; and a power supply circuit for feeding the memory cell an operating voltage, which comprises:

forming the memory cell in a first region over the main surface of a semiconductor substrate, forming the power supply circuit in a second region over the main surface of the semiconductor substrate, (a) forming a first insulating film over the semiconductor substrate, (b) forming a second opening in the first insulating film in the second region, (c) forming a first conductive film along the sidewall and bottom of the second opening, forming a second insulating film over the first conductive film, forming a second conductive film over the second insulating film, and forming a second capacitor element which has the first conductive film as a lower electrode, the second insulating film as an insulator and the second conductive film as an upper electrode and is electrically connected between the power supply circuit and memory cell, and a ground potential.

In the above-described method, the first conductive film is formed by the steps including:

(c1) forming, over the first insulating film including the inside of the first opening, an amorphous silicon film containing an impurity, and (c2) feeding the surface of the amorphous silicon film with an $SiH_4$-containing gas in an atmosphere of reduced pressure to form silicon grains on the surface of he amorphous silicon film.

The above-described manufacturing method further comprises a step of forming a third insulating film over the semiconductor substrate prior the step (a), forming the second opening so as to reach, at the bottom thereof, the third insulating film, forming the first conductive film and second conductive film to extend over the first insulating film;

(d) a step of forming a fourth insulating film over the first insulating film, (e) perforating the fourth insulating film to form a connecting hole reaching the first conductive film extending over the first insulating film and another connecting hole reaching the second conductive film extending over the first insulating film, and (f) forming a conductive layer in the connecting hole.

A manufacturing method of a semiconductor integrated circuit device, which comprises:

(a) forming a first insulating film over a semiconductor substrate, (b) forming a second opening in the first insulating film, (c) forming a first conductive film along the sidewall and bottom of the second opening, forming a second insulating film over the first conductive film, forming a second conductive film over the second insulating film, and forming a second capacitor element having the first conductive film as a lower electrode, the second insulating film as an insulator and the second conductive film as an upper electrode, and forming an analog circuit by using the capacitor element, wherein the first conductive film is formed by the steps including:

(c1) forming, over the first insulating film including the inside of the first opening, an amorphous silicon film containing an impurity, and (c2) feeding the surface of the amorphous silicon film with an $SiH_4$-containing gas in an atmosphere of reduced pressure to form silicon grains on the surface of the amorphous silicon film.

The above-described manufacturing method further comprises forming a third insulating film over the semiconductor substrate prior the step (a), forming the second opening so as to reach, at the bottom thereof, the third insulating film, forming the first conductive film and second conductive film to extend over the first insulating film, (d) forming a fourth insulating film over the first insulating film, (e) perforating the fourth insulating film to form a connecting hole reaching the first conductive film extending over the first insulating film and another connecting hole reaching the second conductive film extending over the first insulating film, and (f) forming a conductive layer in the connecting hole.

A semiconductor integrated circuit device comprises a first insulating film formed over a semiconductor substrate, a plurality of second openings formed in the first insulating film, and a capacitor element which is formed over the sidewall and bottom of the plurality of second openings and has, as a lower electrode, a first conductive film formed along the sidewall and bottom of the second openings, as an insulator, a second insulating film formed over the first conductive film, and, as an upper electrode, a second conductive film formed over the second insulating film in the plurality of second openings, wherein the first insulating film has a plurality of interconnect grooves formed therein and an interconnect is formed in each of the interconnect grooves.

Of the advantages disclosed by the present embodiments, typical ones will next be described briefly.

By forming a hole in an insulating film formed over a semiconductor substrate and forming a capacitor element in the hole, the capacitance can be formed over the bottom and circumference of the sidewall of the hole. The capacitance of the capacitor element and, in turn, properties of the semiconductor integrated circuit device can therefore be improved without an increase in the chip size. In addition, soft error resistance of the memory cell of an SRAM against α radiation can be heightened, leading to an improvement in the reliability of the memory cell.

Advantages available by the typical inventions of the present inventions disclosed by the present application will next be described briefly.

In short, the properties of the semiconductor integrated circuit device can be improved.

What is claimed is:

1. A semiconductor integrated circuit device comprising:
   a memory cell having a first and a second drive MISFET and a first and a second load MISFET,
   the first and the second drive MISFET each having a source region and a drain region formed in a substrate,
   the first and the second load MISFET each having a source region and a drain region formed in a substrate,
   gate electrodes of the first and second drive MISFET and the first and second load MISFET formed over a main surface of the substrate;
   a first insulating film is formed over the first and second drive MISFET and the first and second load MISFET,
   wherein the first insulating film has a first opening and a second opening;
   a first capacitor element formed over the side wall and bottom of the first opening such that the first capacitor element has, as a lower electrode, a first conductive film formed along the side wall and bottom of the first opening, as a capacitor insulator film, a second insulating film formed over the first conductive film, and as an upper electrode, a second conductive film formed over the second insulating film; and
   a second capacitor element formed over the side wall and bottom of the second opening such that the second capacitor element has, as a lower electrode, a third conductive film formed along the side wall and bottom of the second opening, as a capacitor insulator film, a third insulating film formed over the third conductive film, and as an upper electrode, a fourth conductive film formed over the third insulating film,
   wherein the first opening is formed to extend over the drain region of the first drive MISFET and the drain region of the first load MISFET such that the first conductive film is electrically connected to the drain of the first drive MISFET, the drain of the first load MISFET, the gate electrode of the second drive MISFET and the gate electrode of the second load MISFET,
   wherein the second opening is formed to extend over the drain region of the second drive MISFET and the drain region of the second load MISFET such that the third conductive film is electrically connected to the drain of the second drive MISFET, the drain of the second load MISFET, the gate electrode of the first drive MISFET and the gate electrode of the first load MISFET.

2. A semiconductor integrated circuit device according to claim 1, wherein the first opening reaches the drain region of the first drive MISFET and the drain region of the first load MISFET, wherein the second opening reaches the drain region of the second drive MISFET and the drain region of the second load MISFET.

3. A semiconductor integrated circuit device according to claim 1, wherein the second conductive film is electrically connected to the fourth conductive film.

4. A semiconductor integrated circuit device according to claim 1, wherein the second conductive film is integrally formed with the fourth conductive film.

5. A semiconductor integrated circuit device according to claim 1, wherein a fixed potential (Vcc, Vss) is applied to the second conductive film and the fourth conductive film.

6. A semiconductor integrated circuit device comprising:
   a memory cell having a first and a second drive MISFET and a first and a second load MISFET,
   the first and the second drive MISFET each having a source region and a drain region formed in a substrate,
   the first and the second load MISFET each having a source region and a drain region formed in a substrate,
   gate electrodes of the first and second drive MISFET and the first and second load MISFET formed over a main surface of the substrate;
   a first insulating film is formed over the first and second drive MISFET and the first and second load MISFET,
   wherein the first insulating film has a first opening and a second opening;
   a first capacitor element formed over the side wall and bottom of the first opening such that the first capacitor element has, as a lower electrode, a first conductive film formed along the side wall and bottom of the first opening, as a capacitor insulator film, a second insulating film formed over the first conductive film, and as an upper electrode, a second conductive film formed over the second insulating film; and
   a second capacitor element formed over the side wall and bottom of the second opening such that the second capacitor element has, as a lower electrode, a third conductive film formed along the side wall and bottom of the second opening, as a capacitor insulator film, a third insulating film formed over the third conductive film, and as an upper electrode, a fourth conductive film formed over the third insulating film,
   wherein the first conductive film is electrically connected to the drain of the first drive MISFET, the drain of the first load MISFET, the gate electrode of the second drive MISFET and the gate electrode of the second load MISFET,
   wherein the third conductive film is electrically connected to the drain of the second drive MISFET, the drain of the second load MISFET, the gate electrode of the first drive MISFET and the gate electrode of the first load MISFET.

7. A semiconductor integrated circuit device according to claim 6, wherein the first opening reaches the drain region of the first drive MISFET and the drain region of the first load MISFET, wherein the second opening reaches the drain region of the second drive MISFET and the drain region of the second load MISFET.

8. A semiconductor integrated circuit device according to claim 6, wherein the second conductive film is electrically connected to the fourth conductive film.

9. A semiconductor integrated circuit device according to claim 6, wherein the second conductive film is integrally formed with the fourth conductive film.

10. A semiconductor integrated circuit device according to claim 6, wherein a fixed potential is applied to the second conductive film and the fourth conductive film.

* * * * *